United States Patent
Lin

(10) Patent No.: US 8,742,582 B2
(45) Date of Patent: Jun. 3, 2014

(54) SOLDER INTERCONNECT ON IC CHIP

(75) Inventor: Mou-Shiung Lin, Hsin-Chu (TW)

(73) Assignee: Megit Acquisition Corp., San Diego, CA (US)

( * ) Notice: Subject to any disclaimer, the term of this patent is extended or adjusted under 35 U.S.C. 154(b) by 73 days.

(21) Appl. No.: 13/271,004

(22) Filed: Oct. 11, 2011

(65) Prior Publication Data

US 2012/0025378 A1 Feb. 2, 2012

Related U.S. Application Data

(63) Continuation of application No. 11/157,186, filed on Jun. 17, 2005, now Pat. No. 8,067,837.

(30) Foreign Application Priority Data

Sep. 20, 2004 (TW) .............................. 93128389 A

(51) Int. Cl.
*H01L 23/528* (2006.01)

(52) U.S. Cl.
USPC .................................. 257/758; 257/E23.019

(58) Field of Classification Search
USPC ........... 257/758, E23.017, E23.018, E23.019, 257/E23.129
See application file for complete search history.

(56) References Cited

U.S. PATENT DOCUMENTS

| | | |
|---|---|---|
| 4,087,314 A | 5/1978 | George et al. |
| 4,179,802 A | 12/1979 | Joshi et al. |
| 4,652,336 A | 3/1987 | Andrascek et al. |
| 5,061,985 A | 10/1991 | Meguro et al. |
| 5,071,518 A | 12/1991 | Pan |
| 5,083,187 A | 1/1992 | Lamson et al. |
| 5,108,950 A | 4/1992 | Wakabayashi et al. |
| 5,132,775 A | 7/1992 | Brighton et al. |
| 5,134,460 A | 7/1992 | Brady et al. |
| 5,137,845 A | 8/1992 | Lochon et al. |
| 5,223,454 A | 6/1993 | Uda et al. |
| 5,226,232 A | 7/1993 | Boyd |
| 5,261,155 A | 11/1993 | Angulas et al. |
| 5,268,072 A | 12/1993 | Agarwala et al. |
| 5,326,709 A | 7/1994 | Moon et al. |
| 5,418,186 A | 5/1995 | Park et al. |

(Continued)

FOREIGN PATENT DOCUMENTS

| | | |
|---|---|---|
| EP | 1536469 A1 | 6/2005 |
| JP | 60217646 A | 10/1985 |

(Continued)

OTHER PUBLICATIONS

Wright P., "Integrated Front-End Modules for Cell Phones," 2005, pp. 564-572.

(Continued)

*Primary Examiner* — Wael Fahmy
*Assistant Examiner* — Sarah Salerno
(74) *Attorney, Agent, or Firm* — Seyfarth Shaw LLP

(57) ABSTRACT

A semiconductor chip suited for being electrically connected to a circuit element includes a line and a bump. The bump is connected to the line and is adapted to be electrically connected to the line. A plane that is horizontal to an active surface of the semiconductor chip is defined. The area that the connection region of the line and the bump is projected on the plane is larger than 30,000 square microns or has an extension distance larger than 500 microns.

37 Claims, 79 Drawing Sheets

(56) References Cited

U.S. PATENT DOCUMENTS

| | | |
|---|---|---|
| 5,503,286 A | 4/1996 | Nye, III et al. |
| 5,541,135 A | 7/1996 | Pfeifer et al. |
| 5,554,940 A | 9/1996 | Hubacher |
| 5,565,379 A | 10/1996 | Baba |
| 5,600,180 A | 2/1997 | Kusaka et al. |
| 5,631,499 A | 5/1997 | Hosomi et al. |
| 5,656,858 A | 8/1997 | Kondo et al. |
| 5,656,863 A | 8/1997 | Yasunaga et al. |
| 5,664,642 A | 9/1997 | Williams |
| 5,729,896 A | 3/1998 | Dalal et al. |
| 5,736,791 A | 4/1998 | Fujiki et al. |
| 5,756,370 A | 5/1998 | Farnworth et al. |
| 5,766,982 A | 6/1998 | Akram et al. |
| 5,767,010 A | 6/1998 | Mis et al. |
| 5,854,513 A | 12/1998 | Kim |
| 5,877,078 A | 3/1999 | Yanagida |
| 5,883,435 A | 3/1999 | Geffken et al. |
| 5,892,273 A | 4/1999 | Iwasaki et al. |
| 5,898,222 A | 4/1999 | Farooq et al. |
| 5,903,343 A | 5/1999 | Ning et al. |
| 5,943,597 A | 8/1999 | Kleffner et al. |
| 5,946,590 A | 8/1999 | Satoh |
| 5,985,765 A | 11/1999 | Hsiao et al. |
| 6,013,571 A | 1/2000 | Morrell |
| 6,028,363 A | 2/2000 | Lin |
| 6,042,953 A | 3/2000 | Yamaguchi et al. |
| 6,075,290 A | 6/2000 | Schaefer et al. |
| 6,077,726 A | 6/2000 | Mistry et al. |
| 6,093,964 A | 7/2000 | Saitoh |
| 6,144,100 A | 11/2000 | Shen et al. |
| 6,144,102 A | 11/2000 | Amagai |
| 6,162,652 A | 12/2000 | Dass et al. |
| 6,180,265 B1 | 1/2001 | Erickson |
| 6,187,680 B1 | 2/2001 | Costrini et al. |
| 6,194,309 B1 | 2/2001 | Jin |
| 6,197,613 B1 | 3/2001 | Kung et al. |
| 6,198,619 B1 | 3/2001 | Fujioka |
| 6,229,220 B1 | 5/2001 | Saitoh et al. |
| 6,229,711 B1 | 5/2001 | Yoneda |
| 6,238,599 B1 | 5/2001 | Gelorme et al. |
| 6,250,541 B1 | 6/2001 | Shangguan et al. |
| 6,271,107 B1 | 8/2001 | Massingill et al. |
| 6,319,830 B1 | 11/2001 | Yamaguchi |
| 6,323,426 B1 | 11/2001 | Hoshizaki et al. |
| 6,332,988 B1 | 12/2001 | Berger, Jr. et al. |
| 6,362,087 B1 | 3/2002 | Wang et al. |
| 6,372,622 B1 | 4/2002 | Tan et al. |
| 6,380,061 B1 | 4/2002 | Kobayashi et al. |
| 6,406,967 B1 | 6/2002 | Chung et al. |
| 6,426,281 B1 | 7/2002 | Lin et al. |
| 6,426,556 B1 | 7/2002 | Lin |
| 6,429,531 B1 | 8/2002 | Mistry et al. |
| 6,452,270 B1 | 9/2002 | Huang |
| 6,467,674 B1 | 10/2002 | Mihara |
| 6,479,900 B1 | 11/2002 | Shinogi et al. |
| 6,495,397 B2 | 12/2002 | Kubota et al. |
| 6,501,169 B1 | 12/2002 | Aoki et al. |
| 6,518,651 B2 | 2/2003 | Hashimoto |
| 6,573,598 B2 | 6/2003 | Ohuchi et al. |
| 6,578,754 B1 | 6/2003 | Tung |
| 6,592,019 B2 | 7/2003 | Tung |
| 6,600,234 B2 | 7/2003 | Kuwabara et al. |
| 6,627,988 B2 | 9/2003 | Andoh |
| 6,653,563 B2 | 11/2003 | Bohr |
| 6,661,100 B1 | 12/2003 | Anderson et al. |
| 6,683,380 B2 | 1/2004 | Efland et al. |
| 6,707,159 B1 | 3/2004 | Kumamoto et al. |
| 6,709,985 B1 | 3/2004 | Goruganthu et al. |
| 6,731,003 B2 | 5/2004 | Joshi et al. |
| 6,732,913 B2 | 5/2004 | Alvarez |
| 6,762,122 B2 | 7/2004 | Mis et al. |
| 6,809,020 B2 | 10/2004 | Sakurai et al. |
| 6,815,324 B2 | 11/2004 | Huang et al. |
| 6,853,076 B2 | 2/2005 | Datta et al. |
| 6,861,742 B2 | 3/2005 | Miyamoto et al. |
| 6,864,165 B1 | 3/2005 | Pogge et al. |
| 6,940,169 B2 | 9/2005 | Jin et al. |
| 6,998,710 B2 | 2/2006 | Kobayashi et al. |
| 7,008,867 B2 | 3/2006 | Lei |
| 7,034,402 B1 | 4/2006 | Seshan |
| 7,098,127 B2 | 8/2006 | Ito |
| 7,135,766 B1 | 11/2006 | Costa et al. |
| 7,220,657 B2 | 5/2007 | Ihara et al. |
| 7,246,432 B2 | 7/2007 | Tanaka et al. |
| 7,335,536 B2 | 2/2008 | Lange et al. |
| 7,405,149 B1 | 7/2008 | Lin et al. |
| 7,456,089 B2 | 11/2008 | Aiba et al. |
| 7,462,942 B2 | 12/2008 | Tan et al. |
| 8,067,837 B2 | 11/2011 | Lin |
| 2002/0043723 A1 | 4/2002 | Shimizu et al. |
| 2002/0127836 A1 | 9/2002 | Lin et al. |
| 2003/0006062 A1 | 1/2003 | Stone et al. |
| 2003/0111711 A1 | 6/2003 | Lin et al. |
| 2003/0133055 A1 | 7/2003 | Um et al. |
| 2003/0137058 A1 | 7/2003 | Magerlein et al. |
| 2003/0218246 A1 | 11/2003 | Abe et al. |
| 2004/0007779 A1 | 1/2004 | Arbuthnot et al. |
| 2004/0070086 A1 | 4/2004 | Lee et al. |
| 2004/0087130 A1* | 5/2004 | Kazama et al. ............... 438/613 |
| 2004/0126927 A1 | 7/2004 | Lin et al. |
| 2005/0161823 A1* | 7/2005 | Jobetto et al. ................. 257/758 |

FOREIGN PATENT DOCUMENTS

| | | |
|---|---|---|
| JP | 62160744 A | 7/1987 |
| JP | 1061038 | 3/1989 |
| JP | 3022437 A | 1/1991 |
| JP | 4278543 | 10/1992 |
| JP | 4318935 | 11/1992 |
| JP | 8013166 | 1/1996 |
| JP | 10107064 A | 4/1998 |
| JP | 2000260803 A | 9/2000 |
| JP | 2002016096 A | 1/2002 |
| JP | 2003133477 A | 5/2003 |
| JP | 2003234367 A | 8/2003 |
| JP | 2003282788 A | 10/2003 |
| JP | 2006128662 A | 5/2006 |
| JP | 2006147810 A | 6/2006 |
| TW | 584950 B | 4/2004 |
| WO | WO8701509 A1 | 3/1987 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

(56) References Cited

OTHER PUBLICATIONS

Edelstein, D. et al. "Full Copper Wiring in a Sub-0.25 pm CMOS ULSI Technology," Technical Digest IEEE International Electron Devices Meeting (1997) pp.773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, pp. 590.

Kumar, R. et al. "A Family of 45nm IA Processors" IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geefken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology ™ —MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

SOLDER INTERCONNECT ON IC CHIP

This application is a continuation of application Ser. No. 11/157,186, filed on Jun. 17, 2005, now pending, which claims priority to Taiwan App. No. 93128389, filed on Sep. 20, 2004, all of which are incorporated herein by reference.

BACKGROUND OF THE INVENTION

1. Field of the Invention

This invention relates to a semiconductor chip, chip package and package process, and particularly to ones with high performance.

2. Description of the Related Art

As the tremendous development of IT (Information Technology) proceeds, it's always been a piece of cake for retrieving information far away from us. Also, with the aid of high-efficiency IT product, enterprise competitor would be of benefit taking the lead in the game of time. IT product constantly renews itself and integrates various circuit designs, resulting in bearing much more function in just one chip. Moreover, plus the advanced technology of semiconductor, the success of mass production for IC copper process and the integrating of circuits, most signal transmission can be done in the same chip. Therefore, reduction of signal transmitting path will bring the high efficiency of chip.

After completing the desired chip, it is then sequentially bonded with the substrate by wirebonded conducting wire or bumps. The wirebonded conducting wire has a small cross-sectional area vertical to the direction of signal transmission which causes unexpected large noise, and worse, computation errors. However, using bumps as transmission media can largely increase the said cross-sectional area, which is why the latter is more preferable. In fact, according to the modern technology we have nowadays, it is only acceptable for binding chip and substrate or binding two chips by small-sized bumps. As a result, high efficiency of signal transmission is still a long way to go.

SUMMARY OF THE INVENTION

The first objective of the invention is to provide a semiconductor chip with a bump enhancing the electrical performance between the semiconductor chip and a circuitry component, wherein the circuitry component is a substrate or another semiconductor chip.

The second objective of the invention is to provide a chip package with a bump enhancing the electrical performance between a semiconductor chip and a circuitry component, wherein the circuitry component is a substrate or another semiconductor chip.

The third objective of the invention is to provide a process for fabricating a chip package with high electrical performance.

The third objective of the invention is to provide a semiconductor chip with an improved electrical performance between a thin-film circuit and a thick metallization circuit.

In accordance with the first objective, the invention provides a semiconductor chip suited to be electrically connected to a circuitry component. The semiconductor chip includes a circuit and a bump. The bump electrically connects the circuit to the circuitry component. A plane parallel to an active surface of the semiconductor chip is defined. The area of projecting the contact between the bump and the circuit onto the plane is greater than 30,000 $\mu m^2$, for example. Alternatively, the area of projecting the contact between the bump and the circuit onto the plane has an extending distance of greater than 500 $\mu m$, for example.

In accordance with the first objective, the invention provides a semiconductor chip suited to be electrically connected to a circuitry component. The semiconductor chip includes a circuit and multiple bumps. The bumps are electrically connected with the circuit. A plane parallel to an active surface of the semiconductor chip is defined. The ratio of the area of "projecting the contact between the bumps and the circuit onto the plane" to the area of "projecting the circuit onto the plane" is greater than 0.5, for example.

In accordance with the first objective, the invention provides a semiconductor chip has a bump suited to be electrically connected to a circuitry component. The bump has a cross-sectional area parallel to an active surface of the semiconductor chip. The cross-sectional area is greater than 30,000 $\mu m^2$, for example. Alternatively, the cross-sectional area has an extending distance of greater than 500 $\mu m$, for example.

In accordance with the second objective, the invention provides a chip package including a semiconductor chip and a circuitry component. The semiconductor chip includes a bump. The circuitry component includes a circuit. The circuit is connected to the bump. A plane parallel to an active surface of the semiconductor chip is defined. The area of projecting the contact between the bump and the circuit onto the plane is greater than 30,000 $\mu m^2$, for example. Alternatively, the area of projecting the contact between the bump and the circuit onto the plane has an extending distance of greater than 500 $\mu m$, for example.

In accordance with the second objective, the invention provides a chip package including a semiconductor chip and a circuitry component. The semiconductor chip includes a bump. The circuitry component includes a circuit. The circuit is electrically connected to the bump. A plane parallel to an active surface of the semiconductor chip is defined. The area of projecting the contact between the bump and the circuit onto the plane is greater than 30,000 $\mu m^2$, for example. Alternatively, the area of projecting the contact between the bump and the circuit onto the plane has an extending distance of greater than 500 $\mu m$, for example.

In accordance with the second objective, the invention provides a chip package including a semiconductor chip, a circuitry component and a conductive layer. The semiconductor chip includes a bump. The circuitry component includes a circuit. The circuit is electrically connected to the bump. The conductive layer composed of a polymer and multiple metal particles distributed in the polymer is between the bump and the circuit. A top surface of the bump is electrically connected to a top surface of the circuit through the metal particles of the conductive layer. A plane parallel to an active surface of the semiconductor chip is defined. The patterns of projecting the top surface of the bump and the top surface of the circuit onto the plane have an overlapping area of greater than 30,000 $\mu m^2$, for example. Alternatively, the overlapping area has an extending distance of greater than 500 $\mu m$, for example.

In accordance with the second objective, the invention provides a chip package including a semiconductor chip, a circuitry component and a conductive layer. The semiconductor chip includes a first bump. The circuitry component includes a second bump. The first bump is electrically connected to the second bump. The conductive layer composed of a polymer and multiple metal particles distributed in the polymer is between the first bump and the second bump. A top surface of the first bump is electrically connected to a top surface of the second bump through the metal particles of the conductive layer. A plane parallel to an active surface of the semiconductor chip is defined. The patterns of projecting the top surface of the first bump and the top surface of the second bump onto the plane have an overlapping area of greater than 30,000 $\mu m^2$, for example. Alternatively, the overlapping area has an extending distance of greater than 500 μm, for example.

In accordance with the third objective, the invention provides a method for fabricating a chip package including providing a semiconductor chip and a circuitry component. The semiconductor chip includes a first connecting portion. The circuitry component includes a second connecting portion. Subsequently, the first and second connecting portions are bonded. The unity of the first and second connecting portions after being bonded has a least cross-sectional area parallel to the active surface of the semiconductor chip. The least cross-sectional area is greater than 30,000 $\mu m^2$, for example. Alternatively, the least cross-sectional area has an extending distance of greater than 500 μm.

In accordance with the third objective, the invention provides a method for fabricating a chip package including providing a semiconductor chip and a circuitry component. The semiconductor chip includes a first connecting portion. The circuitry component includes a second connecting portion and a circuit, wherein the second connecting portion is on the circuit. Subsequently, the first and second connecting portions are bonded. A plane parallel to an active surface of the semiconductor chip is defined. The area of projecting the contact between the unity of the first and second connecting portions after being bonded and the circuit onto the plane is greater than 30,000 $\mu m^2$, for example. Alternatively, the area has an extending distance of greater than 500 μm, for example.

In accordance with the third objective, the invention provides a method for fabricating a chip package including providing a semiconductor chip and a circuitry component. The semiconductor chip includes a first connecting portion and a circuit, wherein the first connecting portion is on the circuit. The circuitry component includes a second connecting portion. Subsequently, the first and second connecting portions are bonded. A plane parallel to an active surface of the semiconductor chip is defined. The area of projecting the contact between the unity of the first and second connecting portions after being bonded and the circuit onto the plane is greater than 30,000 $\mu m^2$, for example. Alternatively, the area has an extending distance of greater than 500 μm, for example.

In accordance with the fourth objective, the invention provides a semiconductor chip suited to be electrically connected to a circuitry component. The semiconductor chip includes a semiconductor substrate, multiple thin-film dielectric layers, multiple thin-film circuit layers, a passivation layer, and a thick metallization layer. The semiconductor substrate has multiple electronic devices formed in a surface layer of an active surface thereof. The thin-film dielectric layers having multiple via holes are deposited over the active surface of the semiconductor substrate, first connecting portion and a circuit, wherein the first connecting portion is on the circuit. Each of the thin-film circuit layers is deposited on one of the thin-film circuit layers, respectively. The thin-film circuit layers are electrically connected to each other through the via holes and to the electronic devices. The topmost one of the thin-film circuit layers includes a thin-film circuit. The passivation layer is deposited over the thin-film circuit layers and the thin-film dielectric layers. An opening in the passivation layer exposes the thin-film circuit. The thick metallization layer is over the passivation layer and has a thickness greater than that of any one of the thin-film circuit layers. The thick metallization layer is connected to the thin-film circuit through the opening in the passivation layer. A plane parallel to the active surface is defined. The area of projecting the contact between the thick metallization layer and the thin-film circuit onto the plane is greater than 30,000 $\mu m^2$, for example. Alternatively, the area has an extending distance of greater than 500 μm, for example.

It is to be understood that both the foregoing general description and the following detailed description are exemplary, and are intended to provide further explanation of the invention as claimed.

1A is a plane view of projecting a circuit 213 of the substrate 200 onto the plane 1050.

Figure 1:
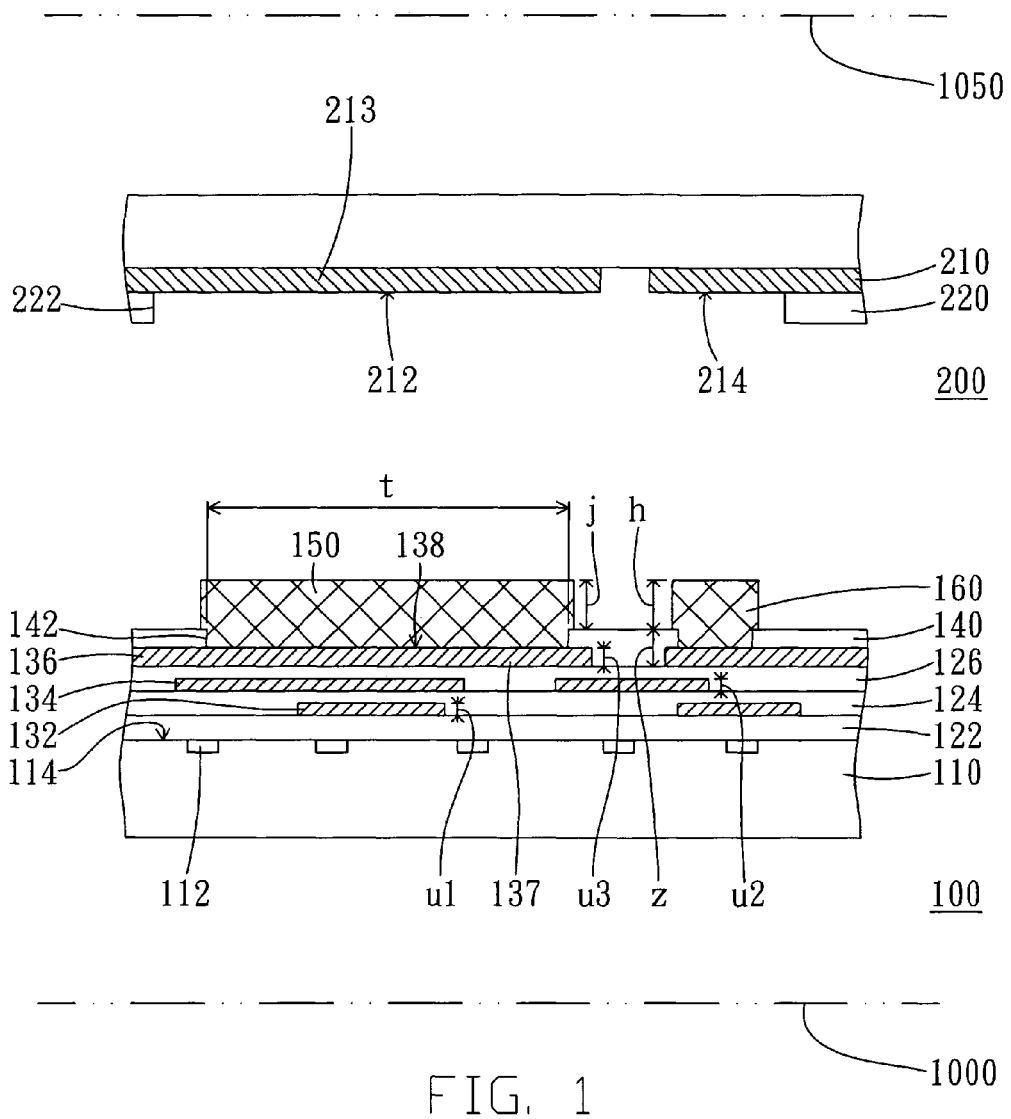
FIG. 1 is a cross-sectional view showing a chip package before a semiconductor chip and a substrate being assembled according to the first embodiment, wherein a bump on a thin-film circuit of the semiconductor chip is adapted to bonded to a circuit layer of the substrate.
Figure 1A:
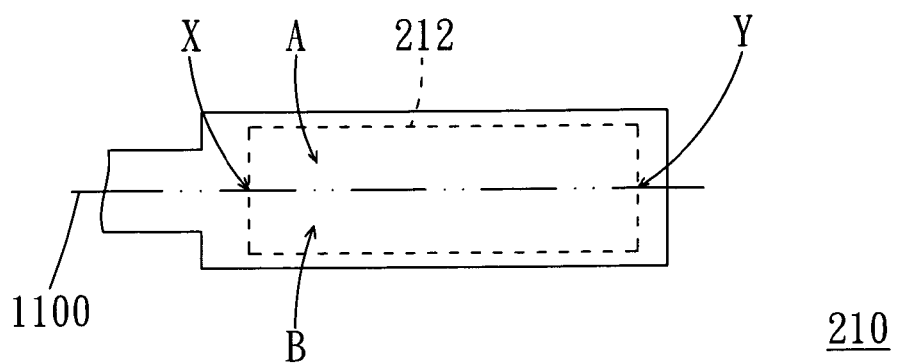
Figure 1B:
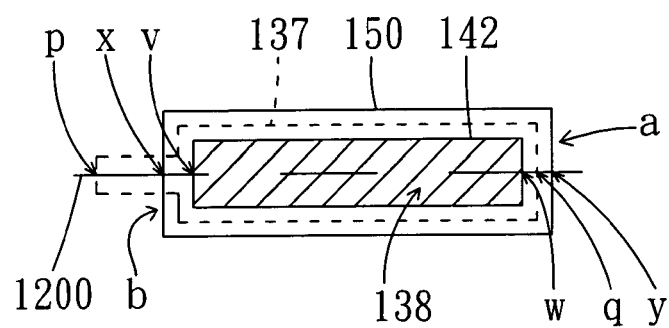

FIG. 1B is a plane view of projecting a bump 150 of the semiconductor chip 100 onto the plane 1000.

Figure 1C:
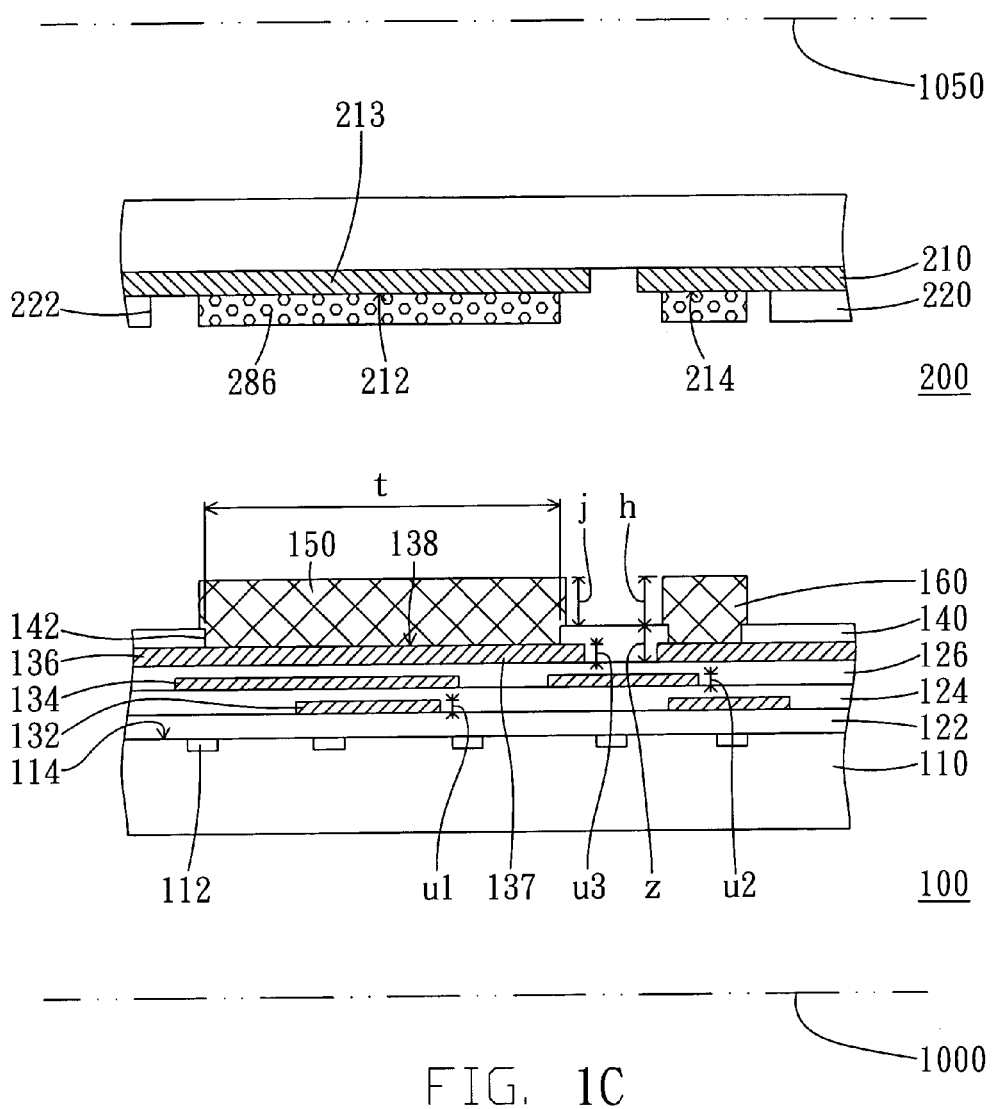

FIG. 1C is a cross-sectional view showing a chip package before a semiconductor chip and a substrate being assembled according to the first embodiment, wherein a bump on a thin-film circuit of the semiconductor chip is adapted to attached to a solder paste on a circuit layer of the substrate.

Figure 2:
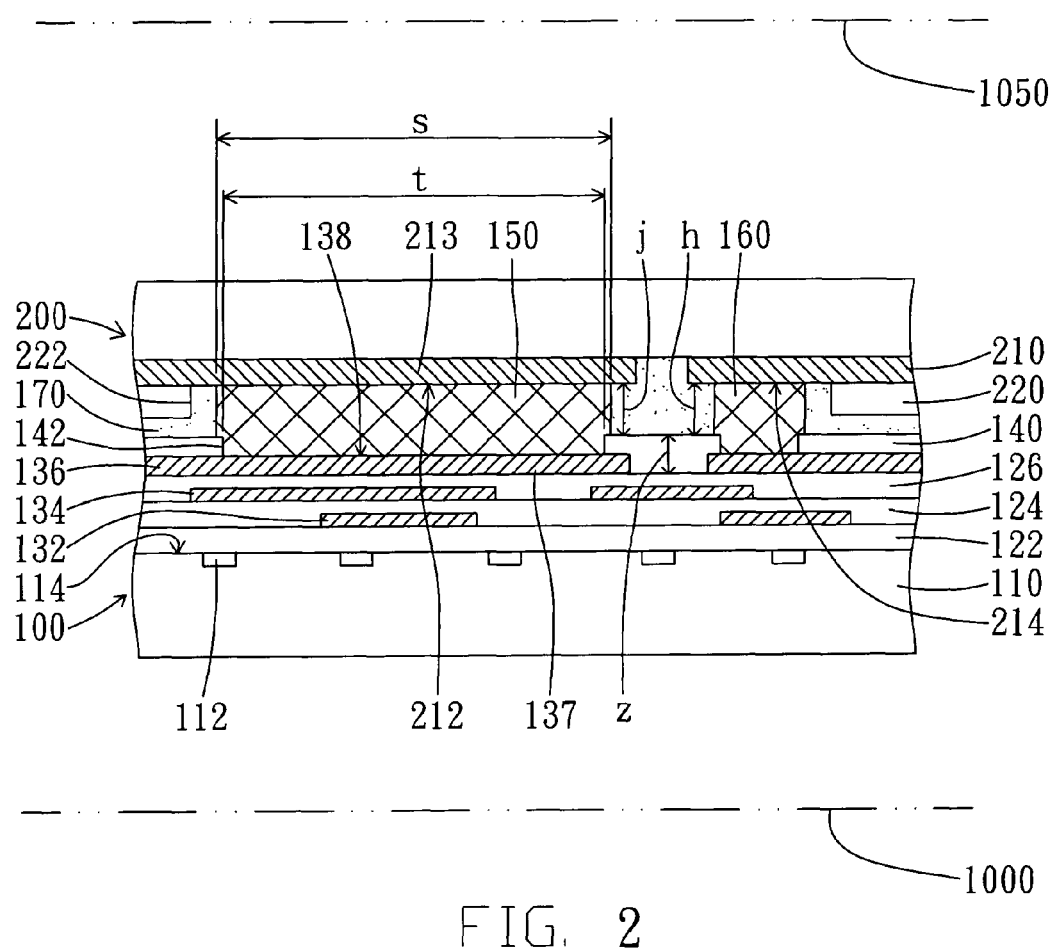

FIG. 2 is a cross-sectional view showing a chip package after the semiconductor chip and the substrate shown in FIG. 1 being assembled according to the first embodiment.

Figure 2A:
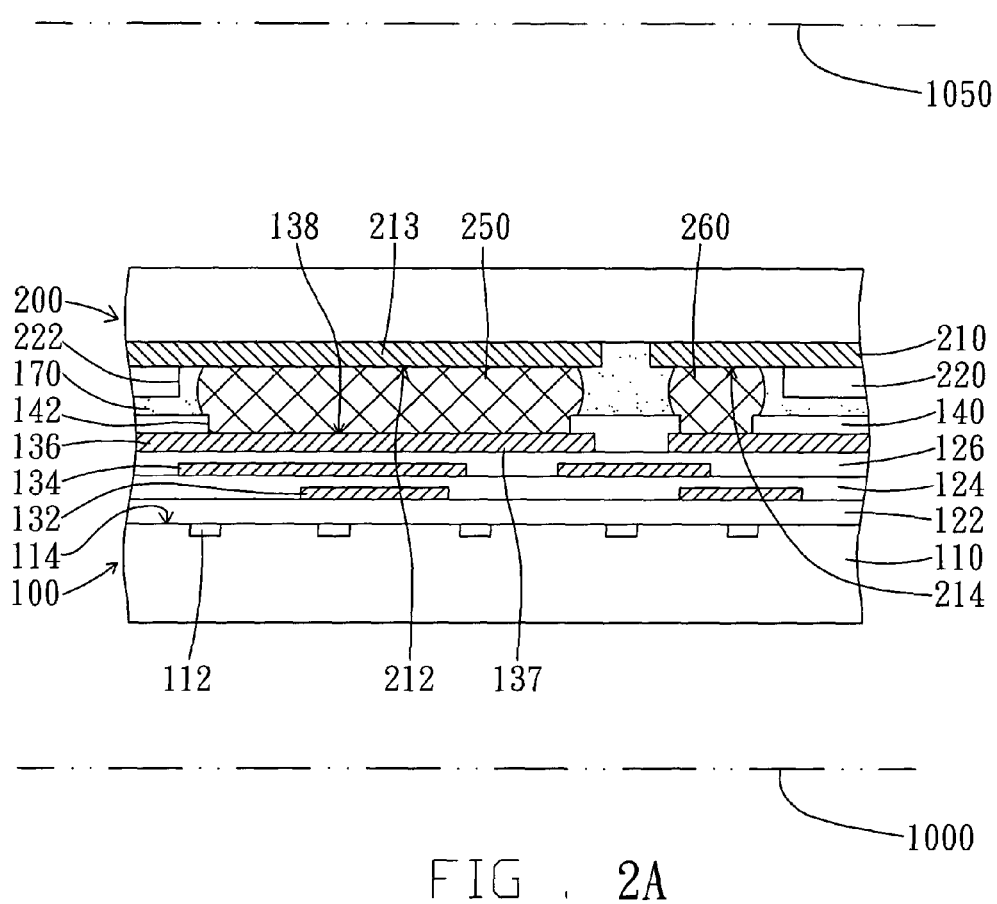

FIG. 2A is a cross-sectional view showing a chip package after the semiconductor chip and the substrate shown in FIG. 1C being assembled according to the first embodiment.

Figure 3:
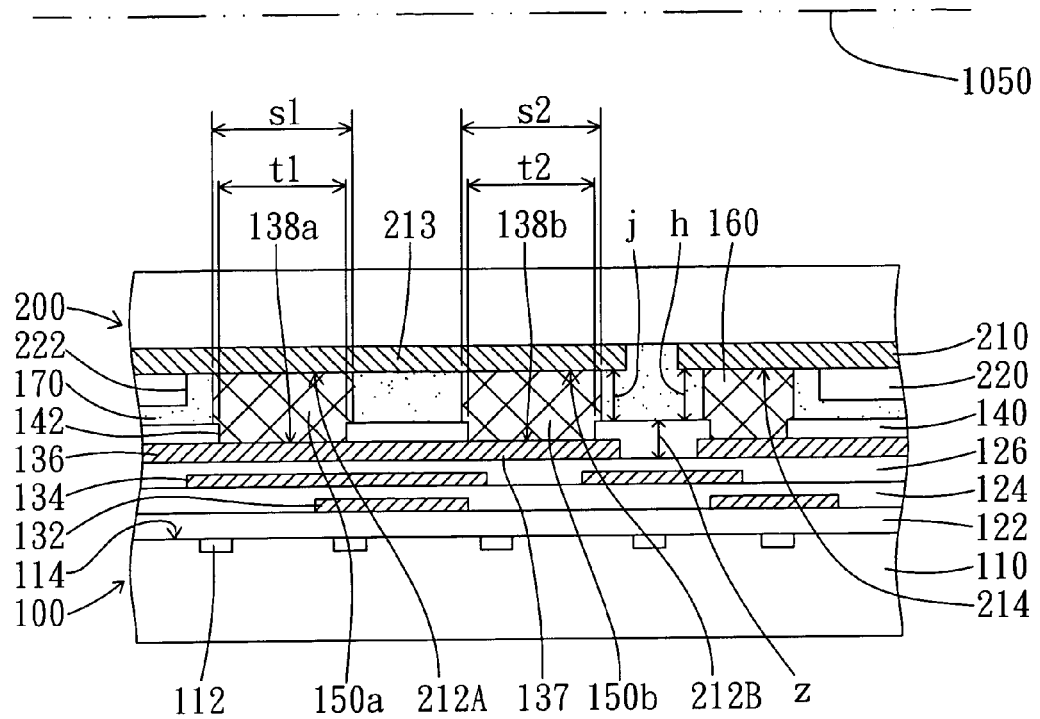

FIG. 3 is a cross-sectional view showing a chip package according to the first embodiment, wherein multiple bumps on a thin-film circuit of the semiconductor chip is bonded to a circuit layer of the substrate.

Figure 3A:
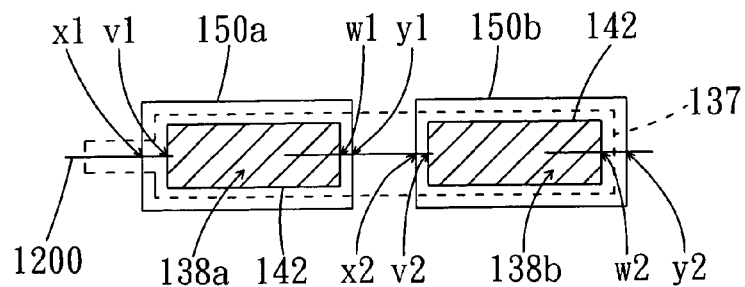

FIG. 3A is a plane view of projecting the bumps 150a and 150b onto the plane 1000.

Figure 3B:
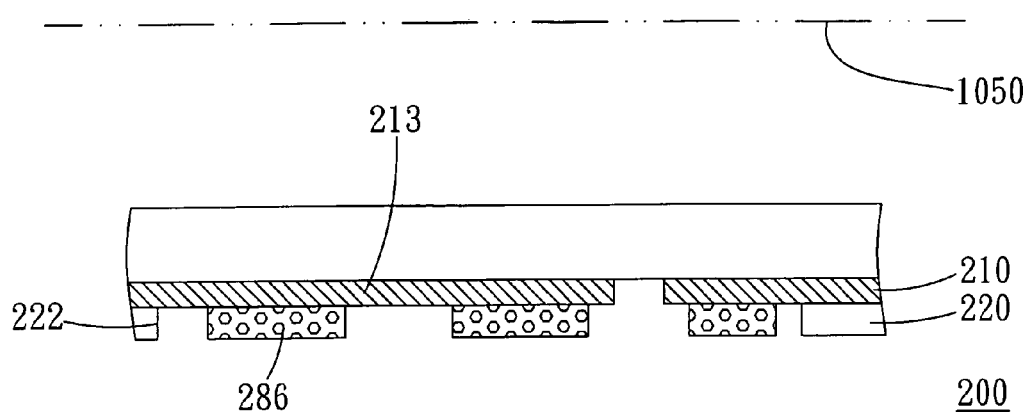
Figure 3B:
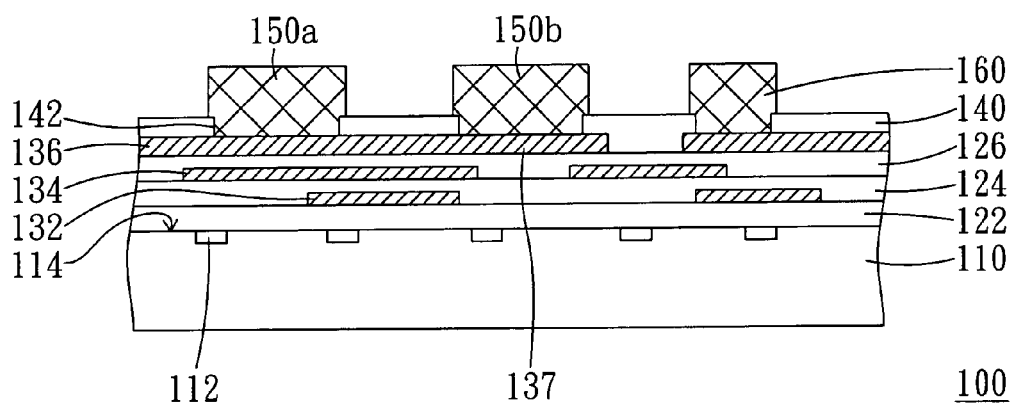

FIG. 3B is a cross-sectional view showing a chip package before a semiconductor chip and a substrate being assembled according to the first embodiment, wherein multiple bumps on a thin-film circuit of the semiconductor chip is adapted to attached to a solder paste on a circuit layer of the substrate.

Figure 3C:
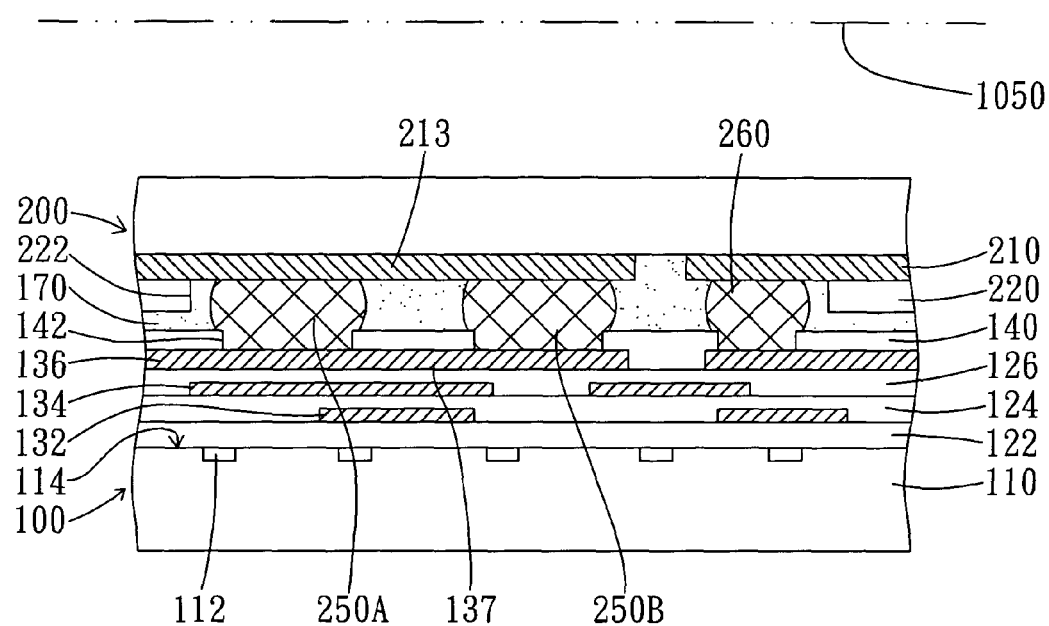

FIG. 3C is a cross-sectional view showing a chip package after the semiconductor chip and the substrate shown in FIG. 3B being assembled according to the first embodiment.

FIGS. 4-9 are cross-sectional views showing chip packages according to the first embodiment, wherein a bump on a thin-film circuit or a passivation layer of the semiconductor chip is bonded to a circuit layer of the substrate.

Figure 10:
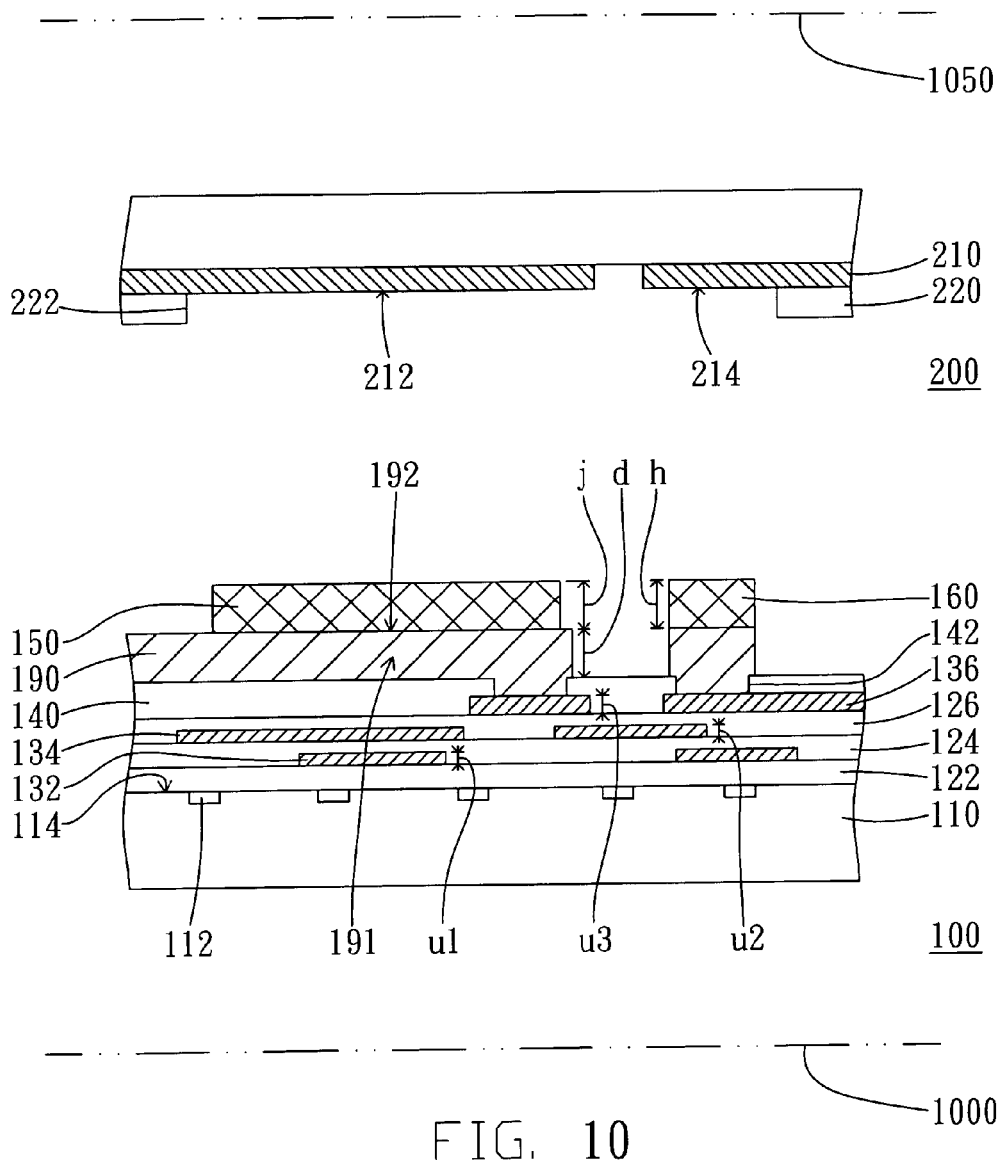

FIG. 10 is a cross-sectional view showing a chip package before a semiconductor chip and a substrate being assembled according to the first embodiment, wherein a bump on a thick metallization circuit of the semiconductor chip is adapted to bonded to a circuit layer of the substrate.

Figure 10A:
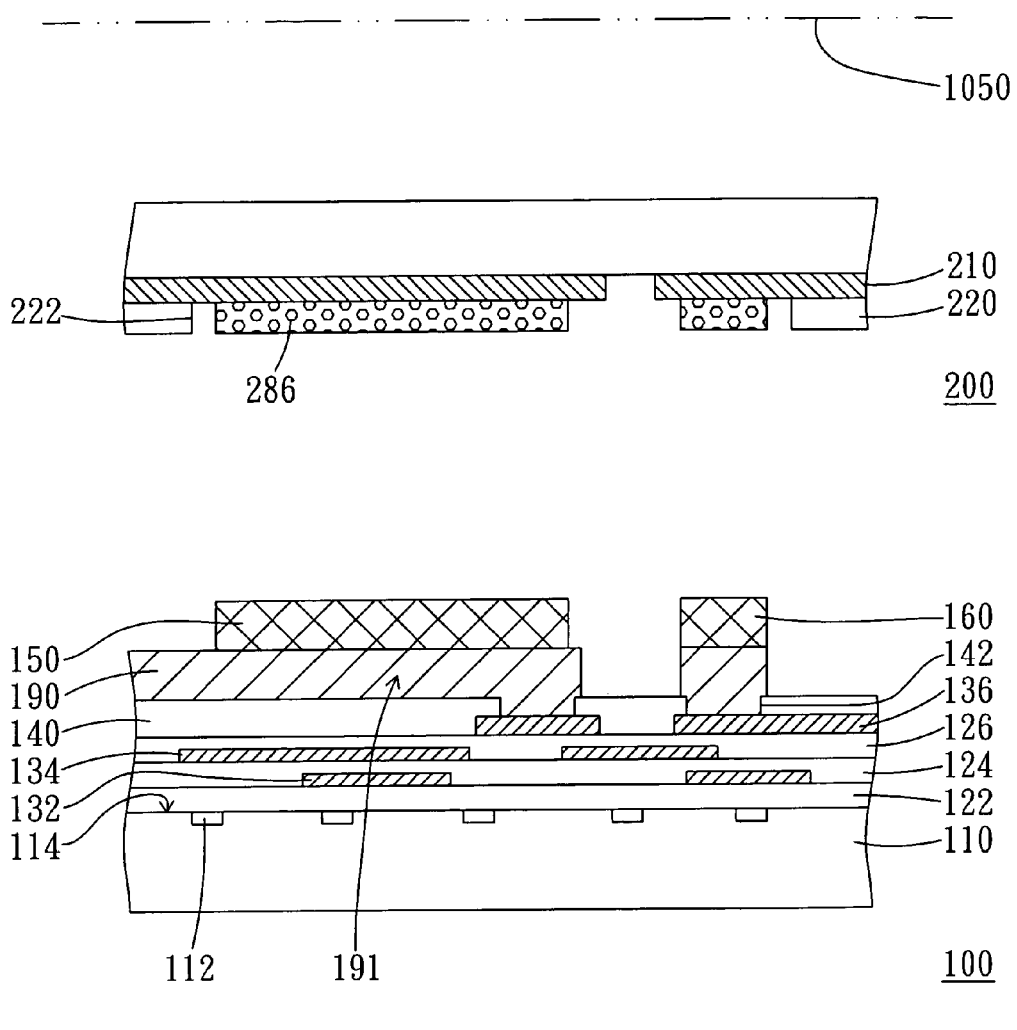

FIG. 10A is a cross-sectional view showing a chip package before a semiconductor chip and a substrate being assembled according to the first embodiment, wherein a bump on a thick metallization circuit of the semiconductor chip is adapted to attached to a solder paste on a circuit layer of the substrate.

Figure 11:
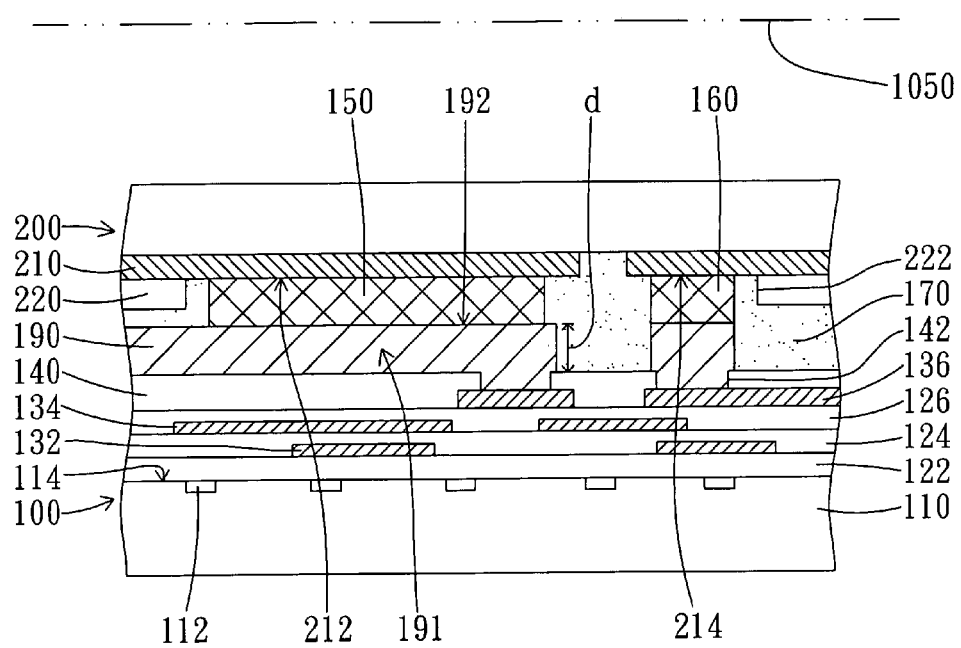

FIG. 11 is a cross-sectional view showing a chip package after the semiconductor chip and the substrate shown in FIG. 10 being assembled according to the first embodiment.

Figure 11A:
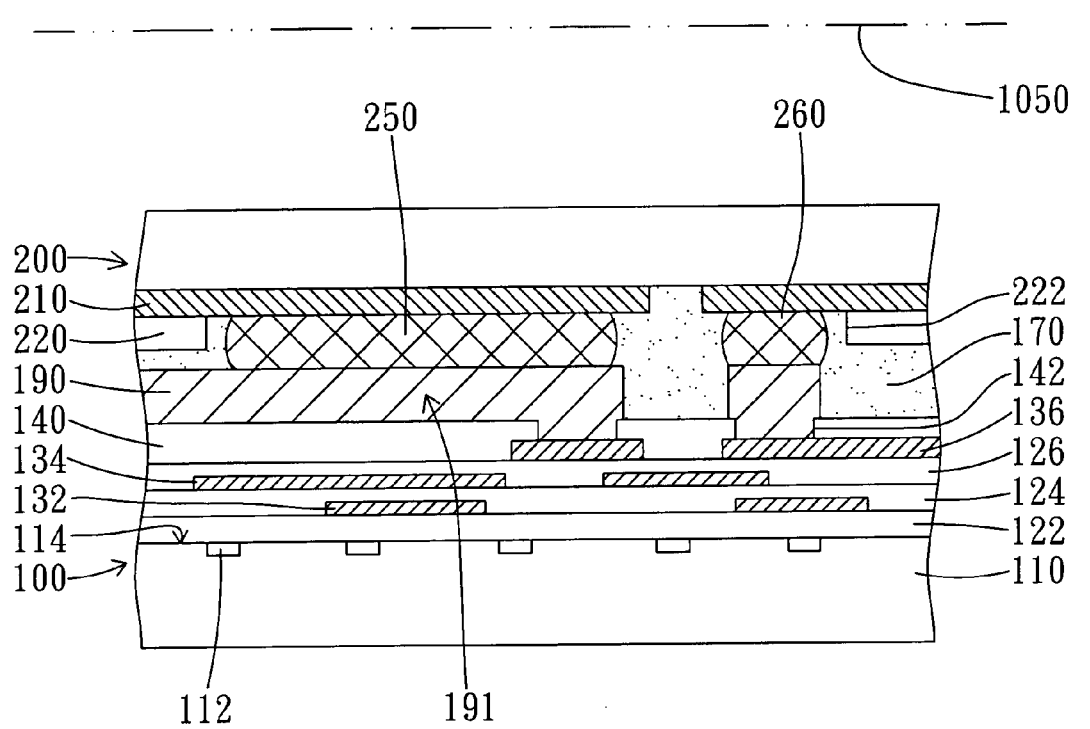

FIG. 11A is a cross-sectional view showing a chip package after the semiconductor chip and the substrate shown in FIG. 10A being assembled according to the first embodiment.

Figure 12:
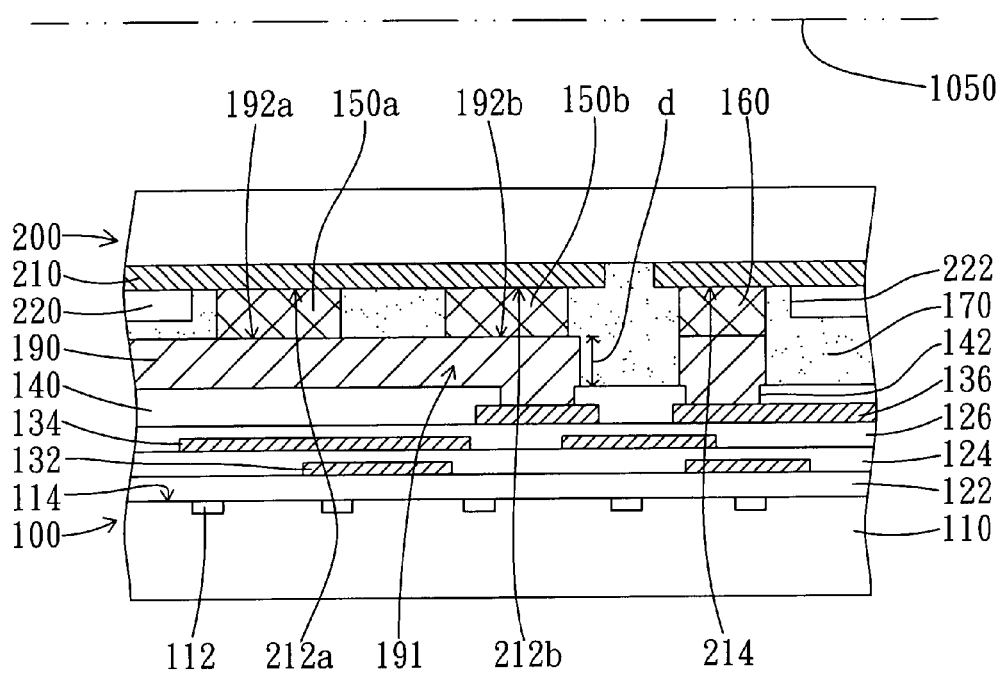

FIG. 12 is a cross-sectional view showing a chip package after a semiconductor chip and a substrate being assembled according to the first embodiment, wherein multiple bumps on a thick metallization circuit of the semiconductor chip are bonded to a circuit layer of the substrate.

Figure 12A:
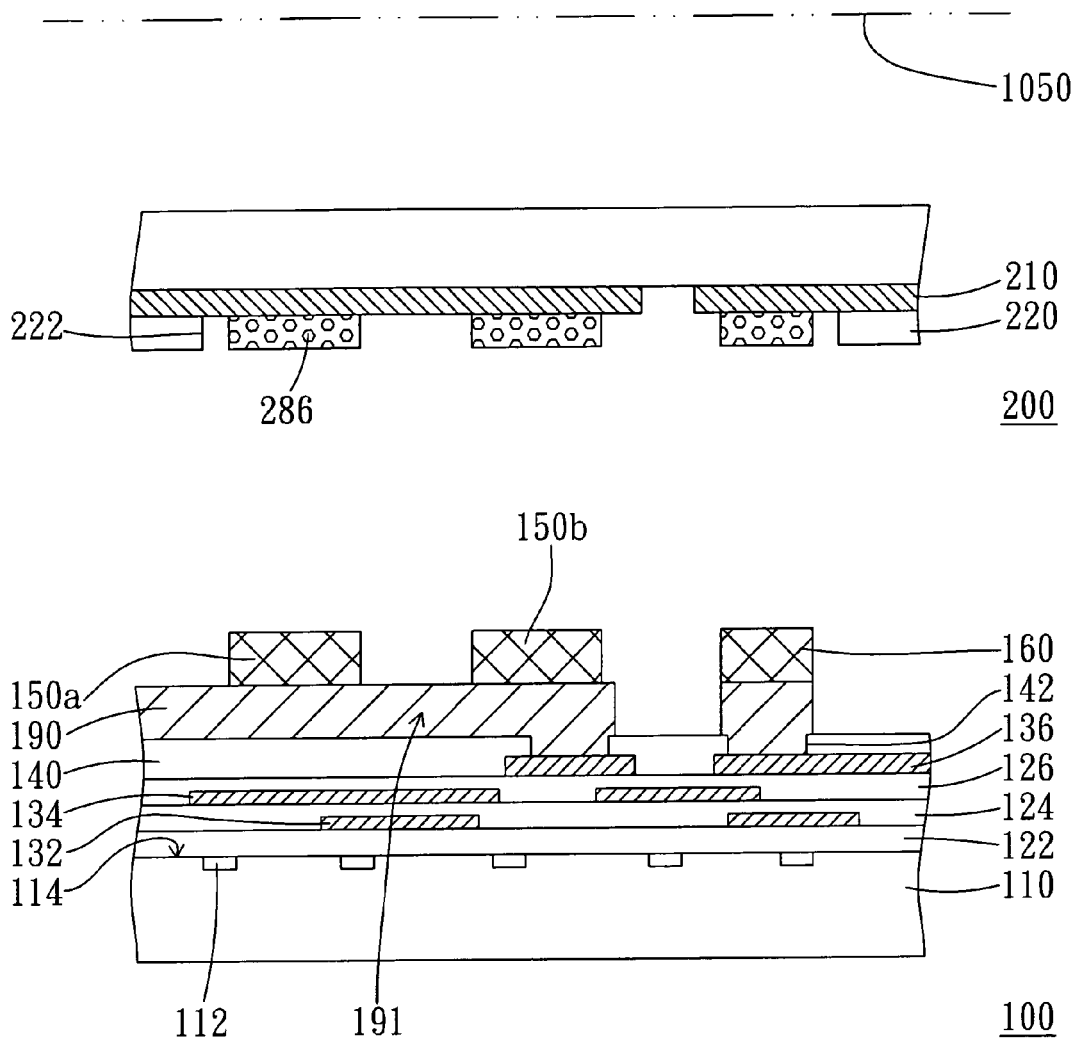

FIG. 12A a chip package before a semiconductor chip and a substrate being assembled according to the first embodiment, wherein a bump on a thick metallization circuit of the semiconductor chip is adapted to attached to a solder paste on a circuit layer of the substrate.

Figure 12B:
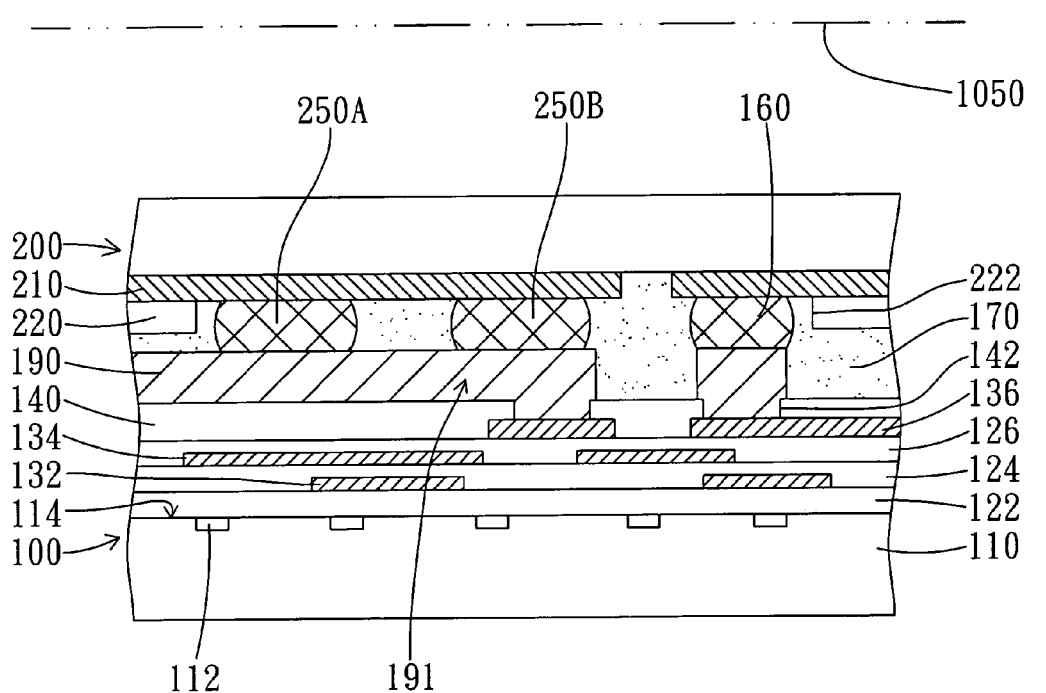

FIG. 12B is a cross-sectional view showing a chip package after a semiconductor chip and a substrate shown in FIG. 12A being assembled according to the first embodiment.

FIGS. 12-21 are cross-sectional views showing chip packages according to the first embodiment, wherein a bump on a thick metallization circuit of the semiconductor chip is bonded to a circuit layer of the substrate.

Figure 20:
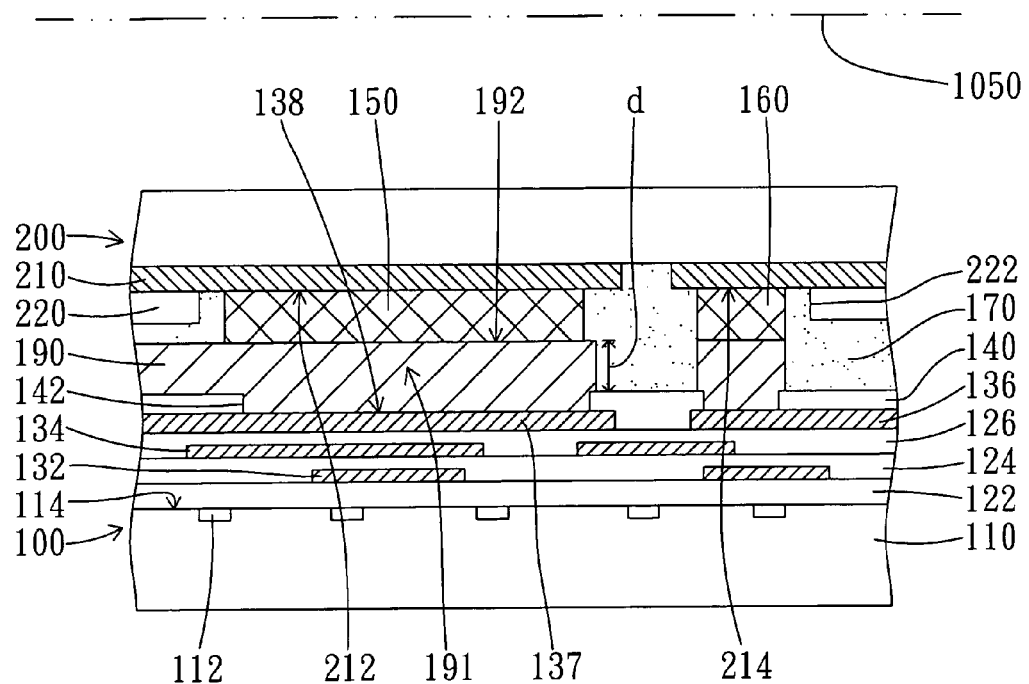
Figure 20A:
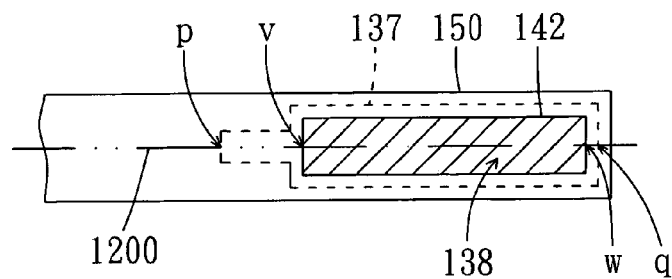

FIG. 20A is a plane view of projecting the contact 138 onto the plane 1000.

Figure 22:
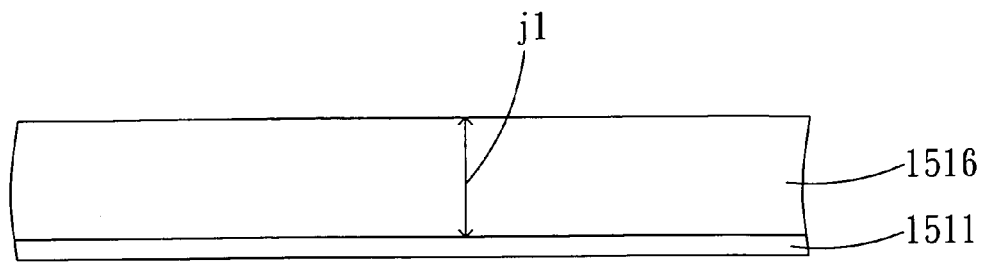
Figure 23:
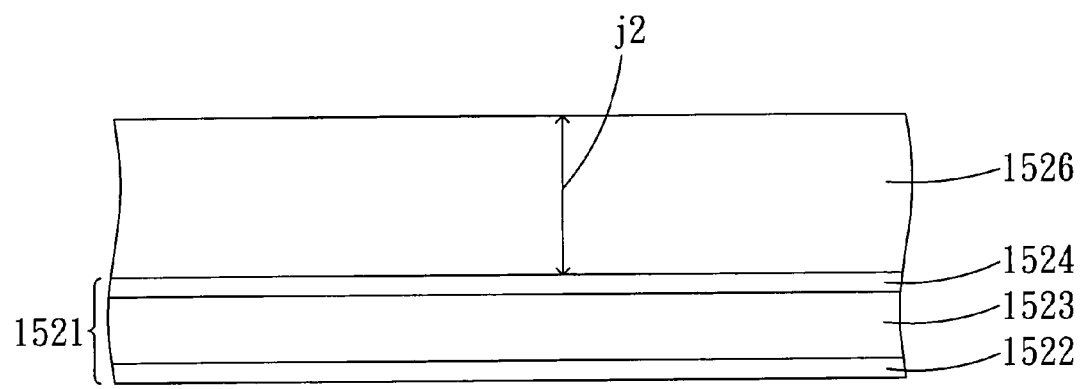

FIGS. 22 and 23 are cross-sectional views showing the metallization structure of the bump according to the first embodiment.

Figure 24:
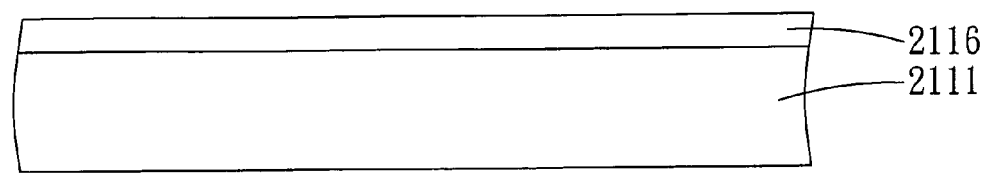

FIG. 24 is a cross-sectional view showing the metallization structure of a circuit layer of the substrate according to the first embodiment.

FIGS. 25-28 are cross-sectional views showing the metallization structure of the thick metallization circuit layer according to the first embodiment.

Figure 29:
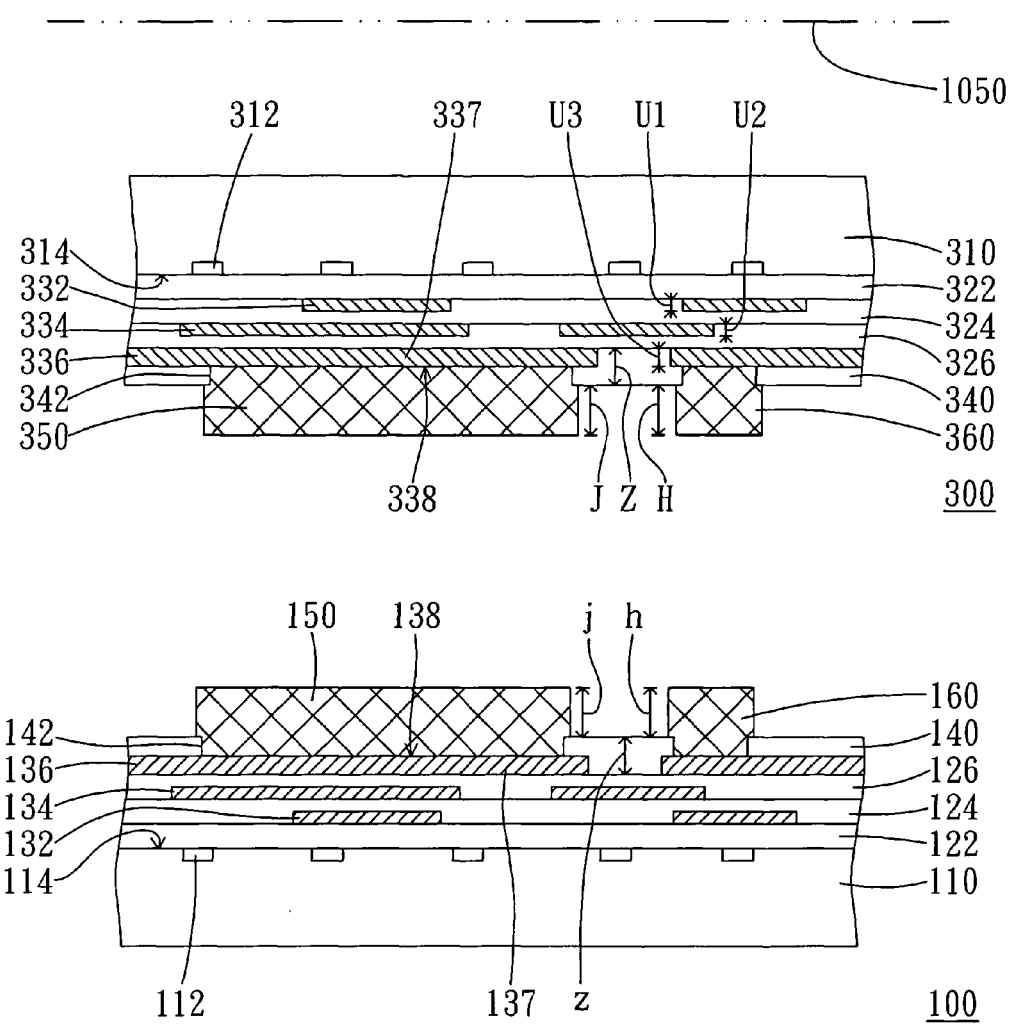

FIG. 29 is a cross-sectional view showing a chip package before two semiconductor chips being assembled according to the second embodiment, wherein a bump on a thin-film circuit of a semiconductor chip is adapted to bonded to another bump on a thin-film circuit of another semiconductor chip.

Figure 30:
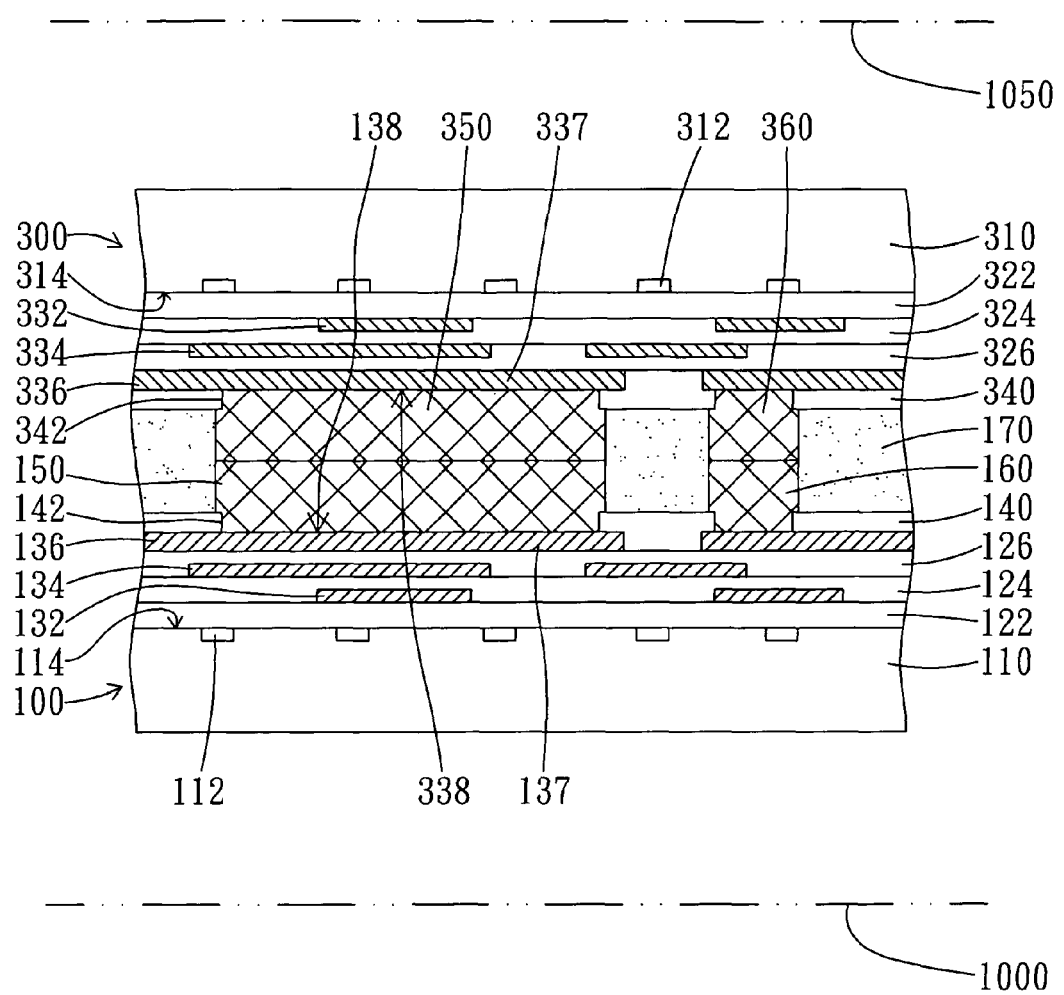

FIG. 30 is a cross-sectional view showing a chip package after the two semiconductor chips shown in FIG. 29 being assembled according to the second embodiment.

FIGS. 31-37 are cross-sectional views showing chip packages according to the second embodiment, wherein a bump on a thin-film circuit of a semiconductor chip is bonded to another bump on a thin-film circuit of another semiconductor chip.

Figure 38:
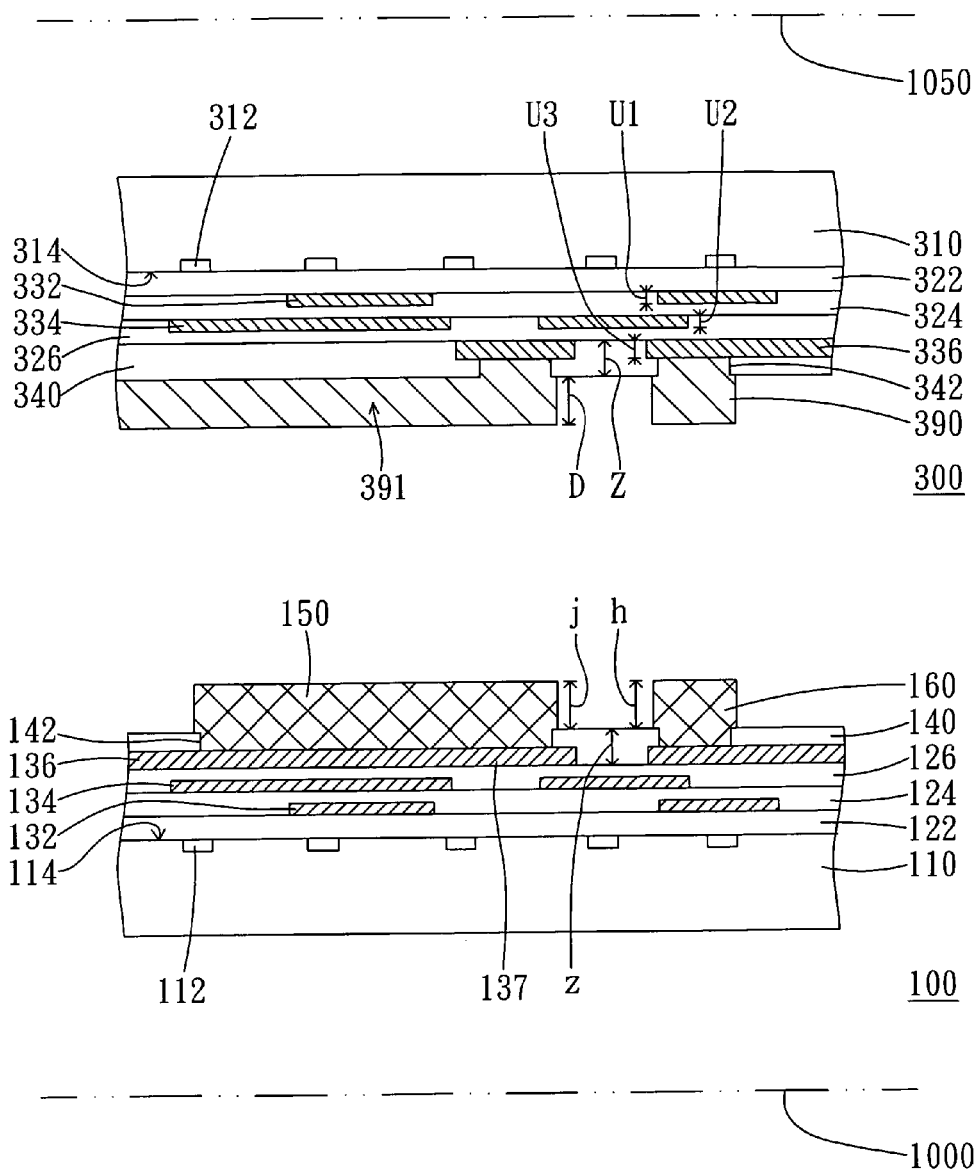

FIG. 38 is a cross-sectional view showing a chip package before two semiconductor chips being assembled according to the second embodiment, wherein a bump on a thin-film circuit of a semiconductor chip is adapted to bonded to a thick metallization circuit of another semiconductor chip.

Figure 38A:
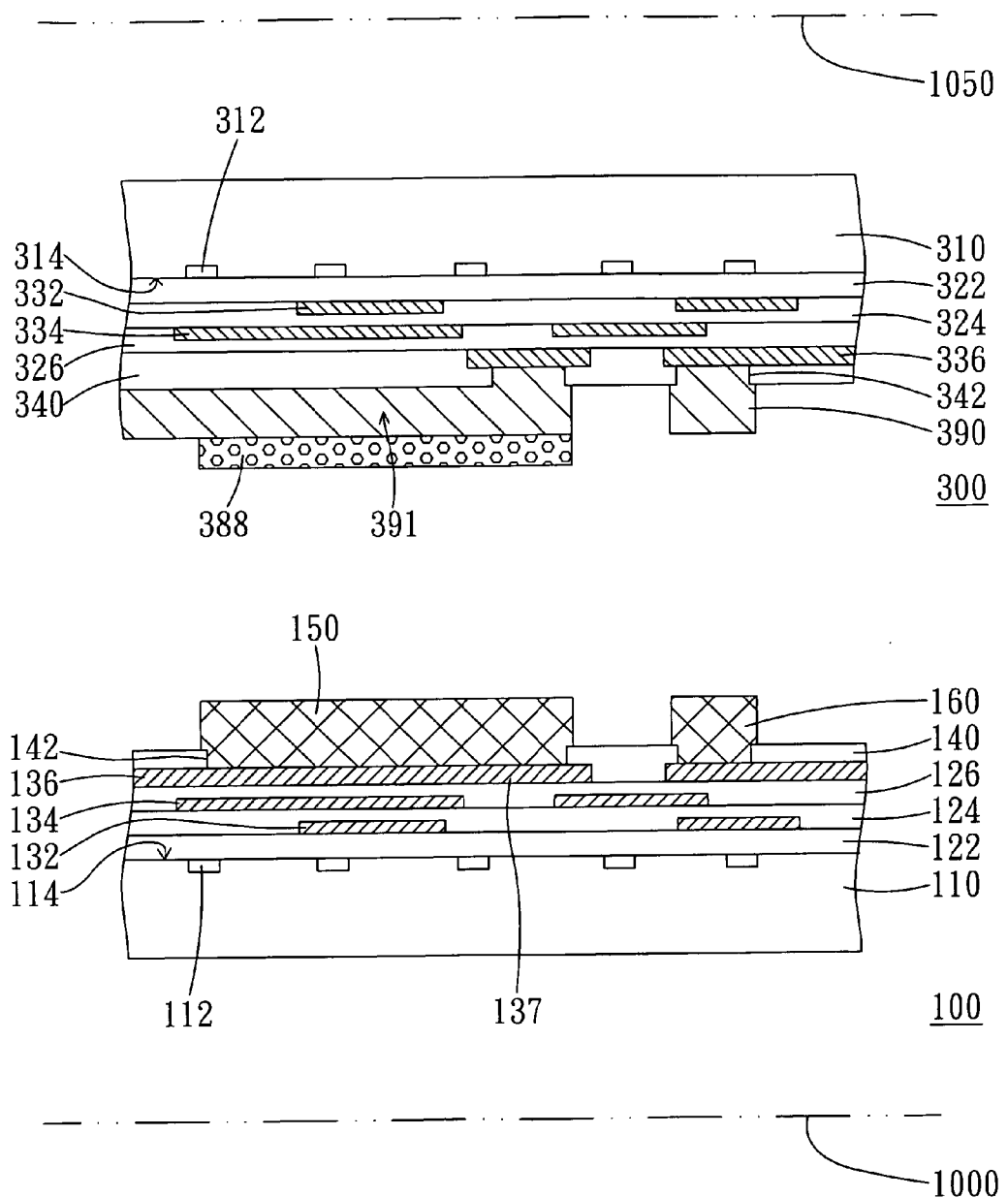

FIG. 38A is a cross-sectional view showing a chip package before two semiconductor chips being assembled according to the second embodiment, wherein a bump on a thin-film circuit of a semiconductor chip is adapted to attached to a solder paste on a thick metallization circuit of another semiconductor chip.

Figure 39:
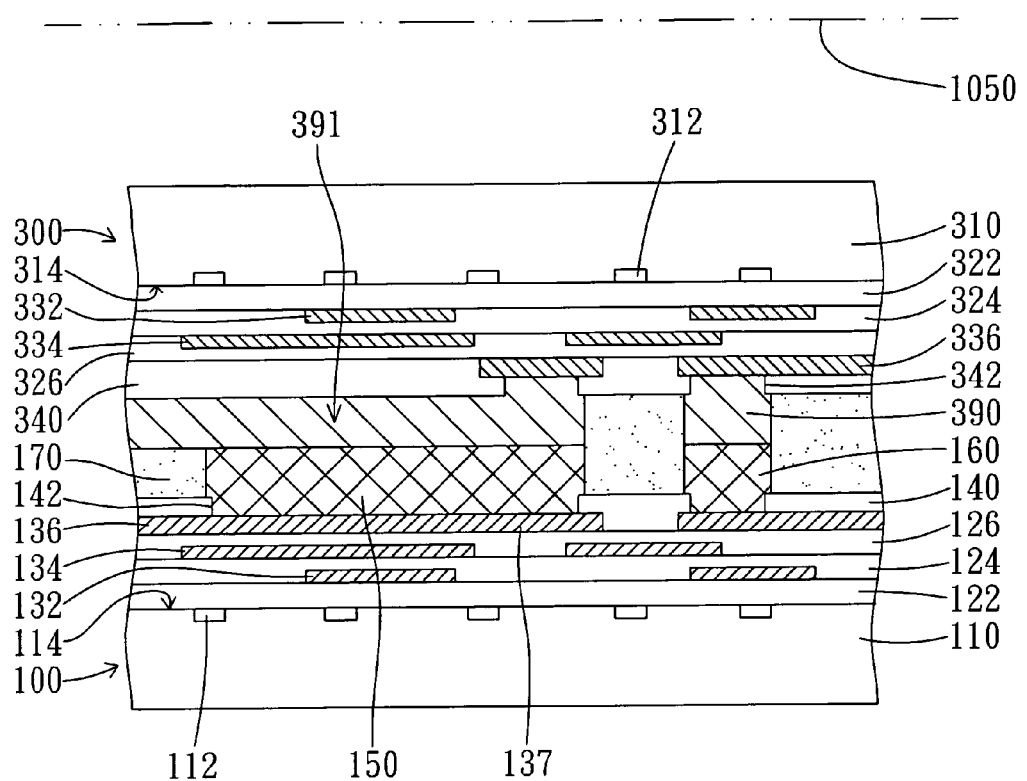

FIG. 39 is a cross-sectional view showing a chip package after the two semiconductor chips shown in FIG. 38 being assembled according to the second embodiment.

Figure 39A:
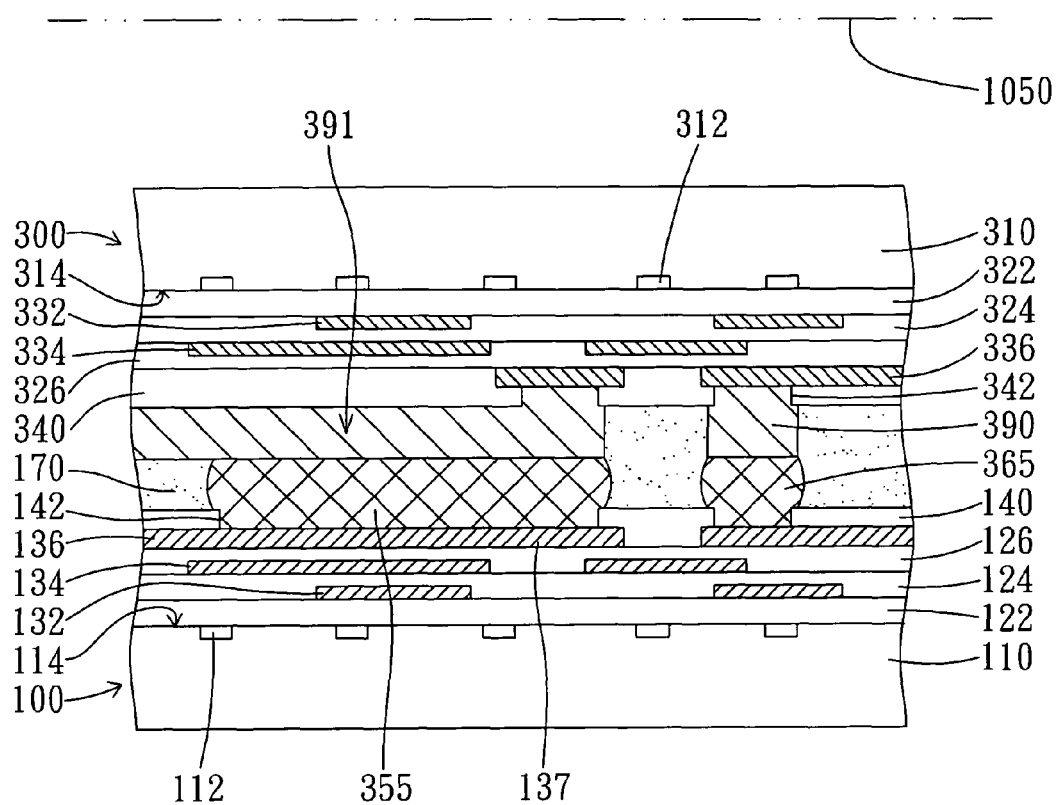

FIG. 39A is a cross-sectional view showing a chip package after the two semiconductor chips shown in FIG. 38A being assembled according to the second embodiment.

Figure 40:
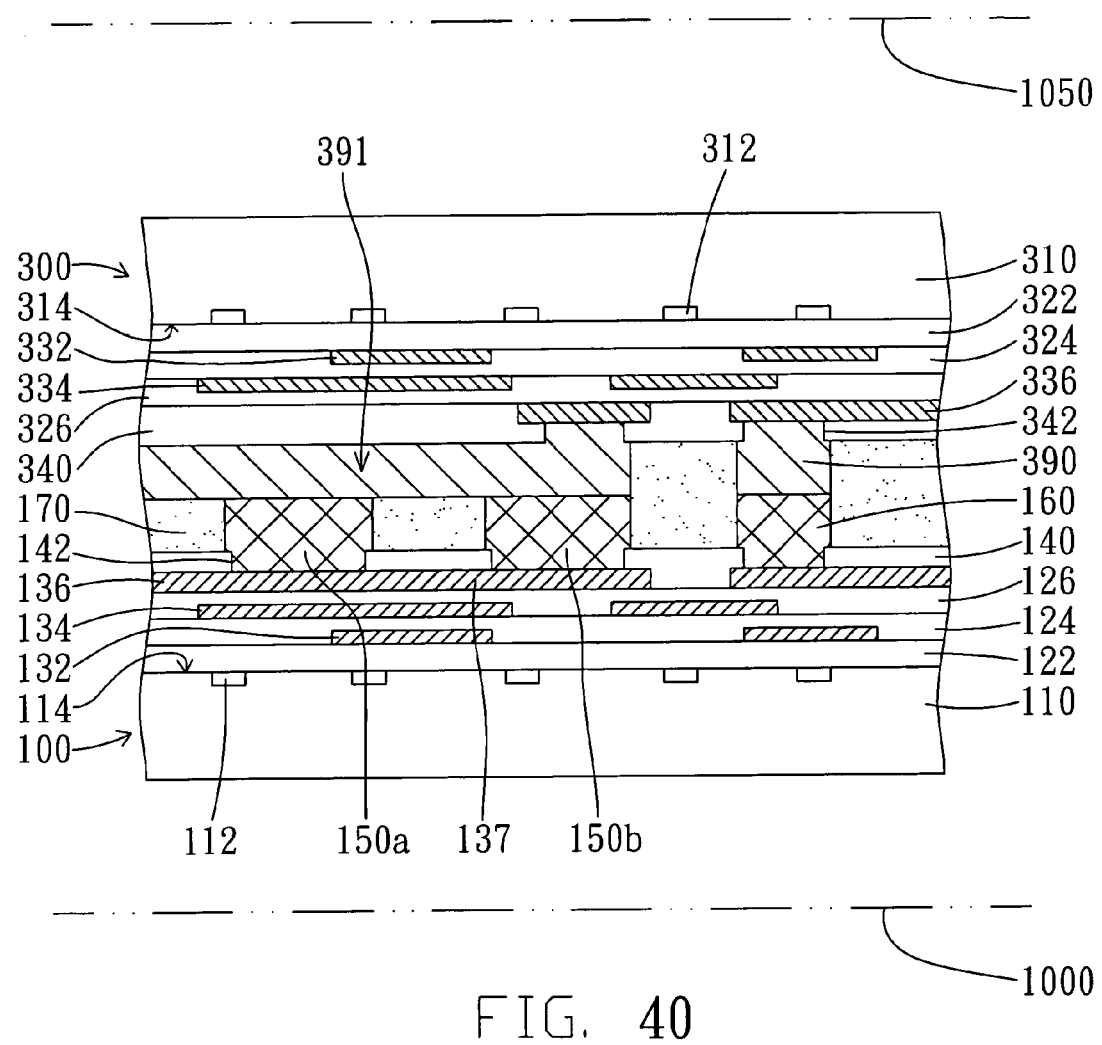

FIG. 40 is a cross-sectional view showing a chip package after two semiconductor chips being assembled according to the second embodiment, wherein multiple bumps on a thin-film circuit of a semiconductor chip are bonded to a thick metallization circuit of another semiconductor chip.

Figure 40A:
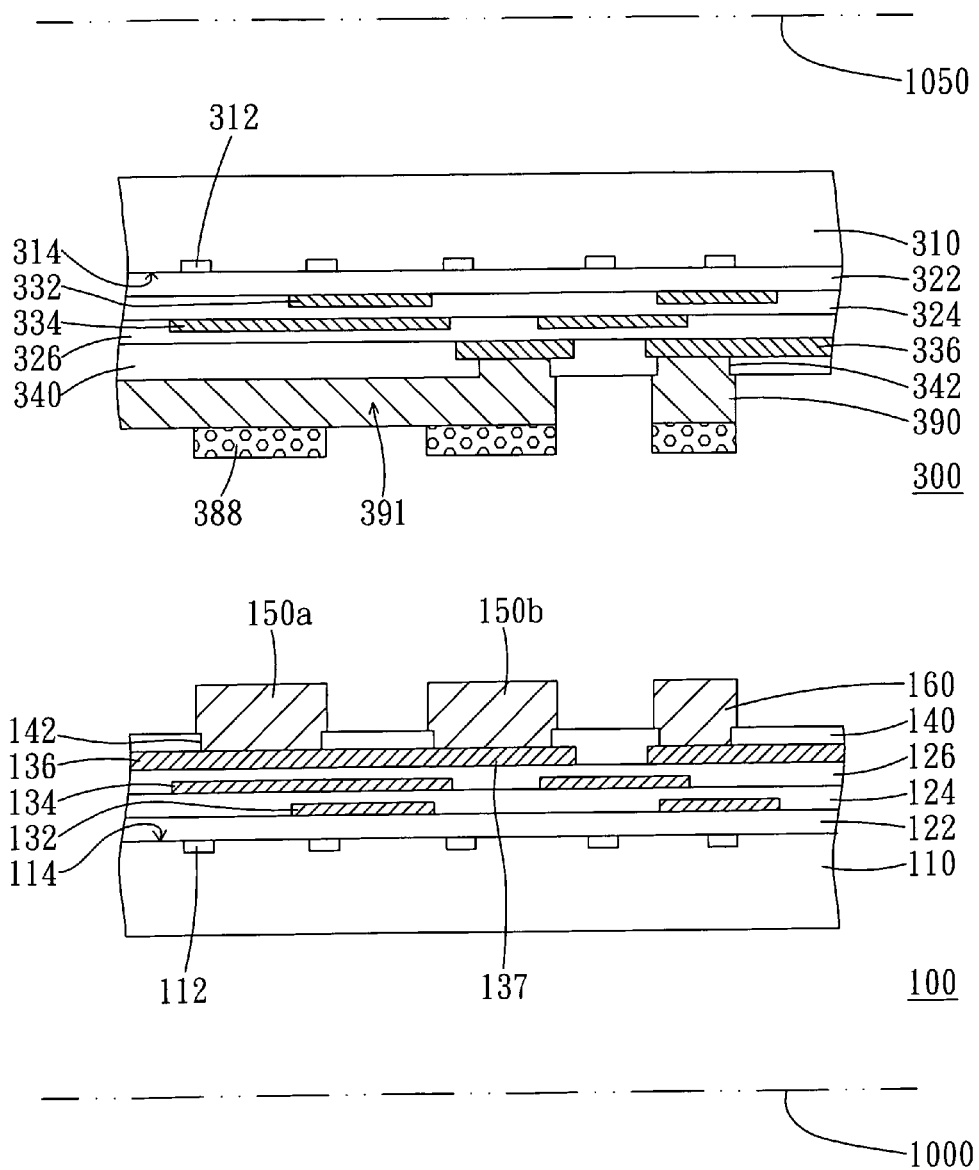

FIG. 40A is a cross-sectional view showing a chip package before two semiconductor chips being assembled according to the second embodiment, wherein multiple bumps on a thin-film circuit of a semiconductor chip is bonded to a solder paste on a thick metallization circuit of another semiconductor chip.

Figure 40B:
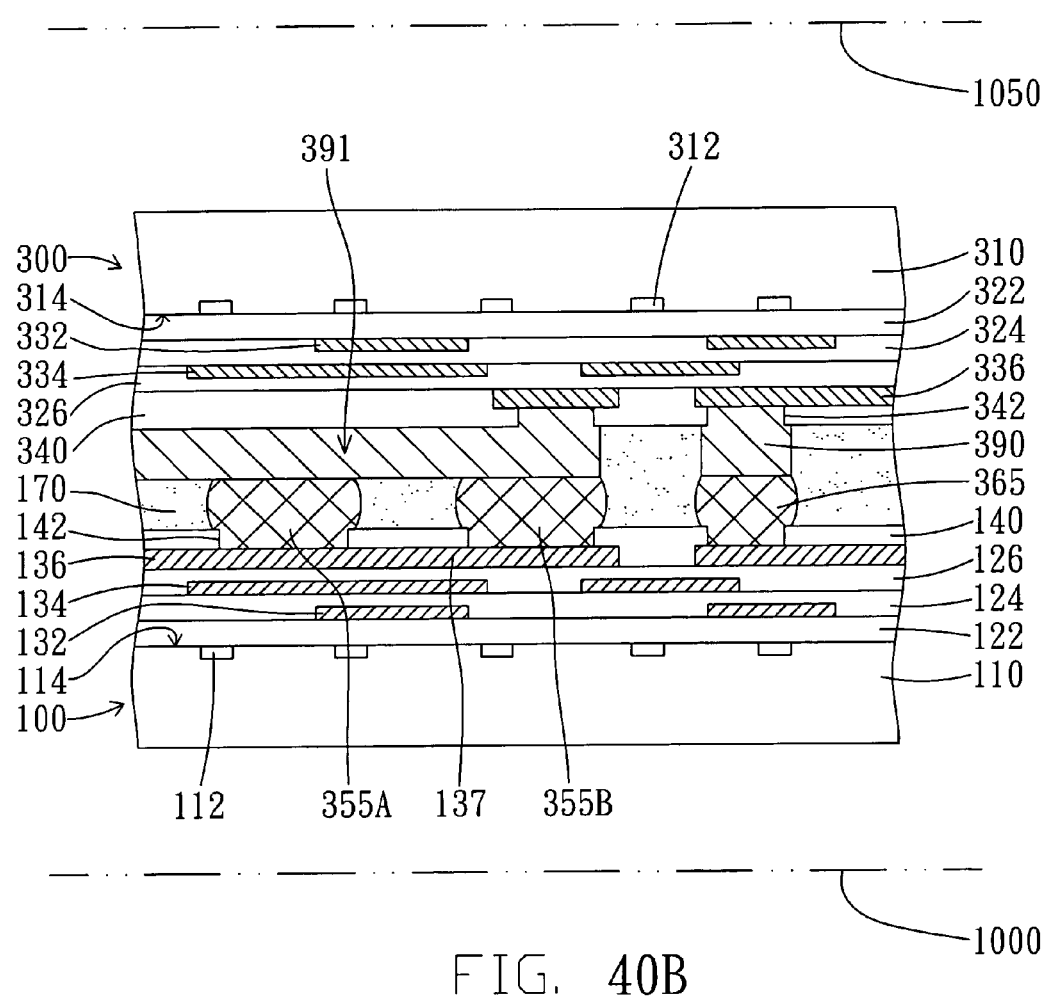

FIG. 40B is a cross-sectional view showing a chip package after the two semiconductor chips shown in FIG. 40A being assembled according to the second embodiment.

FIGS. 41-51 are cross-sectional views showing chip packages according to the second embodiment, wherein a bump on a thin-film circuit or a passivation layer of a semiconductor chip is bonded to a thick metallization circuit of another semiconductor chip.

Figure 52:
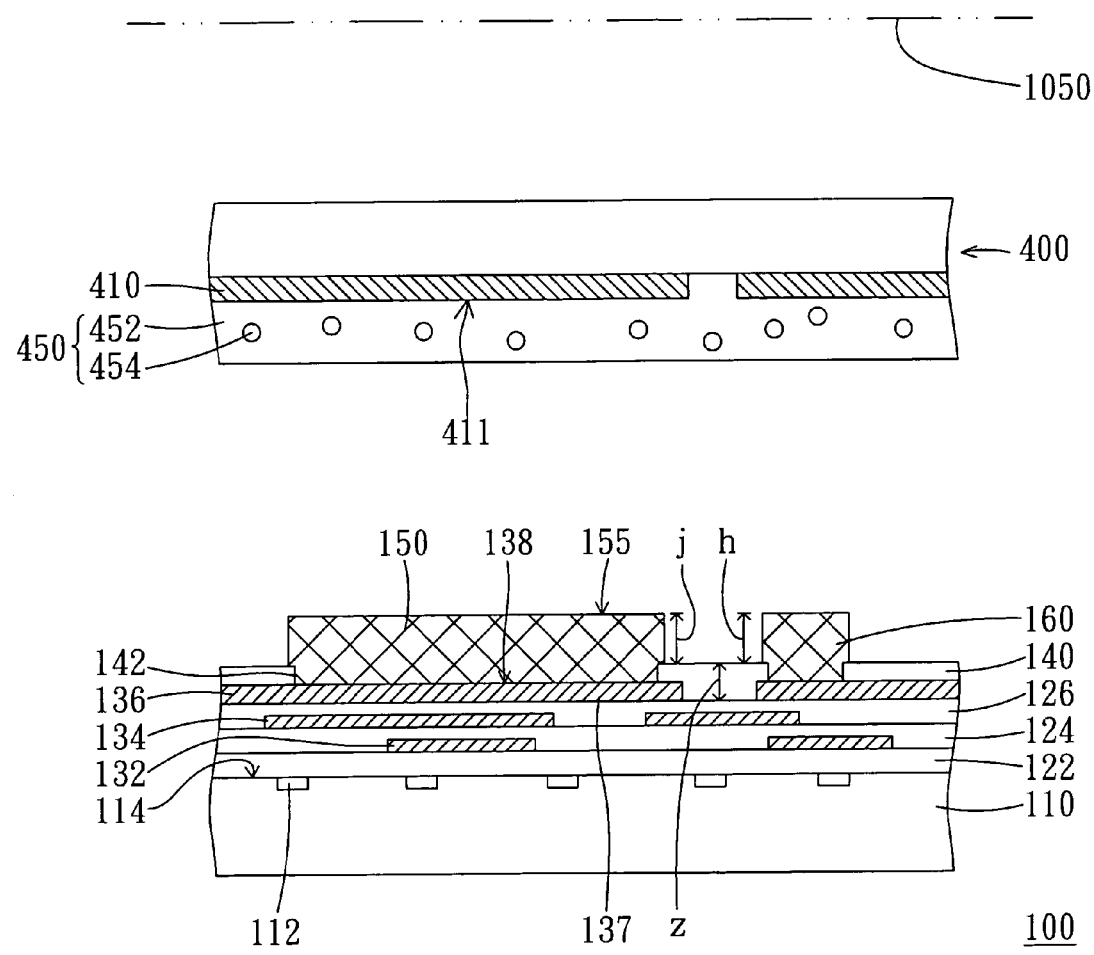

FIG. 52 is a cross-sectional view showing a chip package before a semiconductor chip and a glass substrate being assembled according to the third embodiment, wherein a bump on a thin-film circuit of the semiconductor chip is adapted to be electrically connected to a circuit layer of the glass substrate through metal particles of ACP or ACF.

Figure 53:
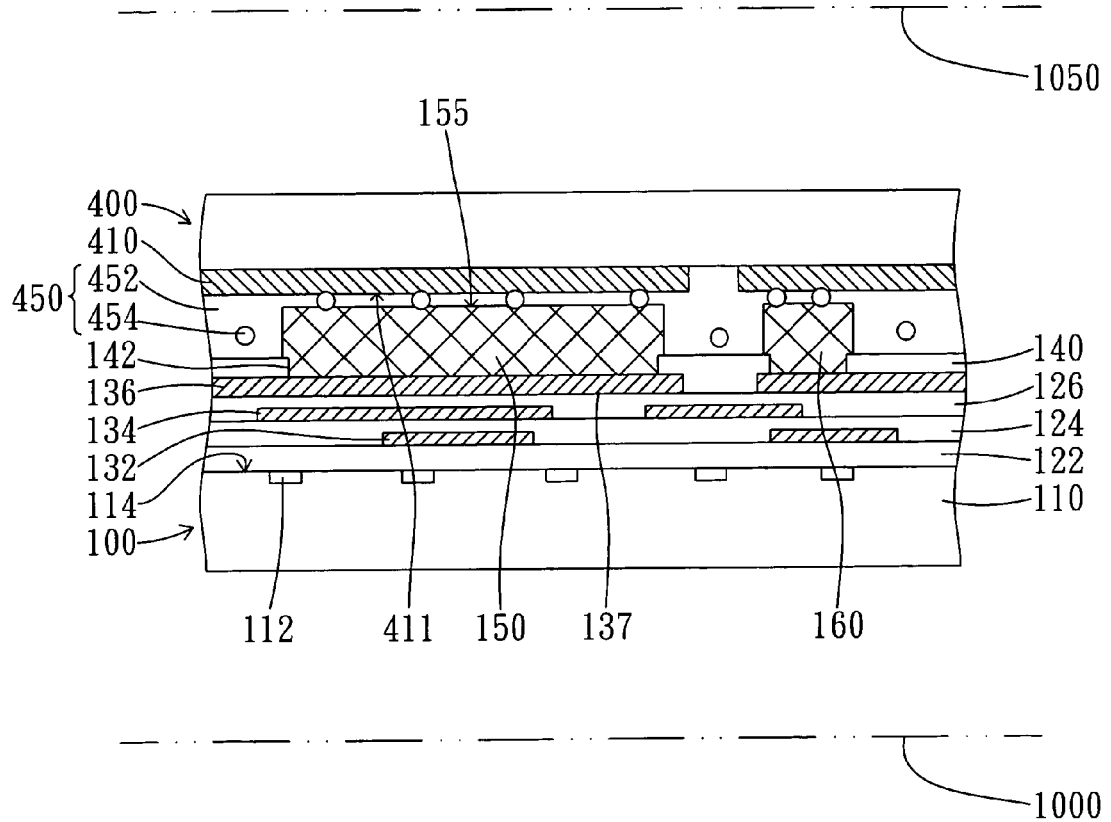

FIG. 53 is a cross-sectional view showing a chip package after the semiconductor chip and the glass substrate shown in FIG. 52 being assembled according to the third embodiment.

Figure 54:
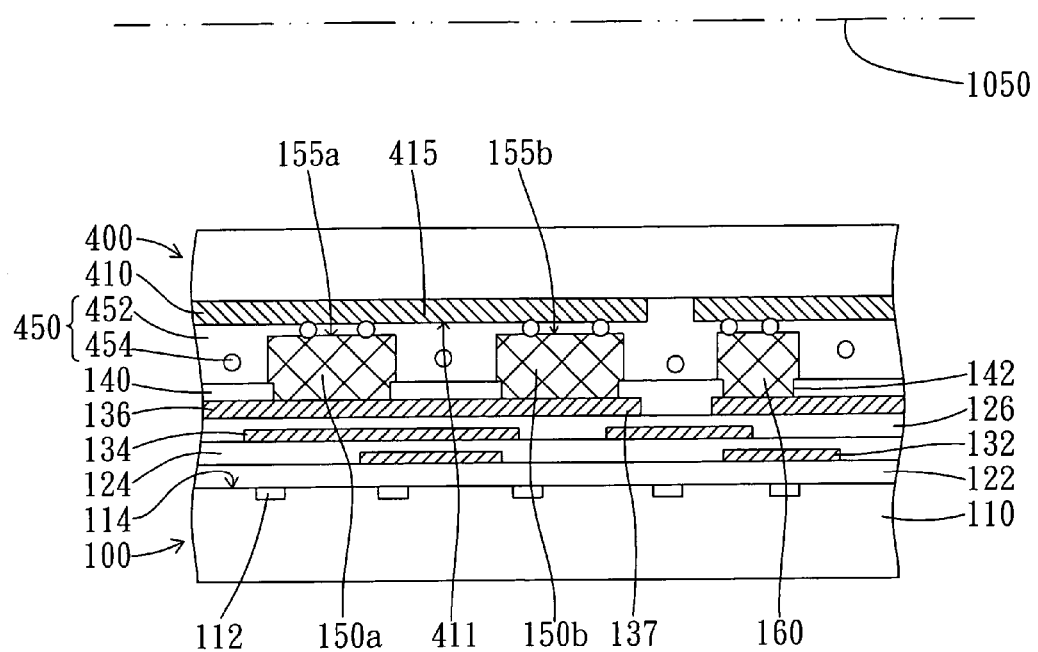
Figure 55:
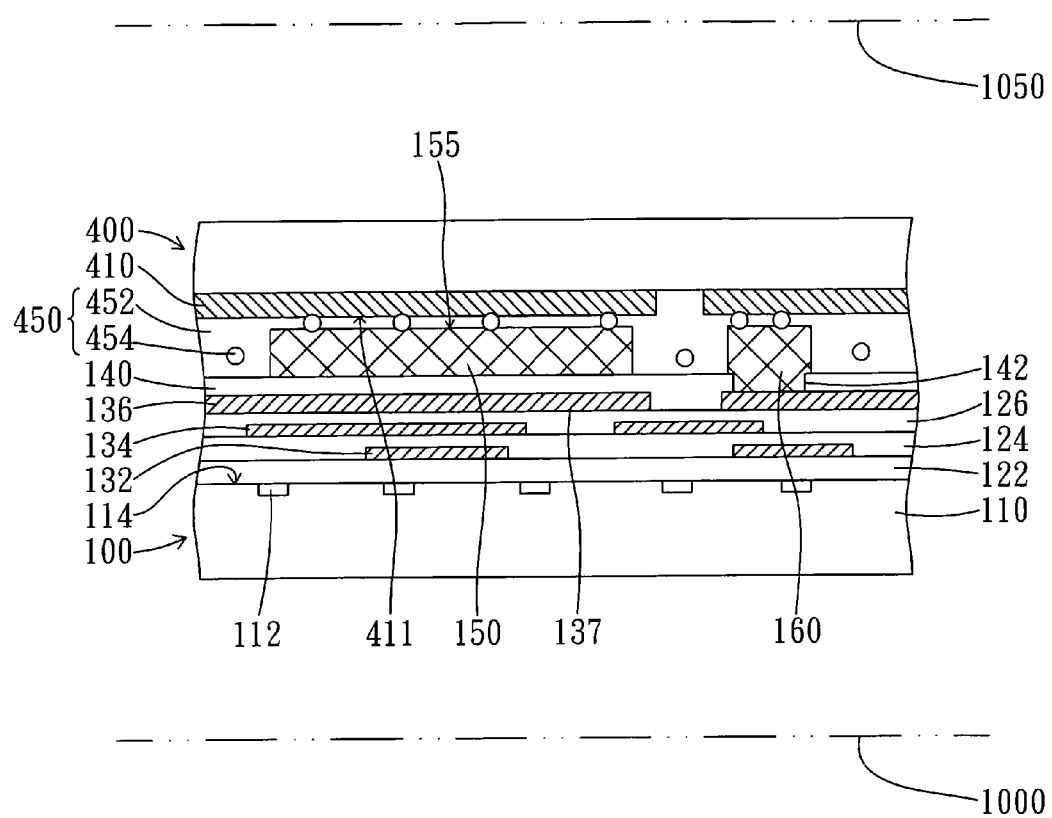
Figure 56:
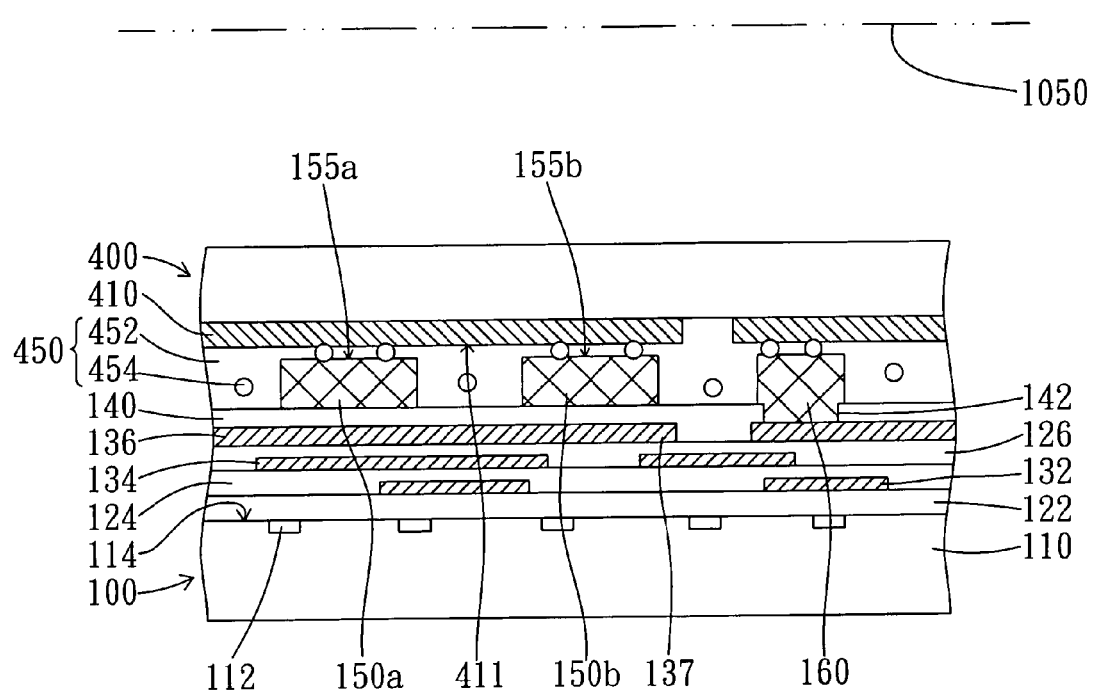

FIG. 54-56 are cross-sectional views showing chip packages according to the third embodiment, wherein a bump on a thin-film circuit of the semiconductor chip is adapted to be electrically connected to a circuit layer of the glass substrate through metal particles of ACP or ACF.

Figure 57:
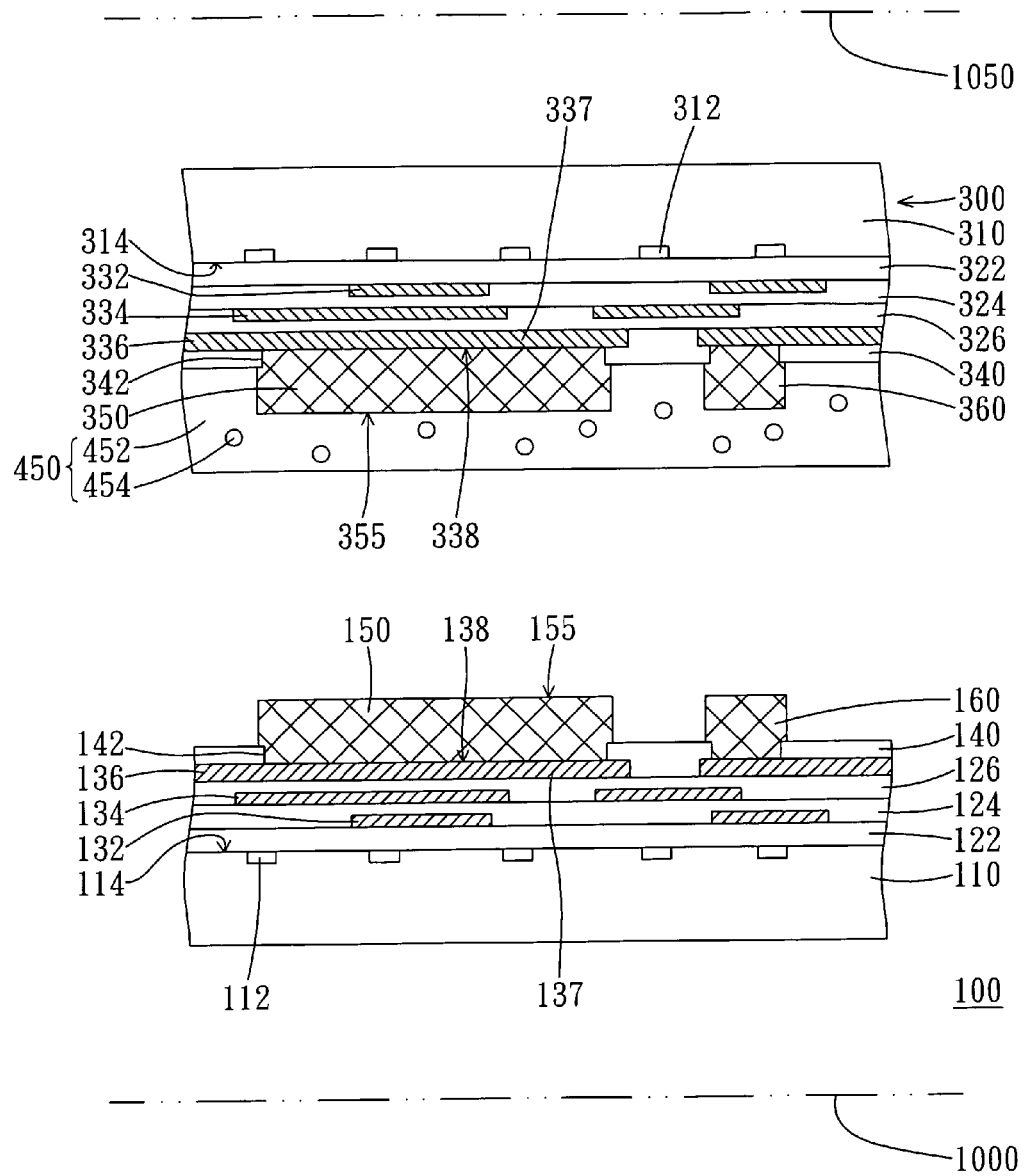

FIG. 57 is a cross-sectional view showing a chip package before two semiconductor chips being assembled according to the fourth embodiment, wherein a bump on a thin-film circuit of a semiconductor chip is adapted to be electrically connected to another bump on a thin-film circuit of another semiconductor chip through metal particles of ACP or ACF.

Figure 58:
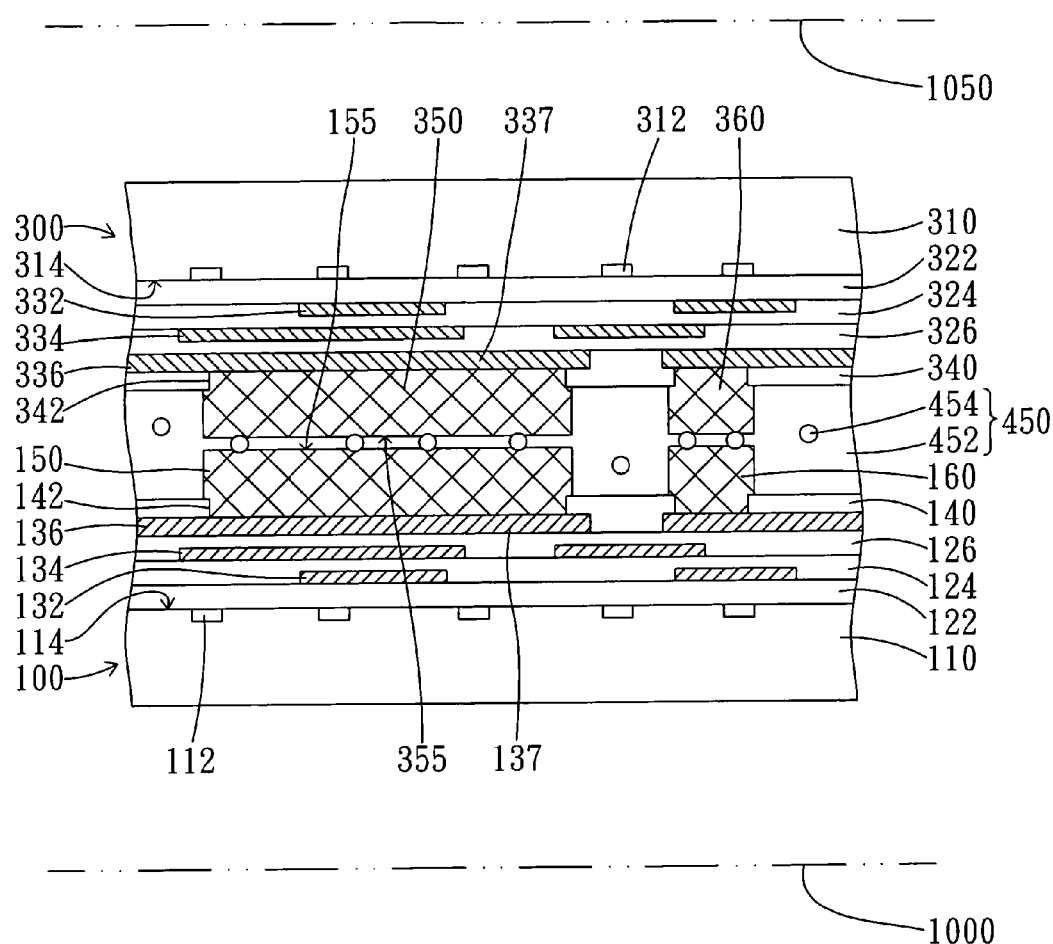

FIG. 58 is a cross-sectional view showing a chip package after the two semiconductor chips shown in FIG. 57 being assembled according to the fourth embodiment.

Figure 59:
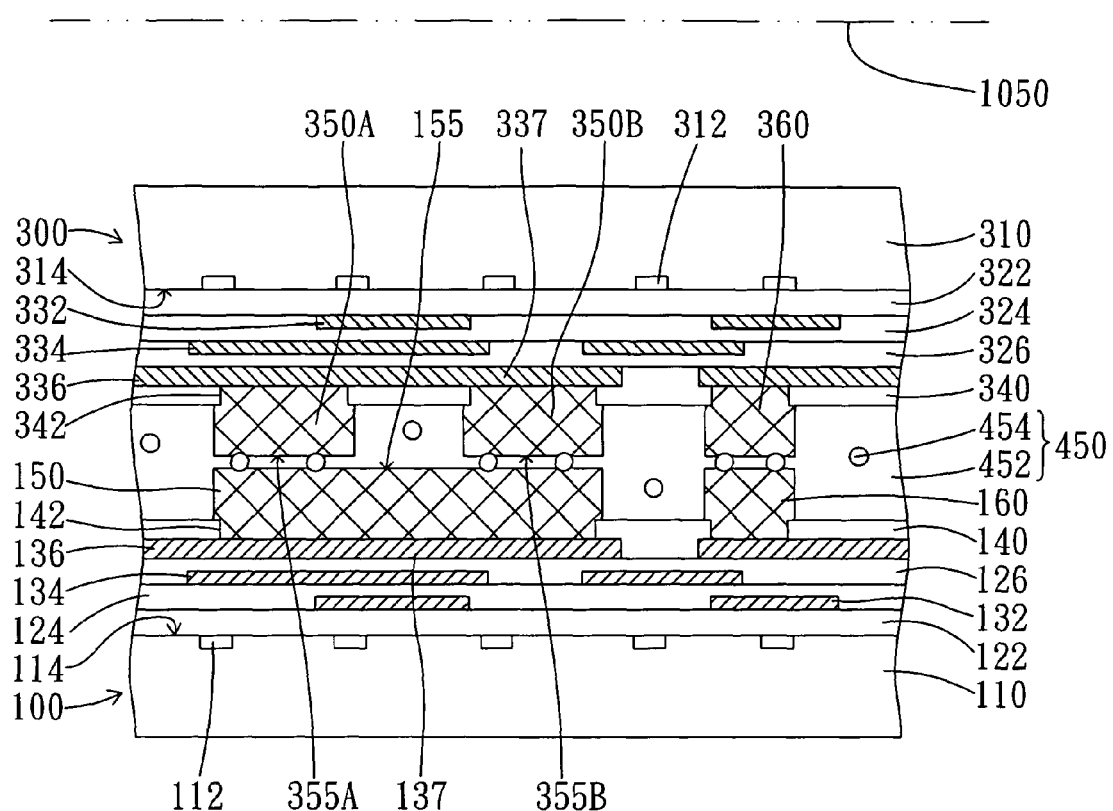
Figure 60:
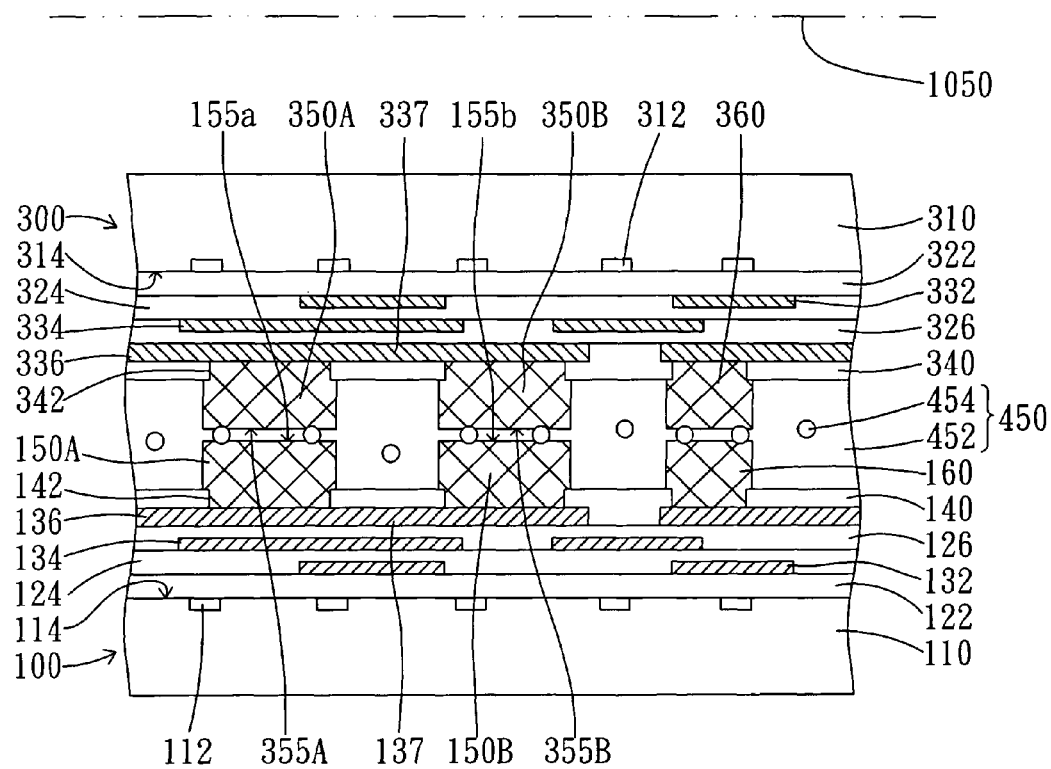
Figure 61:
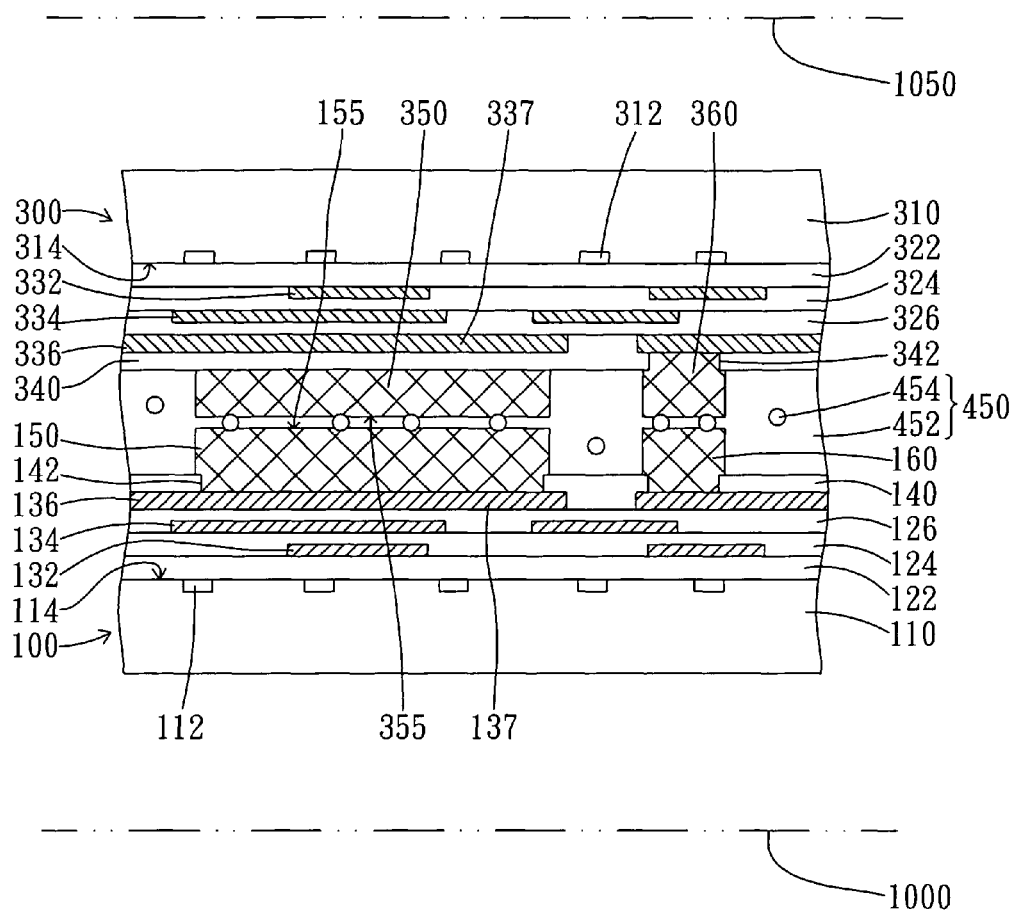

FIGS. 59-61 are cross-sectional views showing chip packages according to the fourth embodiment, wherein a bump on a thin-film circuit or passivation layer of a semiconductor chip is adapted to be electrically connected to another bump on a thin-film circuit of another semiconductor chip through metal particles of ACP or ACF.

Figure 62:
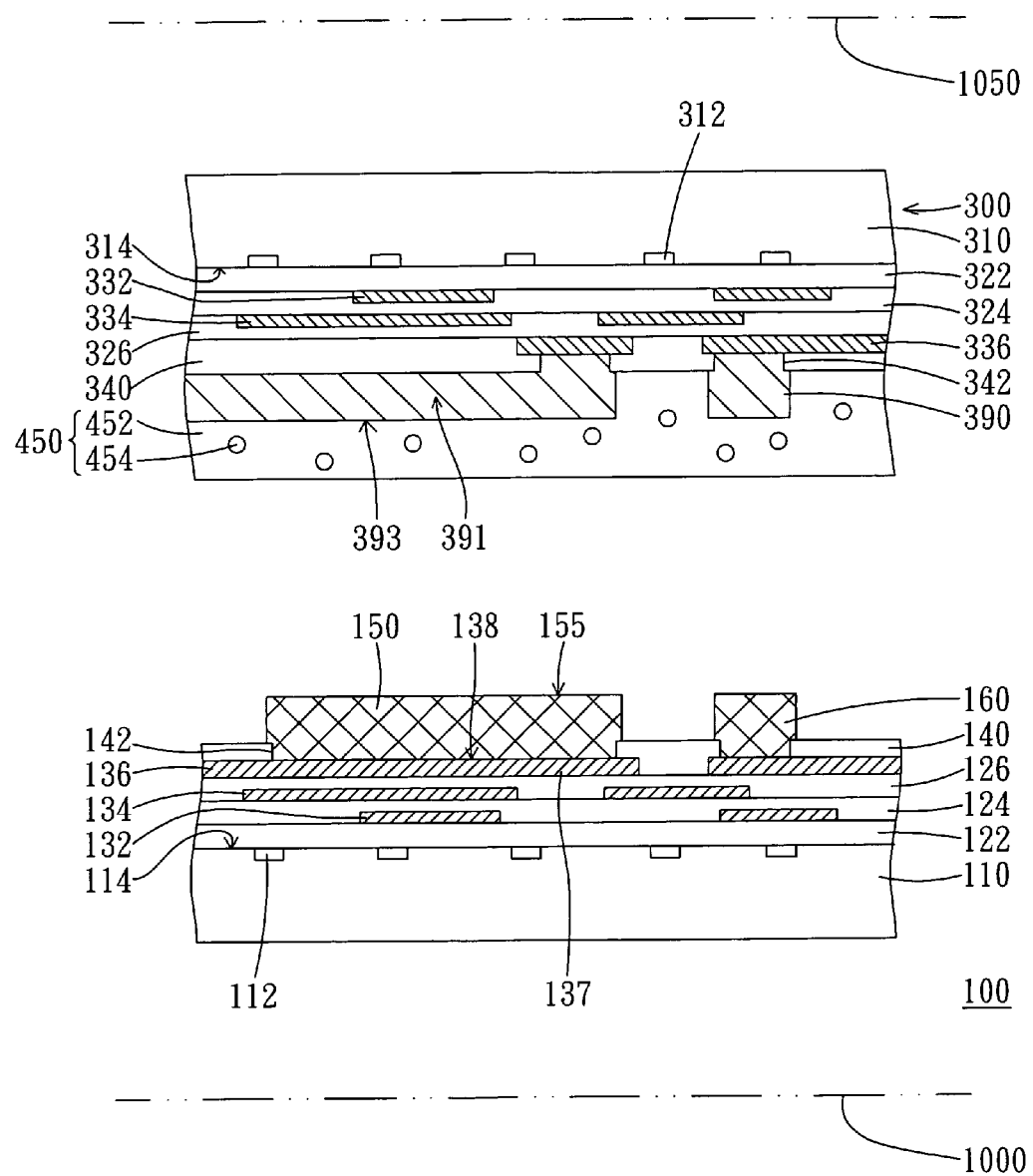

FIG. 62 is a cross-sectional view showing a chip package before two semiconductor chips being assembled according to the fourth embodiment, wherein a bump on a thin-film circuit of a semiconductor chip is adapted to be electrically connected to a thick metallization circuit of another semiconductor chip through metal particles of ACP or ACF.

Figure 63:
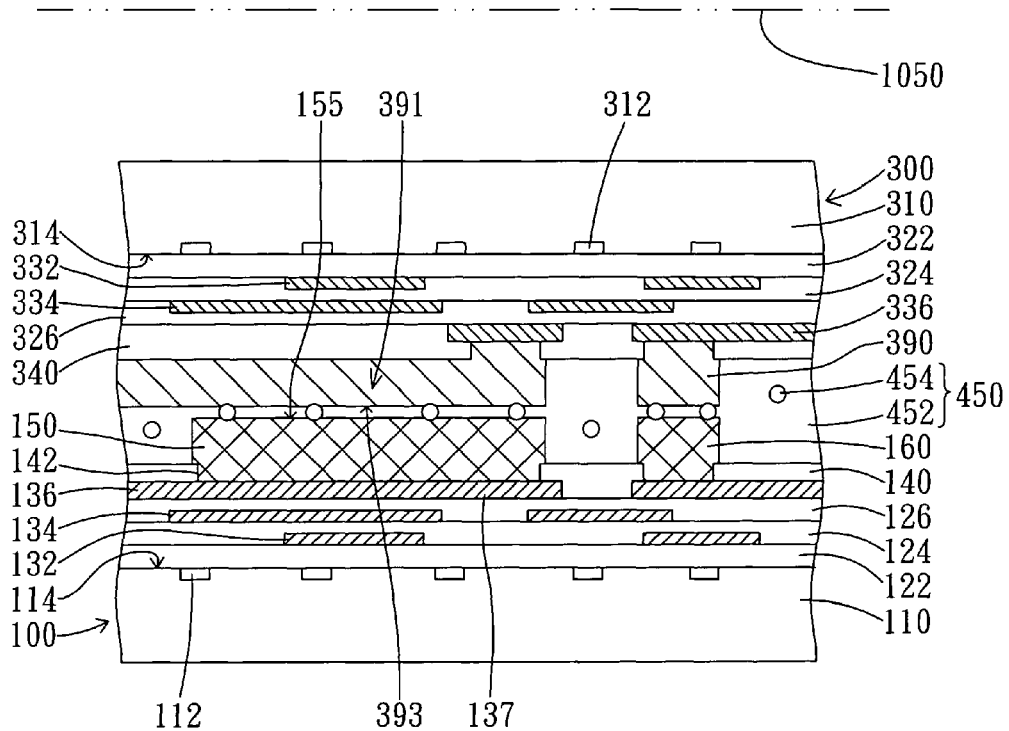

FIG. 63 is a cross-sectional view showing a chip package after the two semiconductor chips shown in FIG. 62 being assembled according to the fourth embodiment.

FIGS. 64-67 are cross-sectional views showing chip packages according to the fourth embodiment, wherein a bump on a thin-film circuit or passivation layer of a semiconductor chip is adapted to be electrically connected to a thick metallization circuit of another semiconductor chip through metal particles of ACP or ACF.

Figure 68:
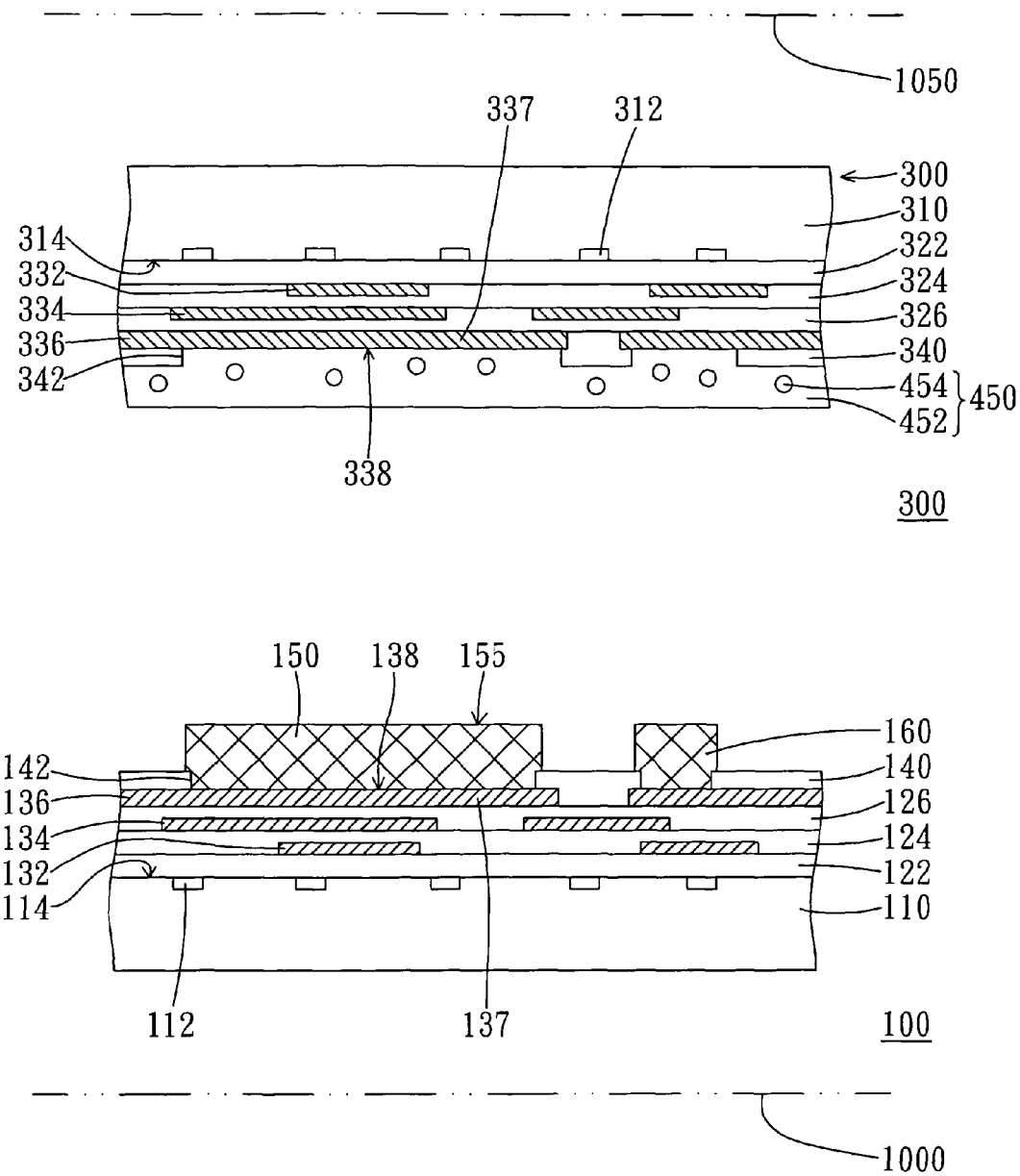

FIG. 68 is a cross-sectional view showing a chip package before two semiconductor chips being assembled according to the fourth embodiment, wherein a bump on a thin-film circuit of a semiconductor chip is adapted to be electrically connected to a thin-film circuit of another semiconductor chip through metal particles of ACP or ACF.

Figure 69:
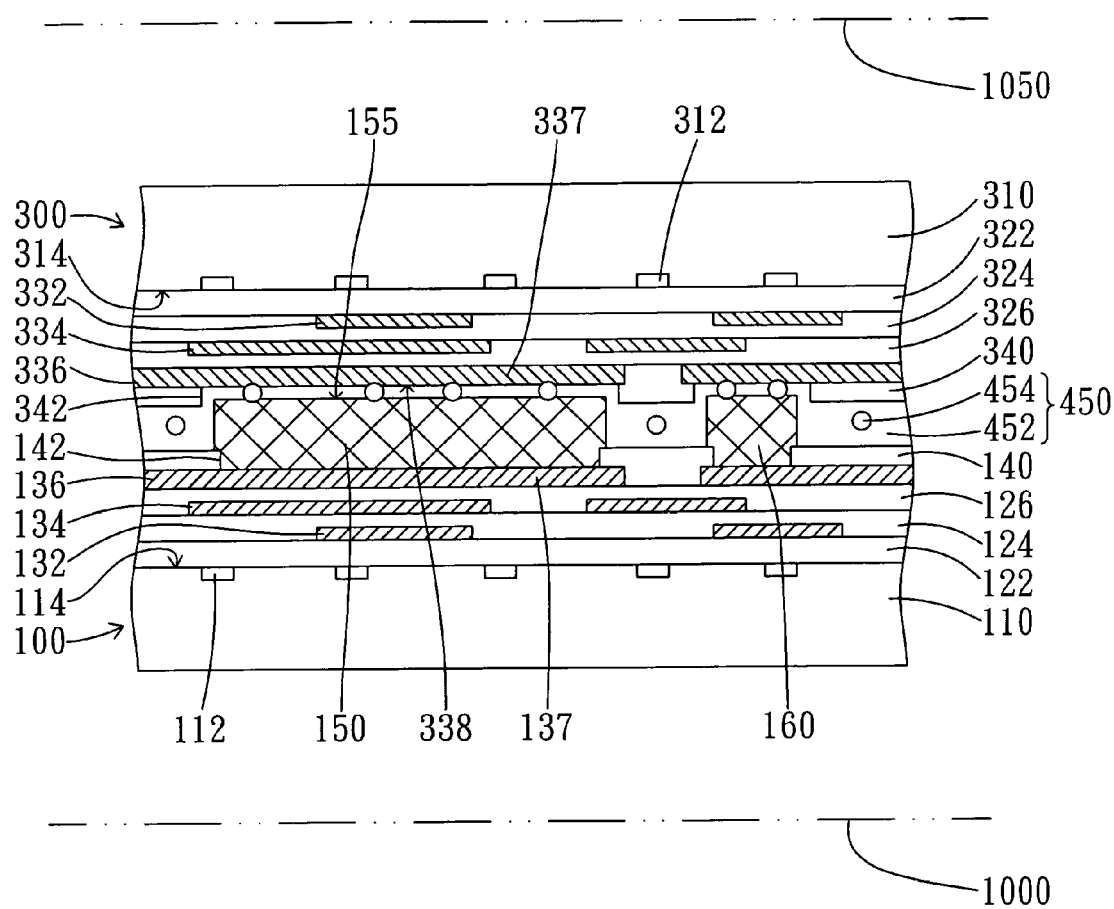

FIG. 69 is a cross-sectional view showing a chip package after the two semiconductor chips shown in FIG. 68 being assembled according to the fourth embodiment.

Figure 70:
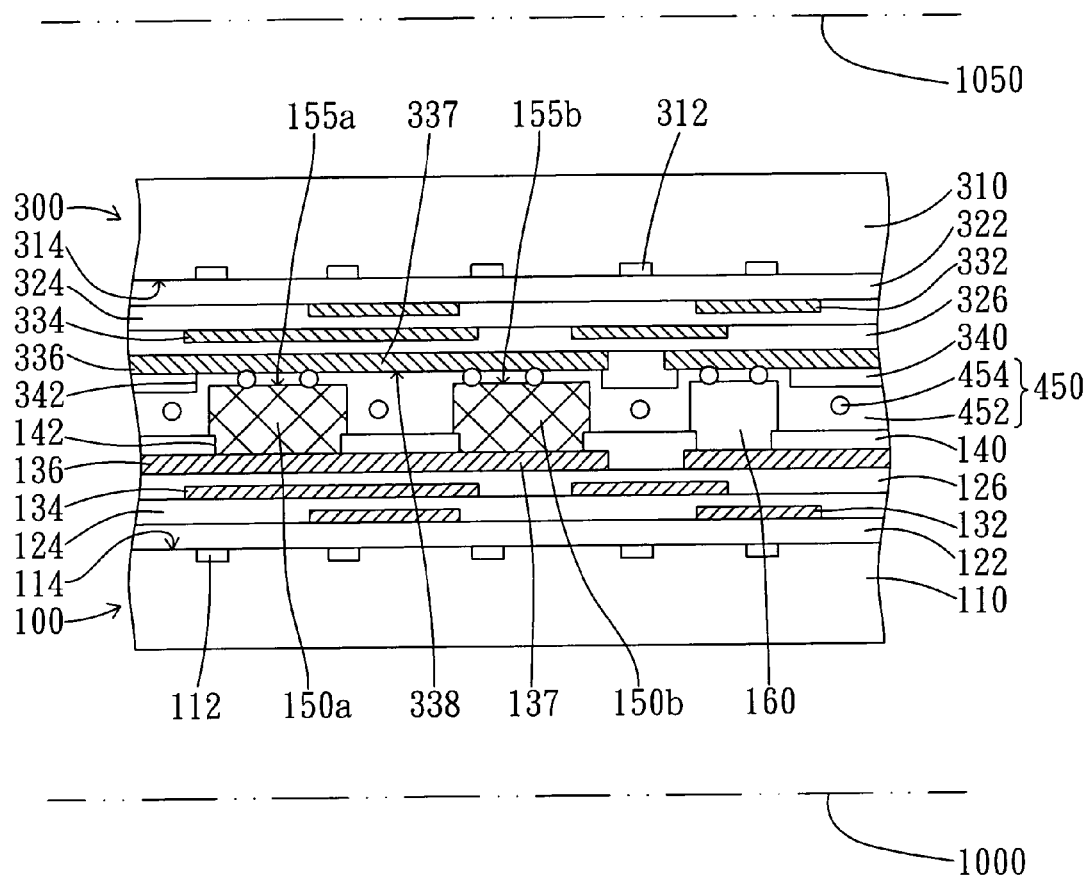
Figure 71:
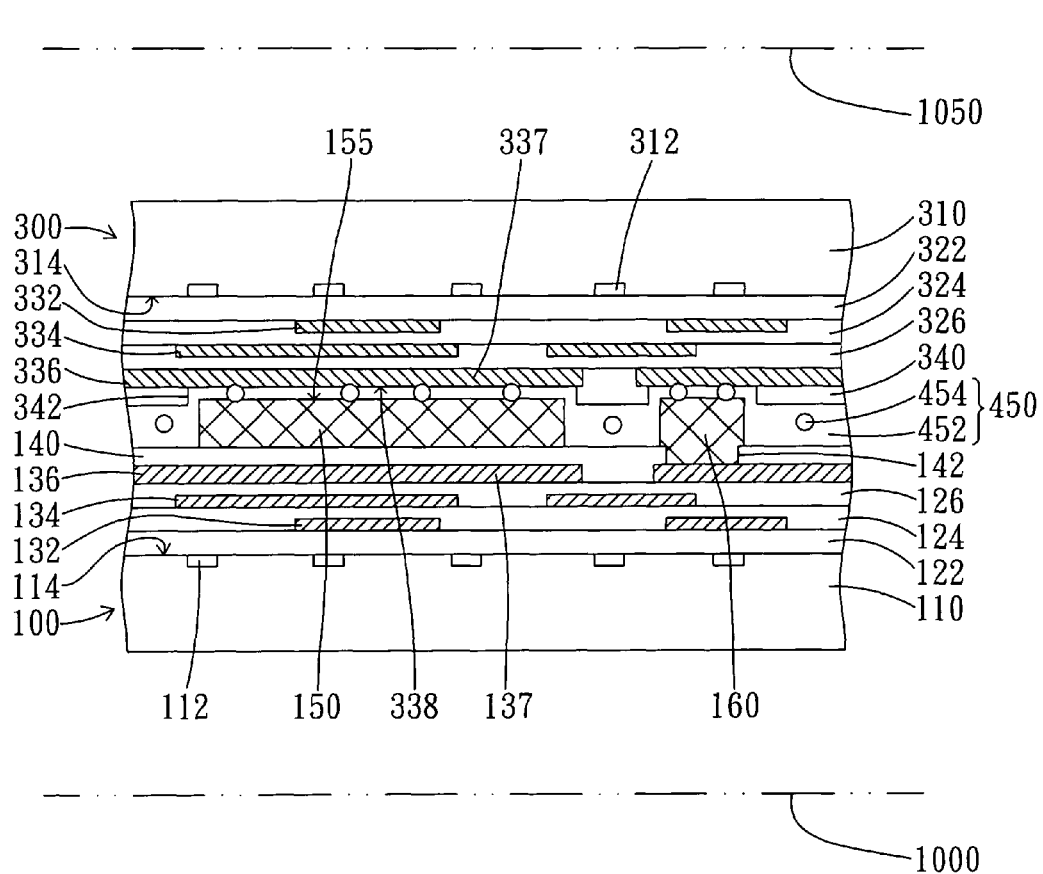

FIGS. 70-71 are cross-sectional views showing chip packages according to the fourth embodiment, wherein a bump on a thin-film circuit or a passivation layer of a semiconductor chip is adapted to be electrically connected to a thin-film circuit of another semiconductor chip through metal particles of ACP or ACF.

DESCRIPTION OF THE PREFERRED EMBODIMENTS

In the following embodiments, all identical symbols represent for same elements, and their content would not be detailed again once if it has been previously introduced.

1. First Embodiment of Chip Packages

In the first embodiment, the chip is bonded to a circuit of a substrate by bumps wherein the bumps can be bonded to the substrate by soldering bonding or Au—Au Eutectic Bonding. Here, some feasible examples are described as follows.

1. Bump on Thin-Film Circuit or Passivation Layer of Semiconductor Chip being Bonded to Circuit Layer of Substrate.

FIG. 1 is a cross-sectional view showing a chip package before a semiconductor chip and substrate being assembled according to a first embodiment. A semiconductor chip 100 includes a semiconductor substrate 110, multiple thin-film dielectric layers 122, 124 and 126, multiple thin-film circuit layers 132, 134 and 136, and a passivation layer 140.

Referring to FIG. 1, the semiconductor substrate 110 has multiple electronic elements 112 in a surface layer of an active surface 114 of the semiconductor substrate 110. The semiconductor substrate 110 could be a silicon substrate. By doping trivalence ions, such as boron ions, or pentad ions, such as phosphorous ions, multiple electronic elements 112 can be formed in or on the semiconductor substrate 110. The electronic elements 112 could be MOS (Metal Oxide Semiconductor) or transistors.

Referring to FIG. 1, multiple thin-film dielectric layers 122, 124 and 126, such as silicon oxide, silicon nitride or silicon oxynitride, can be formed over the active surface 114 of the semiconductor substrate 110 by CVD (Chemical Vapor Deposition) process. Each of the thin-film circuit layers 132, 134 and 136 is formed on one of the thin-film dielectric layers, respectively. The thin-film circuit layers 132, 134, 136 could include aluminum, copper or silicon, for example. The thin-film circuit layers 132, 134 and 136 have thicknesses u1, u2, and u3 of smaller than 1 μm. The thin-film dielectric layers 122, 124 and 126 have multiple via holes (unshown) connecting the thin-film circuit layers 132, 134 and 136 to one another or to the electronic elements 112. The topmost thin-film circuit layer 136 is made mainly of aluminum or copper.

Referring to FIG. 1, a passivation layer 140 is formed over the thin-film dielectric layers 122, 124 and 126 and over the thin-film circuit layers 132, 134, and 136. The passivation layer 140 has a thickness z of greater than 0.35 μm, for example, and comprises silicon oxide, silicon nitride, phosphosilicate glass (PSG) or a multiply structure with multiple above-mentioned materials. Multiple openings in the passivation layer 140 expose the topmost thin-film circuit layer 136.

Referring to FIG. 1, multiple bumps 150 and 160 are simultaneously deposited on the topmost thin-film circuit layer 136 using screen printing or electroplating, for example. Therefore, the bumps 150 and 160 have a same metallization structure which is described in the following. The bump 150 has a thickness j that is substantially identical to the thickness h of the bump 160, wherein their thicknesses j and h are greater than 1 μm and, preferably, greater than 5 μm.

Referring to FIG. 1, the topmost thin-film circuit layer 136 has a thin-film circuit 137. The opening 142 in the passivation layer 140 exposes the thin-film circuit 137 with a large exposed area. Therefore, the bump 150 can be joined to the exposed thin-film circuit 137 with a large contact area. The above-mentioned large contact area is described as follows.

Referring to FIG. 1, in the first case, the area of the thin-film circuit 137 exposed by the opening 142 in the passivation layer 140 is greater than 30,000 $\mu m^2$, 80,000 $\mu m^2$ or 150,000 $\mu m^2$. Therefore, the bump 150 can be connected to the exposed thin-film circuit 137 with a large contact area. A plane 1000 parallel to the active surface 114 of the semiconductor substrate 110 is defined. The area of projecting the contact between the bump 150 and the thin-film circuit 137 onto the plane 1000 is greater than 30,000 $\mu m^2$, 80,000 $\mu m^2$ or 150,000 $\mu m^2$.

In the second case, the area of projecting the contact between the bump 150 and the thin-film circuit layer 136 onto the plane 1000 has an extending distance t of greater than 500 μm, 800 μm or 1200 μm. The bump 150 can be considered to be joined to the thin-film circuit 137 with a large contact area if one of the above mentioned cases meets.

In this embodiment, the ratio of the area of "projecting the contact between the bump 150 and the thin-film circuit 137 onto the plane 1000" to the area of "projecting the thin-film circuit 137 onto the plane 1000" is greater than 0.5 or 0.8 or even equal to 1.

Referring to FIG. 1, the bump 150 can extend at a top portion of the semiconductor chip 100 with various types, such as linear extension, curve extension, irregular extension with discontinuous bends, or branch-like extension. Alternatively, the area of projecting the bump 150 onto the plane 1000 may be circle-patterned, oval-patterned, or polygon-patterned. The contact 138 of the thin-film circuit 137 joined with the bump 150 may have the pattern matching that of the bump 150, such as pattern of linear extension, curve extension, irregular extension with discontinuous bends, or branch-like extension. Also, the contact 138 may have a circle pattern, an oval pattern or a polygon pattern.

Referring to FIG. 1, the semiconductor chip 100 includes a big-sized bump 150 suitable for being bonded with a circuitry component 200. The big-sized bump 150 has a cross-sectional area parallel to the active surface 114 of the semiconductor chip 100. The cross-sectional area is greater than 30,000 $\mu m^2$, 80,000 $\mu m^2$ or 150,000 $\mu m^2$. Also, the cross-sectional area may have an extending distance greater than 500 μm, 800 μm or 1200 μm.

Referring to FIG. 1, the substrate can be a general printed circuit board (PCB) or flexible circuit substrate. The printed circuit board is usually formed by multiple circuit layers and insulating layers stacking with one another, such as four-layer, six-layer or eight-layer printed circuit board. The insulating layers can be polymer or a ceramic material. The flexible circuit substrate is formed by laminating a circuit layer on a insulating layer, wherein the insulating layer is polymer, for example. In general, the flexible circuit substrate is much durable due to its thin thickness.

Referring to FIG. 1, the substrate 200 can be a printed circuit board or flexible circuit substrate. The substrate 200 may include a circuit layer 210 and a solder-mask layer 220. The solder-mask layer 220 is deposited on the circuit layer 210 to protect the circuit layer 210. An opening 222 in the solder-mask layer 220 exposes contacts 212 and 214 of the circuit layer 210.

Referring to FIG. 1, preferably, the pattern of the contact 212 of the substrate 200 may match that of the bump 150, such as pattern of linear extension, curve extension, irregular extension with discontinuous bends or branch-like extension. Also, the contact 212 may have a circle pattern, an oval pattern, or a polygon pattern. Preferably, the relation between the pattern of projecting the bump 150 onto the plane 1000 and the pattern of projecting the contact 212 onto the plane 1050 is mirror symmetry. Therefore, the bump 150 can be bonded to the contact 212 of the substrate 200.

In an embodiment, the bump 150 and the contact 212 of the substrate 200 linearly extends, as shown in FIGS. 1A and 1B. FIG. 1A is a plane view showing the pattern of projecting the contact 212 of the substrate 200 onto the plane 1050 in FIG. 1. FIG. 1B is a plane view showing the pattern of projecting the bump 150 onto the plane 1000 in FIG. 1.

Referring to FIGS. 1A and 1B, the bump 150 extends along a path 1200, such as from point x to point y. The thin-film circuit 137 extends along the path 1200, such as from point p to point q. The contact 212 of the substrate 200 extends along a path 1100, such as from point X and point Y. The opening 142 in the passivation layer 140 exposes the contact 138 (slash marked) of the thin-film circuit 137 with a large contact area. The contact 138 (slash marked) connected to the bump 150 with a large contact area linearly extends along the path 1200, from point v to point w. The relation between the patterns of the bump 150 and the contact 212 of the substrate 200 is mirror symmetry. That is, the mirror pattern of the lower part b of the bump 150, based on the mirror line 1200, is similar to the pattern of the upper part A of the contact 212 of the substrate 200. The mirror pattern of the upper part a of the bump 150, based on the mirror line 1200, is similar to the pattern of the lower part B of the contact 212 of the substrate 200.

Referring to FIG. 1B, the exposed area (slash marked) of the thin-film circuit 137 is greater than 30,000 $\mu m^2$, 80,000 $\mu m^2$, or 150,000 $\mu m^2$. The area of projecting the contact between the bump 150 and the thin-film circuit 137 onto the plane 1000 is greater than 30,000 $\mu m^2$, 80,000 $\mu m^2$, or 150,000 $\mu m^2$. The area (slash marked in FIG. 1B) of projecting the contact between the bump 150 and the contact 138 of the thin-film circuit 137 onto the plane 1000 has an extending distance (stretching from point v to point w along the path 1200 in FIG. 1B) of greater than 500 $\mu m$, 800 $\mu m$ or 1200 $\mu m$.

Referring to FIG. 1B, the ratio of the area (slash marked in FIG. 1B) of "projecting the contact between the bump 150 and the contact 138 of the thin-film circuit 137 onto the plane 1000" to the area (enclosed by the dotted line in FIG. 1B) of "projecting the thin-film circuit 137 onto the plane 1000" is greater than 0.5 or 0.8, or even equal to 1.

Referring to FIG. 1B, the bump 150 has a cross-sectional area (enclosed by a solid line) parallel to the active surface 114 of chip 100. This cross-sectional area of the bump 150 is greater than 30,000 $\mu m^2$, 80,000 $\mu m^2$ or 150,000 $\mu m^2$. Alternatively, in an embodiment, the cross-sectional area (enclosed by a solid line) of the big-sized bump 150 has an extending distance of greater than 500 $\mu m$, 800 $\mu m$ or 1200 $\mu m$.

FIG. 2 is a cross-sectional view showing a chip package created after bonding the semiconductor chip and the substrate shown in FIG. 1. After providing the semiconductor chip 100 and the substrate 200, the bumps 150 and 160 formed over the semiconductor chip 100 are joined to the contacts 212 and 214 of the substrate 200 respectively by soldering or Au—Au eutectic bonding. Next, a polymer 170 is filled into the gap between the semiconductor chip 100 and the substrate 200, covering the bumps 150 and 160.

Referring to FIG. 2, the bump 150 is joined to the contact 212 of the substrate 200 with a large contact area, described as follows. A plane 1000 parallel to the active surface 114 of the semiconductor chip 100 is defined. The pattern of projecting the contact between the bump 150 and the contact 212 of the substrate 200 onto the plane 1000 has an extending distance of greater than 500 $\mu m$, 800 $\mu m$ or 1200 $\mu m$. The area of projecting the contact between the bump 150 and the contact 212 of the substrate 200 onto the plane 1000 is greater than 30,000 $\mu m^2$, 80,000 $\mu m^2$ or 150,000 $\mu m^2$. The bump 150 can be considered to be joined to the contact 212 of the substrate 200 with a large contact area if one of the above mentioned cases meets.

Referring to FIG. 2, the bump 150 is joined to the circuit 213 of the circuit layer 210. The ratio of the area of "projecting the contact between the bump 150 and the circuit 213 onto the plane 1050" to the area of "projecting the circuit 213 onto the plane 1050" is greater than 0.5 or 0.8, or even equal to 1.

In the previous embodiment, referring to FIGS. 1A and 1B, the upper part a of the bump 150 is bonded to the lower part B of the contact 212 of the substrate 200 by soldering or Au—Au eutectic bonding. The lower part b of the bump 150 is bonded to the upper part A of the contact 212 of the substrate 200 by soldering or Au—Au eutectic bonding. The area of projecting the contact (enclosed by a dotted line in FIG. 1A or enclosed by an external solid line in FIG. 1B) between the bump 150 and the contact 212 of the substrate 200 onto the plane 1000 or 1050 has an extended distance (along the path 1100 from point X to point Y, or along the path 1200 from point x to point y) of greater than 500 $\mu m$, 800 $\mu m$, or 1200 $\mu m$. The area of projecting the contact (enclosed by a dotted line in FIG. 1A or enclosed by an external solid line in FIG. 1B) between the bump 150 and the contact 212 of the substrate 200 onto the plane 1000 or 1050 is greater than 30,000 $\mu m^2$, 80,000 $\mu m^2$, or 150,000 $\mu m^2$.

Referring to FIG. 1C, before the semiconductor chip 100 and substrate 200 are bounded, a solder paste 286 can be formed on the circuit layer 210 of the substrate 200. The solder paste 286 could includes tin, for example. Thereafter, the bumps 150 and 160 are attached onto the solder paste 286. Next, during a reflow process, the bumps 150 and 160 blend with the solder paste 286 and the blend solidifies to form multiple bulks 250 and 260 as shown in FIG. 2A. These bulks 250 and 260 connect the semiconductor chip 100 to the substrate 200.

The bumps 150 and 160 have a topmost solder layer adapted to be joined with the solder paste 286. Alternatively, the bumps 150 and 160 may have a topmost gold layer adapted to be joined with the solder paste 286. In this embodiment, the bulk 250 has a least cross-sectional area parallel to the active surface 114 of the semiconductor chip 100. The least cross-sectional area of the bulk 250 is at the bottom of the bulk 250, for example. The least cross-sectional area of the bulk 250 is greater than 30,000 $\mu m^2$, 80,000 $\mu m^2$ or 150,000 $\mu m^2$, and has an extending distance of greater than 500 $\mu m$, 800 $\mu m$ or 1200 $\mu m$.

Referring to FIG. 2A, the area of projecting the contact between the bulk 250 and the thin-film circuit 137 onto the plane 1000 is greater than 30,000 $\mu m^2$, 80,000 $\mu m^2$ or 150,000 $\mu m^2$ and has an extending distance of greater than 500 $\mu m$, 800 $\mu m$ or 1200 $\mu m$.

Referring to FIG. 2A, the area of projecting the contact between the bulk 250 and the circuit layer 210 onto the plane 1000 is greater than 30,000 $\mu m^2$, 80,000 $\mu m^2$ or 150,000 $\mu m^2$ and has an extending distance of greater than 500 $\mu m$, 800 $\mu m$ or 1200 $\mu m$.

Referring to FIG. 2A, the bulk 250 is joined to the circuit 213 of the circuit layer 210. The ratio of the area of "projecting the contact between the bulk 250 and the circuit 213 onto the plane 1050" to the area of "projecting the circuit 213 onto the plane 1050" is greater than 0.5 or 0.8, or even equal to 1. The ratio of the area of "projecting the contact between the bulk 250 and the thin-film circuit 137 onto the plane 1000" to the area of "projecting the thin-film circuit 137 onto the plane 1000" is greater than 0.5 or 0.8, or even equal to 1.

Referring to FIGS. 2 and 2A, the bump 150 and the bulk 250 can serve as the signal transmission media for the internal elements of the semiconductor chip 100, for the internal elements of the substrate 200, or for the interconnection between the semiconductor chip 100 and the substrate 200. The following description takes multiple examples for the bump 150, which also can be employed for the bulk 250.

Referring to FIG. 2, the bump 150 serves as signal transmission media of the interconnection between the semiconductor chip 100 and substrate 200. An electronic signal can be transmitted from one of the electronic elements 112 of the semiconductor chip 100 to the substrate 200, sequentially passing the thin-film circuit layers 132, 134 and 136, penetrating through the passivation layer 140 and passing the bump 150. Alternatively, an electronic signal can be transmitted from the substrate 200 to one of the electronic elements 112 of the semiconductor chip 100, sequentially passing the bump 150, thin-film circuit 137, and thin-film circuit layers 134 and 132.

Referring to FIG. 2, the bump 150 serves as the signal transmission medium for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, bump 150, and the circuit layer 210 of the substrate 200, with horizontally transmitted via the thin-film circuit 137, bump 150, and the circuit layer 210 of the substrate 200, and then sequentially passing the thin-film circuit layers 134 and 132.

Furthermore, the electronic signal can be optionally transmitted into the substrate 200 from the bump 150 when being transmitted from one of the electronic elements 112 of the semiconductor chip 100 to the other one thereof. The bump 150 serves as the signal transmission media for the internal elements in the semiconductor chip 100, and for the interconnection between the semiconductor chip 100 and substrate 200.

Referring to FIG. 2, the bump 150 serves as the signal transmission medium for the internal elements in the substrate 200. An electronic signal can be transmitted from one part of the substrate 200 to the other part thereof, passing the circuit layer 210 of the substrate 200, the bump 150 and the thin-film circuit 137, with horizontally transmitted via the circuit layer 210 of the substrate 200, the bump 150 and the thin-film circuit 137. Furthermore, the electronic signal can be optionally transmitted to the electronic elements 112 of the semiconductor chip 100 from the bump 150 when being transmitted from one part of the substrate 200 to the other part thereof. The bump 150 serves as the signal transmission media for the internal elements in the substrate 200 and for the interconnection between the semiconductor chip 100 and substrate 200.

Referring to FIG. 2, through the bump 160, an electronic signal can be transmitted from the semiconductor chip 100 to the substrate 200 or transmitted from the substrate 200 to the semiconductor chip 100.

Referring to FIG. 2, the bump 150 not only horizontally transmits an electronic signal but also vertically transmits the electronic signal between the semiconductor chip 100 and substrate 200. The bump 150 is joined to the contact 138 of thin-film circuit 137 of semiconductor chip 100 with a large contact area and joined to the contact 212 of the substrate 200 with a large contact area. Therefore, the performance for electrical connection between the semiconductor chip 100 and the substrate 200 can be enhanced and noise can be reduced.

Alternatively, referring to FIG. 2, the bump 150 can also serve as a power bus. The bump 150 can be connected to an internal power bus in the semiconductor chip 100, and to an internal power bus in the substrate 200. The bump 150 is joined to the contact 138 of the thin-film circuit 137 of the semiconductor chip 100 with a large contact area and joined to the circuit layer 210 of the substrate 200 with a large contact area. As a result, the appearance of the power bus of the semiconductor chip 100 providing an unstable power voltage due to being interfered by noise can be diminished, so the semiconductor chip 100 can provide a stable power voltage.

Alternatively, referring to FIG. 2, the bump 150 can also serves as a ground bus. The bump 150 can be connected to an internal ground bus in the semiconductor chip 100, and to an internal ground bus in the substrate 200. The bump 150 is joined to the contact 138 of thin-film circuit 137 of the semiconductor chip 100 with a large contact area and joined to the circuit layer 210 of the substrate 200 with a large contact area. As a result, the appearance of the ground bus of the semiconductor chip 100 providing an unstable ground voltage due to being interfered by noise can be diminished, so the semiconductor chip 100 can provide a stable ground voltage.

In the FIGS. 1 and 2, the thin-film circuit 137 is joined with only one bump 150 with a large contact area. However, the thin-film circuit 137 can also be joined with multiple bumps 150a and 150b with large contact areas, as shown in FIG. 3. FIG. 3 is a cross-sectional view showing another chip package according to the first embodiment. FIG. 3A is a plane view showing the pattern of projecting the bumps 150a and 150b onto the plane 1000.

Referring to FIG. 3, the bumps 150a and 150b can extend with various types, such as linear extension, curve extension, irregular extension with discontinuous bends, or branch-like extension. Alternatively, the areas of projecting the bumps 150a and 150b onto the plane 1000 may be circle-patterned, oval-patterned, or polygon-patterned.

The contacts 138a and 138b of the thin-film circuit 137 connected to the bumps 150a and 150b may have the patterns matching those of the bumps 150a and 150b, such as the pattern of linear extension, curve extension, irregular extension with discontinuous bends, or branch-like extension. Also, the contacts 138a and 138b may have a circle pattern, an oval pattern or a polygon pattern. The contacts 212A and 212B of the substrate 200 connected to the bumps 150a and 150b may have the pattern matching that of the bumps 150a and 150b, such as pattern of linear extension, curve extension, irregular extension with discontinuous bends, or branch-like extension. Also, the contacts 212A and 212B may have a circle pattern, an oval pattern or a polygon pattern.

Referring to FIG. 3A, the ratio of the total area (slash marked) of "projecting the contacts between the thin-film circuit 137 and the bumps 150a and 150b onto the plane 1000" to the area (enclosed by a dotted line) of "projecting the thin-film circuit 137 onto the plane 1000" is greater than 0.5 or 0.8.

Referring to FIGS. 3 and 3A, the area (slash marked on the left side) of projecting the contact between the thin-film circuit 137 and the bump 150a onto the plane 1000 is greater than 30,000 $\mu m^2$, 80,000 $\mu m^2$, or 150,000 $\mu m^2$. The area (slash marked on the right side) of projecting the contact between the thin-film circuit 137 and the bump 150b onto the plane 1000 is greater than 30,000 $\mu m^2$, 80,000 $\mu m^2$, or 150,000 $\mu m^2$.

Alternatively, the area of projecting the contact between the thin-film circuit 137 and one of the bumps 150a and 150b onto the plane 1000 is greater than 30,000 $\mu m^2$, 80,000 $\mu m^2$, or 150,000 $\mu m^2$, but the area of projecting the contact between the thin-film circuit 137 and the other one of the bump 150a and 150b is less than 30,000 $\mu m^2$.

Referring to FIGS. 3 and 3A, the area of projecting the contact between the thin-film circuit 137 and the bump 150a onto the plane 1000 has an extending distance t1 (along the path 1200 from point v1 to point w1 shown in FIG. 3A) of greater than 500 µm, 800 µm, or 1200 µm. The area of projecting the contact between the thin-film circuit 137 and the bump 150b onto the plane 1000 has an extending distance t2 (along the path 1200 from point v2 to point w2 shown in FIG. 3A) of greater than 500 µm, 800 µm, or 1200 µm.

Alternatively, the area of projecting the contact between the thin-film circuit 137 and one of the bumps 150a and 150b onto the plane 1000 has an extending distance of greater than 500 µm, 800 µm, or 1200 µm, but the area of projecting the contact between the thin-film circuit 137 and the other one of the bumps 150a and 150b onto the plane 1000 has an extending distance of less than 500 µm.

Referring to FIGS. 3 and 3A, the area (enclosed by a solid line used to demonstrate the bump 150a shown in FIG. 3A) of projecting the contact between the contact 212A of the substrate 200 and the bump 150a onto the plane 1000 is greater than 30,000 $\mu m^2$, 80,000 $\mu m^2$, or 150,000 $\mu m^2$. The area (enclosed by a solid line used to demonstrate the bump 150b shown in FIG. 3A) of projecting the contact between the contact 212B of the substrate 200 and the bump 150b onto the plane 1000 is greater than 30,000 $\mu m^2$, 80,000 $\mu m^2$, or 150,000 $\mu m^2$.

Alternatively, the area of projecting the contact between one of the contacts 212A and 212B of the substrate 200 and one of the bumps 150a and 150b onto the plane 1000 is greater than 30,000 $\mu m^2$, 80,000 $\mu m^2$, or 150,000 $\mu m^2$, but the area of projecting the contact between the other one of the contacts 212A and 212B of the substrate 200 and the other one of the bumps 150a and 150b onto the plane 1000 is less than 30,000 $\mu m^2$.

Referring to FIG. 3 and FIG. 3A, the area of projecting the contact between the contact 212A of the substrate 200 and the bump 150a onto the plane 1000 has an extending distance s1 (along the path 1200 from point x1 to point y1 shown in FIG. 3A) of greater than 500 µm, 800 µm, or 1200 µm. The area of projecting the contact between the contact 212B of the substrate 200 and the bump 150b onto the plane 1000 has an extending distance s2 (along the path 1200 from point x2 to point y2 shown in FIG. 3A) of greater than 500 µm, 800 µm, or 1200 µm.

Alternatively, the area of projecting the contact between one of the contacts 212A and 212B of the substrate 200 and one of the bumps 150a and 150b onto the plane 1000 has an extending distance of greater than 500 µm, 800 µm, or 1200 µm, but the area of projecting the contact between the other one of the contacts 212A and 212B of the substrate 200 and the other one of the bumps 150a and 150b onto the plane 1000 has an extending distance of less than 500 µm.

Referring to FIG. 3, the ratio of the total area of "projecting the contact between the circuit 213 of the circuit layer 210 and the bumps 150a and 150b onto the plane 1050" to the area of "projecting the circuit 213 of the circuit layer 210 onto the plane 1050" is greater than 0.5 or 0.8.

Alternatively, referring to FIGS. 3B and 3C, the bumps 150a and 150b can be attached to the substrate 200 with a solder paste 286, which mechanism can refer to the description concerning FIGS. 1C and 2A. After a reflow process, the bumps 150a and 150b blend with the solder paste 286 and the blend solidifies to form multiple bulks 250A and 250B.

The ratio of the total area of "projecting the contact between the thin-film circuit 137 and the bulks 250A and 250B onto the plane 1000" to the area of "projecting the thin-film circuit 137 onto the plane 1000" is greater than 0.5 or 0.8. The ratio of the total area of projecting the contact between the circuit 213 of the circuit layer 210 and the bulks 250A and 250B onto the plane 1050" to the area of "projecting the circuit 213 of the circuit layer 210 onto the plane 1050" is greater than 0.5 or 0.8.

Referring to FIG. 3B and FIG. 3C, the area of projecting the contact between the thin-film circuit 137 and the bulk 250A onto the plane 1000 is greater than 30,000 $\mu m^2$, 80,000 $\mu m^2$, or 150,000 $\mu m^2$. The area of projecting the contact between the thin-film circuit 137 and the bulk 250B onto the plane 1000 is greater than 30,000 $\mu m^2$, 80,000 $\mu m^2$, or 150,000 $\mu m^2$.

Alternatively, the area of projecting the contact between the thin-film circuit 137 and one of the bulks 250A and 250B onto the plane 1000 is greater than 30,000 $\mu m^2$, 80,000 $\mu m^2$, or 150,000 $\mu m^2$, but the area of projecting the contact between the thin-film circuit 137 and the other one of the bulks 250A and 250B onto the plane 1000 is less than 30,000 $\mu m^2$.

Referring to FIG. 3B and FIG. 3C, the area of projecting the contact between the thin-film circuit 137 and the bulk 250A onto the plane 1000 has an extending distance of greater than 500 µm, 800 µm, or 1200 µm. The area of projecting the contact between the thin-film circuit 137 and the bulk 250B onto the plane 1000 has an extending distance of greater than 500 µm, 800 µm, or 1200 µm.

Alternatively, the area of projecting the contact between the thin-film circuit 137 and one of the bulks 250A and 250B onto the plane 1000 has an extending distance of greater than 500 µm, 800 µm, or 1200 µm, but the area of projecting the contact between the thin-film circuit 137 and the other one of the bulks 250A and 250B onto the plane 1000 has an extending distance of less than 500 µm.

Referring to FIGS. 3B and 3C, the area of projecting the contact between the circuit layer 210 of the substrate 200 and the bulk 250A onto the plane 1000 is greater than 30,000 $\mu m^2$, 80,000 $\mu m^2$, or 150,000 $\mu m^2$. The area of projecting the contact between the circuit layer 210 of the substrate 200 and the bulk 250B onto the plane 1000 is greater than 30,000 $\mu m^2$, 80,000 $\mu m^2$, or 150,000 $\mu m^2$.

Alternatively, the area of projecting the contact between the circuit layer 210 of the substrate 200 and one of the bulks 250A and 250B onto the plane 1000 is greater than 30,000 $\mu m^2$, 80,000 $\mu m^2$, or 150,000 $\mu m^2$, but the area of projecting the contact between the circuit layer 210 of the substrate 200 and the other one of the bulks 250A and 250B onto the plane 1000 is less than 30,000 $\mu m^2$.

Referring to FIG. 3B and FIG. 3C, the area of projecting the contact between the circuit layer 210 of the substrate 200 and the bulk 250A onto the plane 1000 has an extending distance of greater than 500 µm, 800 µm, or 1200 µm. The area of projecting the contact between the circuit layer 210 of the substrate 200 and the bulk 250B onto the plane 1000 has an extending distance of greater than 500 µm, 800 µm, or 1200 µm.

Alternatively, the area of projecting the contact between the circuit layer 210 of the substrate 200 and one of the bulks 250A and 250B onto the plane 1000 has an extending distance of greater than 500 µm, 800 µm, or 1200 µm, but the area of projecting the contact between the circuit layer 210 of the substrate 200 and the other one of the bulks 250A and 250B onto the plane 1000 has an extending distance of less than 500 µm.

Referring to FIGS. 3B and 3C, the bulk 250A has a least cross-sectional area parallel to the active surface 114 of the semiconductor chip 100. The least cross-sectional area of the bulk 250A is at the bottom of the bulk 250A, for example. The least cross-sectional area of the bulk 250A is greater than 30,000 µm², 80,000 µm² or 150,000 µm² and has an extending distance of greater than 500 µm, 800 µm or 1200 µm.

The bulk 250B has a least cross-sectional area parallel to the active surface 114 of the semiconductor chip 100. The least cross-sectional area of the bulk 250B is at the bottom of the bulk 250B, for example. The least cross-sectional area of the bulk 250B is greater than 30,000 µm², 80,000 µm² or 150,000 µm² and has an extending distance of greater than 500 µm, 800 µm or 1200 µm.

Alternatively, one of the bulks 250A and 250B has a least cross-sectional area of greater than 30,000 µm², 80,000 µm² or 150,000 µm², but the other one of the bulks 250A and 250B has a least cross-sectional area of less than 30,000 µm². Moreover, one of the bulks 250A and 250B has a least cross-sectional area having an extending distance of greater than 500 µm, 800 µm or 1200 µm, but the other one of the bulks 250A and 250B has a least cross-sectional area having an extending distance of less than 500 µm.

Referring to FIGS. 3 and 3C, the bumps 150a and 150b and the bulks 250A and 250B can serve as signal transmission media for the internal elements of the semiconductor chip 100, for the internal elements of the substrate 200, or for the interconnection between the semiconductor chip 100 and the substrate 200. The following description takes multiple examples for the bumps 150a and 150b, which can be employed for the bulks 250A and 250B.

Referring to FIG. 3, the bumps 150a and 150b serve as signal transmission media of the interconnection between the semiconductor chip 100 and substrate 200. An electronic signal can be transmitted from one of the electronic elements 112 of the semiconductor chip 100 to the substrate 200, sequentially passing the thin-film circuit layers 132, 134 and 136, penetrating through the passivation layer 140 and passing the bumps 150a and 150b. Alternatively, an electronic signal can be transmitted from the substrate 200 to one of the electronic elements 112 of the semiconductor chip 100, sequentially passing the bumps 150a and 150b, thin-film circuit 137, and thin-film circuit layers 134 and 132.

Referring to FIG. 3, the bumps 150a and 150b serve as signal transmission media for the internal elements of the semiconductor chip 100. An electronic signal can be transmitted from one of the electronic elements 112 of the semiconductor chip 100 to the other one thereof, sequentially passing the thin-film circuit layers 132 and 134, thin-film circuit 137, bumps 150a and 150b, and the circuit layer 210 of the substrate 200, with horizontally transmitted via the thin-film circuit 137, bumps 150a and 150b, and the circuit layer 210 of the substrate 200, and then sequentially passing the thin-film circuit layers 134 and 132.

Furthermore, the electronic signal can be optionally transmitted to the substrate 200 from the bumps 150a and 150b when being transmitted from one of the electronic elements 112 of the semiconductor chip 100 to the other one thereof. The bumps 150a and 150b serve as the signal transmission media for the internal elements in the semiconductor chip 100, and for the interconnection between the semiconductor chip 100 and substrate 200.

Referring to FIG. 3, the bumps 150a and 150b serve as the signal transmission media for the internal elements in the substrate 200. An electronic signal can be transmitted from one part of the substrate 200 to the other part thereof, passing the circuit layer 210 of the substrate 200, the bumps 150a and 150b and the thin-film circuit 137, with horizontally transmitted via the circuit layer 210 of the substrate 200, the bumps 150a and 150b and the thin-film circuit 137. Furthermore, the electronic signal can be optionally transmitted to the semiconductor chip 100 from the bumps 150a and 150b when being transmitted from one part of the substrate 200 to the other part thereof. The bumps 150a and 150b serve as the signal transmission media for the internal elements in the substrate 200 and for the interconnection between the semiconductor chip 100 and substrate 200.

Referring to FIG. 3, through the bump 160, an electronic signal can be transmitted from the semiconductor chip 100 to the substrate 200 or transmitted from the substrate 200 to the semiconductor chip 100.

Referring to FIG. 3, the bumps 150a and 150b not only horizontally transmit an electronic signal but also vertically transmit the electronic signal between the semiconductor chip 100 and substrate 200. The bumps 150a and 150b are joined to the contact 138 of thin-film circuit 137 of chip 100 with a large contact area and joined to the contact 212 of the substrate 200 with a large contact area. Therefore, the performance for electrical connection between the semiconductor chip 100 and the substrate 200 can be enhanced and noise can be reduced.

Alternatively, referring to FIG. 3, the bumps 150a and 150b can also serve as power buses. The bumps 150a and 150b can be connected to an internal power bus in the semiconductor chip 100, and to an internal power bus in the substrate 200. The bumps 150a and 150b are joined to the contact 138 of thin-film circuit 137 of the semiconductor chip 100 with a large contact area and joined to the circuit layer 210 of the substrate 200 with a large contact area. As a result, the appearance of the power bus of the semiconductor chip 100 providing an unstable power voltage due to being interfered by noise can be diminished, so the semiconductor chip 100 can provide a stable power voltage.

Alternatively, referring to FIG. 3, the bumps 150a and 150b can also serve as ground buses. The bumps 150a and 150b can be connected to an internal ground bus in the semiconductor chip 100, and to an internal ground bus in the substrate 200. The bumps 150a and 150b are joined to the contact 138 of thin-film circuit 137 of the semiconductor chip 100 with a large contact area and joined to the circuit layer 210 of the substrate 200 with a large contact area. As a result, the appearance of the ground bus of the semiconductor chip 100 providing an unstable ground voltage due to being interfered by noise can be diminished, so the semiconductor chip 100 can provide a stable ground voltage.

Figure 4:
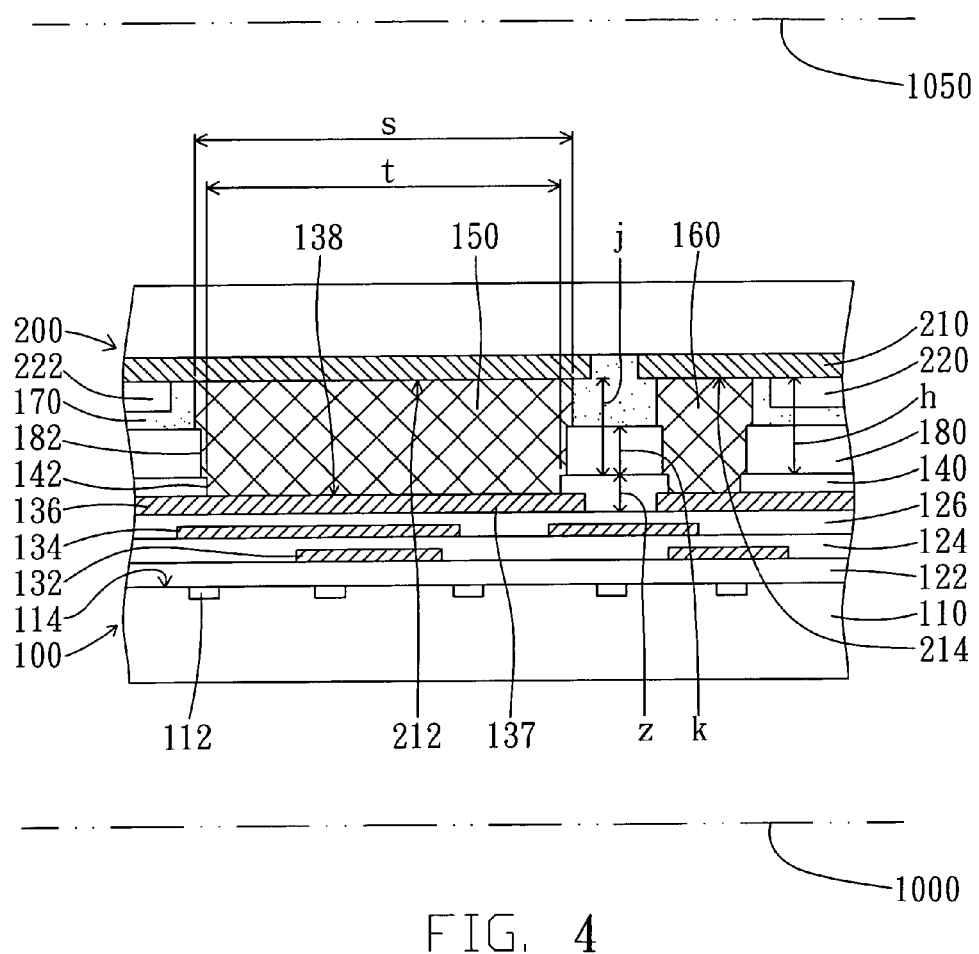
Figure 5:
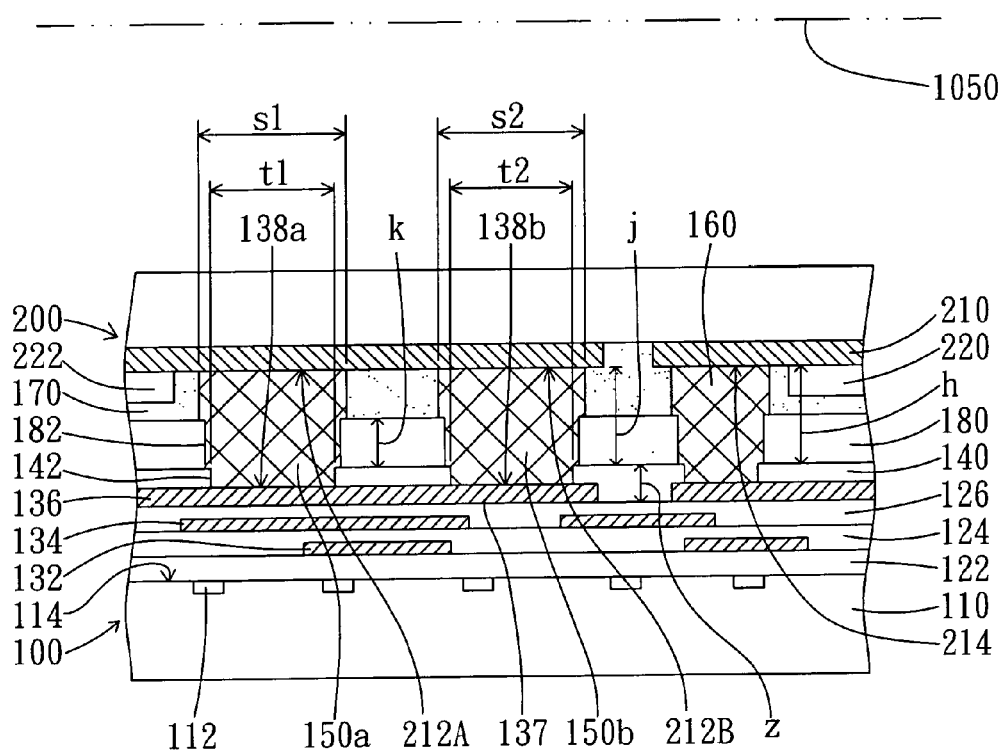

FIGS. 4 and 5 are cross-sectional views showing another chip package according to the first embodiment. Referring to FIGS. 4 and 5, a polymer layer 180 can be deposited on the passivation layer 140. Multiple openings 182 in the polymer layer 180 are aligned to the openings 142 in the passivation layer 140 and expose the thin-film circuit layer 136. Next, the bumps 150 and 160 can be deposited on the thin-film circuit layer 136 exposed by the openings 182 and 142 in the polymer layer 180 and the passivation layer 140. The bumps 150 and 160 have thicknesses j and h of greater than 1 µm and, preferably, greater than 5 µm.

The bumps 150 and 160 are simultaneously deposited using same steps. Therefore, they have a same metallization structure and identical thicknesses j and h. The polymer layer 180 may have a thickness k of greater than 1 μm and could be polyimide (PI), benzocyclobutence (BCB), parylene, porous dielectric material or elastomer. Referring to FIG. 4, the detail of the contact between the bump 150 and the thin-film circuit 137, the contact between the bump 150 and the circuit layer 210 of the substrate 200, and the electric function for the bump 150 can refer to the previous embodiment shown in FIGS. 1 and 2.

Referring to FIG. 5, a polymer layer 180 is formed on the passivation layer 140. Multiple bumps 150a and 150b are deposited on the thin-film circuit 137 exposed by the openings 182 in the polymer layer 180 and the openings 142 in the passivation layer 140. The detail of the contacts between the bumps 150a and 150b and the thin-film circuit 137, the contacts between the bumps 150a and 150b and the circuit layer 210 of the substrate 200, and the electric function for the bumps 150a and 150b can refer to FIG. 3 and the corresponding description.

Figure 6:
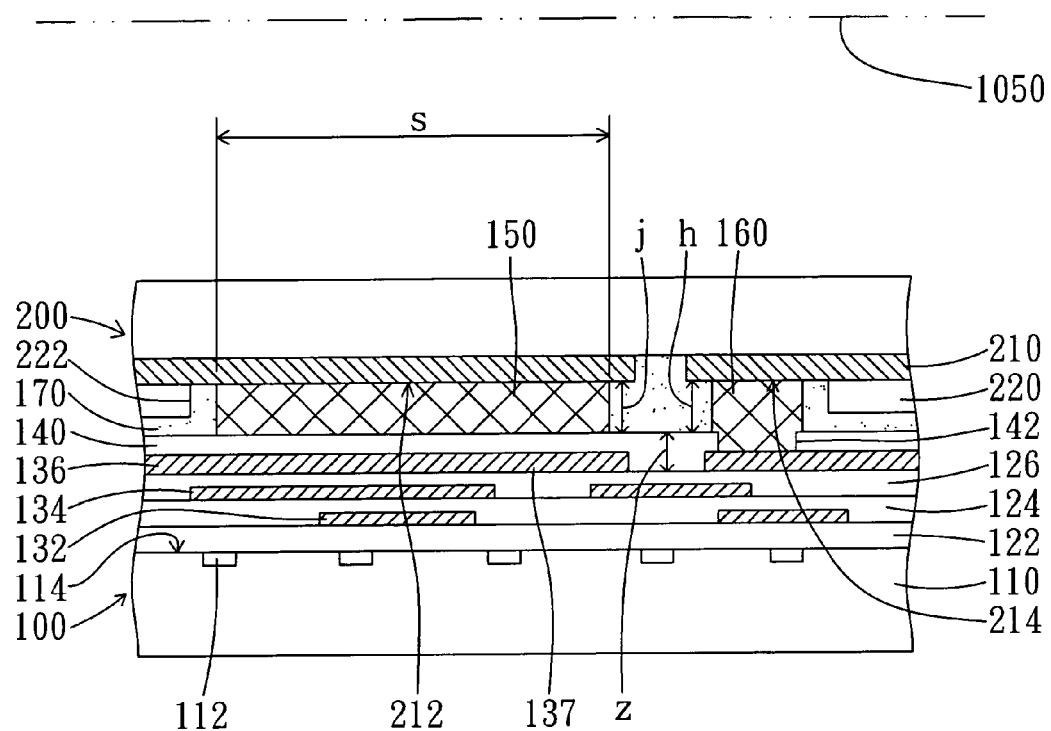

In FIGS. 1-5, the bumps 150, 150a and 150b are electrically connected to the topmost thin-film circuit layer 136. However, this invention is not limited to the above-mentioned. Alternatively, the bumps 150, 150a and 150b can be disconnected from the topmost thin-film circuit layer 136, as shown in FIGS. 6-9. FIGS. 6-9 are cross-sectional views showing other chip packages according to the first embodiment. Referring to FIG. 6, the bump 150 is deposited on the passivation layer 140 and disconnected from the thin-film circuit 136. The bump 150 is connected to the contact 212 of the substrate 200, wherein the detail of the contact between the bump 150 and the contact 212 of the substrate 200 is the same as that described in FIG. 2.

Referring to FIG. 6, the bump 150 can serve as signal transmission media for the internal elements in the substrate 200. An electronic signal can be transmitted from one part of the substrate 200 to the other part thereof, passing the circuit layer 210 of the substrate 200 and the bump 150, with horizontally transmitted via the circuit layer 210 of the substrate 200 and the bump 150. Alternatively, the bump 150 can also serve as a power bus or a ground bus, wherein it can be connected to the internal power bus or ground bus in the substrate 200.

Figure 7:
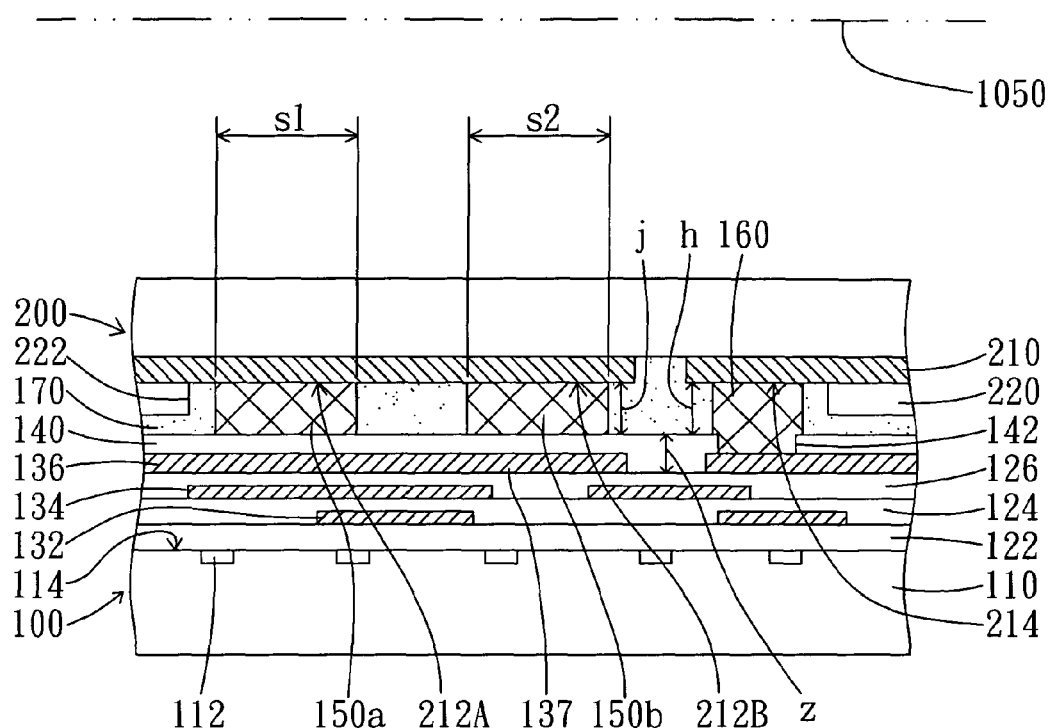

Alternatively, referring to FIG. 7, multiple bumps 150a and 150b can be deposited on the passivation layer 140 wherein the bumps 150a and 150b are disconnected from the thin-film circuit layer 136. The bumps 150a and 150b are connected to the contacts 212A and 212B of the substrate 200, wherein the detail of the contacts between the bump 150a and the contact 212A of the substrate 200 and between the bump 150b and the contact 212B of the substrate 200 is the same as that described in FIG. 3.

Referring to FIG. 7, the bumps 150a and 150b can serve as signal transmission media for the internal elements in the substrate 200. An electronic signal can be transmitted from one part of the substrate 200 to the other part thereof, passing the circuit layer 210 of the substrate 200 and the bumps 150a and 150b, with horizontally transmitted via the circuit layer 210 of the substrate 200 and the bumps 150a and 150b. Alternatively, the bumps 150a and 150b can also serve as a power bus or a ground bus, wherein they can be connected to the internal power bus or ground bus in the substrate 200.

Figure 8:
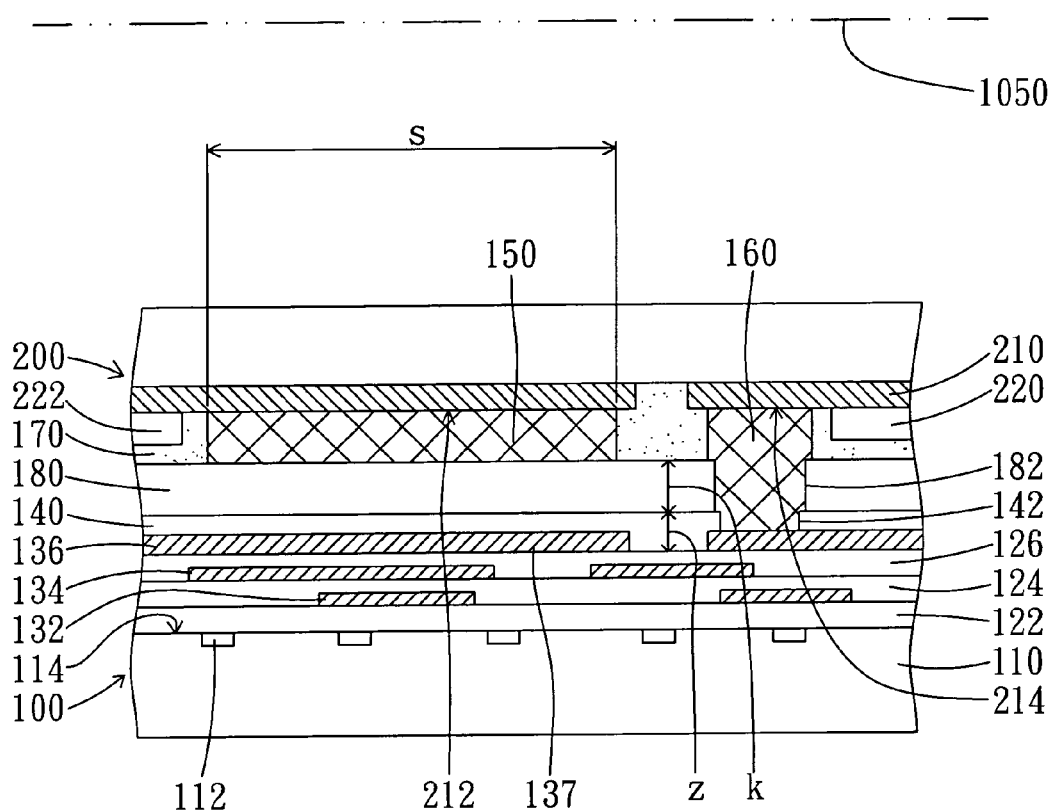

Alternatively, referring to FIG. 8, the bump 150 can be deposited on the polymer layer 180 on the passivation layer 180, wherein the bump 150 is disconnected from the thin-film circuit layer 136. The bump 150 is electrically connected to the contact 212 of the substrate 200, wherein the detail of the contact between the bump 150 and the contact 212 of the substrate 200 is the same as that described in FIG. 2.

Figure 9:
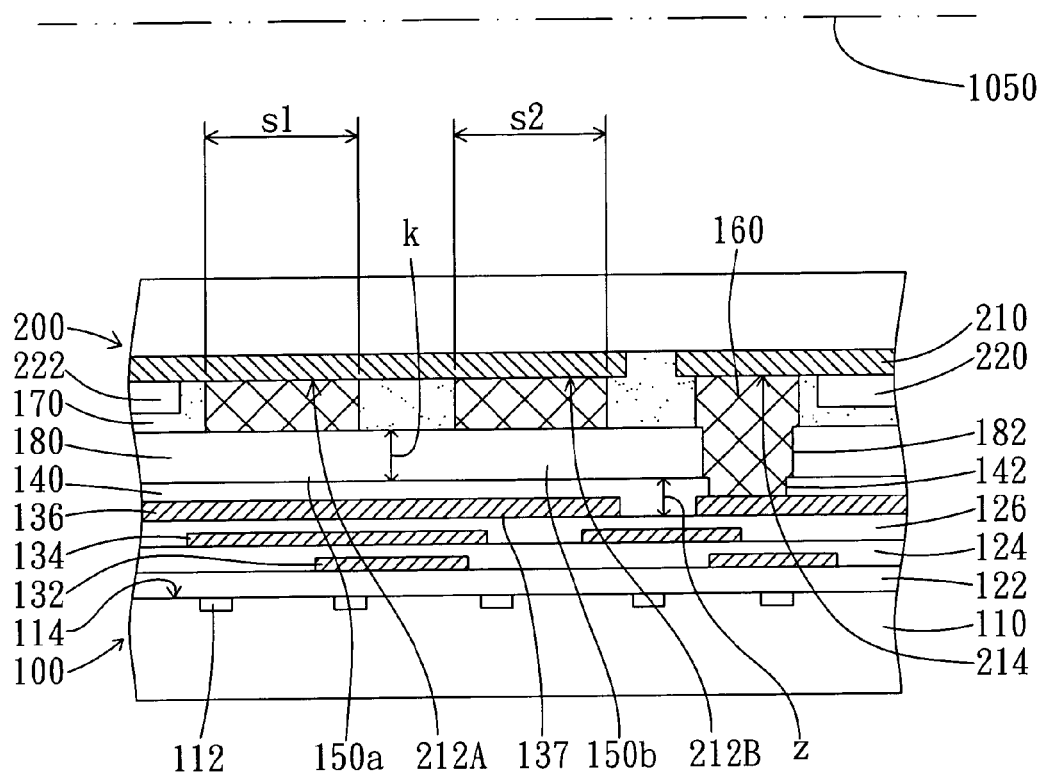

Alternatively, referring to FIG. 9, multiple bumps 150a and 150b can be deposited on the polymer layer 180 on the passivation layer 140, wherein the bumps 150a and 150b are disconnected from the thin-film circuit 136. The bumps 150a and 150b are connected to the contacts 212A and 212B of the substrate 200, wherein the detail of the contacts between the bump 150a and the contact 212A of the substrate 200 and between the bump 150b and the contact 212B of the substrate 200 is the same as that described in FIG. 3.

Those skilled in the art should realize that the bonding by a bump and a solder paste can be employed in all of the above-mentioned chip packages, which can refer to FIGS. 1C, 2A, 3B and 3C.

2. Bump on Thick Metallization Circuit Layer of Semiconductor Chip being Bonded to Circuit Layer of Substrate FIG. 10 is a cross-sectional view showing a chip package before a semiconductor chip and substrate being assembled according to a first embodiment. Referring to FIG. 10, the bump 150 can be deposited on the thick metallization circuit layer 191 over the passivation layer 140.

Referring to FIG. 10, the semiconductor chip 100 includes a semiconductor substrate 110, multiple thin-film dielectric layers 122, 124 and 126, and multiple thin-film circuit layers 132, 134 and 136, and a passivation layer 140, which have same structures and materials as those described in FIG. 1. In FIG. 10, the semiconductor chip 100 includes a thick metallization circuit layer 190 on the passivation layer 140. The thick metallization circuit layer 190 is connected to the topmost thin-film circuit layer 136 through an opening 142 in the passivation layer. The thick metallization circuit layer has a thickness d greater than 1 μm and, preferably, greater than 3 μm. The thickness d of the thick metallization circuit layer 190 is greater than the thicknesses u1, u2 and u3 of the thin-film circuit layers 132, 134 and 136. The detail structure of the thick metallization circuit layer 190 is in the following paragraphs.

Referring to FIG. 10, the bumps 150 and 160 are simultaneously deposited on the thick metallization circuit layer 190 using same steps including screen printing or electroplating, for example. Therefore, the bumps 150 and 160 have a same metallization structure. The bump 150 has a thickness identical to that of the bump 160 and greater than 1 μm and, preferably, greater than 5 μm.

Referring to FIG. 10, the thick metallization circuit layer 190 includes a thick metallization circuit 191. A big-sized bump 150 can be deposited on the thick metallization circuit 191 and has a cross-sectional area substantially parallel to the active surface 114 of chip 100. This cross-sectional area of the bump 150 is greater than 30,000 μm$^2$, 80,000 μm$^2$ or 150,000 μm$^2$. This cross-sectional area of the bump 150 has an extending distance of greater than 500 μm, 800 μm or 1200 μm.

Referring to FIG. 10, the bump 150 can be joined to joined to the thick metallization circuit 191 with a large contact area. The mentioned large contact area is described as follows. In the first case, a plane 1000 parallel to the active surface 114 of the semiconductor substrate 110 is defined. The ratio of the area of "projecting the contact between the bump 150 and the thick metallization circuit 191 onto the plane 1000" to the area of "projecting the thick metallization circuit 191 onto the plane 1000" is greater than 0.5 or 0.8 or even equal to 1.

In the second case, the area of projecting the contact between the bump 150 and the thick metallization circuit 191 onto the plane 1000 is greater than 30,000 μm$^2$, 80,000 μm$^2$ or 150,000 μm$^2$. In the third case, the area of projecting the contact between the bump 150 and the thick metallization circuit 191 onto the plane 1000 has an extending distance of greater than 500 μm, 800 μm or 1200 μm. The bump 150 can be considered to be joined to the thick metallization circuit 191 with a large contact area if one of the above mentioned cases meets.

In this embodiment, as shown in FIGS. 10 and 11, the detail of the contact between the bump 150 and the thick metallization circuit 191 can refer to the detail of the contact between the bump 150 and the thin-film circuit 137 of the semiconductor chip 100 shown in FIGS. 1 and 2, which takes an example of the bump with the pattern of linear extension. The description concerning the contact between the bump 150 and the thick metallization circuit 191 can be clearly understood if the detail of the contact between the bump 150 and the thin-film circuit 137 of the semiconductor chip 100 shown in FIGS. 1A and 1B is referred to.

Referring to FIG. 10, the bump 150 can extend with various types, such as linear extension, curve extension, irregular extension with discontinuous bends, or branch-like extension. Alternatively, the area of projecting the bump 150 onto the plane 1000 may be circle-patterned, oval-patterned, or polygon-patterned.

The contact 192 of the thick metallization circuit 191 joined with the bump 150 may have the pattern matching that of the bump 150, such as pattern of linear extension, curve extension, irregular extension with discontinuous bends, or branch-like extension. Also, the contact 192 may have a circle pattern, an oval pattern or a polygon pattern.

FIG. 11 is a cross-sectional view showing a chip package created after bonding the semiconductor chip and the substrate shown in FIG. 10. After providing the semiconductor chip 100 and the substrate 200, the bumps 150 and 160 formed over the semiconductor chip 100 are joined to the contacts 212 and 214 of the substrate 200 respectively by soldering or Au—Au eutectic bonding. Next, a polymer 170 is filled into the gap between the semiconductor chip 100 and the substrate 200, covering the bumps 150 and 160.

Referring to FIG. 11, the bump 150 is joined to the contact 212 of the substrate 200 with a large area, described as follows. A plane 1000 parallel to the active surface 114 of the semiconductor chip 100 is defined. The pattern of projecting the contact between the bump 150 and the contact 212 of the substrate 200 onto the plane 1000 has an extending distance of greater than 500 μm, 800 μm or 1200 μm. The area of projecting the contact between the bump 150 and the contact 212 of the substrate 200 onto the plane 1000 is greater than 30,000 μm$^2$, 80,000 μm$^2$ or 150,000 μm$^2$. The bump 150 can be considered to be joined to the contact 212 of the substrate 200 with a large contact area if one of the above mentioned cases meets.

Referring to FIG. 11, the bump 150 is joined to the circuit 213 of the circuit layer 210. The ratio of the area of "projecting the contact between the bump 150 and the circuit 213 onto the plane 1050" to the area of "projecting the circuit 213 onto the plane 1050" is greater than 0.5 or 0.8, or even equal to 1.

Referring to FIG. 10A, before the chip 100 and substrate 200 are bounded, a solder paste 286 can be formed on the circuit layer 210 of the substrate 200. The solder paste 286 could includes tin, for example. Thereafter, the bumps 150 and 160 are attached onto the solder paste 286. Next, during a reflow process, the bumps 150 and 160 blend with the solder paste 286 and the blend solidifies to form multiple bulks 250 and 260 as shown in FIG. 11A. These bulks 250 and 260 connect the semiconductor chip 100 to the substrate 200.

The bumps 150 and 160 have a topmost solder layer adapted to be joined with the solder paste 286. Alternatively, the bumps 150 and 160 may have a topmost gold layer adapted to be joined with the solder paste 286. In this embodiment, the bulk 250 has a least cross-sectional area parallel to the active surface 114 of the semiconductor chip 100. The least cross-sectional area of the bulk 250 is at the bottom of the bulk 250, for example. The least cross-sectional area of the bulk 250 is greater than 30,000 μm$^2$, 80,000 μm$^2$ or 150,000 μm$^2$, and has an extending distance of greater than 500 μm, 800 μm or 1200 μm.

Referring to FIG. 11A, the area of projecting the contact between the bulk 250 and the thick metallization circuit 191 onto the plane 1000 is greater than 30,000 μm$^2$, 80,000 μm$^2$ or 150,000 μm$^2$ and has an extending distance of greater than 500 μm, 800 μm or 1200 μm.

Referring to FIG. 11A, the area of projecting the contact between the bulk 250 and the circuit layer 210 onto the plane 1000 is greater than 30,000 μm$^2$, 80,000 μm$^2$ or 150,000 μm$^2$ and has an extending distance of greater than 500 μm, 800 μm or 1200 μm.

Referring to FIG. 11A, the bulk 250 is joined to the circuit 213 of the circuit layer 210. The ratio of the area of "projecting the contact between the bulk 250 and the circuit 213 onto the plane 1050" to the area of "projecting the circuit 213 onto the plane 1050" is greater than 0.5 or 0.8, or even equal to 1. The ratio of the area of "projecting the contact between the bulk 250 and the thick metallization circuit 191 onto the plane 1000" to the area of "projecting the thick metallization circuit 191 onto the plane 1000" is greater than 0.5 or 0.8, or even equal to 1.

Referring to FIGS. 11 and 11A, the bump 150 and the bulk 250 can serve as signal transmission media for the internal elements of the semiconductor chip 100, for the internal elements of the substrate 200, or for the interconnection between the semiconductor chip 100 and the substrate 200. The following description takes multiple examples for the bump 150, which also can be employed for the bulk 250.

Referring to FIG. 11, the bump 150 serves as signal transmission media of the interconnection between the semiconductor chip 100 and substrate 200. An electronic signal can be transmitted from one of the electronic elements 112 of the semiconductor chip 100 to the substrate 200, sequentially passing the thin-film circuit layers 132, 134 and 136, penetrating through the passivation layer 140 and passing the thick metallization circuit 191 and the bump 150. Alternatively, an electronic signal can be transmitted from the substrate 200 to one of the electronic elements 112 of the semiconductor chip 100, sequentially passing the bump 150, thick metallization circuit 191 and thin-film circuit layers 136, 134 and 132.

Referring to FIG. 11, the bump 150 serves as signal transmission media for the internal elements in the semiconductor chip 100. An electronic signal can be transmitted from one of the electronic elements 112 of the semiconductor chip 100 to the other one thereof, sequentially passing the thin-film circuit layers 132, 134 and 136, thick metallization circuit 191, bump 150, and the circuit layer 210 of the substrate 200, with horizontally transmitted via the thick metallization circuit 191, bump 150, and the circuit layer 210 of the substrate 200, and then sequentially passing the thin-film circuit layers 136, 134 and 132.

Furthermore, the electronic signal can be optionally transmitted into the substrate 200 from the bump 150 when being transmitted from one of the electronic elements 112 of the semiconductor chip 100 to the other one thereof. The bump 150 serves as the signal transmission media for the internal elements in the semiconductor chip 100, and for the interconnection between the semiconductor chip 100 and substrate 200.

Referring to FIG. 11, the bump 150 serves as signal transmission media for the internal elements in the substrate 200.

An electronic signal can be transmitted from one part of the substrate 200 to the other part thereof, passing the circuit layer 210 of the substrate 200, the bump 150 and the thick metallization circuit 191, with horizontally transmitted via the circuit layer 210 of the substrate 200, the bump 150 and the thick metallization circuit 191. Furthermore, the electronic signal can be optionally transmitted into the semiconductor chip 100 from the bump 150 when being transmitted from one part of the substrate 200 to the other part thereof. The bump 150 serves as the signal transmission media for the internal elements in the substrate 200 and for the interconnection between the semiconductor chip 100 and substrate 200.

Referring to FIG. 11, through the bump 160, an electronic signal can be transmitted from the semiconductor chip 100 to the substrate 200 or transmitted from the substrate 200 to the semiconductor chip 100.

Referring to FIG. 11, the bump 150 not only horizontally transmits an electronic signal but also vertically transmits the electronic signal between the semiconductor chip 100 and substrate 200. The bump 150 is joined to the thick metallization circuit 191 with a large contact area and joined to the contact 212 of the substrate 200 with a large contact area. Therefore, the performance for electrical connection between the semiconductor chip 100 and the substrate 200 can be enhanced and noise can be reduced.

Alternatively, referring to FIG. 11, the bump 150 and thick metallization circuit 191 can serve as a power bus. The bump 150 and thick metallization circuit 191 can be connected to an internal power bus in the semiconductor chip 100, and to an internal power bus in the substrate 200. The bump 150 is joined to the thick metallization circuit 191 with a large contact area and joined to the circuit layer 210 of the substrate 200 with a large contact area. As a result, the appearance of the power bus of the semiconductor chip 100 providing an unstable power voltage due to being interfered by noise can be diminished, so the semiconductor chip 100 can provide a stable power voltage.

Also, referring to FIG. 11, the bump 150 and thick metallization circuit 191 can also serves as a ground bus. The bump 150 and thick metallization circuit 191 can be connected to an internal ground bus in the semiconductor chip 100, and to an internal ground bus in the substrate 200. The bump 150 is joined to the thick metallization circuit 191 with a large contact area and joined to the circuit layer 210 of the substrate 200 with a large contact area. As a result, the appearance of the ground bus of the semiconductor chip 100 providing an unstable ground voltage due to being interfered by noise can be diminished, so the semiconductor chip 100 can provide a stable ground voltage.

In the FIGS. 10 and 11, the thick metallization circuit layer 191 is joined with only one bump 150 with a large contact area. However, the thick metallization circuit layer 191 can also be joined to multiple bumps 150a and 150b with large contact areas, as shown in FIG. 12. FIG. 12 is a cross-sectional view showing another chip package according to the first embodiment.

Referring to FIG. 12, the bumps 150a and 150b can extend with various types, such as the pattern with linear extension, curve extension, irregular extension with discontinuous bends, or branch-like extension. Alternatively, the area of projecting the bump 150 onto the plane 1000 may be circle-patterned, oval-patterned, or polygon-patterned.

The contacts 192a and 192b of the thick metallization circuit 191 connected to the bumps 150a and 150b may have the pattern matching that of the bumps 150a and 150b, such as pattern of linear extension, curve extension, irregular extension with discontinuous bends, or branch-like extension. Also, the contacts 192a and 192b may have a circle pattern, an oval pattern or a polygon pattern. The contacts 212A and 212B of the substrate 200 connected to the bumps 150a and 150b may have the pattern matching that of the bumps 150a and 150b, such as pattern of linear extension, curve extension, irregular extension with discontinuous bends, or branch-like extension. Also, the contacts 212A and 212B may have a circle pattern, an oval pattern or a polygon pattern.

Referring to FIG. 12, the ratio of the total area of "projecting the contact between the bumps 150a and 150b and the thick metallization circuit 191 onto the plane 1000" to the area of "projecting the thick metallization circuit layer 191 onto the plane 1000" is greater than 0.5 or 0.8. The ratio of the total area of projecting the contact between the bumps 150a and 150b and the circuit 213 of the circuit layer 210 onto the plane 1050" to the area of "projecting the circuit 213 of circuit layer 210 onto the plane 1050" is greater than 0.5 or 0.8.

Referring to FIG. 12, the area of projecting the contact between the thick metallization circuit 191 and the bump 150a onto the plane 1000 is greater than 30,000 $\mu m^2$, 80,000 $\mu m^2$, or 150,000 $\mu m^2$. The area of projecting the contact between the thick metallization circuit 191 and the bump 150b onto the plane 1000 is greater than 30,000 $\mu m^2$, 80,000 $\mu m^2$, or 150,000 $\mu m^2$.

Alternatively, the area of projecting the contact between the thick metallization circuit 191 and one of the bumps 150a and 150b onto the plane 1000 is greater than 30,000 $\mu m^2$, 80,000 $\mu m^2$, or 150,000 $\mu m^2$, but the area of projecting the contact between the thick metallization circuit 191 and the other one of the bump 150a and 150b is less than 30,000 $\mu m^2$.

Referring to FIG. 12, the area of projecting the contact between the thick metallization circuit 191 and the bump 150a onto the plane 1000 has an extending distance of greater than 500 μm, 800 μm, or 1200 μm. The area of projecting the contact between the thick metallization circuit 191 and the bump 150b onto the plane 1000 has an extending distance of greater than 500 μm, 800 μm, or 1200 μm.

Alternatively, the area of projecting the contact between the thick metallization circuit 191 and only one of the bumps 150a and 150b onto the plane 1000 has an extending distance of greater than 500 μm, 800 μm, or 1200 μm.

Referring to FIG. 12, the area of projecting the contact between the contact 212A of the substrate 200 and the bump 150a onto the plane 1000 is greater than 30,000 $\mu m^2$, 80,000 $\mu m^2$, or 150,000 $\mu m^2$. The area of projecting the contact between the contact 212B of the substrate 200 and the bump 150b onto the plane 1000 is greater than 30,000 $\mu m^2$, 80,000 $\mu m^2$, or 150,000 $\mu m^2$.

Alternatively, the area of projecting the contact between only one of the contacts 212A and 212B of the substrate 200 and only one of the bumps 150a and 150b onto the plane 1000 is greater than 30,000 $\mu m^2$, 80,000 $\mu m^2$, or 150,000 $\mu m^2$.

Referring to FIG. 12, the area of projecting the contact between the contact 212A of the substrate 200 and the bump 150a onto the plane 1000 has an extending distance of greater than 500 μm, 800 μm, or 1200 μm. The area of projecting the contact between the contact 212B of the substrate 200 and the bump 150b onto the plane 1000 has an extending distance of greater than 500 μm, 800 μm, or 1200 μm.

Alternatively, the area of projecting the contact between only one of the contacts 212A and 212B of the substrate 200 and only one of the bumps 150a and 150b onto the plane 1000 has an extending distance of greater than 500 μm, 800 μm, or 1200 μm.

Alternatively, referring to FIG. 12B, the bumps 150a and 150b can be attached to the substrate 200 with a solder paste 286, which mechanism can refer to the description concerning FIGS. 10A and 11A. After a reflow process, the bumps 150a and 150b blend with the solder paste 286 and the blend solidifies to form multiple bulks 250A and 250B.

The ratio of the total area of "projecting the contact between the thick metallization circuit 191 and the bulks 250A and 250B onto the plane 1000" to the area of "projecting the thick metallization circuit 191 onto the plane 1000" is greater than 0.5 or 0.8. The ratio of the total area of projecting the contact between the circuit 213 of the circuit layer 210 and the bulks 250A and 250B onto the plane 1050" to the area of "projecting the circuit 213 of the circuit layer 210 onto the plane 1050" is greater than 0.5 or 0.8.

Referring to FIG. 12B, the area of projecting the contact between the thick metallization circuit 191 and the bulk 250A onto the plane 1000 is greater than 30,000 $\mu m^2$, 80,000 $\mu m^2$, or 150,000 $\mu m^2$. The area of projecting the contact between the thick metallization circuit 191 and the bulk 250B onto the plane 1000 is greater than 30,000 $\mu m^2$, 80,000 $\mu m^2$, or 150,000 $\mu m^2$.

Alternatively, the area of projecting the contact between the thick metallization circuit 191 and one of the bulks 250A and 250B onto the plane 1000 is greater than 30,000 $\mu m^2$, 80,000 $\mu m^2$, or 150,000 $\mu m^2$, but the area of projecting the contact between the thick metallization circuit 191 and the other one of the bulks 250A and 250B onto the plane 1000 is less than 30,000 $\mu m^2$.

Referring to FIG. 12B, the area of projecting the contact between the thick metallization circuit 191 and the bulk 250A onto the plane 1000 has an extending distance of greater than 500 μm, 800 μm, or 1200 μm. The area of projecting the contact between the thick metallization circuit 191 and the bulk 250B onto the plane 1000 has an extending distance of greater than 500 μm, 800 μm, or 1200 μm.

Alternatively, the area of projecting the contact between the thick metallization circuit 191 and one of the bulks 250A and 250B onto the plane 1000 has an extending distance of greater than 500 μm, 800 μm, or 1200 μm, but the area of projecting the contact between the thick metallization circuit 191 and the other one of the bulks 250A and 250B onto the plane 1000 has an extending distance of less than 500 μm.

Referring to FIG. 12B, the area of projecting the contact between the circuit layer 210 of the substrate 200 and the bulk 250A onto the plane 1000 is greater than 30,000 $\mu m^2$, 80,000 $\mu m^2$, or 150,000 $\mu m^2$. The area of projecting the contact between the circuit layer 210 of the substrate 200 and the bulk 250B onto the plane 1000 is greater than 30,000 $\mu m^2$, 80,000 $\mu m^2$, or 150,000 $\mu m^2$.

Alternatively, the area of projecting the contact between the circuit layer 210 of the substrate 200 and one of the bulks 250A and 250B onto the plane 1000 is greater than 30,000 μm2, 80,000 μm2, or 150,000 μm2, but the area of projecting the contact between the circuit layer 210 of the substrate 200 and the other one of the bulks 250A and 250B onto the plane 1000 is less than 30,000 μm2.

Referring to FIG. 12B, the area of projecting the contact between the circuit layer 210 of the substrate 200 and the bulk 250A onto the plane 1000 has an extending distance of greater than 500 μm, 800 μm, or 1200 μm. The area of projecting the contact between the circuit layer 210 of the substrate 200 and the bulk 250B onto the plane 1000 has an extending distance of greater than 500 μm, 800 μm, or 1200 μm.

Alternatively, the area of projecting the contact between the circuit layer 210 of the substrate 200 and one of the bulks 250A and 250B onto the plane 1000 has an extending distance of greater than 500 μm, 800 μm, or 1200 μm, but the area of projecting the contact between the circuit layer 210 of the substrate 200 and the other one of the bulks 250A and 250B onto the plane 1000 has an extending distance of less than 500 μm.

Referring to FIG. 12B, the bulk 250A has a least cross-sectional area parallel to the active surface 114 of the semiconductor chip 100. The least cross-sectional area of the bulk 250A is at the bottom of the bulk 250A, for example. The least cross-sectional area of the bulk 250A is greater than 30,000 $\mu m^2$, 80,000 $\mu m^2$ or 150,000 $\mu m^2$ and has an extending distance of greater than 500 μm, 800 μm or 1200 μm.

The bulk 250B has a least cross-sectional area parallel to the active surface 114 of the semiconductor chip 100. The least cross-sectional area of the bulk 250B is at the bottom of the bulk 250B, for example. The least cross-sectional area of the bulk 250B is greater than 30,000 $\mu m^2$, 80,000 $\mu m^2$ or 150,000 $\mu m^2$ and has an extending distance of greater than 500 μm, 800 μm or 1200 μm.

Alternatively, one of the bulks 250A and 250B has a least cross-sectional area of greater than 30,000 μm2, 80,000 μm2 or 150,000 μm2, but the other one of the bulks 250A and 250B has a least cross-sectional area of less than 30,000 μm2. Moreover, one of the bulks 250A and 250B has a least cross-sectional area having an extending distance of greater than 500 μm, 800 μm or 1200 μm, but the other one of the bulks 250A and 250B has a least cross-sectional area having an extending distance of less than 500 μm.

Referring to FIGS. 12 and 12B, the bumps 150a and 150b and the bulks 250A and 250B can serve as signal transmission media for the internal elements of the semiconductor chip 100, for the internal elements of the substrate 200, or for the interconnection between the semiconductor chip 100 and the substrate 200. The following description takes multiple examples for the bumps 150a and 150b, which can be employed for the bulks 250A and 250B.

Referring to FIG. 12, the bumps 150a and 150b serve as signal transmission media of the interconnection between the semiconductor chip 100 and substrate 200. An electronic signal can be transmitted from one of the electronic elements 112 of the semiconductor chip 100 to the substrate 200, sequentially passing the thin-film circuit layers 132, 134 and 136, penetrating through the passivation layer 140 and passing the thick metallization circuit 191 and bumps 150a and 150b. Alternatively, an electronic signal can be transmitted from the substrate 200 to one of the electronic elements 112 of the semiconductor chip 100, sequentially passing the bumps 150a and 150b, thick metallization circuit 191, and thin-film circuit layers 136, 134 and 132.

Referring to FIG. 12, the bumps 150a and 150b serve as signal transmission media for the internal elements of the semiconductor chip 100. An electronic signal can be transmitted from one of the electronic elements 112 of the semiconductor chip 100 to the other one thereof, sequentially passing the thin-film circuit layers 132, 134, and 136, thick metallization circuit 191, bumps 150a and 150b, and the circuit layer 210 of the substrate 200, with horizontally transmitted via the thick metallization circuit 191, bumps 150a and 150b, and the circuit layer 210 of the substrate 200, and then sequentially passing the thin-film circuit layers 136, 134 and 132.

Furthermore, the electronic signal can be optionally transmitted to the substrate 200 from the bumps 150a and 150b when being transmitted from one of the electronic elements 112 of the semiconductor chip 100 to the other one thereof. The bumps 150a and 150b serve as the signal transmission media for the internal elements in the semiconductor chip 100, and for the interconnection between the semiconductor chip 100 and substrate 200.

Referring to FIG. 12, the bumps 150a and 150b serve as the signal transmission media for the internal elements in the substrate 200. An electronic signal can be transmitted from one part of the substrate 200 to the other part thereof, passing the circuit layer 210 of the substrate 200, the bumps 150a and 150b and the thick metallization circuit 191, with horizontally transmitted via the circuit layer 210 of the substrate 200, the bumps 150a and 150b and the thick metallization circuit 191. Furthermore, the electronic signal can be optionally transmitted to the semiconductor chip 100 from the bumps 150a and 150b when being transmitted from one part of the substrate 200 to the other part thereof. The bumps 150a and 150b serve as the signal transmission media for the internal elements in the substrate 200 and for the interconnection between the semiconductor chip 100 and substrate 200.

Referring to FIG. 12, through the bump 160, an electronic signal can be transmitted from the semiconductor chip 100 to the substrate 200 or transmitted from the substrate 200 to the semiconductor chip 100.

Referring to FIG. 12, the bumps 150a and 150b not only horizontally transmit an electronic signal but also vertically transmit the electronic signal between the semiconductor chip 100 and substrate 200. The bumps 150a and 150b are joined to the thick metallization circuit 191 with a large contact area and joined to the contact 212 of the substrate 200 with a large contact area. Therefore, the performance for electrical connection between the semiconductor chip 100 and the substrate 200 can be enhanced and noise can be reduced.

Alternatively, referring to FIG. 12, the thick metallization circuit 191 and bumps 150a and 150b can also serve as power buses. The bumps 150a and 150b can be connected to an internal power bus in the semiconductor chip 100, and to an internal power bus in the substrate 200. The bumps 150a and 150b are joined to the thick metallization circuit 191 with a large contact area and joined to the circuit layer 210 of the substrate 200 with a large contact area. As a result, the appearance of the power bus of the semiconductor chip 100 providing an unstable power voltage due to being interfered by noise can be diminished, so the semiconductor chip 100 can provide a stable power voltage.

Alternatively, referring to FIG. 12, the thick metallization circuit 191 and bumps 150a and 150b can also serve as ground buses. The bumps 150a and 150b can be connected to an internal ground bus in the semiconductor chip 100, and to an internal ground bus in the substrate 200. The bumps 150a and 150b are joined to the thick metallization circuit 191 with a large contact area and joined to the circuit layer 210 of the substrate 200 with a large contact area. As a result, the appearance of the ground bus of the semiconductor chip 100 providing an unstable ground voltage due to being interfered by noise can be diminished, so the semiconductor chip 100 can provide a stable ground voltage.

Figure 13:
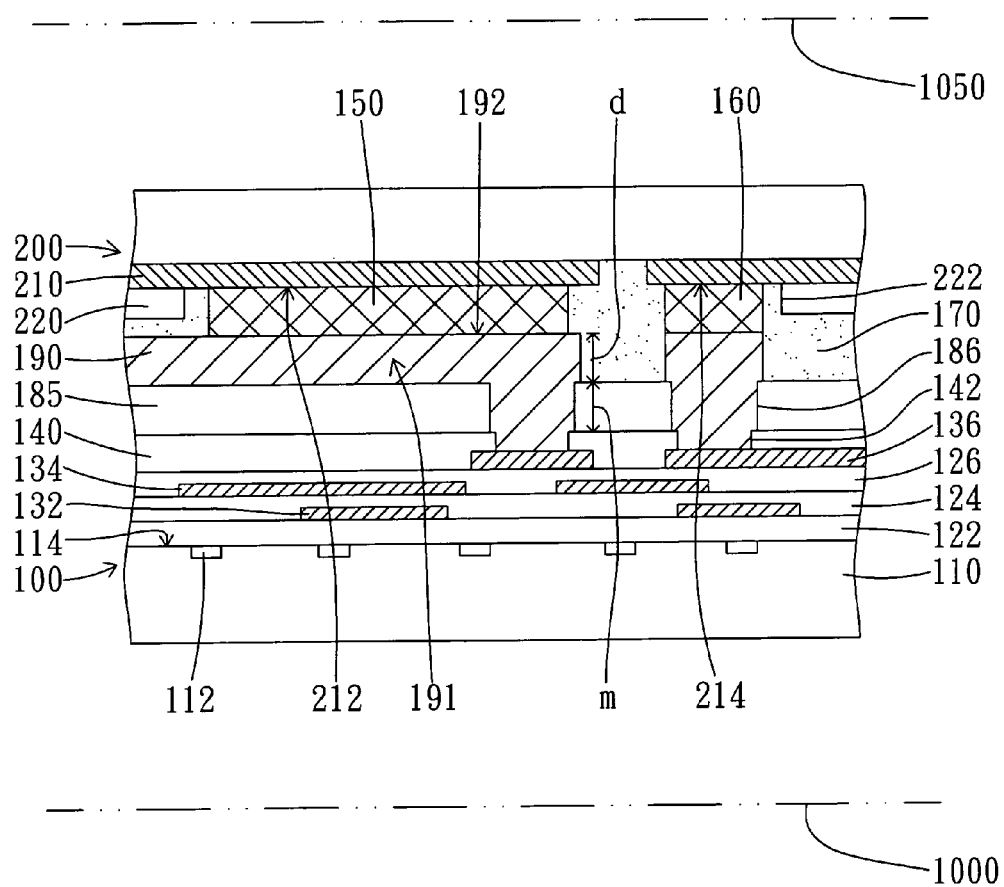
Figure 14:
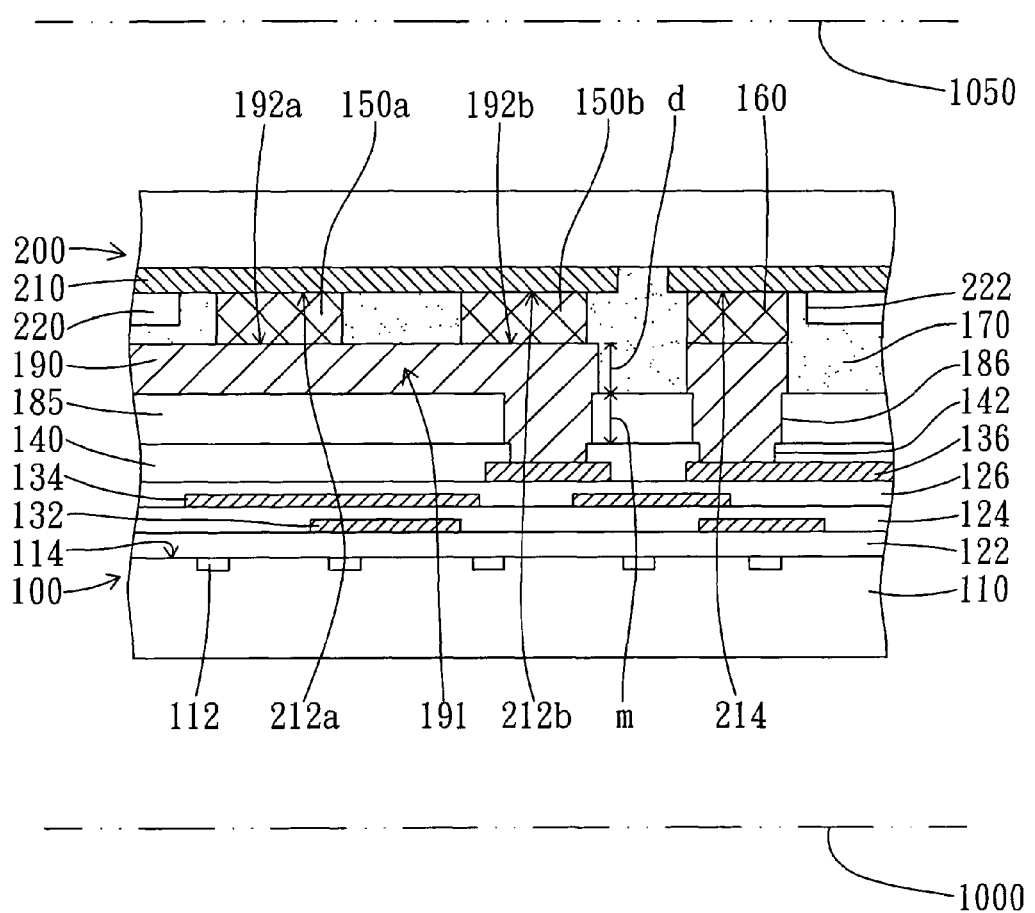

FIGS. 13 and 14 are cross-sectional views showing chip packages according to the first embodiment. Referring to FIGS. 13 and 14, a polymer layer 185 can be deposited on the passivation layer 140. The thick metallization circuit layer 190 can be formed on the polymer layer 185.

Referring to FIG. 13, a polymer layer 185 can be first deposited on the passivation layer 140. Multiple openings 182 in the polymer layer 180 are substantially aligned to the openings 142 in the passivation layer 140 and expose the thin-film circuit layer 136. Next, the thick metallization circuit layer 190 can be formed on the polymer layer 185 and connected to the thin-film circuit layer 136 through the openings 186 in the polymer layer 185 and the openings 142 in the passivation layer 140. Next, the bumps 150 and 160 can be deposited on the thick metallization circuit layer 190. The bumps 150 and 160 have a thickness of greater than 1 μm and, preferably, greater than 5 μm.

The bumps 150 and 160 are simultaneously deposited using same steps. Therefore, they have a same metallization structure and an identical thickness. The polymer layer 185 may have a thickness k of greater than 1 μm and could be polyimide (PI), benzocyclobutence (BCB), parylene, porous dielectric material or elastomer. Referring to FIG. 13, the detail of the contact between the bump 150 and the thick metallization circuit 191, the contact between the bump 150 and the circuit layer 210 of the substrate 200, and the electric function for the bump 150 can refer to FIGS. 10 and 11 and the corresponding description.

Referring to FIG. 14, a polymer layer 185 is formed on the passivation layer 140. Multiple bumps 150a and 150b are formed on the thick metallization circuit layer 190. The detail of the contacts between the bumps 150a and 150b and the thin-film circuit 137, the contacts between the bumps 150a and 150b and the circuit layer 210 of the substrate 200, and the electric function for the bumps 150a and 150b can refer to FIG. 12 and the corresponding description.

Figure 15:
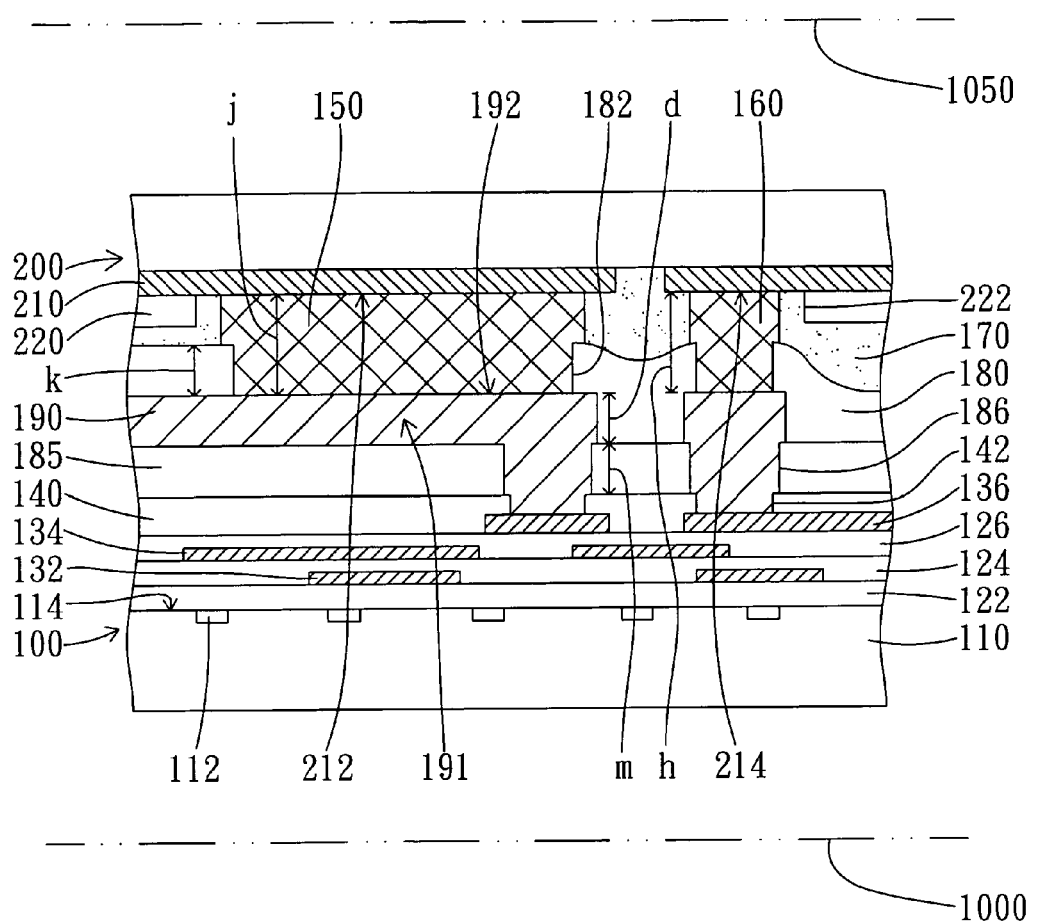
Figure 16:
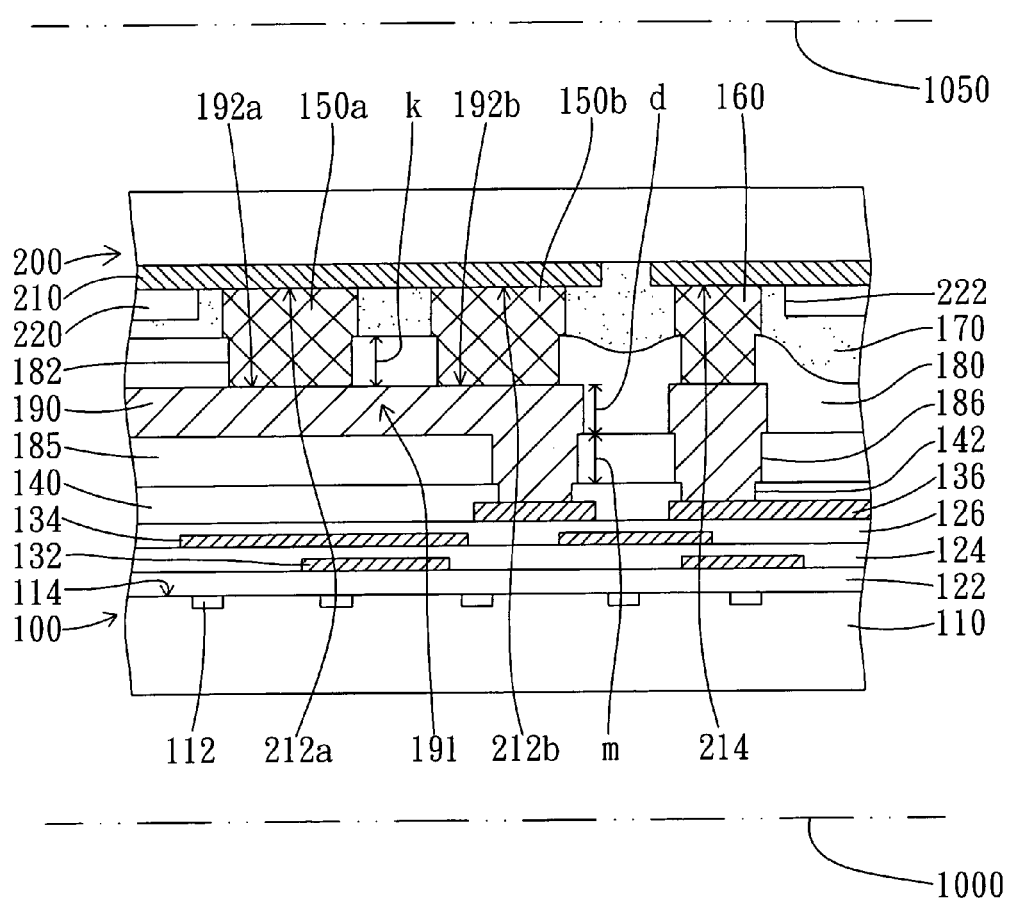

FIGS. 15 and 16 are cross-sectional views showing other chip packages according to the first embodiment. Referring to FIG. 15, after the thick metallization circuit layer 190 is deposited on the polymer layer 185, a polymer layer 180 is deposited on the thick metallization circuit layer 190. Multiple openings 182 in the polymer layer 180 expose the thick metallization circuit layer 190. The bumps 150 and 160 are deposited on the thick metallization circuit layer 190 exposed by the openings 182 in the polymer layer 180. The bumps 150 and 160 have a thickness of greater than 1 μm and, preferably, greater than 5 μm.

The bumps 150 and 160 are simultaneously deposited using same steps. Therefore, they have a same metallization structure and an identical thickness. The polymer layer 180 may have a thickness k of greater than 1 μm and could be polyimide (PI), benzocyclobutence (BCB), parylene, porous dielectric material or elastomer. Referring to FIG. 15, the detail of the contact between the bump 150 and the thick metallization circuit 191, the contact between the bump 150 and the circuit layer 210 of the substrate 200, and the electric function for the bump 150 can refer to the previous embodiment shown in FIGS. 10 and 11.

Referring to FIG. 16, the semiconductor chip 100 is similar to that shown in FIG. 15 and can refer to the corresponding description. The only difference is that, in FIG. 16, multiple bumps 150a and 150b are deposited on the thick metallization circuit layer 191. The detail of the contacts between the bumps 150a and 150b and the thick metallization circuit 191, the contacts between the bumps 150a and 150b and the circuit layer 210 of the substrate 200, and the electric function for the bumps 150a and 150b can refer to FIG. 12 and the corresponding description.

Figure 17:
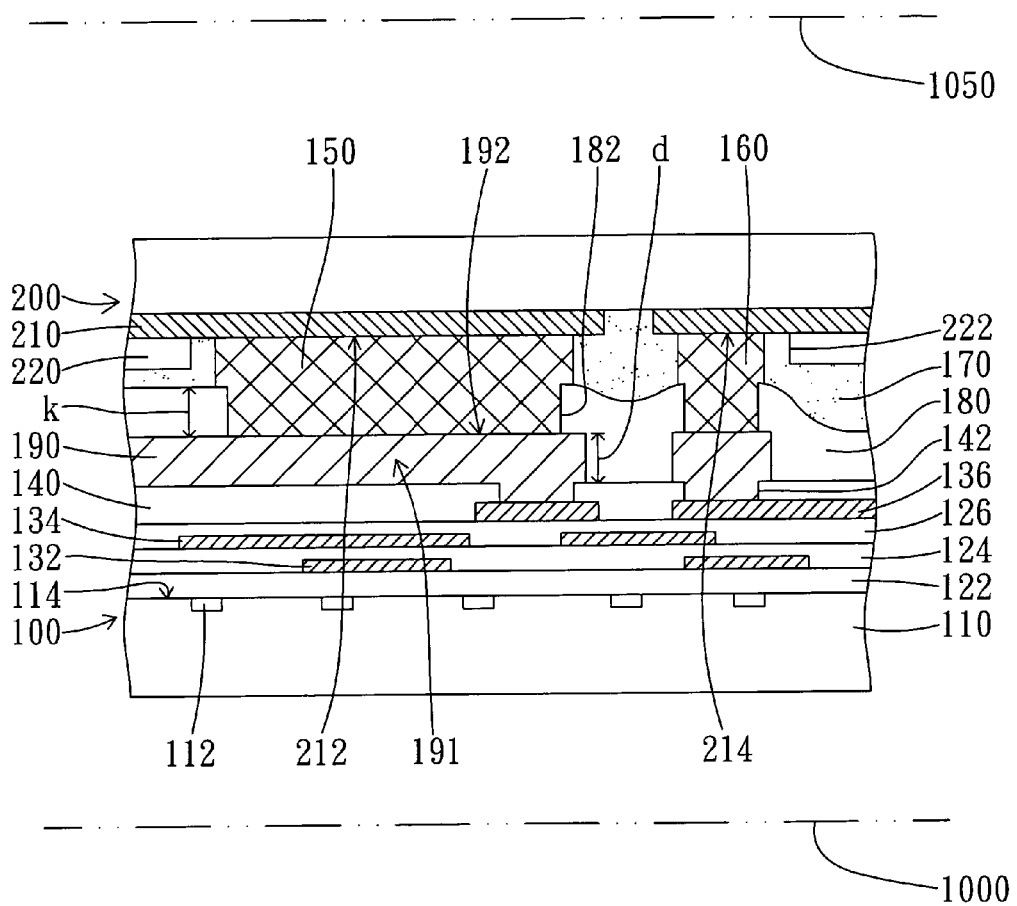
Figure 18:
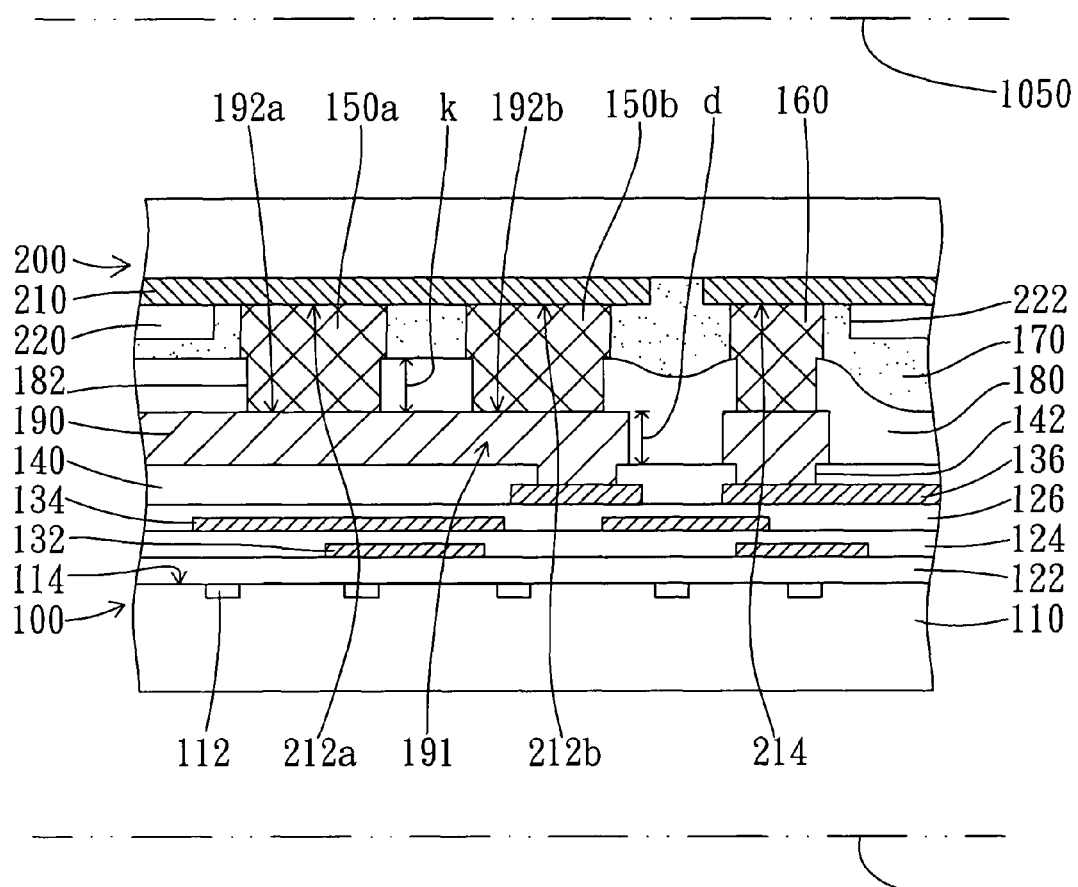

FIGS. 17 and 18 are cross-sectional views showing other chip packages according to the first embodiment. Referring to FIG. 17, the thick metallization circuit layer 190 is deposited on and in contact with the passivation layer 140. A polymer layer 180 is formed on the thick metallization circuit layer 190. Multiple openings 182 in the polymer layer 180 expose the thick metallization circuit layer 190. The bumps 150 and 160 are deposited on the thick metallization circuit layer 190 exposed by the openings in the in the polymer layer 180. The bumps 150 and 160 have a thickness of greater than 1 μm and, preferably, greater than 5 μm.

The bumps 150 and 160 are simultaneously deposited using same steps. Therefore, they have a same metallization structure and an identical thickness. The polymer layer 180 may have a thickness k of greater than 1 μm and could be polyimide (PI), benzocyclobutence (BCB), parylene, porous dielectric material or elastomer. The detail of the contact between the bump 150 and the thick metallization circuit 191, the contact between the bump 150 and the circuit layer 210 of the substrate 200, and the electric function for the bump 150 can refer to FIGS. 10 and 11 and the corresponding description.

Referring to FIG. 18, the semiconductor chip 100 is similar to that shown in FIG. 17 and can refer to the corresponding description. The only difference is that, in FIG. 18, multiple bumps 150*a* and 150*b* are deposited on the thick metallization circuit layer 191. The detail of the contacts between the bumps 150*a* and 150*b* and the thick metallization circuit 191, the contacts between the bumps 150*a* and 150*b* and the circuit layer 210 of the substrate 200, and the electric function for the bumps 150*a* and 150*b* can refer to the previous embodiment shown in FIG. 12.

Figure 19:
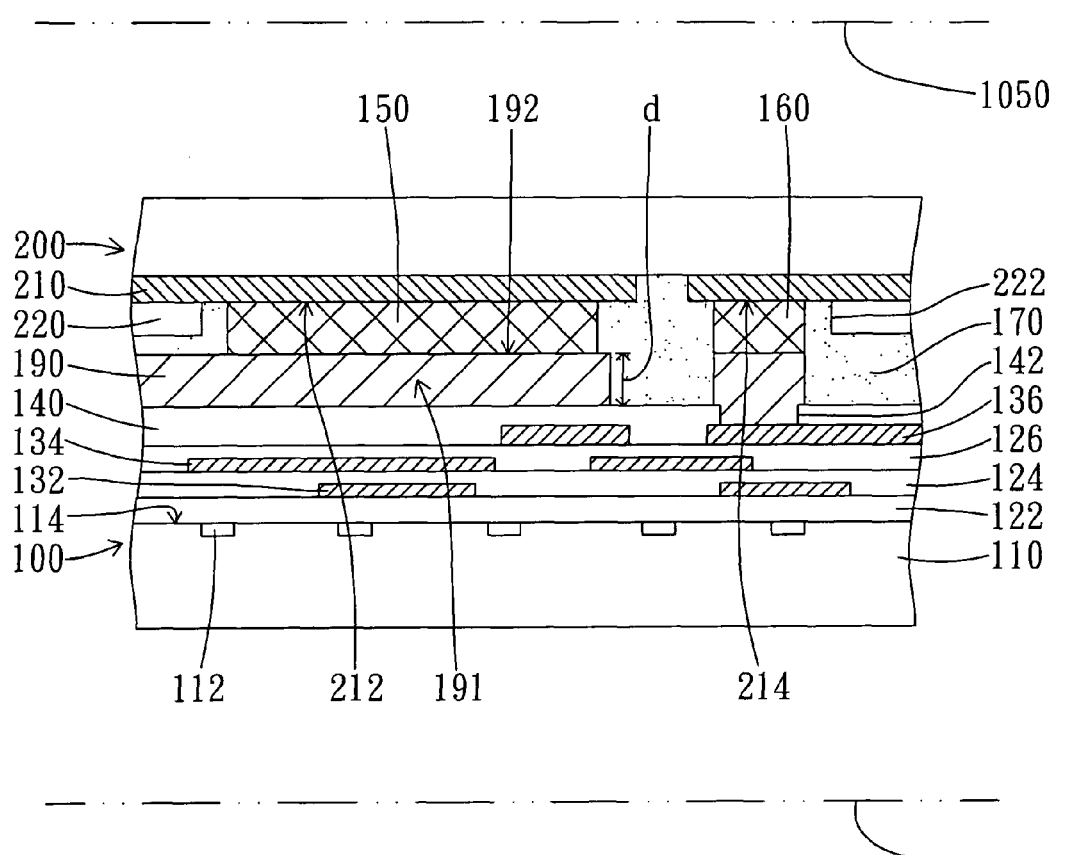

In FIGS. 10-18, the thick metallization circuit 191 is electrically connected to the topmost thin-film circuit layer 136. Alternatively, the thick metallization circuit 191 can be disconnected from the topmost thin-film circuit layer 136, as shown in FIG. 19. FIG. 19 is a cross-sectional view showing another chip package according to the first embodiment. The detail of the contact between the bump 150 and the circuit layer 210 of the substrate 200 is the same as that described in FIGS. 10 and 11.

Alternatively, multiple bumps can be deposited on the thick metallization circuit 191 shown in FIG. 19. The detail of the contact between the multiple bumps and the circuit layer 210 of the substrate 200 is the same as that described in FIG. 12. Alternatively, at least one polymer layer can be formed on the passivation layer 140 shown in FIG. 19, which can refer to FIGS. 13-18.

Figure 21:
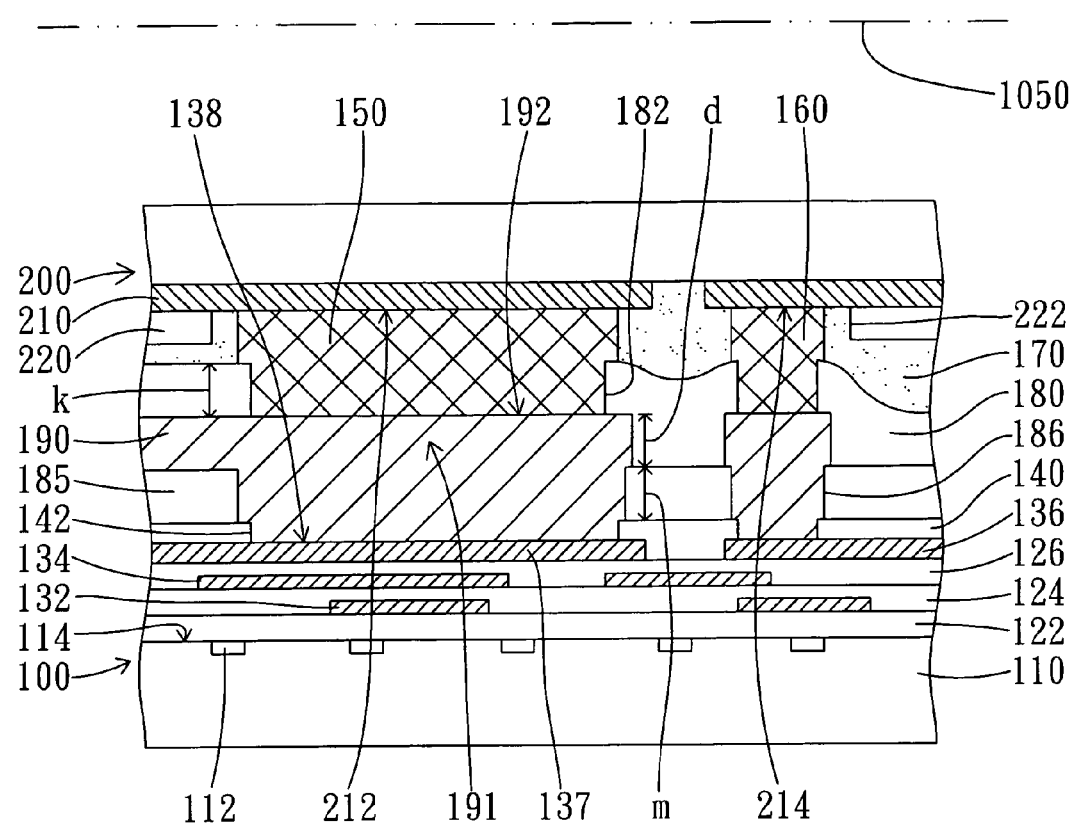

In FIGS. 10-18, the thick metallization circuit 191 is connected to the topmost thin-film circuit layer 136 with a small contact area. Alternatively, the thick metallization circuit layer 191 can be connected to the topmost thin-film circuit layer 136 with a large contact area, as shown in FIGS. 20 and 21. FIGS. 20 and 21 are cross-sectional views showing other chip packages according to the first embodiment.

Referring to FIG. 20, the thick metallization circuit layer 191 is connected to a contact 138 of thin-film circuit 136 with a large area. The contact 138 can extend with various types, such as linear extension, curve extension, irregular extension with discontinuous bends, or branch-like extension. Alternatively, the area of projecting the contact 138 onto the plane 1000 may be circle-patterned, oval-patterned, or polygon-patterned.

FIG. 20A is a plane view showing the pattern of projecting the contact 138 shown in FIG. 20 onto the plane 1000. Referring to FIG. 20A, the contact 138 has a pattern with linear extension.

Referring to FIG. 20A, the thin-film circuit 137 extends along the path 1200, such as from point p to point q. The ratio of the area (slash marked) of projecting the contact between the thin-film circuit 137 and the thick metallization circuit 191 onto the plane 1000 to the area (enclosed by a dotted line) of projecting the thin-film circuit 137 onto the plane 1000 is greater than 0.5 or 0.8, or even equal to 1.

The area (slash marked) of the thin-film circuit 137 exposed by the opening 142 in the passivation layer 140 is greater than 30,000 μm$^2$, 80,000 μm$^2$, or 150,000 μm$^2$. The thick metallization circuit 191 is connected to the thin-film circuit 137 exposed by the opening 142 in the passivation layer 140. The area (slash marked) of projecting the contact between the thick metallization circuit 191 and the thin-film circuit 137 onto the plane 1000 is greater than 30,000 μm$^2$, 80,000 μm$^2$, or 150,000 μm$^2$. The area of projecting the contact (slash marked) between the thick metallization circuit 191 and the thin-film circuit 137 onto the plane 1000 has an extending distance (along the path 1200 from point v to point w) of greater than 500 μm, 800 μm, or 1200 μm.

Referring to FIG. 20, the bump 150 is deposited on the thick metallization circuit 191, wherein the bump 150 is deposited above the contact 138. Alternatively, the bump 150 can be deposited on anywhere of the thick metallization circuit 191. The detail of the contact between the bump 150 and the thick metallization circuit 191, the contact between the bump 150 and the circuit layer 210 of the substrate 200 can refer to the previous embodiment shown in FIGS. 10 and 11. Alternatively, multiple bumps can be deposited on the thick metallization circuit 191 shown in FIG. 20. The detail of the contact between the multiple bumps and the thick metallization circuit 191, the contact between the multiple bumps and the circuit layer 210 of the substrate 200 can refer to the previous embodiment shown in FIG. 12.

Referring to FIG. 21, the thick metallization circuit layer 191 is connected to the thin-film circuit 137 with a large contact area. The detail of the contact between the thick metallization circuit 191 and the thin-film circuit 137 can refer to the previous embodiment shown in FIG. 20. Multiple polymer layers 180 and 185 can be formed on the passivation layer 140, which can refer to FIGS. 13-18 and the corresponding description.

Referring to FIGS. 20 and 21, the thick metallization circuit 191 is connected to the thin-film circuit 137 with a large area. Therefore, the performance for electrical connection between the semiconductor chip 100 and the substrate 200 can be enhanced and noise can be reduced.

Those skilled in the art should realize that the bonding by a bump and a solder paste can be employed in all of the above-mentioned chip packages, which can refer to FIGS. 10A, 11A, 12A and 12B.

3. Metallization Structure of Bumps

FIG. 22 is a cross-sectional view showing a metallization structure of a bump according to the first embodiment. The bumps 150, 150*a* and 150*b* include a lower metal layer 1511 and an upper metal layer 1516. The lower metal layer 1511 can be deposited on and in contact with the thin-film circuit 137, as shown in FIGS. 1-5, or the thick metallization circuit 191, as shown in FIGS. 10-21. The upper metal layer 1516 is deposited on the lower metal layer 1511. The lower metal layer 1511, such as titanium-tungsten alloy, titanium nitride, tantalum or tantalum nitride, could be deposited by sputtering, for example. The upper metal layer 1516, such as gold, could be deposited by electroplating, for example. The upper metal layer 1516 has a thickness j1 of greater than 1 μm and, preferably, greater than 5 μm. The bump 160 can be deposited with the same metallization structure as the bumps 150, 150*a* and 150*b*, as shown in FIG. 22.

FIG. 23 is a cross-sectional view showing another metallization structure of a bump according to the first embodiment. Referring to FIG. 23, the bumps 150, 150*a* and 150*b* include a lower metal layer 1521 and a upper metal layer 1526, wherein the upper metal layer 1526 is deposited on the lower metal layer 1521. The lower metal layer 1521 includes an adhesion/barrier layer 1522, a copper layer 1523 and a nickel layer 1524. The adhesion/barrier layer 1522 is deposited on and in contact with the thin-film circuit 137, as shown in FIGS. 1-5, or the thick metallization circuit 191, as shown in FIGS. 10-21. The copper layer 1523 is formed on the adhesion/barrier layer 1522 and the nickel layer 1524 is formed on the copper layer 1523. The adhesion/barrier layer could be chromium, titanium, titanium-tungsten alloy, titanium nitride, tantalum or tantalum nitride. Alternatively, the adhesion/barrier layer 1522 can be formed by depositing a chromium layer and a chromium-copper-alloy layer, wherein the chromium-copper-alloy layer is deposited on chromium layer. The adhesion/barrier layer 1522 can be formed by sputtering. The copper layer 1523 and nickel layer 1524 can be formed by electroplating. The upper metal layer 1526 is deposited on the nickel layer 1524 of the lower metal layer 1521. The upper metal layer 1526 could be a solder material, such as tin-lead alloy, tin, tin-silver alloy or tin-silver-copper alloy and could be formed by electroplating or screen printing process, for example. The upper metal layer 1526 has a thickness j2 of greater than 1 µm and, preferably, greater than 5 µm. The bump 160 can be deposited with the same metallization structure as the bumps 150, 150a and 150b, as shown in FIG. 23.

4. Metallization Structure of Contact of Substrate

FIG. 24 is a cross-sectional view showing a metallization structure of a circuit of a substrate according to the first embodiment. The mentioned contact 212 of substrate 200 is a structure with multiple metal layers. The mentioned contact 212 of substrate 200 has an upper metal layer 2116 joined with the bumps 150 and 160. The upper metal layer 2116 could be gold or copper. Alternatively, the upper metal layer 2116 could be a solder material, such as tin-lead alloy, tin, tin-silver alloy, or tin-silver-copper alloy. The upper metal layer 2116 is formed on the lower metal layer 2111 by electroplating, for example. The contact 214 of the substrate 200 can be deposited with the same metallization structure as the contact 212, as shown in FIG. 24.

In FIGS. 1-21, one method for bonding the bump 150 and the contact 212 of substrate 200 includes Au—Au eutectic bonding. That is, the upper metal layer of the bump 150 is gold, and the upper layer of the contact 212 of substrate 200 is gold. When the semiconductor chip 100 and the substrate 200 are bonded, the upper metal layer of the bump 150 is joined with the upper metal layer of the contact 212 of the substrate 200 by gold-gold eutectic bonding. The bump 150 may have the metallization structure shown in FIG. 22.

The other one method for bonding the bump 150 and the contact 212 of substrate 200 is soldering. That is, the bump 150 or the contact 212 of the substrate 200 may include a solder material to connect the semiconductor chip 100 and the substrate 200. Alternatively, a solder paste 286 can be formed on the circuit layer 212 of substrate 200 to join the bump 150 and the circuit layer 212.

The upper metal layer of the bump 150 can be a solder material and can be bonded to the contact 212 of substrate 200 by soldering. For example, the bump 150 has the metallization structure shown in FIG. 23, wherein the upper metal layer 1526 is a solder material. The upper metal layer 2116 of the contact 212 of the substrate 200 could be gold, copper, or a solder material. Alternatively, the contact 212 can be made of a single copper layer. Therefore, the upper metal layer 1526 of the bump 150 can be bonded to the contact 212 of the substrate 200 by soldering.

Alternatively, the upper metal layer 2116 of the contact 212 of the substrate 200 can be a solder material. The upper metal layer of the bump 150 can be gold, copper, or a soldering material. Therefore, the upper metal layer of the bump 150 can be bonded to the contact 212 of the substrate 200 by soldering.

Alternatively, a solder paste 286 can be formed on the circuit layer 210 of the substrate 200. The upper metal layer of the bump 150 can be gold, copper, or a soldering material. Therefore, using a reflow process, the upper metal layer of the bump 150 may blend with the solder paste 286 and the blend solidifies to form a bulk 250.

5. Metal Structure of Thick Metallization Circuit

Figure 25:
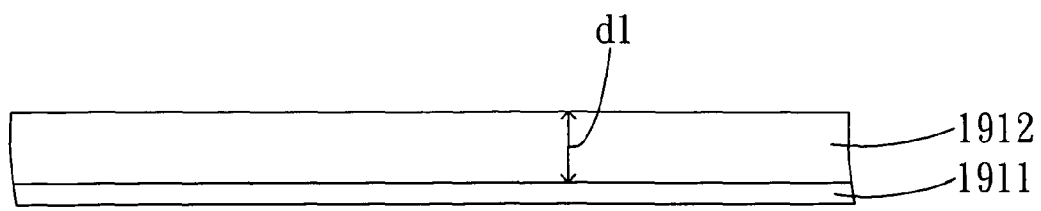

FIG. 25 is a cross-sectional view showing a metallization structure of the a thick metallization circuit layer according to the first embodiment. Referring to FIG. 25, the above-mentioned thick metallization circuit layer 190 includes metal layers 1911 and 1912. The metal layer 1911 can be formed on and in contact with the passivation layer 140, as shown in FIGS. 10-12 and FIGS. 17-20, or the polymer layer 185, as shown in FIGS. 13-16 and FIG. 21. The metal layer 1912 is formed on the metal layer 1911. In the embodiments as shown in FIG. 10-21, the bumps 150 and 160 are formed on the metal layer 1912. The metal layer 1911, such as titanium-tungsten alloy, titanium nitride, tantalum or tantalum nitride, could be formed by sputtering, for example. The metal layer 1912, such as Au, could be formed by electroplating, for example. The metal layer 1912 has a thickness d1 of greater than 1 µm and, preferably, greater than 3 µm.

Figure 26:
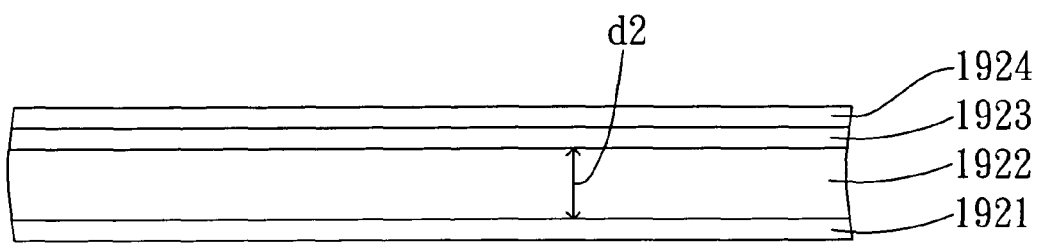

FIG. 26 is a cross-sectional view showing a metallization structure of a thick metallization circuit layer according to the first embodiment. The above-mentioned thick metallization circuit layer 190 includes an adhesion/barrier layer 1921, a copper layer 1922, a nickel layer 1923 and a gold layer 1924. The adhesion/barrier layer 1921 can be formed on and in contact with the passivation layer 140, as shown in FIGS. 10-12 and FIGS. 17-20, or the polymer layer 185, as shown in FIGS. 13-16 and FIG. 21. The copper layer 1922 is formed on the adhesion/barrier layer 1921. The nickel layer 1923 is formed on the copper layer 1922. The gold layer 1924 is formed on nickel layer 1923. In the embodiments as shown in FIGS. 10-21, the bumps 150 and 160 are deposited on the gold layer 1924. The copper layer 1922 has a thickness d2 of greater than 1 µm and, preferably, greater than 3 µm. The adhesion/barrier layer 1921 could be chromium, titanium, titanium-tungsten alloy, titanium nitride, tantalum, or tantalum nitride. Alternatively, the adhesion/barrier layer 1921 can be formed by sequentially depositing a chromium layer and depositing a chromium-copper-alloy layer on the chromium layer. The adhesion/barrier layer 1921 can be formed by sputtering, for example. The copper layer 1922, nickel layer 1923, and gold layer 1924 can be formed by electroplating, for example.

Figure 27:
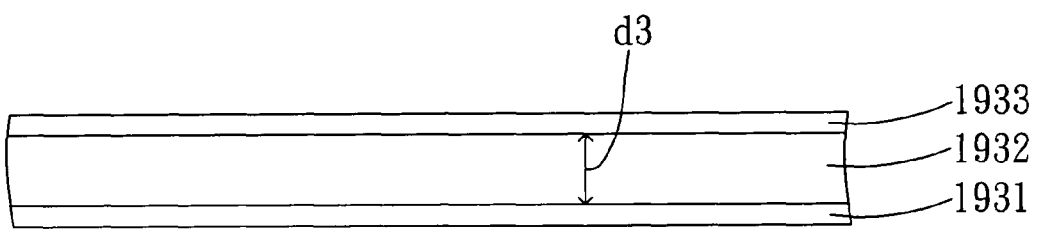

FIG. 27 is a cross-sectional view showing a metallization structure of a thick metallization circuit layer according to the first embodiment. The mentioned thick metallization circuit layer 190 includes an adhesion/barrier layer 1931, a copper layer 1932 and a nickel layer 1933. The adhesion/barrier layer 1931 can be formed on and in contact with the passivation layer 140, as shown in FIGS. 10-12 and FIGS. 17-20, or the polymer layer 185, as shown in FIGS. 13-16 and FIG. 21. The copper layer 1932 is formed on the adhesion/barrier layer 1931. The nickel layer 1933 is formed on the copper layer 1932. In the embodiments as shown in FIGS. 10-21, the bumps 150 and 160 are deposited on the nickel layer 1933. The copper layer 1922 has a thickness d3 of greater than 1 µm and, preferably, greater than 3 µm. The adhesion/barrier layer 1931 could be chromium, titanium, titanium-tungsten alloy, titanium nitride, tantalum, or tantalum nitride. Alternatively, the adhesion/barrier layer 1931 can be formed by sequentially depositing a chromium layer and depositing a chromium-copper-alloy layer on the chromium layer. The adhesion/barrier layer 1931 can be formed by sputtering, for example. The copper layer 1932 and nickel layer 1933 can be formed by electroplating, for example.

Figure 28:
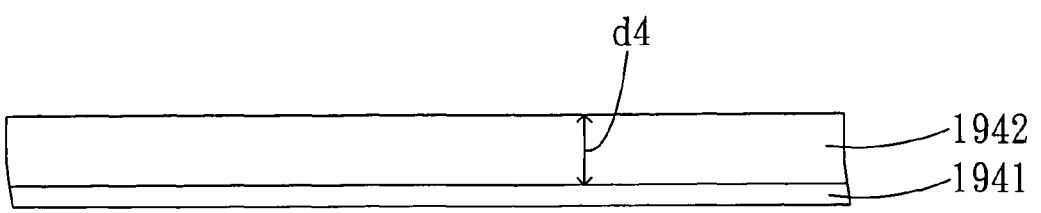

FIG. 28 is a cross-sectional view showing a metallurgy structure of a thick metallization circuit layer according to the first embodiment. The above-mentioned thick metallization circuit layer 190 includes an adhesion/barrier layer 1941 and a copper layer 1942. The adhesion/barrier layer 1941 can be formed on and in contact with the passivation layer 140, as shown in FIGS. 10-12 and FIGS. 17-20, or the polymer layer 185, as shown in FIGS. 13-16 and FIG. 21. The copper layer 1942 is formed on the adhesion/barrier layer 1941. In the embodiments as shown in FIGS. 10-21, the bumps 150 and 160 are deposited on the copper layer 1942. The copper layer 1942 has a thickness d3 of greater than 1 μm and, preferably, greater than 3 μm. The adhesion/barrier layer 1941 could be chromium, titanium, titanium-tungsten alloy, titanium nitride, tantalum, or tantalum nitride. Alternatively, the adhesion/barrier layer 1931 can be formed by sequentially depositing a chromium layer and depositing a chromium-copper-alloy layer on the chromium layer. The adhesion/barrier layer 1941 can be formed by sputtering, for example. The copper layer 1942 can be formed by electroplating, for example.

2. Second Embodiment of Chip Packages

The bumps not only can bond a semiconductor chip to a substrate but also can bond two semiconductor chips, as shown in the following FIG. 29-51. The structure of the semiconductor chips has been described in the first embodiment and the related description is omitted hereinafter. Some embodiments are described as follows.

1. Bump on Thin-Film Circuit of a Semiconductor Chip being Bonded to Another Bump on Passivation Layer or Thin-Film Circuit of Another Chip FIG. 29 is a cross-sectional views showing a chip package before two semiconductor chips being assembled according to a second embodiment. FIG. 30 is a cross-sectional view showing a chip package created after bonding two semiconductor chips shown in FIG. 29.

Referring to FIG. 29, a semiconductor chip 300 includes a semiconductor substrate 310, multiple thin-film dielectric layers 322, 324 and 326, multiple thin-film circuit layers 332, 334 and 336, and a passivation layer 340. The semiconductor substrate 310 has multiple electronic elements 312 in a surface layer of an active surface 314 of the semiconductor substrate 310. The semiconductor substrate 310 could be a silicon substrate. By doping trivalence ions, such as boron ions, or pentad ions, such as phosphorous ions, multiple electronic elements 112 can be formed in or on the semiconductor substrate 110. The electronic elements 112 could be MOS (Metal Oxide Semiconductor) or transistors.

Referring to FIG. 29, multiple thin-film dielectric layers 322, 324 and 326, such as silicon oxide, silicon nitride or silicon oxynitride, can be formed over the active surface 314 of the semiconductor substrate 310 by CVD (Chemical Vapor Deposition) process. Each of the thin-film circuit layers 132, 134 and 136 is formed on one of the thin-film dielectric layers, respectively. The thin-film circuit layers 132, 134, 136 could include aluminum, copper or silicon, for example. The thin-film circuit layers 132, 134 and 136 have thicknesses U1, U2, and U3 of smaller than 1 μm. The thin-film dielectric layers 122, 124 and 126 have multiple via holes (unshown) connecting the thin-film circuit layers 132, 134 and 136 to one another or to the electronic elements 112.

Referring to FIG. 29, a passivation layer 340 is formed over the thin-film dielectric layers 322, 324 and 326 and over the thin-film circuit layers 332, 334, and 336. The passivation layer 340 has a thickness z of greater than 0.35 μm, for example, and comprises silicon oxide, silicon nitride, phosphosilicate glass (PSG) or a multiply structure with multiple above-mentioned materials. Multiple openings in the passivation layer 340 expose the topmost thin-film circuit layer 336.

Referring to FIG. 29, multiple bumps 350 and 360 are simultaneously deposited on the topmost thin-film circuit layer 336 using screen printing or electroplating, for example. Therefore, the bumps 350 and 360 have a same metallization structure which is described in the following. The bump 350 has a thickness J that is substantially identical to the thickness H of the bump 360, wherein their thicknesses J and H are greater than 1 μm and, preferably, greater than 5 μm.

Referring to FIG. 29, the bump 350 has a cross-sectional area parallel to the active surface 314 of the chip 300. The cross-sectional area of the bump 350 is greater than 30,000 μm2, 80,000 μm2 or 150,000 μm2. The cross-sectional area of the bump 350 may have an extending distance of greater than 500 μm, 800 μm or 1200 μm.

Referring to FIG. 29, the topmost thin-film circuit layer 336 has a thin-film circuit 337. The opening 342 in the passivation layer 340 exposes the thin-film circuit 337 with a large exposed area. Therefore, the bump 350 can be joined to the exposed thin-film circuit 137 with a large contact area. The above-mentioned large contact area is described as follows.

Referring to FIG. 29, in the first case, a plane 1050 parallel to the active surface 314 of the semiconductor substrate 310 is defined. The ratio of the area of "projecting the contact between the bump 350 and the thin-film circuit 337 onto the plane 1050" to the area of "projecting the thin-film circuit 337 onto the plane 1050" is greater than 0.5 or 0.8, or even equal to 1.

In the second case, the exposed area of the thin-film circuit 337 exposed by an opening 342 in the passivation layer 340 is greater than 30,000 μm2, 80,000 μm2 or 150,000 μm2. Therefore, the bump 350 can be connected to the exposed thin-film circuit 337 with a large contact area. The area of projecting the contact between the bump 350 and the thin-film circuit 337 onto the plane 1050 is greater than 30,000 μm2, 80,000 μm2 or 150,000 μm2.

In the third case, the area of projecting the contact between the bump 350 and the thin-film circuit layer 336 onto the plane 1050 has an extending distance t of greater than 500 μm, 800 μm or 1200 μm. The bump 350 can be considered to be joined to the thin-film circuit 337 with a large contact area if one of the above mentioned cases meets.

In this embodiment, referring to FIGS. 29-30, the contact between the bump 350 and the thin-film circuit 337 of the semiconductor chip 300 can refer to the contact between the bump 150 and the thin-film circuit 137 of the semiconductor chip 100 described in the first embodiment and FIGS. 1 and 2. Furthermore, the bump 150 having the pattern with linear extension as shown in FIGS. 1A and 1B can be referred to herein.

Referring to FIG. 29, the bumps 150 and 350 can extend respectively at top portions of the semiconductor chips 100 and 300 with various types, such as linear extension, curve extension, irregular extension with discontinuous bends, or branch-like extension. Alternatively, the area of projecting the bumps 150 and 350 onto the plane 1000 may be circle-patterned, oval-patterned, or polygon-patterned. Preferably, the relation between the patterns of the bumps 150 and 350 is mirror symmetry. Therefore, the bumps 150 and 350 can be bonded when the semiconductor chips 100 and 300 are bonded.

Referring to FIG. 30, after providing the semiconductor chips 100 and 300, the bumps 150 and 160 formed over the semiconductor chip 100 are joined to the bumps 350 and 360 formed over the semiconductor chip 300 respectively by soldering or Au—Au eutectic bonding. Next, a polymer layer 170 is filled into the gap between the semiconductor chips 100 and 300, covering the bumps 150, 350, 160 and 360.

Referring to FIG. 30, the bump 150 is joined to the bump 350 over the semiconductor chip 300 with a large contact area, described as follows. A plane 1000 parallel to the active surface 114 of the semiconductor chip 100 is defined. The pattern of projecting the contact between the bumps 150 and 350 onto the plane 1000 has an extending distance of greater than 500 μm, 800 μm or 1200 μm. The area of projecting the contact between the bumps 150 and 350 onto the plane 1000 is greater than 30,000 μm2, 80,000 μm2 or 150,000 μm2. The bump 150 can be considered to be joined to the bump 350 of the semiconductor chip 300 with a large contact area if one of the above mentioned cases meets.

Referring to FIG. 30, the unity of the bumps 150 and 350 after being bonded has a cross-sectional area parallel to the active surface 114 of the semiconductor chip 100. The cross-sectional area is greater than 30,000 $\mu m^2$, 80,000 $\mu m^2$ or 150,000 $\mu m^2$ and may have an extending distance of greater than 500 μm, 800 μm or 1200 μm.

Referring to FIG. 30, the area of projecting the contact between the unity of the bumps 150 and 350 after being bonded and the thin-film circuit 137 onto the plane 1000 is greater than 30,000 $\mu m^2$, 80,000 $\mu m^2$ or 150,000 $\mu m^2$. The area of projecting the contact between the unity, formed by bonding the bumps 150 and 350, and the thin-film circuit 137 onto the plane 1000 has an extending distance of greater than 500 μm, 800 μm or 1200 μm.

Referring to FIG. 30, the area of projecting the contact between the unity of the bumps 150 and 350 after being bonded and the thin-film circuit 337 onto the plane 1050 is greater than 30,000 $\mu m^2$, 80,000 $\mu m^2$ or 150,000 $\mu m^2$. The area of projecting the contact between the unity of the bumps 150 and 350 after being bonded and the thin-film circuit 337 onto the plane 1050 has an extending distance of greater than 500 μm, 800 μm or 1200 μm.

Referring to FIG. 30, the ratio of the area of "projecting the contact between the unity, formed by bonding the bumps 150 and 350, and the thin-film circuit 337 onto the plane 1050" to the area of "projecting the thin-film circuit 337 onto the plane 1050" is greater than 0.5 or 0.8, or even equal to 1. The r ratio of the area of "projecting the contact between the unity, formed by bonding the bumps 150 and 350, and the thin-film circuit 137 onto the plane 1000" to the area of "projecting the thin-film circuit 137 onto the plane 1000" is greater than 0.5 or 0.8, or even equal to 1.

Referring to FIG. 30, the bumps 150 and 350 can serve as signal transmission media for the internal elements of the semiconductor chip 100, for the internal elements of the semiconductor chip 300, or for the interconnection between the semiconductor chips 100 and 300, described as follows.

Referring to FIG. 30, the bumps 150 and 350 serve as the signal transmission medium for the interconnection between the semiconductor chips 100 and 300. An electronic signal can be transmitted from one of the electronic elements 112 of the semiconductor chip 100 to one of the electronic elements 312 of the semiconductor chip 300, sequentially passing the thin-film circuit layers 132, 134 and 136, penetrating through the passivation layer 140, passing the bumps 150 and 350, penetrating through the passivation layer 340 and passing the thin-film circuit layers 336, 334 and 332. Alternatively, an electronic signal can be transmitted from one of the electronic elements 312 of the semiconductor chip 300 to one of the electronic elements 112 of the semiconductor chip 100, sequentially passing the thin-film circuit layers 332, 334 and 336, penetrating through the passivation layer 340, passing the bumps 350 and 150, penetrating through the passivation layer 140 and passing the thin-film circuit layers 136, 134 and 132.

Referring to FIG. 30, the bumps 150 and 350 serve as the signal transmission medium for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, bumps 150 and 350, and the thin-film circuit 337 of the semiconductor chip 300, with horizontally transmitted via the thin-film circuit 137, bumps 150 and 350, and the thin-film circuit 337 of the semiconductor chip 300, and then sequentially passing the thin-film circuit layers 134 and 132.

Furthermore, the electronic signal can be optionally transmitted into the semiconductor chip 300 from the bumps 150 and 350 when being transmitted from one of the electronic elements 112 of the semiconductor chip 100 to the other one thereof. The bumps 150 and 350 serve as the signal transmission media for the internal elements in the semiconductor chip 100, and for the interconnection between the semiconductor chips 100 and 300.

Referring to FIG. 30, the bumps 150 and 350 serve as signal transmission media for the internal elements in the semiconductor chip 300. An electronic signal can be transmitted from one of the electronic elements 312 of the semiconductor chip 300 to the other one thereof, sequentially passing the thin-film circuit layers 332 and 334, thin-film circuit 337, bumps 350 and 150, and the thin-film circuit 137 of the semiconductor chip 100, with horizontally transmitted via the thin-film circuit 337, bumps 350 and 150, and the thin-film circuit 137 of the semiconductor chip 100, and then sequentially passing the thin-film circuit layers 334 and 332. Furthermore, the electronic signal can be optionally transmitted to the electronic elements 112 of the semiconductor chip 100 from the bumps 350 and 150 when being transmitted from one of the electronic elements 312 of the semiconductor chip 300 to the other one thereof. The bumps 350 and 150 serve as the signal transmission media for the internal elements in the semiconductor chip 300, and for the interconnection between the semiconductor chips 300 and 100.

Referring to FIG. 30, through the bumps 160 and 360, an electronic signal can be transmitted from the semiconductor chip 100 to the semiconductor chip 300 or transmitted from the semiconductor chip 300 to the semiconductor chip 100.

Referring to FIG. 30, the bumps 150 and 350 not only horizontally transmit an electronic signal but also vertically transmit the electronic signal between the semiconductor chips 100 and 300. The bump 150 is joined to the thin-film circuit 137 of the semiconductor chip 100 with a large contact area. The bump 350 is joined to the thin-film circuit 337 of the semiconductor chip 300 with a large contact area. Furthermore, the bump 150 is joined to the bump 350 with a large contact area. Therefore, the performance for electrical connection between the semiconductor chips 100 and 300 can be enhanced and noise can be reduced.

Alternatively, referring to FIG. 30, the bumps 150 and 350 can also serve as a power bus. The bumps 150 and 350 can be connected to internal power buses in the semiconductor chips 100 and 300. The bump 150 is joined to the thin-film circuit 137 of the semiconductor chip 100 with a large contact area. The bump 350 is joined to the thin-film circuit 337 of the semiconductor chip 300 with a large contact area. Furthermore, the bump 150 is joined to the bump 350 with a large contact area. As a result, the appearance of the power buses of the semiconductor chips 100 and 300 providing an unstable power voltage due to being interfered by noise can be diminished, so the semiconductor chips 100 and 300 can provide a stable power voltage.

Alternatively, referring to FIG. 30, the bumps 150 and 350 can also serve as a ground bus. The bumps 150 and 350 can be connected to internal ground bus in the semiconductor chips 100 and 300. The bump 150 is joined to the thin-film circuit 137 of the semiconductor chip 100 with a large contact area. The bump 350 is joined to the thin-film circuit 337 of the semiconductor chip 300 with a large contact area. Furthermore, the bump 150 is joined to the bump 350 with a large contact area. As a result, the appearance of the ground buses of the semiconductor chips 100 and 300 providing an unstable ground voltage due to being interfered by noise can be diminished, so the semiconductor chips 100 and 300 can provide a stable ground voltage.

Alternatively, at least one polymer layer can be formed over the passivation layer 140 shown in FIGS. 29 and 30, which can refer to FIGS. 4 and 5 and the corresponding description.

Figure 31:
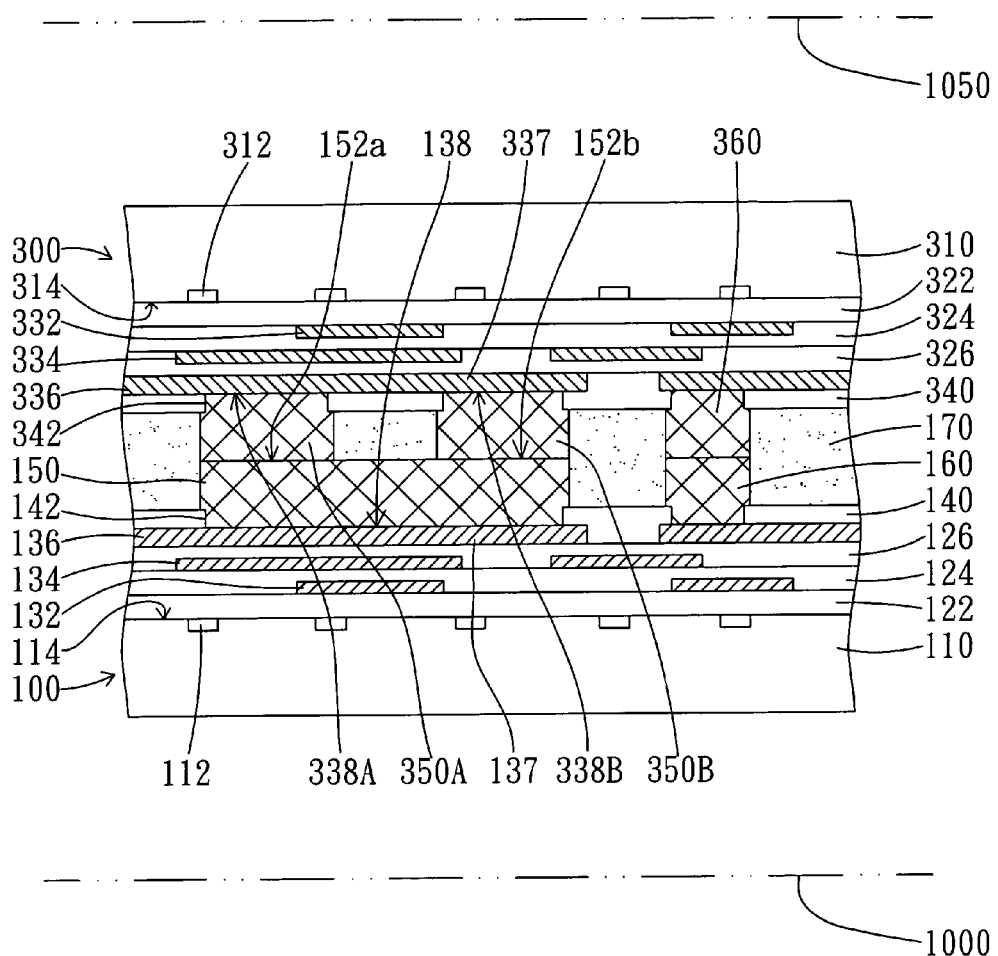

In FIGS. 29 and 30, the thin-film circuit 337 is joined with only one bump 150 with a large contact area. However, the thin-film circuit 337 can also be joined with multiple bumps 350A and 350B with large contact areas, as shown in FIG. 31. FIG. 31 is a cross-sectional view showing another chip package according to the second embodiment.

Referring to FIG. 31, the bumps 350A and 350B, can extend with various types, such as linear extension, curve extension, irregular extension with discontinuous bends, or branch-like extension. Alternatively, the areas of projecting the bumps 350A and 350B onto the plane 1000 may be circle-patterned, oval-patterned, or polygon-patterned.

The contacts 338a and 338b of the thin-film circuit 337 connected to the bumps 350A and 350B may have the patterns matching those of the bumps 350A and 350B, such as the pattern of linear extension, curve extension, irregular extension with discontinuous bends, or branch-like extension. Also, the contacts 338a and 338b may have a circle pattern, an oval pattern or a polygon pattern. The contacts 152a and 152b of the bumps 150a and 150b connected to the bumps 350A and 350B may have the patterns matching those of the bumps 150a and 150b, such as the patterns of linear extension, curve extension, irregular extension with discontinuous bends, or branch-like extension. Also, the contacts 152a and 152b of the bumps 150a and 150b connected to the bumps 350A and 350B may have a circle pattern, an oval pattern or a polygon pattern.

Referring to FIG. 31, the bump 350A may have a least cross-sectional area parallel to the active surface 114 of the chip 100. The least cross-sectional area of the bump 350A is provided by the bottom surface of the bump 350A, for example, which is connected to the thin-film circuit 337. The least cross-sectional area of the bump 350A may be greater than 30,000 $\mu m^2$, 80,000 $\mu m^2$ or 150,000 $\mu m^2$ and may have an extending distance of greater than 500 µm, 800 µm or 1200 µm.

The bump 350B may have a least cross-sectional area parallel to the active surface 114 of the chip 100. The least cross-sectional area of the bump 350B is provided by the bottom surface of the bump 350B, for example, which is connected to the thin-film circuit 337. The least cross-sectional area of the bump 350B may be greater than 30,000 $\mu m^2$, 80,000 $\mu m^2$ or 150,000 $\mu m^2$ and may have an extending distance of greater than 500 µm, 800 µm or 1200 µm.

Alternatively, one of the bumps 350A and 350B may have a least cross-sectional area of greater than 30,000 $\mu m^2$, 80,000 $\mu m^2$ or 150,000 $\mu m^2$, but the other one of the bulks 250A and 250B may have a least cross-sectional area of less than 30,000 $\mu m^2$. Moreover, one of the bumps 350A and 350B may have a least cross-sectional area having an extending distance of greater than 500 µm, 800 µm or 1200 µm, but the other one of the bumps 350A and 350B may have a least cross-sectional area having an extending distance of less than 500 µm.

Referring to FIG. 31, the bumps 350A and 350B are connected to the thin-film circuit 337 with a large contact area. A plane 1050 parallel to the active surface 314 of the substrate 310 is defined. The ratio of the total area of "projecting the contact between the bumps 350A and 350B and the thin-film circuit 337 onto the plane 1050" to the area of "projecting the thin-film circuit 337 onto the plane 1050" is greater than 0.5 or 0.8.

Referring to FIG. 31, the area of projecting the contact between the thin-film circuit 337 and the bump 350A onto the plane 1050 is greater than 30,000 µm2, 80,000 µm2, or 150,000 µm2. The area of projecting the contact between the thin-film circuit 337 and the bump 350B onto the plane 1050 is greater than 30,000 µm2, 80,000 µm2, or 150,000 µm2. Alternatively, the area of projecting the contact between the thin-film circuit 337 and one of the bumps 350A and 350B onto the plane 1000 is greater than 30,000 µm2, 80,000 µm2, or 150,000 µm2, but the area of projecting the contact between the thin-film circuit 337 and the other one of the bumps 350A and 350B onto the plane 1000 is less than 30,000 µm2. Referring to FIG. 31, the area of projecting the contact between the thin-film circuit 337 and the bump 350A onto the plane 1050 has an extending distance of greater than 500 µm, 800 µm, or 1200 µm. The area of projecting the contact between the thin-film circuit 337 and the bump 350B onto the plane 1050 has an extending distance of greater than 500 µm, 800 µm, or 1200 µm. Alternatively, the area of projecting the contact between the thin-film circuit 337 and one of the bumps 350A and 350B onto the plane 1050 has an extending distance of greater than 500 µm, 800 µm, or 1200 µm, but the area of projecting the contact between the thin-film circuit 337 and the other one of the bumps 350A and 350B onto the plane 1050 has an extending distance of less than 500 µm.

In this embodiment, as shown in FIG. 31, the detail of the contact between the bumps 350A and 350B and the thin-film circuit 337 can refer to the detail of the contact between the bumps 150a and 150b and the thin-film circuit 137 shown in FIG. 3, which takes an example of the bump with the pattern of linear extension. The description concerning the contact between the bumps 350A and 350B and the thin-film circuit 337 can be clearly understood if the detail of the contact between the bumps 150a and 150b and the thin-film circuit 137 shown in FIG. 3A is referred to.

Referring to FIG. 31, the area of projecting the contact between the bump 350A and the bump 150 onto the plane 1000 is greater than 30,000 µm2, 80,000 µm2, or 150,000 µm2. The area of projecting the contact between the bump 350B and the bump 150 onto the plane 1000 is greater than 30,000 µm2, 80,000 µm2, or 150,000 µm2. Alternatively, the area of projecting the contact between the bump 150 and one of the bumps 350A and 350B onto the plane 1000 is greater than 30,000 µm2, 80,000 µm2, or 150,000 µm2, but the area of projecting the contact between the bump 150 and the other one of the bumps 350A and 350B onto the plane 1000 is less than 30,000 µm2.

Referring to FIG. 31, the area of projecting the contact between the bump 350A and the bump 150 onto the plane 1000 has an extending distance of greater than 500 µm, 800 µm, or 1200 µm. The area of projecting the contact between the bump 350B and the bump 150 onto the plane 1000 has an extending distance of greater than 500 µm, 800 µm, or 1200 µm. Alternatively, the area of projecting the contact between one of the bumps 350A and 350B and the bump 150 onto the plane 1000 has an extending distance of greater than 500 µm, 800 µm, or 1200 µm, but the area of projecting the contact between the other one of the bumps 350A and 350B and the bump 150 onto the plane 1000 has an extending distance of less than 500 µm.

Referring to FIG. 31, the unity of the bumps 150, 350A and 350B after being bonded has a least cross-sectional area parallel to the active surface 114 of the semiconductor chip 100. The least cross-sectional area is provided by the bottom surfaces of the bumps 350A and 350B, for example. The least cross-sectional area is greater than 30,000 µm², 80,000 µm² or 150,000 µm², for example.

Referring to FIG. 31, the area of the contact of projecting the unity of the bumps 150, 350A and 350B after being bonded and the thin-film circuit 337 onto the plane 1050 is greater than 30,000 µm², 80,000 µm² or 150,000 µm². The area of projecting the contact between the unity of the bumps 150, 350A and 350B after being bonded and the thin-film circuit 137 onto the plane 1000 is greater than 30,000 µm², 80,000 µm² or 150,000 µm². The area of projecting the contact between the unity of the bumps 150, 350A and 350B after being bonded and the thin-film circuit 137 onto the plane 1000 has an extending distance of greater than 500 µm, 800 µm or 1200 µm.

Alternatively, referring to FIG. 31, the ratio of the area of "projecting the contact between the unity of the bumps 150, 350A and 350B after being bonded and the thin-film circuit 337 onto the plane 1050" to the area of "projecting the thin-film circuit 337 onto the plane 1050" is greater than 0.5 or 0.8 or even equal to 1. The ratio of the area of "projecting the contact between the unity of the bumps 150, 350A and 350B after being bonded and the thin-film circuit 137 onto the plane 1000" to the area of "projecting the thin-film circuit 137 onto the plane 1000" is greater than 0.5 or 0.8 or even equal to 1.

Referring to FIG. 31, the bumps 150, 350A and 350B can serve as signal transmission media for the internal elements of the semiconductor chip 100, for the internal elements of the semiconductor chip 300, or for the interconnection between the semiconductor chips 100 and 300, described as follows.

Referring to FIG. 31, the bumps 150, 350A and 350B serve as signal transmission media of the interconnection between the semiconductor chips 100 and 300. An electronic signal can be transmitted from one of the electronic elements 112 of the semiconductor chip 100 to one of the electronic elements 312 of the semiconductor chip 300, sequentially passing the thin-film circuit layers 132, 134 and 136, penetrating through the passivation layer 140, passing the bumps 150, 350A and 350B, penetrating through the passivation layer 340 and passing the thin-film circuit layers 336, 334 and 332. Alternatively, an electronic signal can be transmitted from one of the electronic elements 312 of the semiconductor chip 300 to one of the electronic elements 112 of the semiconductor chip 100, sequentially passing the thin-film circuit layers 332, 334 and 336, penetrating through the passivation layer 340, passing the bumps 350A, 350B and 150, penetrating through the passivation layer 140 and passing the thin-film circuit layers 136, 134 and 132.

Referring to FIG. 31, the bumps 150 and 350 serve as signal transmission media for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, bumps 150, 350A and 350B, and the thin-film circuit 337 of the semiconductor chip 300, with horizontally transmitted via the thin-film circuit 137, bumps 150, 350A and 350B, and the thin-film circuit 337 of the semiconductor chip 300, and then sequentially passing the thin-film circuit layers 134 and 132. Furthermore, the electronic signal can be optionally transmitted into the semiconductor chip 300 from the bumps 150, 350A and 350B when being transmitted from one of the electronic elements 112 of the semiconductor chip 100 to the other one thereof. The bumps 150, 350A and 350B serve as the signal transmission media for the internal elements in the semiconductor chip 100, and for the interconnection between the semiconductor chips 100 and 300.

Referring to FIG. 31, the bumps 150, 350A and 350B serve as signal transmission media for the internal elements in the semiconductor chip 300. An electronic signal can be transmitted from one of the electronic elements 312 of the semiconductor chip 300 to the other one thereof, sequentially passing the thin-film circuit layers 332 and 334, thin-film circuit 337, bumps 350A, 350B and 150, and the thin-film circuit 137 of the semiconductor chip 100, with horizontally transmitted via the thin-film circuit 337, bumps 350A, 350B and 150, and the thin-film circuit 137 of the semiconductor chip 100, and then sequentially passing the thin-film circuit layers 334 and 332.

Furthermore, the electronic signal can be optionally transmitted to the electronic elements 112 of the semiconductor chip 100 from the bumps 350A, 350B and 150 when being transmitted from one of the electronic elements 312 of the semiconductor chip 300 to the other one thereof. The bumps 350A, 350B and 150 serve as the signal transmission media for the internal elements in the semiconductor chip 300, and for the interconnection between the semiconductor chips 300 and 100.

Referring to FIG. 31, through the bumps 160 and 360, an electronic signal can be transmitted from the semiconductor chip 100 to the semiconductor chip 300 or transmitted from the semiconductor chip 300 to the semiconductor chip 100.

Referring to FIG. 31, the bumps 150, 350A and 350B not only horizontally transmit an electronic signal but also vertically transmits the electronic signal between the semiconductor chips 100 and 300. The bump 150 is joined to the thin-film circuit 137 of the semiconductor chip 100 with a large contact area. The bumps 350A and 350B are joined to the thin-film circuit 337 of the semiconductor chip 300 with a large contact area. Furthermore, the bump 150 is joined to the bumps 350A and 350B with a large contact area. Therefore, the performance for electrical connection between the semiconductor chips 100 and 300 can be enhanced and noise can be reduced.

Alternatively, referring to FIG. 31, the bumps 150, 350A and 350B can also serve as a power bus. The bumps 150, 350A and 350B can be connected to internal power buses in the semiconductor chips 100 and 300. The bump 150 is joined to the thin-film circuit 137 of the semiconductor chip 100 with a large contact area. The bumps 350A and 350B are joined to the thin-film circuit 337 of the semiconductor chip 300 with a large contact area. Furthermore, the bump 150 is joined to the bumps 350A and 350B with a large contact area. Furthermore, the bump 150 is joined to the bump 350 with a large contact area. As a result, the appearance of the power buses of the semiconductor chips 100 and 300 providing an unstable power voltage due to being interfered by noise can be diminished, so the semiconductor chips 100 and 300 can provide a stable power voltage.

Alternatively, referring to FIG. 31, the bumps 150, 350A and 350B can also serve as a ground bus. The bumps 150, 350A and 350B can be connected to internal ground buses in the semiconductor chips 100 and 300. The bump 150 is joined to the thin-film circuit 137 of the semiconductor chip 100 with a large contact area. The bumps 350A and 350B are joined to the thin-film circuit 337 of the semiconductor chip 300 with a large contact area. Furthermore, the bump 150 is joined to the bumps 350A and 350B with a large contact area. Furthermore, the bump 150 is joined to the bump 350 with a large contact area. As a result, the appearance of the ground buses of the semiconductor chips 100 and 300 providing an unstable ground voltage due to being interfered by noise can be diminished, so the semiconductor chips 100 and 300 can provide a stable ground voltage.

Figure 32:
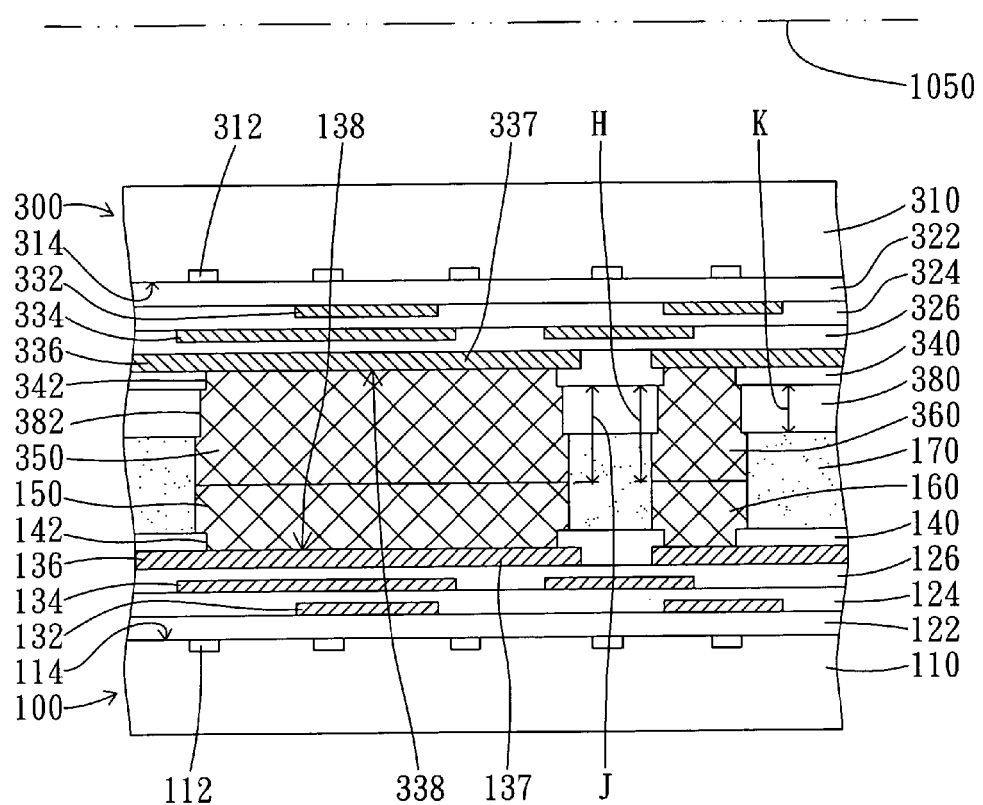
Figure 33:
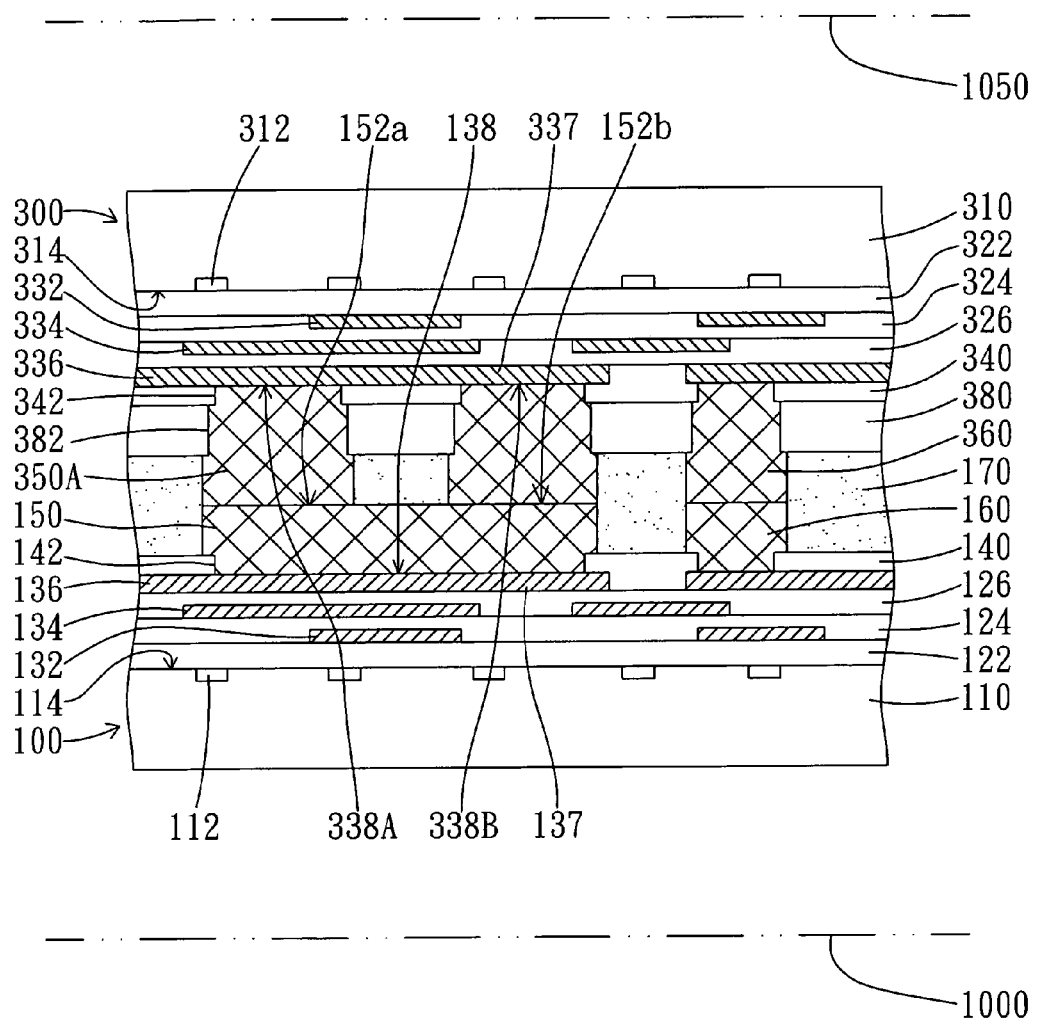

FIGS. 32 and 33 are cross-sectional views showing chip packages according to the second embodiment. Referring to FIGS. 32 and 33, a polymer layer 380 can be deposited on the passivation layer 340. Multiple openings 382 in the polymer layer 380 are aligned to the openings 342 in the passivation layer 340 and expose the thin-film circuit layer 336. Next, the bumps 350 and 360 can be deposited on the thin-film circuit layer 336 exposed by the openings 382 and 342 in the polymer layer 380 and the passivation layer 340. The bumps 350 and 360 have thicknesses J and H of greater than 1 µm and, preferably, greater than 5 µm.

The bumps 350 and 360 are simultaneously deposited using same steps. Therefore, they have a same metallization structure and identical thicknesses J and H. The polymer layer 380 may have a thickness K of greater than 1 µm and could be polyimide (PI), benzocyclobutene (BCB), parylene, porous dielectric material or elastomer. Referring to FIG. 32, the detail of the contact between the bump 350 and the thin-film circuit 337, the contact between the bumps 150 and 350 and the contact between the bump 150 and the thin-film circuit 137, and the electric function for the bumps 150 and 350 can refer to the previous embodiment shown in FIGS. 29 and 30.

Referring to FIG. 33, a polymer layer 380 is formed on the passivation layer 340. Multiple bumps 350a and 350b are deposited on the thin-film circuit 337 exposed by the openings 382 in the polymer layer 380 and the openings 342 in the passivation layer 340. The detail of the contacts between the bumps 350A and 350B and the thin-film circuit 337, the contacts between the bumps 350A and 350B and the bump 150, the contact between the bump 150 and the thin-film circuit 137, and the electric function for the bumps 150, 350A and 350B can refer to FIG. 33 and the corresponding description.

Figure 34:
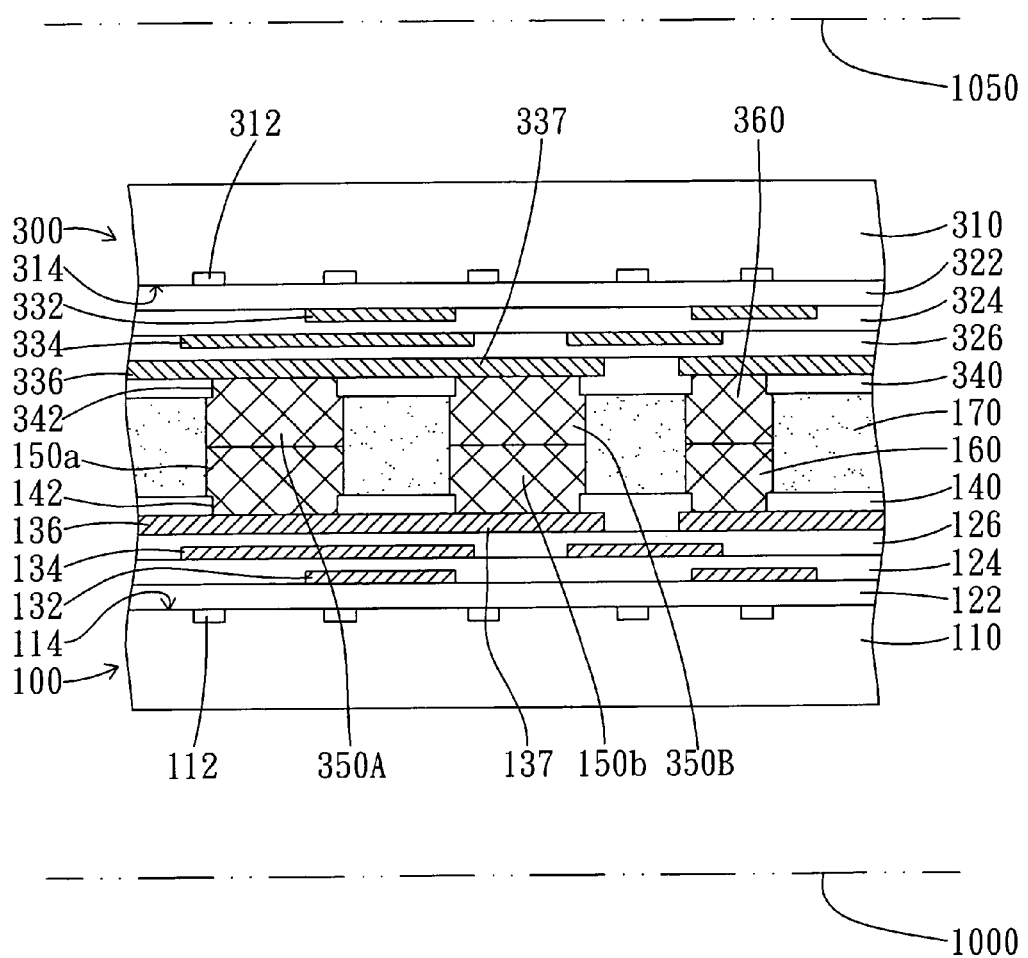

In the embodiment shown in FIG. 29-33, chips 100 and 300 are connected by bonding a bump 150 to a bump 350 or bonding a bump 150 to multiple bumps 350A and 350B. Alternatively, multiple bumps 150a and 150b can be deposited on the thin-film circuits 137 of the semiconductor chip 100, and multiple bumps 350A and 350B can be deposited on the thin-film circuits 337 of the semiconductor chip 300. Next, the bumps 150a and 350A are bonded, and the bumps 150b and 350B are bonded, as shown in FIG. 34. FIG. 34 is a cross-sectional view showing another chip package according to the second embodiment.

Referring to FIG. 34, the relation between the bumps 150a and 350A is mirror symmetry, and also, the relation between bumps 150b and 350B is mirror symmetry. The types of the bumps 150a and 150b and the detail of the contact between the bumps 150a and 150b and the thin-film circuit 137 can refer to FIG. 3 and the corresponding description. The types of the bumps 350A and 350B and the detail of the contact between the bumps 350A and 350B and the thin-film circuit 337 can refer to FIG. 34 and the corresponding description.

Referring to FIG. 34, the area of projecting the contact between the bumps 350A and 150a onto the plane 1000 is greater than 30,000 µm², 80,000 µm², or 150,000 µm², for example. The area of projecting the contact between the bumps 350B and 150b onto the plane 1000 is greater than 30,000 µm², 80,000 µm², or 150,000 µm², for example. Alternatively, the area of projecting the contact between one of the bumps 350A and 350B and one of the bumps 150a and 150b onto the plane 1000 is greater than 30,000 µm², 80,000 µm², or 150,000 µm², but the area of projecting the contact between the other one of the bumps 350A and 350B and the other one of the bumps 150a and 150b onto the plane 1000 is less than 30,000 µm².

Referring to FIG. 34, the area of projecting the contact between the bumps 350A and 150a onto the plane 1000 has an extending distance of greater than 500 µm, 800 µm, or 1200 µm. The area of projecting the contact between the bumps 350B and 150b onto the plane 1000 has an extending distance of greater than 500 µm, 800 µm, or 1200 µm. Alternatively, the area of projecting the contact between one of the bumps 350A and 350B and one of the bumps 150a and 150b onto the plane 1000 has an extending distance of greater than 500 µm, 800 µm, or 1200 µm, but the area of projecting the contact between the other one of the bumps 350A and 350B and the other one of the bumps 150a and 150b onto the plane 1000 has an extending distance of less than 500 µm.

Referring to FIG. 34, the unity of the bumps 150a and 350A after being bonded has a least cross-sectional area parallel to the active surface 114 of the semiconductor chip 100. The least cross-sectional area can be provided by the surface of the unity joined with the thin-film circuit 337 or the surface of the unity joined with the thin-film circuit 137, for example. The least cross-sectional area is greater than 30,000 µm², 80,000 µm² or 150,000 µm² and may have an extending distance of greater than 500 µm, 800 µm or 1200 µm.

The unity of the bumps 150b and 350B after being bonded has a least cross-sectional area parallel to the active surface 114 of the semiconductor chip 100. The least cross-sectional area can be provided by the surface of the unity joined with the thin-film circuit 337, for example. The least cross-sectional area is greater than 30,000 µm², 80,000 µm² or 150,000 µm² and may have an extending distance of greater than 500 µm, 800 µm or 1200 µm.

Referring to FIG. 34, the area of projecting the contact between the unity of the bumps 150a and 350A after being bonded and the thin-film circuit 137 onto the plane 1000 is greater than 30,000 µm², 80,000 µm² or 150,000 µm². The area of projecting the contact between the unity of the bumps 150b and 350B after being bonded and the thin-film circuit 137 onto the plane 1000 is greater than 30,000 µm², 80,000 µm² or 150,000 µm².

Referring to FIG. 34, the area of projecting the contact between the unity of the bumps 150a and 350A after being bonded and the thin-film circuit 137 onto the plane 1000 has an extending distance of greater than 500 µm, 800 µm or 1200 µm. The area of projecting the contact between the unity of the bumps 150b and 350B after being bonded and the thin-film circuit 137 onto the plane 1000 has an extending distance of greater than 500 µm, 800 µm or 1200 µm.

Referring to FIG. 34, the area of projecting the contact between the unity of the bumps 150a and 350A after being bonded and the thin-film circuit 337 onto the plane 1050 is greater than 30,000 µm², 80,000 µm² or 150,000 µm². The area of projecting the contact between the unity of the bumps 150b and 350B after being bonded and the thin-film circuit 337 onto the plane 1050 is greater than 30,000 µm², 80,000 µm² or 150,000 µm².

Referring to FIG. 34, the area of projecting the contact between the unity of the bumps 150a and 350A after being bonded and the thin-film circuit 337 onto the plane 1050 has an extending distance of greater than 500 μm, 800 μm or 1200 μm. The area of projecting the contact between the unity of the bumps 150b and 350B after being bonded and the thin-film circuit 337 onto the plane 1050 has an extending distance of greater than 500 μm, 800 μm or 1200 μm.

Alternatively, referring to FIG. 34, the ratio of the area of "projecting the contact between the unity of the bumps 150a, 350A, 150b and 350B after being bonded and the thin-film circuit 337 onto the plane 1050" to the area of "projecting the thin-film circuit 337 onto the plane 1050" is greater than 0.5 or 0.8, or even equal to 1. The ratio of the area of "projecting the contact between the unity of the bumps 150a, 350A, 150b and 350B after being bonded and the thin-film circuit 137 onto the plane 1000" to the area of "projecting the thin-film circuit 137 onto the plane 1000" is greater than 0.5 or 0.8, or even equal to 1.

Referring to FIG. 34, the bumps 150a, 150b, 350A and 350B can serve as signal transmission media for the internal elements of the semiconductor chip 100, for the internal elements of the semiconductor chip 300, or for the interconnection between the semiconductor chips 100 and 300, described as follows.

Referring to FIG. 34, the bumps 150a, 150b, 350A and 350B serve as signal transmission media of the interconnection between the semiconductor chips 100 and 300. An electronic signal can be transmitted from one of the electronic elements 112 of the semiconductor chip 100 to one of the electronic elements 312 of the semiconductor chip 300, sequentially passing the thin-film circuit layers 132, 134 and 136, penetrating through the passivation layer 140, passing the bumps 150a, 150b, 350A and 350B, penetrating through the passivation layer 340 and passing the thin-film circuit layers 336, 334 and 332. Alternatively, an electronic signal can be transmitted from one of the electronic elements 312 of the semiconductor chip 300 to one of the electronic elements 112 of the semiconductor chip 100, sequentially passing the thin-film circuit layers 332, 334 and 336, penetrating through the passivation layer 340, passing the bumps 350A, 350B, 150a and 150b, penetrating through the passivation layer 140 and passing the thin-film circuit layers 136, 134 and 132.

Referring to FIG. 34, the bumps 150a, 150b, 350A and 3508 serve as signal transmission media for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, bumps 150a, 150b, 350A and 350B, and the thin-film circuit 337 of the semiconductor chip 300, with horizontally transmitted via the thin-film circuit 137, bumps 150a, 150b, 350A and 350B, and the thin-film circuit 337 of the semiconductor chip 300, and then sequentially passing the thin-film circuit layers 134 and 132.

Furthermore, the electronic signal can be optionally transmitted into the semiconductor chip 300 from the bumps 150a, 150b, 350A and 350B when being transmitted from one of the electronic elements 112 of the semiconductor chip 100 to the other one thereof. The bumps 150a, 150b, 350A and 350B serve as the signal transmission media for the internal elements in the semiconductor chip 100, and for the interconnection between the semiconductor chips 100 and 300.

Referring to FIG. 34, the bumps 150 and 350 serve as signal transmission media for the internal elements in the semiconductor chip 300. An electronic signal can be transmitted from one of the electronic elements 312 of the semiconductor chip 300 to the other one thereof, sequentially passing the thin-film circuit layers 332 and 334, thin-film circuit 337, bumps 350A, 350B, 150a and 150b, and the thin-film circuit 137 of the semiconductor chip 100, with horizontally transmitted via the thin-film circuit 337, bumps 350A, 350B, 150a and 150b, and the thin-film circuit 137 of the semiconductor chip 100, and then sequentially passing the thin-film circuit layers 334 and 332. Furthermore, the electronic signal can be optionally transmitted to the electronic elements 112 of the semiconductor chip 100 from the bumps 350A, 350B, 150a and 150b when being transmitted from one of the electronic elements 312 of the semiconductor chip 300 to the other one thereof. The bumps 350A, 350B, 150a and 150b serve as the signal transmission media for the internal elements in the semiconductor chip 300, and for the interconnection between the semiconductor chips 300 and 100.

Referring to FIG. 34, through the bumps 160 and 360, an electronic signal can be transmitted from the semiconductor chip 100 to the semiconductor chip 300 or transmitted from the semiconductor chip 300 to the semiconductor chip 100.

Referring to FIG. 34, the bumps 150a, 150b, 350A and 350B not only horizontally transmit an electronic signal but also vertically transmit the electronic signal between the semiconductor chips 100 and 300. The bumps 150a and 150b are joined to the thin-film circuit 137 of the semiconductor chip 100 with a large contact area. The bumps 350A and 350B are joined to the thin-film circuit 337 of the semiconductor chip 300 with a large contact area. Furthermore, the bumps 150a and 150b are joined to the bumps 350A and 350B with a large contact area. Therefore, the performance for electrical connection between the semiconductor chips 100 and 300 can be enhanced and noise can be reduced.

Alternatively, referring to FIG. 34, the bumps 150 and 350 can also serve as a power bus. The bumps 150a, 150b, 350A and 350B can be connected to internal power buses in the semiconductor chips 100 and 300. The bumps 150a and 150b are joined to the thin-film circuit 137 of the semiconductor chip 100 with a large contact area. The bumps 350A and 350B are joined to the thin-film circuit 337 of the semiconductor chip 300 with a large contact area. Furthermore, the bumps 150a and 150b are joined to the bumps 350A and 350B with a large contact area. As a result, the appearance of the power buses of the semiconductor chips 100 and 300 providing an unstable power voltage due to being interfered by noise can be diminished, so the semiconductor chips 100 and 300 can provide a stable power voltage.

Alternatively, referring to FIG. 34, the bumps 150 and 350 can also serve as a ground bus. The bumps 150a, 150b, 350A and 350B can be connected to internal ground buses in the semiconductor chips 100 and 300. The bumps 150a and 150b are joined to the thin-film circuit 137 of the semiconductor chip 100 with a large contact area. The bumps 350A and 350B are joined to the thin-film circuit 337 of the semiconductor chip 300 with a large contact area. Furthermore, the bumps 150a and 150b are joined to the bumps 350A and 350B with a large contact area. As a result, the appearance of the ground buses of the semiconductor chips 100 and 300 providing an unstable ground voltage due to being interfered by noise can be diminished, so the semiconductor chips 100 and 300 can provide a stable ground voltage.

Figure 35:
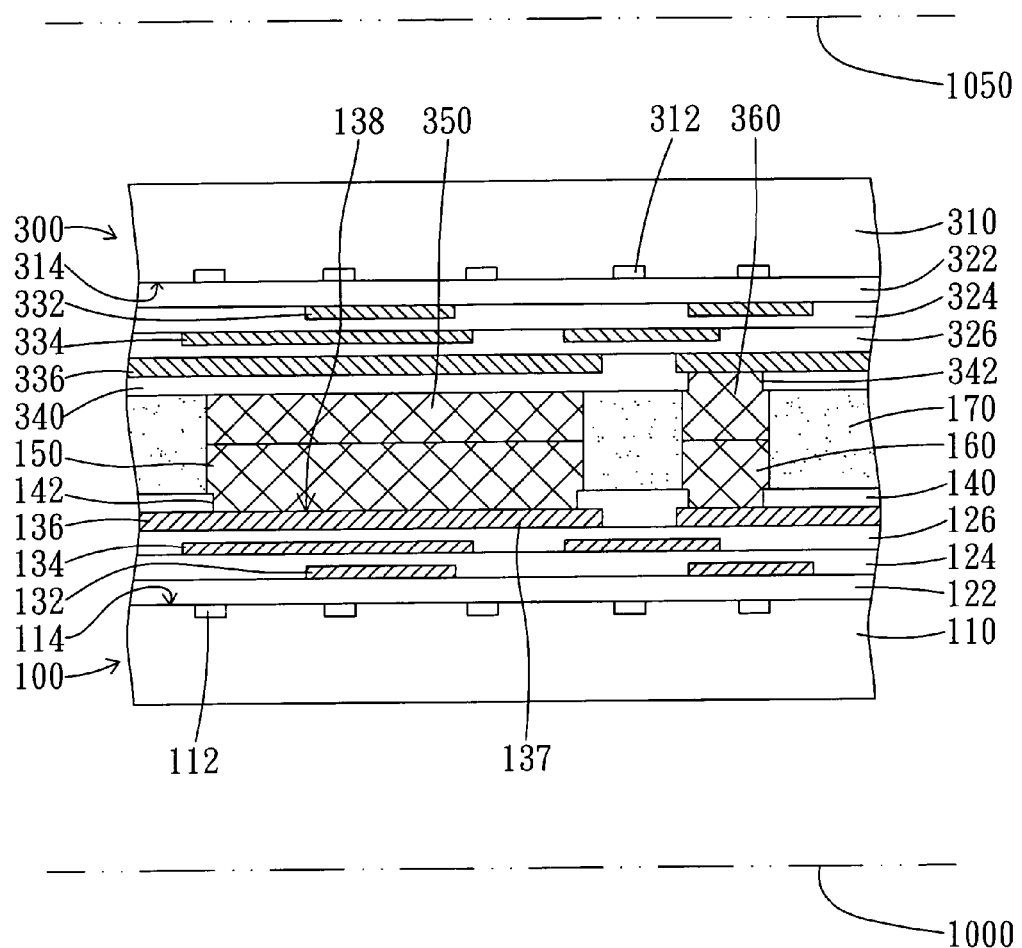

Alternatively, referring to FIG. 35, the bump 350 can also be disconnected from the thin-film circuit 336, wherein the bumps 150 and 350 are bonded with a large contact area, as shown in FIG. 35. In this embodiment, the bump 336 is deposited on and in contact with the passivation layer 340. Alternatively, a polymer layer (unshown) can be formed on the passivation layer 340, followed by depositing a bump 350 disconnected from the thin-film circuit 336 on the polymer layer. After depositing the bumps 150 and 350 over the semiconductor chips 100 and 300, respectively, the bumps 150 and 350 are bonded.

Referring to FIG. 35, the bumps 150 and 350 serve as signal transmission media for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, and bumps 150 and 350, with horizontally transmitted via the thin-film circuit 137, and bumps 150 and 350, and then sequentially passing the thin-film circuit layers 134 and 132.

Alternatively, referring to FIG. 35, the bumps 150 and 350 can also serve as a power bus. The bumps 150 and 350 can be connected to an internal power bus in the semiconductor chip 100. Alternatively, the bumps 150 and 350 can also serve as a ground bus. The bumps 150 and 350 can be connected to an internal ground bus in the semiconductor chip 100.

Figure 36:
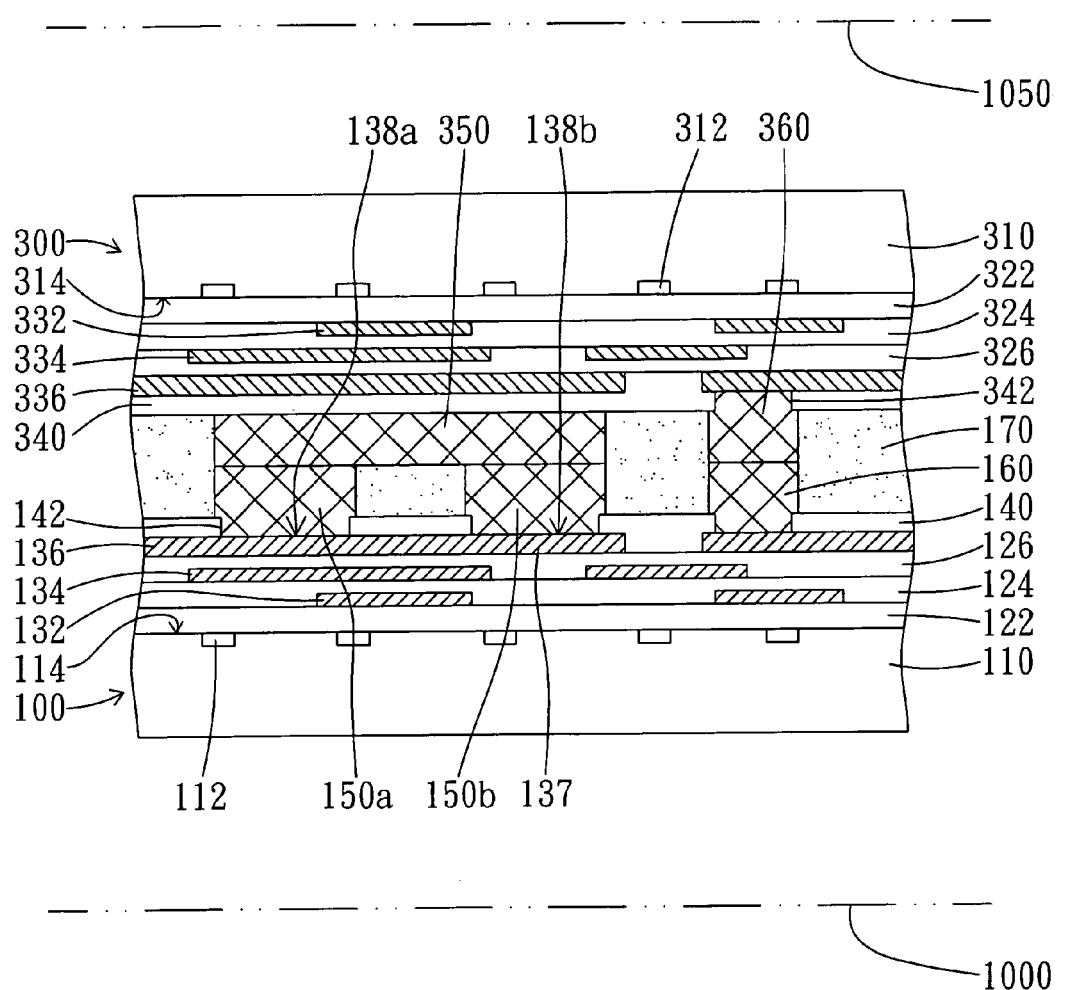

Referring to FIG. 36, the bumps 150a and 150b are joined to the thin-film circuit 137 with a large contact area, which can refer to FIG. 3 and the corresponding description. The bump 350 is disconnected from the thin-film circuit 336 and joined to the bumps 150a and 150b with a large contact area, described as follows.

Referring to FIG. 36, the area of projecting the contact between the bumps 350 and 150a onto the plane 1000 is greater than 30,000 μm², 80,000 μm², or 150,000 μm². The area of projecting the contact between the bumps 350 and 150b onto the plane 1000 is greater than 30,000 μm², 80,000 μm², or 150,000 μm². Alternatively, the area of projecting the contact between one of the bumps 150a and 150b and the bump 350 onto the plane 1000 is greater than 30,000 μm², 80,000 μm², or 150,000 μm², but the area of projecting the contact between the other one of the bumps 150a and 150b and the bump 350 onto the plane 1000 is less than 30,000 μm².

Referring to FIG. 36, the area of projecting the contact between the bumps 150a and 350 onto the plane 1000 has an extending distance of greater than 500 μm, 800 μm, or 1200 μm. The area of projecting the contact between the bumps 150b and 350 onto the plane 1000 has an extending distance of greater than 500 μm, 800 μm, or 1200 μm. Alternatively, the area of projecting the contact between one of the bumps 150a and 150b and the bump 350 onto the plane 1000 has an extending distance of greater than 500 μm, 800 μm, or 1200 μm, but the area of projecting the contact between the other one of the bumps 150a and 150b and the bump 350 onto the plane 1000 has an extending distance of less than 500 μm.

Referring to FIG. 36, the unity of bumps 350, 150a and 150b after being bonded has a least cross-sectional area parallel to the active surface 114 of the chip 100. The least cross-sectional area is provided by the bottom surface of the bumps 150a and 150b, for example, which is connected to the thin-film circuit 137. The least cross-sectional area may be greater than 30,000 μm², 80,000 μm² or 150,000 μm² and may have an extending distance of greater than 500 μm, 800 μm or 1200 μm.

Referring to FIG. 36, the area of projecting the contact between the unity of the bumps 350, 150a and 150b after being bonded and the thin-film circuit 137 onto the plane 1000 is greater than 30,000 μm², 80,000 μm² or 150,000 μm².

Alternatively, referring to FIG. 36, the ratio of an area, projecting the contact between the union of bumps 150a, 150b, 350 and the thin-film circuit 337 onto the plane 1000, to another area, projecting the thin-film circuit 137 onto the plane 1000, is greater than 0.5, 0.8 or equivalent to 1.

Referring to FIG. 36, the bumps 150a, 150b and 350 may serve as signal transmission media for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, and bumps 150a, 150b and 350, with horizontally transmitted via the thin-film circuit 137, and the bumps 150a, 150b and 350, and then sequentially passing the thin-film circuit layers 134 and 132.

Also, referring to FIG. 36, the bumps 150a, 150b and 350 may serve as a power bus. The bumps 150a, 150b and 350 can be connected to an internal power bus in the semiconductor chip 100. Alternatively, the bumps 150a, 150b and 350 may serve as a ground bus. The bumps 150a, 150b and 350 can be connected to an internal ground bus in the semiconductor chip 100.

Figure 37:
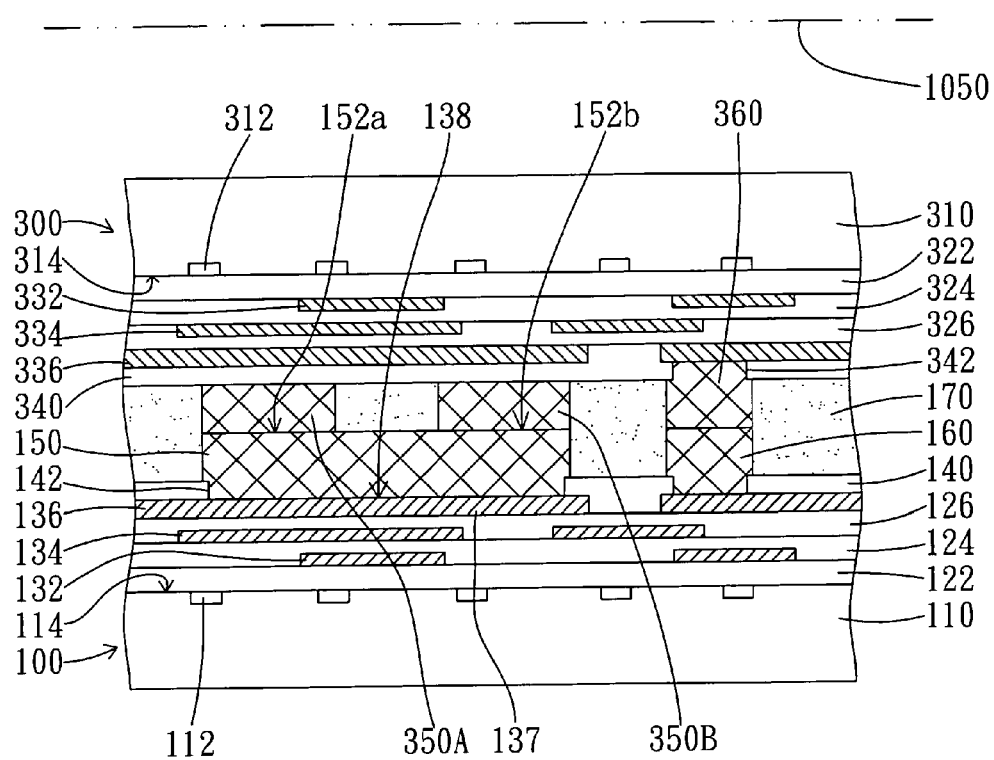

Alternatively, referring to FIG. 37, multiple bumps 350A and 350B are deposited on the passivation layer, wherein the bumps 350A and 350B are disconnected from the thin-film circuit layer 336. The bump 150 is bonded to the thin-film circuit 137 with a large contact area, which can refer to FIGS. 1 and 2 and the corresponding description. The bump 150 is bonded to the bumps 350A and 350B with a large contact area, which can refer to FIG. 31 and the corresponding description.

Referring to FIG. 37, the bumps 150, 350A and 350B may serve as signal transmission media for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, and bumps 150, 350A and 350B, with horizontally transmitted via the thin-film circuit 137, and the bumps 150, 350A and 350B, and then sequentially passing the thin-film circuit layers 134 and 132.

Also, referring to FIG. 37, the bumps 150, 350A and 350B may serve as a power bus. The bumps 150, 350A and 350B can be connected to an internal power bus in the semiconductor chip 100. Alternatively, the bumps 150, 350A and 350B may serve as a ground bus. The bumps 150, 350A and 350B can be connected to an internal ground bus in the semiconductor chip 100.

Alternatively, referring to FIGS. 29-37, at least one polymer layer can be formed on the passivation layer 140, which can refer to FIGS. 4-5 and the corresponding description.

2. Bump Deposited on Thin-Film Circuit of a Chip being Bonded to Thick Metallization Circuit Layer of Another Chip.

In previous embodiment, the bump 150, 150a or 150b on the semiconductor chip 100 is bonded to the bump 350, 350A or 350B on the semiconductor chip 300. Alternatively, the bump 150, 150a or 150b of the semiconductor chip 100 can be bonded to a thick metallization circuit layer 391 on the semiconductor chip 300, as shown in FIGS. 38 and 39. FIG. 38 is a cross-sectional view showing a chip package where two semiconductor chips are not assembled yet according to the second embodiment. FIG. 39 is a cross-sectional view showing a chip package after two semiconductor chips shown in FIG. 38 are bonded.

Referring to FIG. 38, the structure of the semiconductor chip 100 and the size of the bump 150 can refer to FIGS. 1 and 2 and the corresponding description. The semiconductor chip 300 includes a semiconductor substrate 310, multiple thin-film dielectric layers 322, 324 and 326, multiple thin-film circuit layers 332, 334 and 336, and a passivation layer 340, which can refer to the semiconductor chip 300 shown in FIG. 29 and the corresponding description. In FIG. 38, the semiconductor chip 300 further includes a thick metallization circuit layer 390 on the passivation layer 340. The thick metallization circuit layer 390 is connected to the topmost thin-film circuit 336 through the opening 342 in the passivation layer 340. The thick metallization circuit layer 390 has a thickness D of greater than 1 μm and, preferably, greater than 3 μm, which is greater than the thicknesses U1, U2 and U3 of the thin-film circuit layers 332, 334 and 336. The structure of the thick metallization circuit layer 390 is described as follows.

Referring to FIG. 39, after providing the semiconductor chips 100 and 300, the bumps 150 and 160 formed over the semiconductor chip 100 are joined to the thick metallization circuit layer 390 formed over the semiconductor chip 300 respectively by soldering or Au—Au eutectic bonding. Next, a polymer layer 170 is filled into the gap between the semiconductor chips 100 and 300, covering the bumps 150 and 160.

Referring to FIG. 39, the thick metallization circuit layer 390 has a thick metallization circuit 391. The bump 150 is joined to the thick metallization circuit 391 with a large contact area. A plane 1000 parallel to the active surface 114 of the substrate 110 is defined. The area of projecting the contact between the bump 150 and the thick metallization circuit 391 onto the plane 1000 has an extending distance of greater than 500 μm, 800 μm or 1200 μm. The area of projecting the contact between the bump 150 and the thick metallization circuit 391 onto the plane 1000 is greater than 30,000 $μm^2$, 80,000 $μm^2$ or 150,000 $μm^2$. The bump 150 can be considered to be joined to the thick metallization circuit 391 with a large contact area if one of the above mentioned cases meets.

Referring to FIG. 38A, before the semiconductor chips 100 and 300 are bounded, a solder paste 388 can be formed on the thick metallization circuit 391 of the semiconductor chip 300. The solder paste 286 could includes tin, for example. Thereafter, the bumps 150 and 160 are attached onto the solder paste 388. Next, during a reflow process, the bumps 150 and 160 blend with the solder paste 388 and the blend solidifies to form multiple bulks 355 and 365, as shown in FIG. 39A. These bulks 355 and 365 connect the semiconductor chips 100 and 300. The bumps 150 and 160 have a topmost solder layer adapted to be joined with the solder paste 388. Alternatively, the bumps 150 and 160 may have a topmost gold layer adapted to be joined with the solder paste 388.

The bulk 355 has a least cross-sectional area parallel to the active surface 114 of the semiconductor chip 100. The least cross-sectional area of the bulk 355 is at the bottom of the bulk 355, for example. The least cross-sectional area of the bulk 355 is greater than 30,000 $μm^2$, 80,000 $μm^2$ or 150,000 $μm^2$, and has an extending distance of greater than 500 μm, 800 μm or 1200 μm, for example.

Referring to FIG. 39A, the area of projecting the contact between the bulk 355 and the thin-film circuit 137 onto the plane 1000 is greater than 30,000 $μm^2$, 80,000 $μm^2$ or 150,000 $μm^2$. The area of projecting the contact between the bulk 355 and the thin-film circuit 137 onto the plane 1000 has an extending distance of greater than 500 μm, 800 μm or 1200 μm.

Alternatively, referring to FIG. 39A, the area of projecting the contact between the bulk 355 and the thick metallization circuit 391 onto the plane 1050 is greater than 30,000 $μm^2$, 80,000 $μm^2$ or 150,000 $μm^2$. The area of projecting the contact between the bulk 355 and the thick metallization circuit 391 onto the plane 1050 has an extending distance of greater than 500 μm, 800 μm or 1200 μm.

Alternatively, referring to FIG. 39A, the ratio of the area of "projecting the contact between the bulk 355 and the thin-film circuit 137 onto the plane 1000" to the area of "projecting the thin-film circuit 137 onto the plane 1000" is greater than 0.5 or 0.8, or even equal to 1. The ratio of the area of "projecting the contact between the bulk 355 and the thick metallization circuit 391 onto the plane 1050" to the area of "projecting the thick metallization circuit 391 onto the plane 1050" is greater than 0.5 or 0.8, or even equal to 1.

Referring to FIG. 39 and FIG. 39A, the bump 150 and the bulk 355 can serve as signal transmission media for the internal elements of the semiconductor chip 100 or 300, or for the interconnection between the semiconductor chip 100 and 300. The following description takes multiple examples for the bump 150, which also can be employed for the bulk 355.

Referring to FIG. 39, the bump 150 serves as signal transmission media of the interconnection between the semiconductor chips 100 and 300. An electronic signal can be transmitted from one of the electronic elements 112 of the semiconductor chip 100 to one of the electronic elements 312 of the semiconductor chip 300, sequentially passing the thin-film circuit layers 132, 134 and 136, penetrating through the passivation layer 140, passing the bump 150 and the thick metallization circuit 391, penetrating through the passivation layer 340 and passing the thin-film circuit layers 336, 334 and 332. Alternatively, an electronic signal can be transmitted from one of the electronic elements 312 of the semiconductor chip 300 to one of the electronic elements 112 of the semiconductor chip 100, sequentially passing the thin-film circuit layers 332, 334 and 336, penetrating through the passivation layer 340, passing the thick metallization circuit 391 and the bump 150, penetrating through the passivation layer 140 and passing the thin-film circuit layers 136, 134 and 132.

Referring to FIG. 34, the bumps 150a, 150b, 350A and 350B serve as signal transmission media for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, bump 150, and the thick metallization circuit 391, with horizontally transmitted via the thin-film circuit 137, bump 150, and the thick metallization circuit 391, and then sequentially passing the thin-film circuit layers 134 and 132. Furthermore, the electronic signal can be optionally transmitted to an electronic element 312 of the semiconductor chip 300 from the bump 150 and the thick metallization circuit 391 when being transmitted from one of the electronic elements 112 of the semiconductor chip 100 to the other one thereof. The bump 150 serves as the signal transmission media for the internal elements in the semiconductor chip 100, and for the interconnection between the semiconductor chips 100 and 300.

Referring to FIG. 39, the bump 150 may serve as signal transmission media for the internal elements in the semiconductor chip 300. An electronic signal can be transmitted from one of the electronic elements 312 of the semiconductor chip 300 to the other one thereof, sequentially passing the thin-film circuit layers 332 and 334 and 336, thick metallization circuit 391, bump 150, and the thin-film circuit 137 of the semiconductor chip 100, with horizontally transmitted via the thick metallization circuit 391, bump 150, and the thin-film circuit 137, and then sequentially passing the thin-film circuit layers 336, 334 and 332. Furthermore, the electronic signal can be optionally transmitted to an electronic element 112 of the semiconductor chip 100 from the bump 150 and the thick metallization circuit 391 when being transmitted from one of the electronic elements 312 of the semiconductor chip 300 to the other one thereof. The bump 150 serves as the signal transmission media for the internal elements in the semiconductor chip 100, and for the interconnection between the semiconductor chips 100 and 300.

Referring to FIG. 39, through the bump 160, an electronic signal can be transmitted from the semiconductor chip 100 to the semiconductor chip 300 or transmitted from the semiconductor chip 300 to the semiconductor chip 100.

Referring to FIG. 39, the bump 150 not only horizontally transmits an electronic signal but also vertically transmits the electronic signal between the semiconductor chips 100 and 300. The bump 150 is joined to the thin-film circuit 137 of semiconductor chip 100 with a large contact area and joined to the thick metallization circuit 391 with a large contact area. Therefore, the performance for electrical connection between the semiconductor chips 100 and 300 can be enhanced and noise can be reduced.

Alternatively, referring to FIG. 39, the bump 150 can also serve as a power bus. The bump 150 can be connected to internal power buses in the semiconductor chips 100 and 300. The bump 150 is joined to the thin-film circuit 137 of the semiconductor chip 100 with a large contact area and joined to the thick metallization circuit 391 with a large contact area. As a result, the appearance of the power bus of the semiconductor chips 100 and 300 providing an unstable power voltage due to being interfered by noise can be diminished, so the semiconductor chips 100 and 300 can provide a stable power voltage.

Alternatively, referring to FIG. 39, the bump 150 can also serve as a ground bus. The bump 150 can be connected to internal ground buses in the semiconductor chips 100 and 300. The bump 150 is joined to the thin-film circuit 137 of the semiconductor chip 100 with a large contact area and joined to the thick metallization circuit 391 with a large contact area. As a result, the appearance of the ground bus of the semiconductor chips 100 and 300 providing an unstable ground voltage due to being interfered by noise can be diminished, so the semiconductor chips 100 and 300 can provide a stable ground voltage.

In the embodiment shown in FIGS. 38 and 39, one bump 150 is bonded to the thick metallization circuit 391. Alternatively, multiple bumps 150a and 150b can be deposited on the thin-film circuit 137 of the semiconductor chip 100. These bumps 150a and 150b can be bonded to the thick metallization circuit 391 by soldering or Au—Au eutectic bonding, as shown in FIG. 40. FIG. 40 is a cross-sectional view showing a chip package according to the second embodiment.

Referring to FIG. 40, the bumps 150a and 150b may have a similar shape to that as shown in FIG. 3 and the corresponding description, and the detail of the contacts between the bumps 150a and 150b and the thin-film circuit 137 may refer to FIG. 3 and the corresponding description. The area of projecting the contact between the thick metallization circuit 391 and the bump 150a onto the plane 1000 is greater than 30,000 $\mu m^2$, 80,000 $\mu m^2$, or 150,000 $\mu m^2$. The area of projecting the contact between the thick metallization circuit 391 and the bump 150b onto the plane 1000 is greater than 30,000 $\mu m^2$, 80,000 $\mu m^2$, or 150,000 $\mu m^2$. Alternatively, the area of projecting the contact between the thick metallization circuit 391 and one of the bumps 150a and 150b onto the plane 1000 is greater than 30,000 $\mu m^2$, 80,000 $\mu m^2$, or 150,000 $\mu m^2$, but the area of projecting the contact between the thick metallization circuit 391 and the other one of the bumps 150a and 150b onto the plane 1000 is less than 30,000 $\mu m^2$.

Referring to FIG. 40, the area of projecting the contact between the thick metallization circuit 391 and the bump 150a onto the plane 1000 has an extending distance of greater than 500 µm, 800 µm, or 1200 µm. The area of projecting the contact between the thick metallization circuit 391 and the bump 150b onto the plane 1000 has an extending distance of greater than 500 µm, 800 µm, or 1200 µm. Alternatively, the area of projecting the contact between the thick metallization circuit 391 and one of the bumps 150a and 150b onto the plane 1000 may have an extending distance of greater than 500 µm, 800 µm, or 1200 µm, but the area of projecting the contact between the thick metallization circuit 391 and the other one of the bumps 150a and 150b onto the plane 1000 may have an extending distance of less than 500 µm.

Alternatively, referring to FIGS. 40A and 40B, the bumps 150a and 150b can be attached to the chip 300 with a solder paste 286, which mechanism may refer to FIGS. 38A and 39A and the corresponding description. Using a reflow process, the bumps 150a and 150b blend with the solder paste 286, and the blend solidifies to form multiple bulks 355A and 355B. The ratio of the total area of "projecting the contact between the thick metallization circuit layer 391 and the bulks 355A and 355B onto the plane 1050" to the area of "projecting the thick metallization circuit layer 391 onto the plane 1050" is greater than 0.5 or 0.8. The ratio of the total area of "projecting the contact between the thin-film circuit 137 and the bulks 355A and 355B onto the plane 1000" to the area of "projecting the thin-film circuit 137 onto the plane 1000" is greater than 0.5 or 0.8.

Referring to FIG. 40B, the area of projecting the contact between the thick metallization circuit 391 and the bulk 355A onto the plane 1050 is greater than 30,000 $\mu m^2$, 80,000 $\mu m^2$, or 150,000 $\mu m^2$. The area of projecting the contact between the thick metallization circuit 391 and the bulk 355B onto the plane 1000 is greater than 30,000 $\mu m^2$, 80,000 $\mu m^2$, or 150,000 $\mu m^2$.

Alternatively, the area of projecting the contact between the thick metallization circuit 391 and one of the bulks 355A and 355B onto the plane 1050 is greater than 30,000 $\mu m^2$, 80,000 $\mu m^2$, or 150,000 $\mu m^2$, but the area of projecting the contact between the thick metallization circuit 391 and the other one of the bulks 355A and 355B onto the plane 1050 is less than 30,000 $\mu m^2$.

Referring to FIG. 40B, the area of projecting the contact between the thick metallization circuit 391 and the bulk 355A onto the plane 1050 has an extending distance of greater than 500 µm, 800 µm, or 1200 µm. The area of projecting the contact between the thick metallization circuit 391 and the bulk 355B onto the plane 1050 has an extending distance of greater than 500 µm, 800 µm, or 1200 µm. Alternatively, the area of projecting the contact between the thick metallization circuit 391 and one of the bulks 355A and 355B onto the plane 1050 may have an extending distance of greater than 500 µm, 800 µm, or 1200 µm, but the area of projecting the contact between the thick metallization circuit 391 and the other one of the bulks 355A and 355B onto the plane 1050 may have an extending distance of less than 500 µm.

Referring to FIG. 40B, the area of projecting the contact between the thin-film circuit 137 and the bulk 355A onto the plane 1000 is greater than 30,000 $\mu m^2$, 80,000 $\mu m^2$, or 150,000 $\mu m^2$. The area of projecting the contact between the thin-film circuit 137 and the bulk 355B onto the plane 1000 is greater than 30,000 $\mu m^2$, 80,000 $\mu m^2$, or 150,000 $\mu m^2$. Alternatively, the area of projecting the contact between the thin-film circuit 137 and one of the bulks 355A and 355B onto the plane 1000 is greater than 30,000 $\mu m^2$, 80,000 $\mu m^2$, or 150,000 $\mu m^2$, but the area of projecting the contact between the thin-film circuit 137 and the other one of the bulks 355A and 355B onto the plane 1000 is less than 30,000 $\mu m^2$.

Referring to FIG. 40B, the area of projecting the contact between the thin-film circuit 137 and the bulk 355A onto the plane 1000 has an extending distance of greater than 500 µm, 800 µm, or 1200 µm. The area of projecting the contact between the thin-film circuit 137 and the bulk 355B onto the plane 1000 has an extending distance of greater than 500 µm, 800 µm, or 1200 µm. Alternatively, the area of projecting the contact between the thin-film circuit 137 and one of the bulks 355A and 355B onto the plane 1000 may have an extending distance of greater than 500 µm, 800 µm, or 1200 µm, but the area of projecting the contact between the thin-film circuit 137 and the other one of the bulks 355A and 355B onto the plane 1000 may have an extending distance of less than 500 µm.

Referring to FIG. 40B, the bulk 355A has a least cross-sectional area parallel to the active surface 114 of the semiconductor chip 100. The least cross-sectional area of the bulk 355A is at the bottom of the bulk 355A, for example. The least cross-sectional area of the bulk 355A is greater than 30,000 $µm^2$, 80,000 $µm^2$ or 150,000 $µm^2$, for example, and has an extending distance of greater than 500 µm, 800 µm or 1200 µm. The bulk 355B has a least cross-sectional area parallel to the active surface 114 of the semiconductor chip 100. The least cross-sectional area of the bulk 355B is at the bottom of the bulk 355B, for example. The least cross-sectional area of the bulk 355B is greater than 30,000 $µm^2$, 80,000 $µm^2$ or 150,000 $µm^2$, for example, and has an extending distance of greater than 500 µm, 800 µm or 1200 µm. Alternatively, one of the bulks 355A and 355B has a least cross-sectional area of greater than 30,000 $µm^2$, 80,000 $µm^2$ or 150,000 $µm^2$, but the other one of the bulks 355A and 355B has a least cross-sectional area of less than 30,000 $µm^2$. One of the bulks 355A and 355B has a least cross-sectional area having an extending distance of greater than 500 µm, 800 µm or 1200 µm, but the other one of the bulks 355A and 355B has a least cross-sectional area having an extending distance of less than 500 µm.

Referring to FIGS. 40 and 40B, the bumps 150a and 150b and the bulks 355A, 355B can serve as signal transmission media for the internal elements of the semiconductor chip 100 or 300, or for the interconnection between the semiconductor chips 100 and 300. The following description takes multiple examples for the bumps 150a and 150b, which also can be employed for the bulks 355A and 355B.

Referring to FIG. 40, the bumps 150a and 150b serve as signal transmission media for the interconnection between the semiconductor chips 100 and 300. An electronic signal can be transmitted from one of the electronic elements 112 of the semiconductor chip 100 to one of the electronic elements 312 of the semiconductor chip 300, sequentially passing the thin-film circuit layers 132, 134 and 136, penetrating through the passivation layer 140, passing the bumps 150a and 150b and the thick metallization circuit 391, penetrating through the passivation layer 340 and passing the thin-film circuit layers 336, 334 and 332. Alternatively, an electronic signal can be transmitted from one of the electronic elements 312 of the semiconductor chip 300 to one of the electronic elements 112 of the semiconductor chip 100, sequentially passing the thin-film circuit layers 332, 334 and 336, penetrating through the passivation layer 340, passing the thick metallization circuit 391 and the bumps 150a and 150b, penetrating through the passivation layer 140 and passing the thin-film circuit layers 136, 134 and 132.

Referring to FIG. 40, the bumps 150a and 150b may serve as a signal transmission medium for the internal elements in the semiconductor chip 100. An electronic signal can be transmitted from one of the electronic elements 112 of the semiconductor chip 100 to the other one thereof, sequentially passing the thin-film circuit layers 132, 134 and 136, the bumps 150a and 150b, and the thick metallization circuit 391, with horizontally transmitted via the bumps 150a and 150b, and the thick metallization circuit 391, and then sequentially passing the thin-film circuit layers 136, 134 and 132. Furthermore, the electronic signal can be optionally transmitted into the semiconductor chip 300 from the bumps 150a and 150b and the thick metallization circuit 391 when being transmitted from one of the electronic elements 112 of the semiconductor chip 100 to the other one thereof. The bumps 150a and 150b serve as the signal transmission media for the internal elements in the semiconductor chip 100, and for the interconnection between the semiconductor chips 100 and 300.

Referring to FIG. 40, the bumps 150a and 150b may serve as a signal transmission medium for the internal elements in the semiconductor chip 300. An electronic signal can be transmitted from one of the electronic elements 312 of the semiconductor chip 300 to the other one thereof, sequentially passing the thin-film circuit layers 332, 334 and 336, the thick metallization circuit 391, and the bumps 150a and 150b, with horizontally transmitted via the thick metallization circuit 391 and the bumps 150a and 150b, and then sequentially passing the thin-film circuit layers 336, 334 and 332. Furthermore, the electronic signal can be optionally transmitted into the semiconductor chip 100 from the thick metallization circuit 391 and the bumps 150a and 150b when being transmitted from one of the electronic elements 312 of the semiconductor chip 300 to the other one thereof. The bumps 150a and 150b serve as the signal transmission media for the internal elements in the semiconductor chip 300, and for the interconnection between the semiconductor chips 100 and 300.

Referring to FIG. 40, through the bump 160, an electronic signal can be transmitted from the semiconductor chip 100 to the semiconductor chip 300 or transmitted from the semiconductor chip 300 to the semiconductor chip 100.

As the statement mentioned above, referring to FIG. 40, the bumps 150a and 150b not only horizontally transmits an electronic signal but also vertically transmits the electronic signal between the semiconductor chips 100 and 300. The bumps 150a and 150b are joined to the thin-film circuit 137 of the semiconductor chip 100 with a large contact area and joined to the thick metallization circuit 391 with a large contact area. Therefore, the performance for electrical connection between the semiconductor chips 100 and 300 can be enhanced and noise can be reduced.

Alternatively, referring to FIG. 40, the bumps 150a and 150b can serve as a power bus. The bumps 150a and 150b can be connected to internal power buses in the semiconductor chips 100 and 300. The bumps 150a and 150b are joined to the thin-film circuit 137 of the semiconductor chip 100 with a large contact area and joined to the thick metallization circuit 391 with a large contact area. As a result, the appearance of the power bus of the semiconductor chips 100 and 300 providing an unstable power voltage due to being interfered by noise can be diminished, so the semiconductor chips 100 and 300 can provide a stable power voltage.

Alternatively, referring to FIG. 40, the bumps 150a and 150b can serve as a ground bus. The bumps 150a and 150b can be connected to internal ground buses in the semiconductor chips 100 and 300. The bumps 150a and 150b are joined to the thin-film circuit 137 of the semiconductor chip 100 with a large contact area and joined to the thick metallization circuit 391 with a large contact area. As a result, the appearance of the ground bus of the semiconductor chips 100 and 300 providing an unstable ground voltage due to being interfered by noise can be diminished, so the semiconductor chips 100 and 300 can provide a stable ground voltage.

In FIGS. 38-40, the thick metallization circuit layer 390 is deposited on and in contact with the passivation layer 340.

Figure 41:
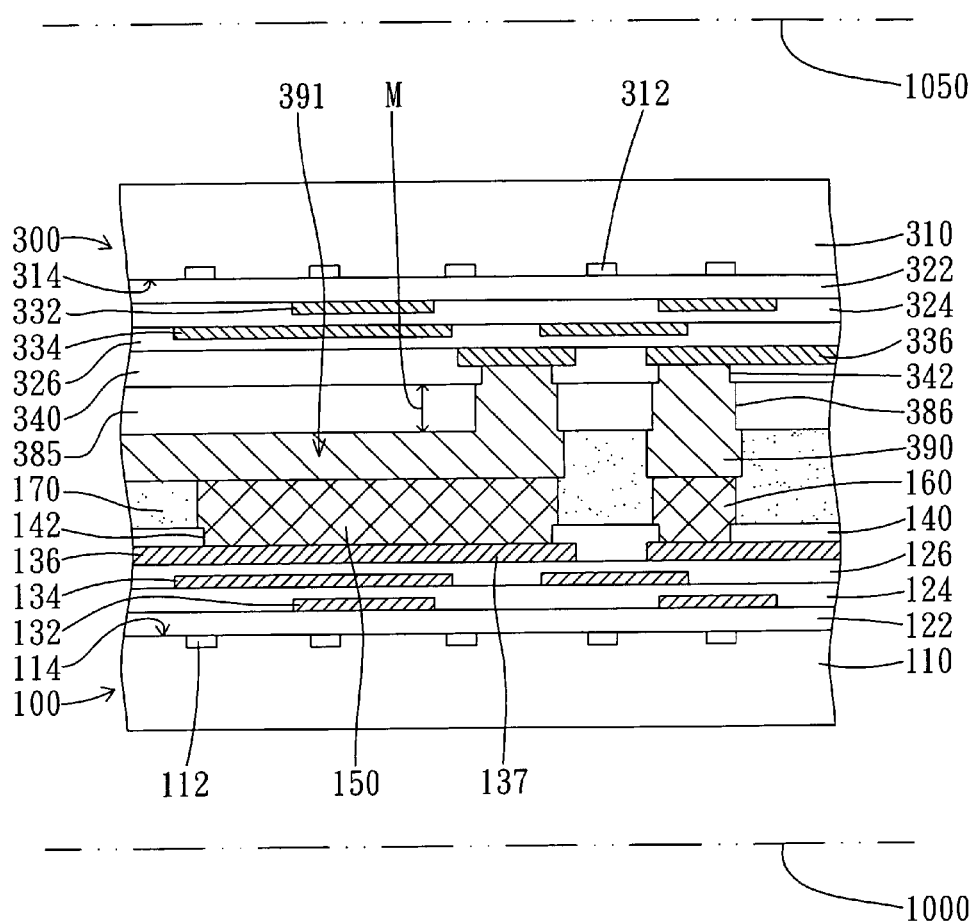
Figure 42:
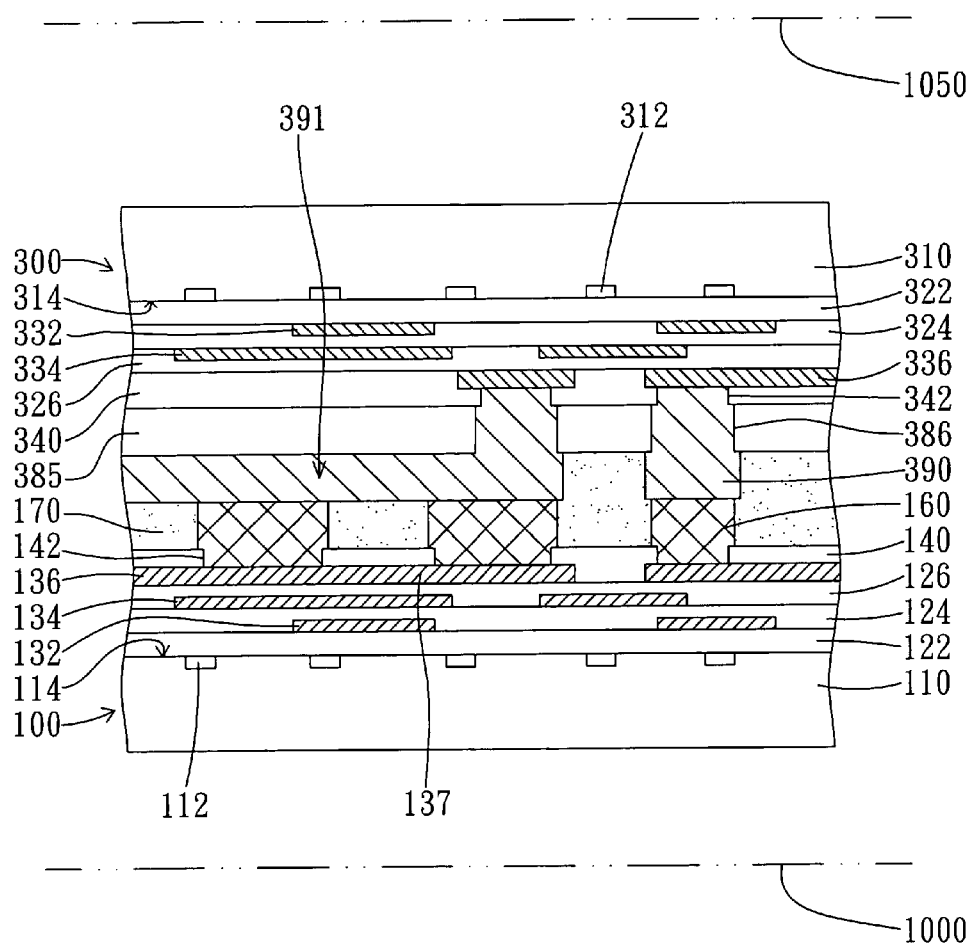

Alternatively, a polymer layer 385 can be first formed on the passivation layer 340, and then the thick metallization circuit layer 390 is formed on the polymer layer 385, as shown in FIGS. 41 and 42. FIGS. 41 and 42 are cross-sectional views showing chip packages according to the second embodiment. Referring to FIG. 41, the polymer layer 385 can be first deposited on the passivation layer 340. Multiple openings 386 in the polymer layer 346 are substantially aligned to the openings 342 in the passivation layer 340 and expose the thin-film circuit layer 336. Next, the thick metallization circuit layer 390 can be formed on the polymer layer 385 and connected to the thin-film circuit layer 336 through the openings 386 in the polymer layer 385 and the openings 342 in the passivation layer 340. The polymer layer 385 may have a thickness M of greater than 1 μm and could be polyimide (PI), benzocyclobutence (BCB), parylene, porous dielectric material or elastomer. The detail of the contact between the bump 150 and the thick metallization circuit 391, and the electric function for the bump 150 can refer to FIGS. 38 and 39 and the corresponding description. The detail of the contact between the bump 150 and the thin-film circuit 137 can refer to FIGS. 1 and 2 and the corresponding description.

Referring to FIG. 42, a polymer layer 385 is formed on the passivation layer 340. Multiple bumps 150a and 150b are joined to the thick metallization circuit 391. The detail of the contacts between the bumps 150a and 150b and the thick metallization circuit 391, and the electric function for the bumps 150a and 150b can refer to FIG. 40 and the corresponding description. The detail of the contact between the bumps 150a and 150b and the thin-film circuit 137 can refer to FIG. 3 and the corresponding description.

Figure 43:
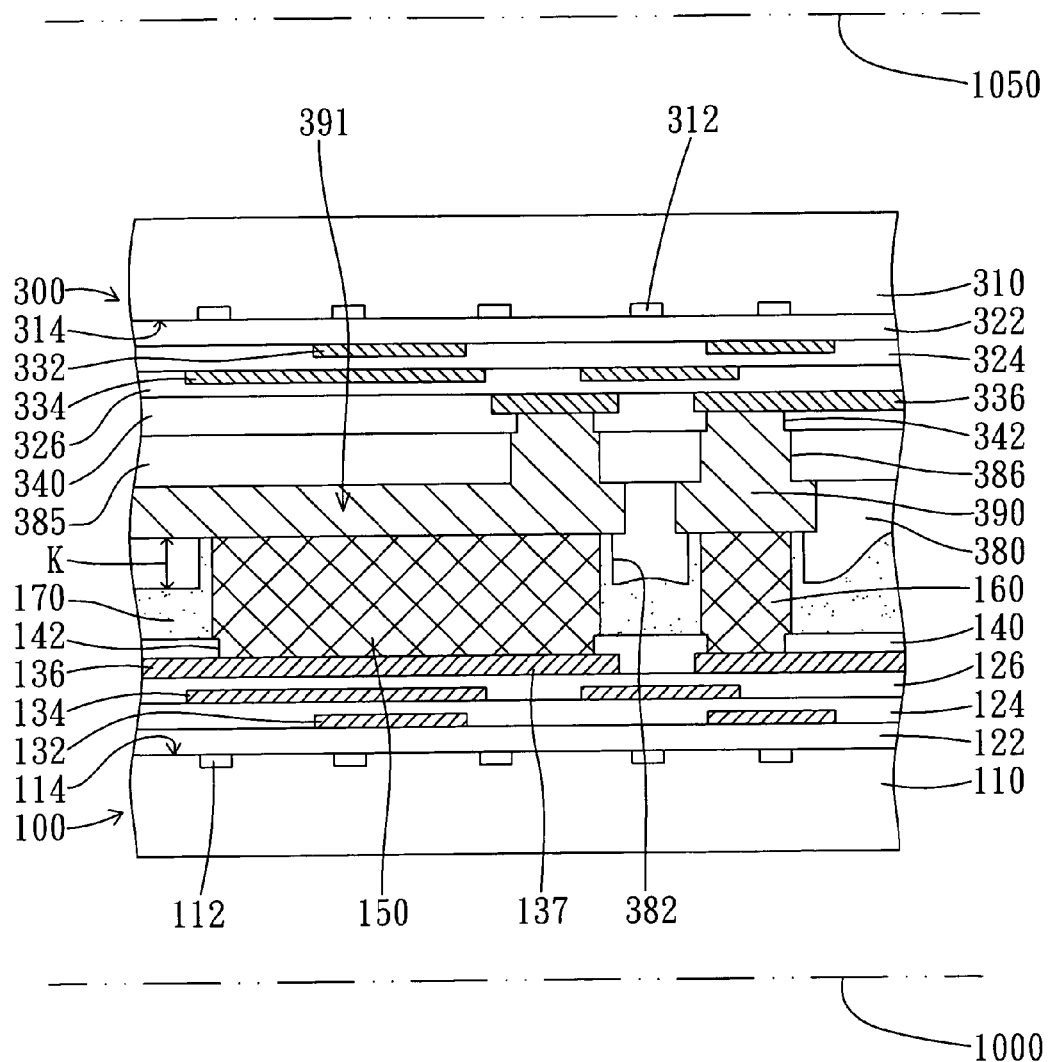
Figure 44:
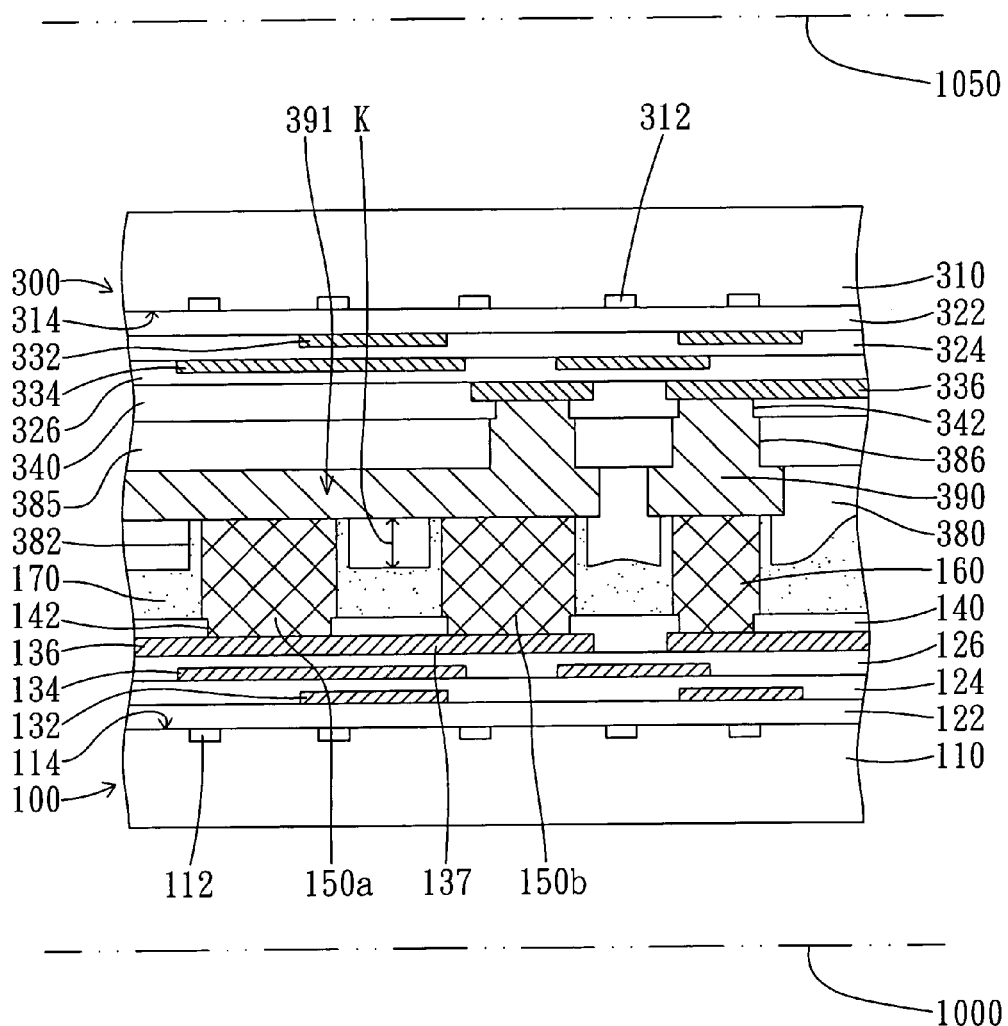

FIGS. 43 and 44 are cross-sectional views showing other chip packages according to the second embodiment. Referring to FIG. 43, after the thick metallization circuit layer 390 is deposited on the polymer layer 385, a polymer layer 380 is deposited on the thick metallization circuit layer 390. Multiple openings 382 in the polymer layer 380 expose the thick metallization circuit layer 390. The polymer layer 380 may have a thickness K of greater than 1 μm and could be polyimide (PI), benzocyclobutence (BCB), parylene, porous dielectric material or elastomer. The detail of the contact between the bump 150 and the thick metallization circuit 391, and the electric function for the bump 150 can refer to FIGS. 38 and 39 and the corresponding description. The detail of the contact between the bump 150 and the thin-film circuit 137 can refer to FIGS. 1 and 2 and the corresponding description.

Referring to FIG. 44, the semiconductor chip 300 is similar to that shown in FIG. 43 and can refer to the corresponding description. The only difference is that, in FIG. 44, multiple bumps 150a and 150b are joined to the thick metallization circuit layer 391. The detail of the contacts between the bumps 150a and 150b and the thick metallization circuit 391, and the electric function for the bumps 150a and 150b can refer to FIG. 40 and the corresponding description. The detail of the contacts between the bumps 150a and 150b and the thin-film circuit 137 can refer to FIG. 3 and the corresponding description.

Figure 45:
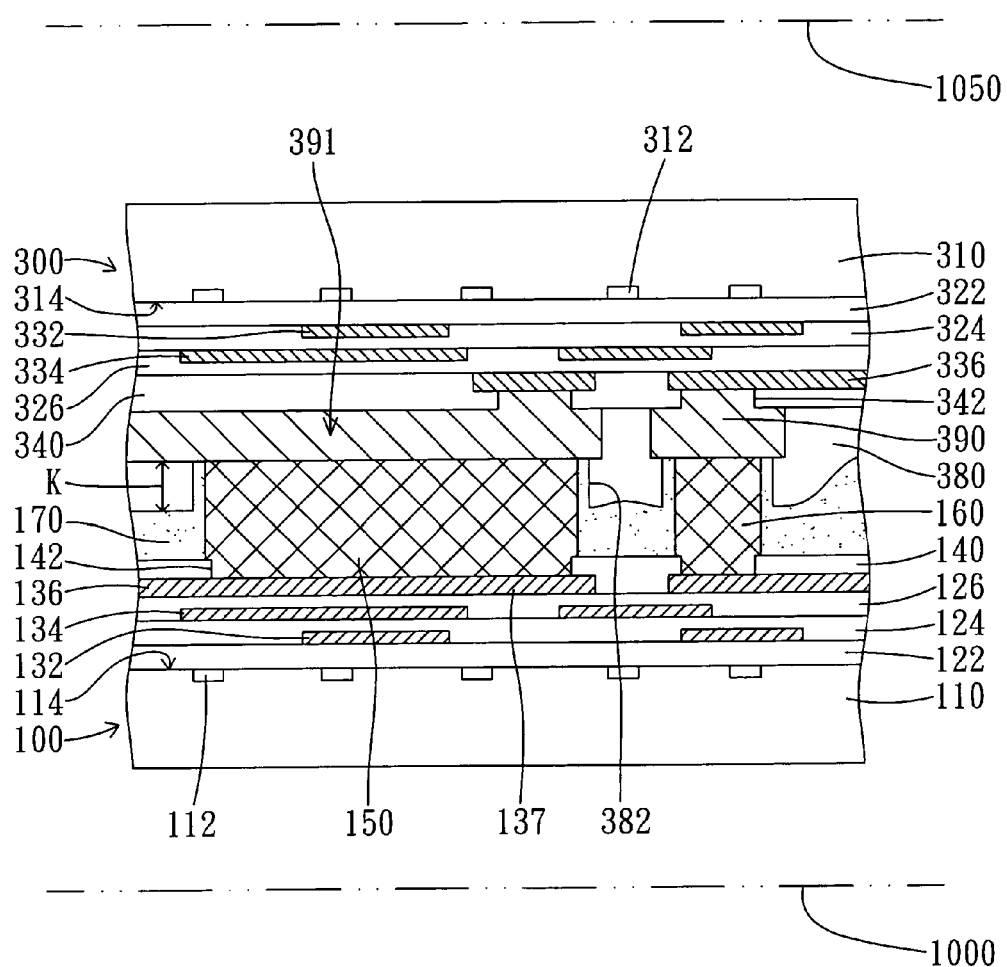
Figure 46:
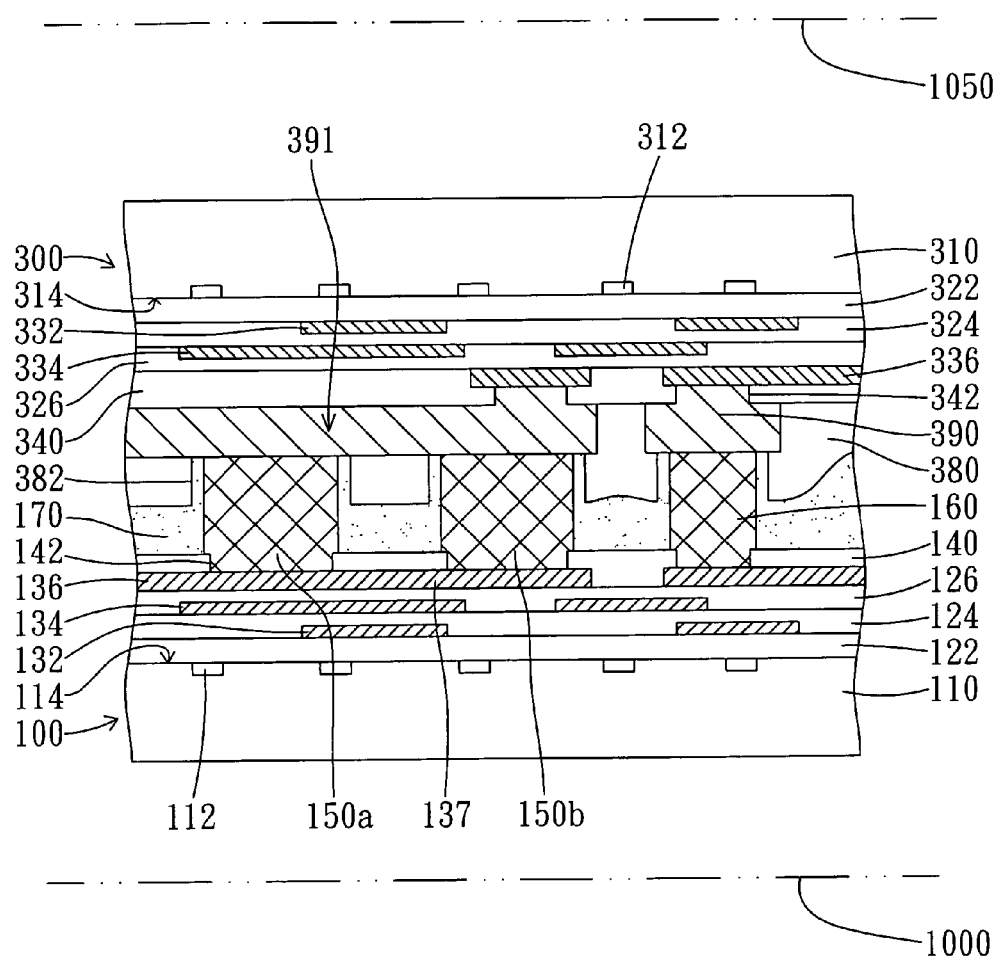

FIGS. 45 and 46 and cross-sectional views showing other chip packages according to the second embodiment. Referring to FIG. 45, the thick metallization circuit layer 390 is deposited on and in contact with the passivation layer 340. A polymer layer 380 is formed on the thick metallization circuit layer 390. Multiple openings 382 in the polymer layer 380 exposes the thick metallization circuit layer 390. The polymer layer 180 may have a thickness k of greater than 1 μm and could be polyimide (PI), benzocyclobutence (BCB), parylene, porous dielectric material or elastomer. The detail of the contact between the bump 150 and the thick metallization circuit 391, and the electric function for the bump 150 can refer to FIGS. 38 and 39 and the corresponding description. The detail of the contact between the bump 150 and the thin-film circuit 137 can refer to FIGS. 1 and 2 and the corresponding description.

Referring to FIG. 46, the semiconductor chip 300 is similar to that shown in FIG. 45 and can refer to the corresponding description. The only difference is that, in FIG. 46, multiple bumps 150a and 150b are joined to the thick metallization circuit layer 391. The detail of the contacts between the bumps 150a and 150b and the thick metallization circuit 391, and the electric function for the bumps 150a and 150b can refer to FIG. 40 and the corresponding description. The detail of the contacts between the bumps 150a and 150b and the thin-film circuit 137 can refer to FIG. 3 and the corresponding description.

Figure 47:
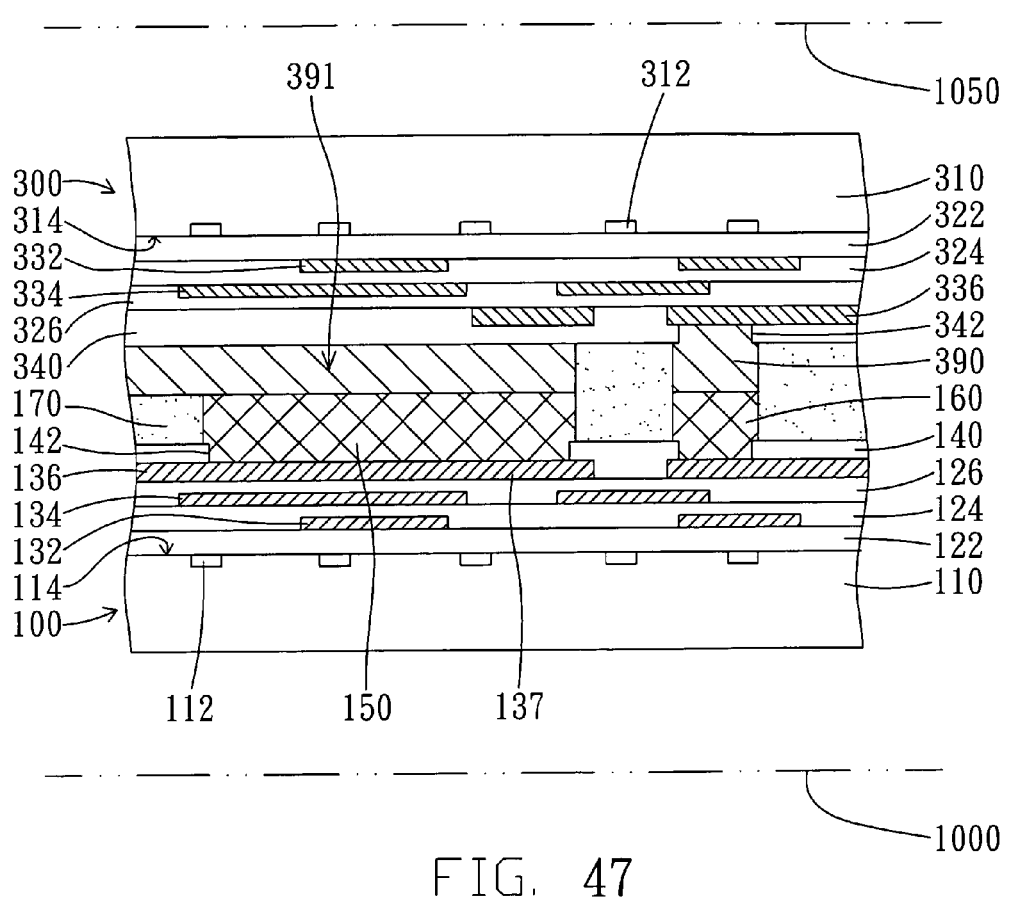

Referring to FIG. 47, the thick metallization circuit 391 can be disconnected from the thin-film circuit 336. The bumps 150 and 350 can be joined together with a large contact area, which can refer to FIGS. 38 and 39 and the corresponding description. The thick metallization circuit 391 is deposited on and in contact with the passivation layer 340. Alternatively, a polymer layer (unshown) can be formed on the passivation layer 340, and then a thick metallization circuit 391 disconnected from the thin-film circuit 336 on the polymer layer. Alternatively, after forming the thick metallization circuit 391 disconnected from the thin-film circuit 336, a polymer layer can be formed on the thick metallization circuit 391.

Referring to FIG. 47, the bump 150 can serve as a signal transmission medium for the internal elements of the semiconductor chip 100. An electronic signal can be transmitted from one of the electronic elements 112 of the semiconductor chip 100 to the other one thereof, sequentially passing the thin-film circuit layers 132 and 134, thin-film circuit 137, bump 150 and thick metallization circuit 391, with horizontally transmitted via the thin-film circuit 137, bump 150, and thick metallization circuit 391, and then sequentially passing the thin-film circuit layers 134 and 132.

Also, referring to FIG. 47, the bump 150 can serve as a power bus. The bump 150 and thick metallization circuit 391 can be connected to an internal power bus in the semiconductor chip 100. Alternatively, the bump 150 and thick metallization circuit 391 can be connected to an internal ground bus in the semiconductor chip 100.

Figure 48:
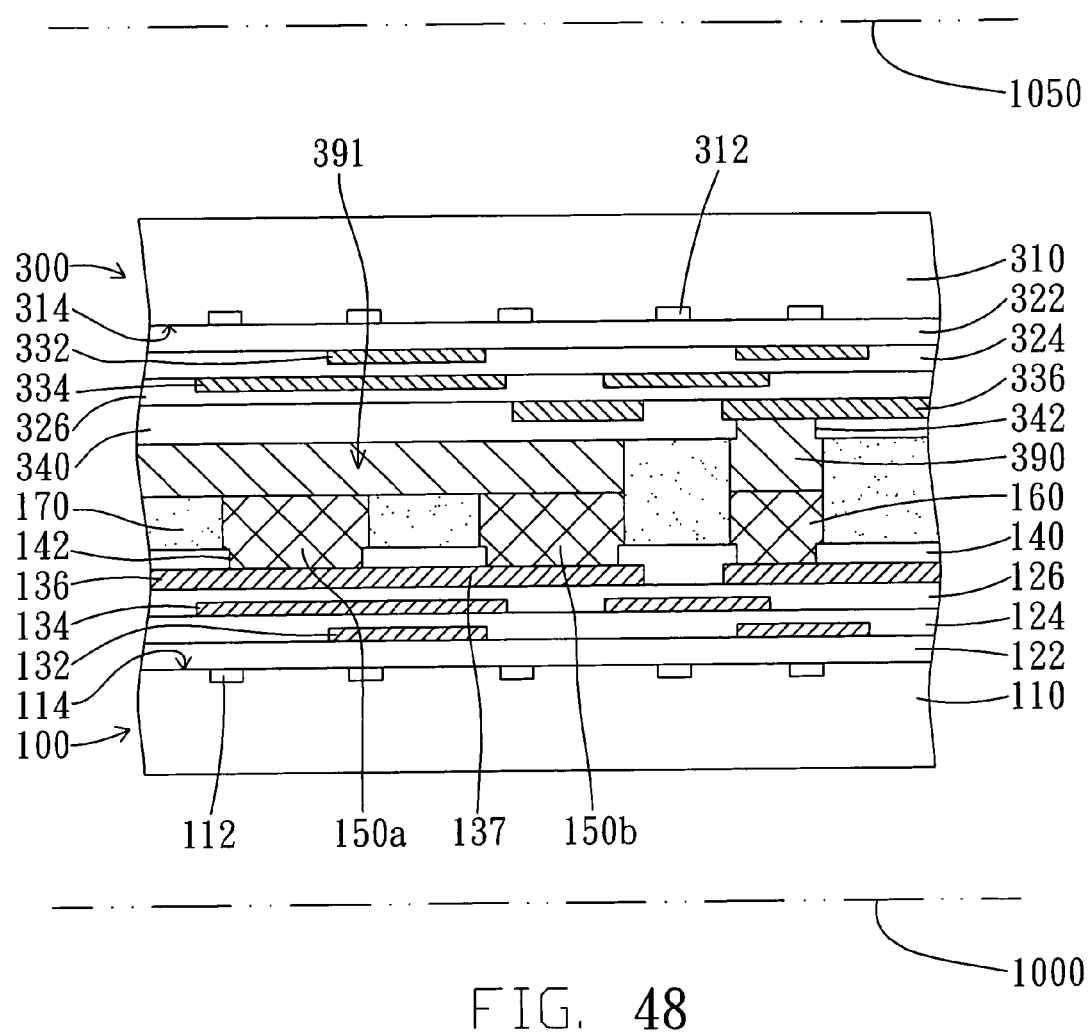

Alternatively, referring to FIG. 48, multiple bumps 150a and 150b are deposited on the thin-film circuit 137 with a large contact area, which can refer to FIG. 3 and the corresponding description. The thick metallization circuit 391 is disconnected from the thin-film circuit 336, and joined to the bumps 150a and 150b with large contact areas, which can refer to FIG. 40 and the corresponding description.

Referring to FIG. 48, the bumps 150a and 150b can serve as a signal transmission medium for the internal elements of the semiconductor chip 100. An electronic signal can be transmitted from one of the electronic elements 112 of the semiconductor chip 100 to the other one thereof, sequentially passing the thin-film circuit layers 132 and 134, thin-film circuit 137, bumps 150a and 150b and thick metallization circuit 391, with horizontally transmitted via the thin-film circuit 137, bumps 150a and 150b, and thick metallization circuit 391, and then sequentially passing the thin-film circuit layers 134 and 132.

Also, referring to FIG. 48, the bumps 150a and 150b can serve as power buses. The bumps 150a and 150b and thick metallization circuit 391 can be connected to an internal power bus in the semiconductor chip 100. Alternatively, the bumps 150a and 150b and thick metallization circuit 391 can be connected to an internal ground bus in the semiconductor chip 100.

Figure 49:
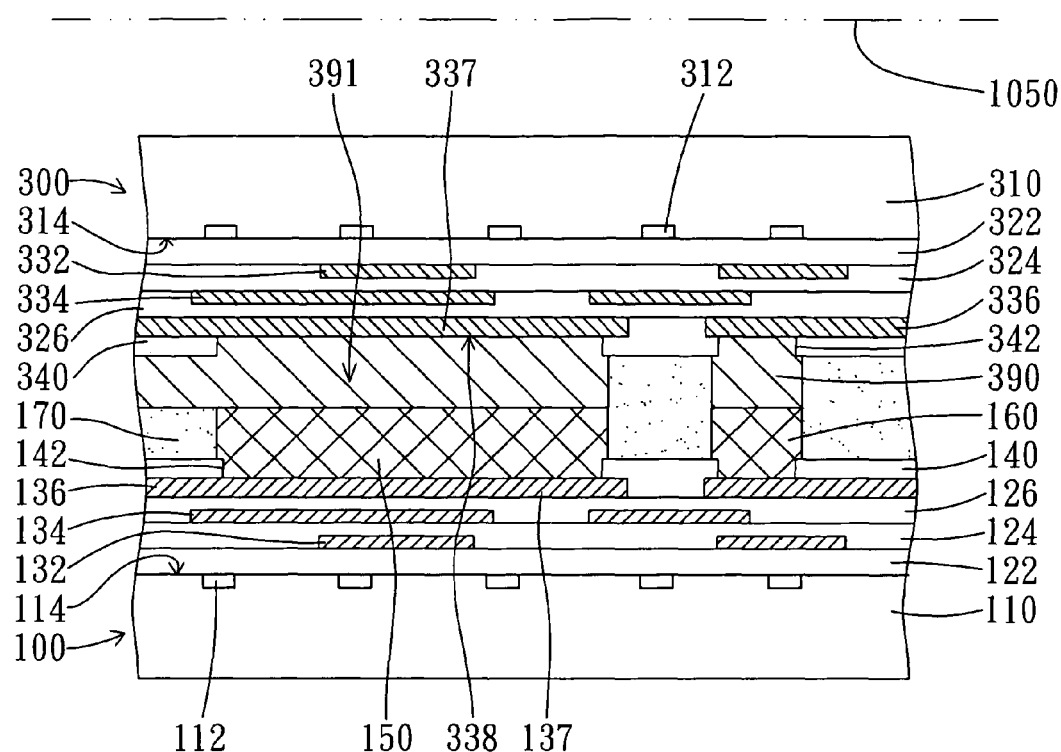
Figure 50:
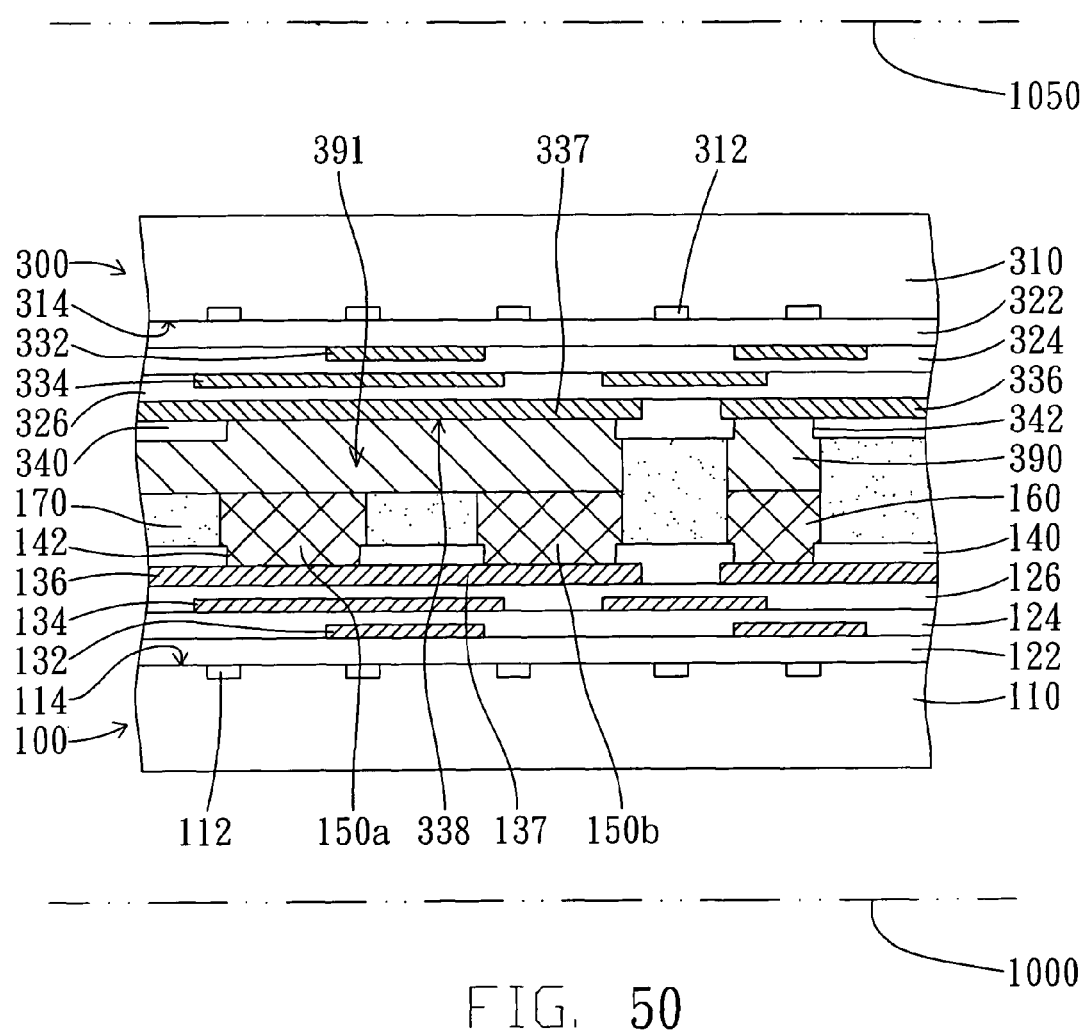

In FIGS. 38-48, the thick metallization circuit 391 is connected to the topmost thin-film circuit layer 336 with a small contact area. Alternatively, the thick metallization circuit 391 can be joined to the topmost thin-film circuit layer 336 with a large contact area, as shown in FIGS. 49 and 50. FIGS. 49 and 50 are cross-sectional views showing chip packages according to the second embodiment.

Referring to FIG. 49, the thick metallization circuit 391 is joined to a contact 338 of the topmost thin-film circuit layer 336. The contact 338 can extend with various types, such as the pattern with linear extension, curve extension, irregular extension with discontinuous bends, or branch-like extension. Alternatively, the area of projecting the contact 338 onto the plane 1000 may be circle-patterned, oval-patterned, or polygon-patterned.

Referring to FIG. 49, the ratio of the area of "projecting the contact between the thick metallization circuit 391 and the thin-film circuit 337 onto the plane 1000" to the area of "projecting the thin-film circuit 337 onto the plane 1000" is greater than 0.5 or 0.8, or even equal to 1.

The area of the thin-film circuit 337 exposed by the opening 342 in the passivation layer 340 is greater than 30,000 $\mu m^2$, 80,000 $\mu m^2$ or 150,000 $\mu m^2$. Therefore, the thick metallization circuit 391 can be connected to the thin-film circuit 337 exposed by the opening 342 in the passivation layer 340. The area of projecting the contact between the thick metallization circuit 391 and thin-film circuit 337 onto the plane 1000 is greater than 30,000 $\mu m^2$, 80,000 $\mu m^2$, or 150,000 $\mu m^2$. The area of projecting the contact between the thick metallization circuit 391 and thin-film circuit 337 onto the plane 1000 may have an extending distance of greater than 500 $\mu m$, 800 $\mu m$, or 1500 $\mu m$.

Referring to FIGS. 49-50, the detail of the contact between the thick metallization circuit 391 and the thin-film circuit 337 can refer to the detail of the contact between the thick metallization circuit 191 and the thin-film circuit 137 shown in FIG. 20, which takes an example of the contact between the thick metallization circuit 191 and the thin-film circuit 137 having the pattern of linear extension. The description concerning the contact between the thick metallization circuit 391 and the thin-film circuit 337 can be clearly understood if the detail of the contact between the thick metallization circuit 191 and the thin-film circuit 137 of the semiconductor chip 100 shown in FIG. 20A is referred to.

Referring to FIG. 49, the bump 150 is joined to the thick metallization circuit 391 over the contact 338. Alternatively, the bump 150 can be joined to anywhere of the thick metallization circuit 391. The detail of the contact between the bump 150 and the thick metallization circuit 391 can refer to FIGS. 38 and 39 and the corresponding description. Alternatively, as shown in FIG. 50, multiple bumps 150a and 150b can be joined to the thick metallization circuit 391. The thick metallization circuit 391 is connected to the thin-film circuit 337 with a large contact area. The detail of the contact between the thick metallization circuit 391 and the thin-film circuit 337 can refer to FIG. 49 and the corresponding description.

Referring to FIGS. 49 and 50, the thick metallization circuit 391 can be connected to the thin-film circuit 337 with a large contact area. The bump 150, 150a or 150b can be joined to the thick metallization circuit 391 and the thin-film circuit 137 with a large contact area. Therefore, the performance for electrical connection between the semiconductor chips 100 and 300 can be enhanced. Alternatively, a polymer layer can be formed over the passivation layer 340 shown in FIGS. 49 and 50, which can refer to FIGS. 41-46 and the corresponding description.

Figure 51:
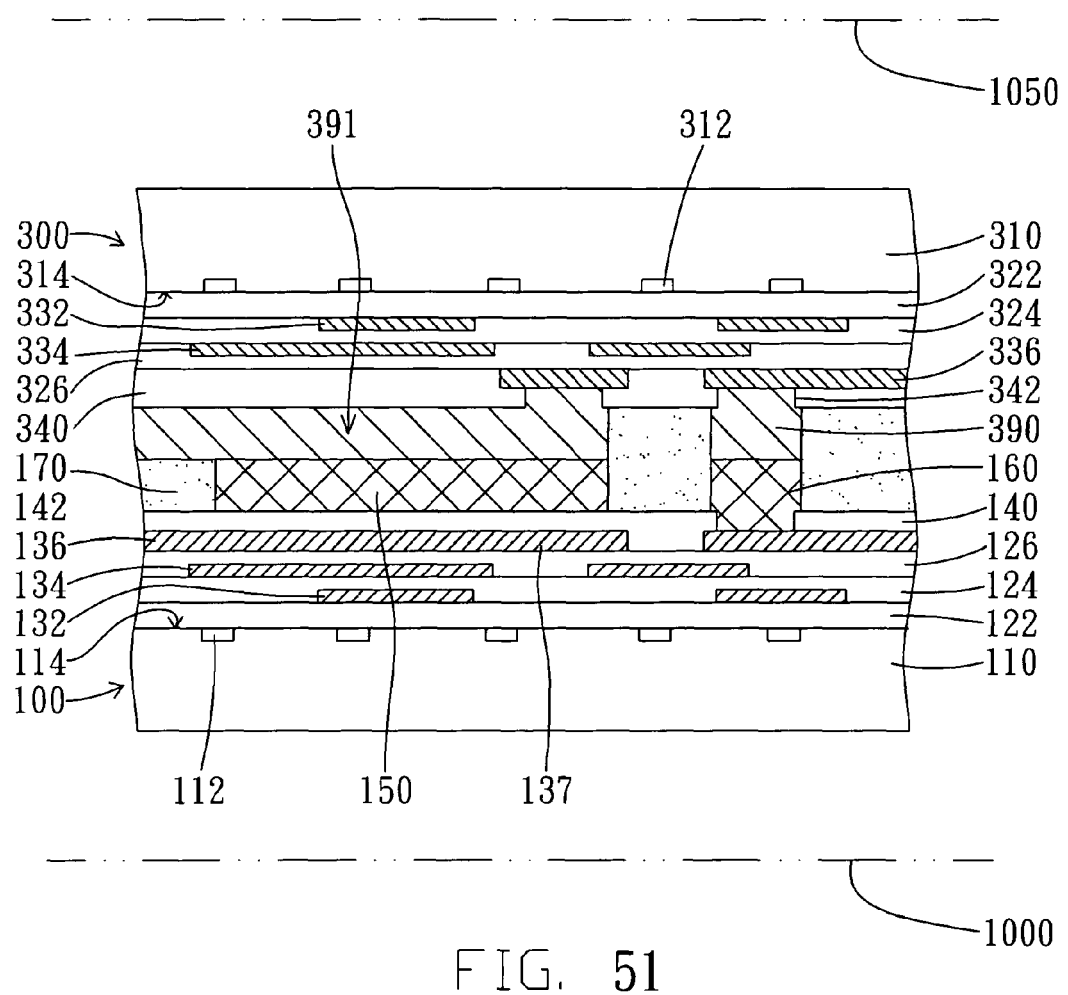

Alternatively, the bump 150 can be disconnected from the thin-film circuit 137, as shown in FIG. 51. FIG. 51 is a cross-sectional view showing another chip package according to the second embodiment.

Referring to FIG. 51, the bump 150 can serve as a signal transmission medium for the internal elements of the semiconductor chip 300. An electronic signal can be transmitted from one of the electronic elements 312 of the semiconductor chip 300 to the other one thereof, sequentially passing the thin-film circuit layers 332, 334 and 336, thick metallization circuit 391 and bump 150, with horizontally transmitted via the bump 150 and thick metallization circuit 391, and then sequentially passing the thin-film circuit layers 336, 334 and 332.

Alternatively, at least one polymer layer can be formed on the passivation layer 140 shown in FIGS. 38-51, which can refer to FIGS. 4 and 5 and the corresponding description.

Those skilled in the art should realize that the bonding by a bump and a solder paste can be employed in all of the above-mentioned chip packages, which can refer to FIGS. 38A, 39A, 40A and 40B.

3. Third Embodiment of Chip Packages

In the previous embodiments, the bumps 150 and 160 are joined to substrate 200 or semiconductor chip 300 by soldering or Au—Au eutectic bonding. Alternatively, the bumps 150 and 160 can be electrically connected to a substrate 400 through a conductive layer 450 with polymer 452 and multiple metal particles 454, as shown in FIGS. 52-56. The structure of the semiconductor chip 100 can refer to that described in the first embodiment. The substrate 400 could be a glass substrate, a ceramic substrate, or a substrate composed of multiple polymer layers. FIGS. 52-56 show a substrate taking an example of a glass substrate including a transparent circuit layer 410, such as ITO (Indium Tin Oxide). Some feasible embodiments are described as follows.

1. Bump on Thin-Film Circuit or Passivation Layer of Semiconductor Chip being Bonded to Circuit Layer of Glass Substrate Through Metal Particles in Conductive Layer FIG. 52 is a cross-sectional view showing a chip package before a semiconductor chip and glass substrate being assembled according to the third embodiment. FIG. 53 is a cross-sectional view showing a chip package created after bonding a semiconductor chip and glass substrate shown in FIG. 52.

Referring to FIG. 52, before the semiconductor chip 100 and glass substrate are bonded, a conductive layer 450, such as anisotropic conductive paste (ACP) or anisotropic conductive film (ACF), can be first formed on the glass substrate 400. The conductive layer 450 comprises a polymer 452 and multiple metal particles 454 scattering in the polymer 452.

Referring to FIG. 52, the bump 150 is joined to the thin-film circuit 137 with a large contact area. The detail of the contact between the bump 150 and thin-film circuit 137 can refer to the corresponding description concerning the detail of the contact between the bump 150 and thin-film circuit 137 shown in FIGS. 1 and 2.

Referring to FIG. 53, after providing the semiconductor chip 100 and glass substrate 400, the bump 150 on the semiconductor chip 100 can be pressed into the conductive layer 450 on the glass substrate 400. The bumps 150 and 160 can be electrically connected to the circuit layer 410 and the contact 414 of the glass substrate 400 through the metal particles 454 of the conductive layer 450. The polymer 452 of the conductive layer 450 covers the bumps 150 and 160.

Referring to FIG. 53, a plane 1000 parallel to the active surface 114 of the semiconductor chip 100 is defined. The patterns of projecting the top surface 155 of the bump 150 and the top surface 411 of the circuit layer 410 of the glass substrate 400 onto the plane 1000 have an overlapping area of greater than 30,000 $\mu m^2$, 80,000 $\mu m^2$ or 150,000 $\mu m^2$. The overlapping area has an extending distance of greater than 500 $\mu m$, 800 $\mu m$ or 1200 $\mu m$.

Referring to FIG. 53, the top surface 155 of the bump 150 has a large area, and therefore can be joined with much more metal particles 454 of the conductive layer 450. As a result, the cross-sectional area allowing electric current flowing between the bump 150 and the glass substrate 400 to flow through can be increased. The performance for electrical connection between the semiconductor chip 100 and the glass substrate 400 can be enhanced.

Referring to FIG. 53, the bump 150 can serve as the signal transmission media for the internal elements of the semiconductor chip 100, for the internal elements of the glass substrate 400, or for the interconnection between the semiconductor chip 100 and the glass substrate 400, described as follows.

Referring to FIG. 53, the bump 150 serves as the signal transmission medium for the interconnection between the semiconductor chip 100 and glass substrate 400. An electronic signal can be transmitted from one of the electronic elements 112 of the semiconductor chip 100 to the glass substrate 400, sequentially passing the thin-film circuit layers 132, 134 and 136, penetrating through the passivation layer 140, and passing the bump 150. Alternatively, an electronic signal can be transmitted from the glass substrate 400 to one of the electronic elements 112 of the semiconductor chip 100, sequentially passing the bump 150, thin-film circuit 137 and thin-film circuit layers 134 and 132.

Referring to FIG. 53, the bump 150 serves as the signal transmission medium for the internal elements in the semiconductor chip 100. An electronic signal can be transmitted from one of the electronic elements 112 of the semiconductor chip 100 to the other one thereof, sequentially passing the thin-film circuit layers 132 and 134, thin-film circuit 137, bump 150, and the circuit layer 410 of the glass substrate 400, with horizontally transmitted via the thin-film circuit 137, bump 150 and the circuit layer 410 of the glass substrate 400, and then sequentially passing the thin-film circuit layers 134 and 132.

Furthermore, the electronic signal can be optionally transmitted into the glass substrate 400 from the bump 150 when being transmitted from one of the electronic elements 112 of the semiconductor chip 100 to the other one thereof. The bump 150 serves as the signal transmission media for the internal elements in the semiconductor chip 100, and for the interconnection between the semiconductor chip 100 and the glass substrate 400.

Referring to FIG. 53, the bump 150 serves as the signal transmission medium for the internal elements in the glass substrate 400. An electronic signal can be transmitted from one part of the glass substrate 400 to the other part thereof, passing the circuit layer 410 of the glass substrate 400, the bump 150 and the thin-film circuit 137, with horizontally transmitted via the circuit layer 410 of the glass substrate 400, the bump 150 and the thin-film circuit 137. Furthermore, the electronic signal can be optionally transmitted to the electronic elements 112 of the semiconductor chip 100 from the bump 150 when being transmitted from one part of the glass substrate 400 to the other part thereof. The bump 150 serves as the signal transmission media for the internal elements in the glass substrate 400 and for the interconnection between the semiconductor chip 100 and glass substrate 400.

Referring to FIG. 53, through the bump 160, an electronic signal can be transmitted from the semiconductor chip 100 to the glass substrate 400 or transmitted from the glass substrate 400 to the semiconductor chip 100.

Referring to FIG. 53, the bump 150 not only horizontally transmits an electronic signal but also vertically transmits the electronic signal between the semiconductor chip 100 and glass substrate 400. The top surface 155 of the bump 150 has a large area, and therefore can be joined with much more metal particles 454 in the conductive layer 450 for electrically connecting the bump 150 to the glass substrate 400. As a result, the cross-sectional area allowing electric current flowing between the bump 150 and the glass substrate 400 to flow through can be increased. The performance for electrical connection between the semiconductor chip 100 and the glass substrate 400 can be enhanced.

Alternatively, referring to FIG. 53, the bump 150 can serve as a power bus. The bump 150 can be connected to an internal power bus in the semiconductor chip 100, and to an internal power bus in the glass substrate 400. The top surface 155 of the bump 150 has a large area, and therefore can be joined with much more metal particles 454 of the conductive layer 450 for electrically connecting the bump 150 to the glass substrate 400. As a result, the cross-sectional area allowing electric current flowing between the bump 150 and the glass substrate 400 to flow through can be increased. As a result, the appearance of the power bus of the semiconductor chip 100 providing an unstable power voltage due to being interfered by noise can be diminished, so the semiconductor chip 100 can provide a stable power voltage.

Alternatively, referring to FIG. 53, the bump 150 can serve as a ground bus. The bump 150 can be connected to an internal ground bus in the semiconductor chip 100, and to an internal ground bus in the glass substrate 400. The top surface 155 of the bump 150 has a large area, and therefore can be joined with much more metal particles 454 of the conductive layer 450 for electrically connecting the bump 150 to the glass substrate 400. As a result, the cross-sectional area allowing electric current flowing between the bump 150 and the glass substrate 400 to flow through can be increased. As a result, the appearance of the ground bus of the semiconductor chip 100 providing an unstable ground voltage due to being interfered by noise can be diminished, so the semiconductor chip 100 can provide a stable ground voltage.

In FIGS. 52-53, the thin-film circuit 137 is joined with only one bump 150 with a large contact area. Alternatively, the thin-film circuit 137 can be joined with multiple bumps 150a and 150b with large contact areas, as shown in FIG. 54. FIG. 54 is a cross-sectional view showing another chip package according to the third embodiment.

Referring to FIG. 54, the thin-film circuit 137 of the semiconductor chip 100 can be connected to the circuit layer 410 of the glass substrate 400 through multiple bumps 150a and 150b. The bumps 150a and 150b are joined with the thin-film circuit 137 with large contact areas. The detail of the contact between the bumps 150a and 150b and the thin-film circuit 137 can refer to FIG. 3 and the corresponding description.

Referring to FIG. 54, the patterns of projecting the top surface 155a of the bump 150a and the top surface 411 of the circuit layer 410 of the glass substrate 400 onto the plane 1000 has an overlapping area of greater than 30,000 $\mu m^2$, 80,000 $\mu m^2$ or 150,000 $\mu m^2$. The patterns of projecting the top surface 155b of the bump 150b and the top surface 411 of the circuit layer 410 of the glass substrate 400 onto the plane 1000 has an overlapping area of greater than 30,000 µm², 80,000 µm² or 150,000 µm². Alternatively, the patterns of projecting the top surface 411 of the circuit layer 410 of the glass substrate 400 and one of the top surfaces 155a and 155b of the bumps 150a and 150b onto the plane 1000 has an overlapping area of greater than 30,000 µm², 80,000 µm² or 150,000 µm², but the patterns of projecting the top surface 411 of the circuit layer 410 of the glass substrate 400 and the other one of the top surfaces 155a and 155b of the bumps 150a and 150b onto the plane 1000 has an overlapping area of less than 30,000 µm².

Referring to FIG. 54, the patterns of projecting the top surface 155a of the bump 150a and the top surface 411 of the circuit layer 410 of the glass substrate 400 onto the plane 1000 has an overlapping area having an extending distance of greater than 500 µm, 800 µm or 1200 µm. The patterns of projecting the top surface 155b of the bump 150b and the top surface 411 of the circuit layer 410 of the glass substrate 400 onto the plane 1000 has an overlapping area having an extending distance of greater than 500 µm, 800 µm or 1200 µm. Alternatively, the patterns of projecting the top surface 411 of the circuit layer 410 of the glass substrate 400 and one of the top surfaces 155a and 155b of the bumps 150a and 150b onto the plane 1000 has an overlapping area having an extending distance of greater than 500 µm, 800 µm or 1200 µm, but the pattern of projecting the top surface 411 of the circuit layer 410 of the glass substrate 400 and the other one of the top surfaces 155a and 155b of the bumps 150a and 150b onto the plane 1000 has an overlapping area having an extending distance of less than 500 µm.

Referring to FIG. 54, the patterns of projecting the top surface 411 of the circuit layer 410 of the glass substrate 400 and the top surfaces 155a and 155b of the bumps 150a and 150b onto the plane 1000 have overlapping areas, total of which are greater than 30,000 µm², 80,000 µm² or 150,000 µm². The circuit layer 410 of the glass substrate 400 has a circuit 415 electrically connected to the bumps 150a and 150b. The ratio of the total overlapping area of the patterns of "projecting the top surface 411 of the circuit 415 and the top surfaces 155a and 155b of the bumps 150a and 150b onto the plane 1000" to the area of "projecting the top surface 411 of the circuit 415 onto the plane 1000" is greater than 0.5 or 0.8.

Referring to FIG. 54, the bumps 150a and 150b can serve as the signal transmission media for the internal elements of the semiconductor chip 100, for the internal elements of the glass substrate 400, or for the interconnection between the semiconductor chips 100 and the glass substrate 400, described as follows.

Referring to FIG. 54, the bumps 150a and 150b serve as the signal transmission medium for the interconnection between the semiconductor chip 100 and glass substrate 400. An electronic signal can be transmitted from one of the electronic elements 112 of the semiconductor chip 100 to the glass substrate 400, sequentially passing the thin-film circuit layers 132, 134 and 136, penetrating through the passivation layer 140, and passing the bumps 150a and 150b. Alternatively, an electronic signal can be transmitted from the glass substrate 400 to one of the electronic elements 112 of the semiconductor chip 100, sequentially passing the bumps 150a and 150b, thin-film circuit 137 and thin-film circuit layers 134 and 132.

Referring to FIG. 54, the bumps 150a and 150b serve as the signal transmission medium for the internal elements in the semiconductor chip 100. An electronic signal can be transmitted from one of the electronic elements 112 of the semi-conductor chip 100 to the other one thereof, sequentially passing the thin-film circuit layers 132 and 134, thin-film circuit 137, bumps 150a and 150b, and the circuit layer 410 of the glass substrate 400, with horizontally transmitted via the thin-film circuit 137, bumps 150a and 150b and the circuit layer 410 of the glass substrate 400, and then sequentially passing the thin-film circuit layers 134 and 132. Furthermore, the electronic signal can be optionally transmitted into the glass substrate 400 from the bumps 150a and 150b when being transmitted from one of the electronic elements 112 of the semiconductor chip 100 to the other one thereof. The bumps 150a and 150b serve as the signal transmission media for the internal elements in the semiconductor chip 100, and for the interconnection between the semiconductor chip 100 and the glass substrate 400.

Referring to FIG. 54, the bump 150a and 150b serve as the signal transmission medium for the internal elements in the glass substrate 400. An electronic signal can be transmitted from one part of the glass substrate 400 to the other part thereof, passing the circuit layer 410 of the glass substrate 400, the bumps 150a and 150b and the thin-film circuit 137, with horizontally transmitted via the circuit layer 410 of the glass substrate 400, the bumps 150a and 150b and the thin-film circuit 137. Furthermore, the electronic signal can be optionally transmitted to the electronic elements 112 of the semiconductor chip 100 from the bumps 150a and 150b when being transmitted from one part of the glass substrate 400 to the other part thereof. The bumps 150a and 150b serve as the signal transmission media for the internal elements in the glass substrate 400 and for the interconnection between the semiconductor chip 100 and glass substrate 400.

Referring to FIG. 54, through the bump 160, an electronic signal can be transmitted from the semiconductor chip 100 to the glass substrate 400 or transmitted from the glass substrate 400 to the semiconductor chip 100.

Referring to FIG. 54, the bump 150 not only horizontally transmits an electronic signal but also vertically transmits the electronic signal between the semiconductor chip 100 and glass substrate 400. The top surfaces 155a and 150b of the bumps 150a and 150b have large areas, and therefore can be joined with much more metal particles 454 in the conductive layer 450 for electrically connecting the bumps 150a and 150b to the glass substrate 400. As a result, the total cross-sectional areas allowing electric current flowing between the bumps 150a and 150b and the glass substrate 400 to flow through can be increased. The performance for electrical connection between the semiconductor chip 100 and the glass substrate 400 can be enhanced.

Alternatively, referring to FIG. 54, the bumps 150a and 150b can serve as power buses. The bumps 150a and 150b can be connected to an internal power bus in the semiconductor chip 100, and to an internal power bus in the glass substrate 400. The top surfaces 155a and 150b of the bumps 150a and 150b have large areas, and therefore can be joined with much more metal particles 454 in the conductive layer 450 for electrically connecting the bumps 150a and 150b to the glass substrate 400. As a result, the total cross-sectional areas allowing electric current flowing between the bumps 150a and 150b and the glass substrate 400 to flow through can be increased. As a result, the appearance of the power bus of the semiconductor chip 100 providing an unstable power voltage due to being interfered by noise can be diminished, so the semiconductor chip 100 can provide a stable power voltage.

Alternatively, referring to FIG. 54, the bumps 150a and 150b can serve as ground buses. The bumps 150a and 150b can be connected to an internal ground bus in the semiconductor chip 100, and to an internal ground bus in the glass substrate 400. The top surfaces 155a and 150b of the bumps 150a and 150b have large areas, and therefore can be joined with much more metal particles 454 in the conductive layer 450 for electrically connecting the bumps 150*a* and 150*b* to the glass substrate 400. As a result, the total cross-sectional areas allowing electric current flowing between the bumps 150*a* and 150*b* and the glass substrate 400 to flow through can be increased. As a result, the appearance of the ground bus of the semiconductor chip 100 providing an unstable ground voltage due to being interfered by noise can be diminished, so the semiconductor chip 100 can provide a stable ground voltage.

Alternatively, at least one polymer layer can be formed on the passivation layer 140 shown in FIGS. 52-54, which can refer to FIGS. 4 and 5 and the corresponding description.

Referring to FIGS. 52-54, the bumps 150, 150*a* and 150*b* are deposited on and in contact with the thin-film circuit layer 136. Alternatively, the bumps 150, 150*a* and 150*b* can be disconnected from the thin-film circuit 136, as shown in FIGS. 55 and 56. FIGS. 55 and 56 are cross-sectional views showing other chip packages according to the third embodiment. Referring to FIG. 55, the bump 150 is deposited on the passivation layer 140 and disconnected from the thin-film circuit 136. The bump 150 is electrically connected to the circuit layer 410 of the glass substrate 400. The detail of the top surface 155 of the bump 150 also can refer to FIGS. 52 and 53 and the corresponding description.

Referring to FIG. 55, the bump 150 serves as the signal transmission medium for the internal elements in the glass substrate 400. An electronic signal can be transmitted from one part of the glass substrate 400 to the other part thereof, passing the circuit layer 410 of the glass substrate 400 and the bump 150, with horizontally transmitted via the circuit layer 410 of the glass substrate 400 and the bump 150. Alternatively, the bump 150 can serve as a power bus, wherein the bump 150 can be connected to an internal power bus in the glass substrate 400. Alternatively, the bump 150 can serve as a ground bus, wherein the bump 150 can be connected to an internal ground bus in the glass substrate 400.

Referring to FIG. 56, the bumps 150*a* and 150*b* are deposited on the passivation layer 140 and disconnected from the thin-film circuit layer 136. The bumps 150*a* and 150*b* are connected to the circuit layer 410 of glass substrate 400 wherein the detail of the top surfaces 155*a* and 155*b* of the bumps 150*a* and 150*b* can refer to FIG. 54 and the corresponding description.

Referring to FIG. 56, the bumps 150*a* and 150*b* serve as the signal transmission medium for the internal elements in the glass substrate 400. An electronic signal can be transmitted from one part of the glass substrate 400 to the other part thereof, passing the circuit layer 410 of the glass substrate 400 and the bumps 150*a* and 150*b*, with horizontally transmitted via the circuit layer 410 of the glass substrate 400 and the bumps 150*a* and 150*b*. Alternatively, the bumps 150*a* and 150*b* can serve as power buses, wherein the bumps 150*a* and 150*b* can be connected to an internal power bus in the glass substrate 400. Alternatively, the bumps 150*a* and 150*b* can serve as ground buses, wherein the bumps 150*a* and 150*b* can be connected to an internal ground bus in the glass substrate 400.

Alternatively, as shown in FIGS. 55 and 56, a polymer layer can be formed on the passivation layer 140, which can refer to FIGS. 8 and 9 and the corresponding description.

In FIGS. 52-56, the bump 150 may include a gold layer at the top of the bump 150. The detail metallization of the bump 150 can refer to FIG. 22 and the corresponding description.

4. Fourth Embodiment of Chip Packages

The bumps not only can bond a semiconductor chip to a substrate but also can bond two semiconductor chips, as shown in the following FIG. 57-71. The bump formed on a semiconductor chip can be electrically connected to another semiconductor chip through multiple metal particles in the conductive layer. The detail structures of the semiconductor chips 100 and 300 can refer to those described in the first and second embodiments. Some feasible examples are described as follows.

1. Bump on Thin-Film Circuit of One Semiconductor Chip being Electrically Connected to Another Bump on Thin-Film Circuit or Passivation Layer of Another Semiconductor Chip Through Metal Particles in Conductive Layer FIG. 57 is a cross-sectional view showing a chip package before two semiconductor chips being assembled according to the fourth embodiment. FIG. 58 is a cross-sectional view showing a chip package created after bonding two semiconductor chips shown in FIG. 57.

Referring to FIG. 57, after depositing the bumps 350 and 360 on the semiconductor chip 300, a conductive layer 450 can be deposited on the semiconductor chip 300, covering the bumps 350 and 360. The conductive layer 450 comprises a polymer 452 and multiple metal particles 454 scattering in the polymer 452. In this embodiment, the conducting layer 450 could be an anisotropic conductive paste (ACP) or an anisotropic conductive film (ACF).

The detail of the chip package shown in FIG. 58 can refer to FIG. 30 and the corresponding description. The only difference is that, as shown in FIG. 58, the bump 150 deposited on the thin-film circuit 137 of the semiconductor chip 100 is electrically connected to the bump 350 deposited on the thin-film circuit 337 of the semiconductor chip 300 through the metal particles 454 in the conductive layer 450. A plane 1000 parallel to the active surface 114 of the semiconductor chip 100 is defined. The patterns of projecting the top surface 155 of the bump 150 and the top surface 355 of the bump 350 onto the plane 1000 have an overlapping area of greater than 30,000 $\mu m^2$, 80,000 $\mu m^2$ or 150,000 $\mu m^2$. The overlapping area may have an extending distance of greater than 500 μm, 800 μm or 1200 μm.

In FIG. 58, the bump 150 formed on the thin-film circuit 137 is connected to the one bump 350 with a large contact area. Alternatively, the bump 150 can be electrically connected to multiple bumps 350A and 350B deposited on the thin-film circuit 337, as shown in FIG. 59. FIG. 59 is a cross-sectional view showing another chip package according to the fourth embodiment.

The detail of the chip package shown in FIG. 59 can refer to FIG. 31 and the corresponding description. The only difference is that, as shown in FIG. 59, the bump 150 deposited on the thin-film circuit 137 of the semiconductor chip 100 is electrically connected to the bumps 350A and 350B deposited on the thin-film circuit 337 of the semiconductor chip 300 through the metal particles 454 in the conductive layer 450.

Referring to FIG. 59, the patterns of projecting the top surface 155 of the bump 150 and the top surface 355A of the bump 350A onto the plane 1000 have an overlapping area of greater than 30,000 $\mu m^2$, 80,000 $\mu m^2$ or 150,000 $\mu m^2$. The patterns of projecting the top surface 155 of the bump 150 and the top surface 355B of the bump 350B onto the plane 1000 have an overlapping area of greater than 30,000 $\mu m^2$, 80,000 $\mu m^2$ or 150,000 $\mu m^2$. Alternatively, the patterns of projecting the top surface 155 of the bump 150 and one of the top surfaces 355A and 355B of the bumps 350A and 350B onto the plane 1000 have an overlapping area of greater than 30,000 $\mu m^2$, 80,000 $\mu m^2$ or 150,000 $\mu m^2$, but the patterns of projecting the top surface 155 of the bump 150 and the other one of the top surfaces 355A and 3558 of the bumps 350A and 350B onto the plane 1000 have an overlapping area of less than 30,000 µm².

Referring to FIG. 59, the patterns of projecting the top surface 155 of the bump 150 and the top surface 355A of the bump 350A onto the plane 1000 have an overlapping area having an extending distance of greater than 500 µm, 800 µm or 1200 µm. The patterns of projecting the top surface 155 of the bump 150 and the top surface 355B of the bump 350B onto the plane 1000 have an overlapping area having an extending distance of greater than 500 µm, 800 µm or 1200 µm. Alternatively, the patterns of projecting the top surface 155 of the bump 150 and one of the top surfaces 355A and 355B of the bumps 350A and 350B onto the plane 1000 have an overlapping area having an extending distance of greater than 500 µm, 800 µm or 1200 µm, but the patterns of projecting the top surface 155 of the bump 150 and the other one of the top surfaces 355A and 355B of the bumps 350A and 350B onto the plane 1000 have an overlapping area having an extending distance of less than 500 µm.

Referring to FIG. 59, the patterns of projecting the top surface 155 of the bump 150 and the top surfaces 355A and 355B of the bumps 350A and 350B onto the plane 1000 have overlapping areas, total of which are greater than 30,000 µm², 80,000 µm² or 150,000 µm². The ratio of the total overlapping area of the patterns of "projecting the top surface 155 of the bump 150 and the top surfaces 355A and 355B of the bumps 350A and 350B onto the plane 1000" to the area of "projecting the top surface 155 of the bump 150 onto the plane 1000" is greater than 0.5 or 0.8.

Alternatively, multiple bumps 150a and 150b can be deposited on the thin-film circuit 137 of the semiconductor chip 100 and bonded with the bumps 350A and 350B, respectively, as shown in FIG. 60. FIG. 60 is a cross-sectional view showing another chip package according to the fourth embodiment. The detail of the chip package shown in FIG. 60 can refer to FIG. 34 and the corresponding description. The only difference is that, as shown in FIG. 60, the bumps 150a and 150b deposited on the thin-film circuit 137 of the semiconductor chip 100 are electrically connected to the bumps 350A and 350B deposited on the thin-film circuit 337 of the semiconductor chip 300 through the metal particles 454 in the conductive layer 450.

Referring to FIG. 60, the patterns of projecting the top surface 155a of the bump 150a and the top surface 355A of the bump 350A onto the plane 1000 have an overlapping area of greater than 30,000 µm², 80,000 µm² or 150,000 µm². The patterns of projecting the top surface 155b of the bump 150b and the top surface 355B of the bump 350B onto the plane 1000 have an overlapping area of greater than 30,000 µm², 80,000 µm² or 150,000 µm². Alternatively, the patterns of projecting one of the top surfaces 155a and 155b of the bumps 150a and 150b and one of the top surfaces 355A and 355B of the bumps 350A and 350B onto the plane 1000 have an overlapping area of greater than 30,000 µm², 80,000 µm² or 150,000 µm², but the patterns of projecting the other one of the top surfaces 155a and 155b of the bumps 150a and 150b and the other one of the top surfaces 355A and 355B of the bumps 350A and 350B onto the plane 1000 have an overlapping area of less than 30,000 µm².

Referring to FIG. 60, the patterns of projecting the top surface 155a of the bump 150a and the top surface 355A of the bump 350A onto the plane 1000 have an overlapping area having an extending distance of greater than 500 µm, 800 µm or 1200 µm. Alternatively, the patterns of projecting one of the top surfaces 155a and 155b of the bumps 150a and 150b and one of the top surfaces 355A and 355B of the bumps 350A and 350B onto the plane 1000 have an overlapping area having an extending distance of greater than 500 µm, 800 µm or 1200 µm, but the patterns of projecting the other one of the top surfaces 155a and 155b of the bumps 150a and 150b and the other one of the top surfaces 355A and 355B of the bumps 350A and 350B onto the plane 1000 have an overlapping area having an extending distance of less than 500 µm.

In FIGS. 57-60, the bump 350 is electrically connected to the thin-film circuit layer 336. Alternatively, the bump 350 can be disconnected from the thin-film circuit layer 336, as shown in FIG. 61. The chip package shown in FIG. 61 can refer to FIG. 35 and the corresponding description. The only difference is that, as shown in FIG. 61, the bump 150 deposited on the thin-film circuit 137 of the semiconductor chip 100 is electrically connected to the bump 350 deposited on the thin-film circuit 337 of chip 300 through the metal particles 454 in the conductive layer 450.

2. Bump Deposited on Thin-Film Circuit of Chip being Electrically Connected to Thick Metallization Circuit of Another Chip Through Metal Particles in Conductive Layer.

FIG. 62 is a cross-sectional view showing a chip package before two semiconductor chips being assembled according to the fourth embodiment. FIG. 63 is a cross-sectional view showing a chip package created after bonding two semiconductor chips shown in FIG. 62.

Referring to FIG. 62, after forming the thick metallization circuit layer 390, a conductive layer 450 is formed on the semiconductor chip 300, covering the thick metallization circuit layer 390. The conductive layer 450 comprises a polymer 452 and multiple metal particles 454 scattering in the polymer 452. In this embodiment, the conducting layer 450 could be an anisotropic conductive paste (ACP) or an anisotropic conductive film (ACF).

The detail of the chip package shown in FIG. 63 can refer to FIG. 39 and the corresponding description. The only difference is that, as shown in FIG. 63, the bump 150 deposited on the thin-film circuit 137 of the semiconductor chip 100 is electrically connected to the thick metallization circuit 391 through the metal particles 454 in the conductive layer 450. A plane 1000 parallel to the active surface 114 of the semiconductor chip 100 is defined. The patterns of projecting the top surface 155 of the bump 150 and the top surface 393 of the thick metallization circuit layer 390 onto the plane 1000 have an overlapping area of greater than 30,000 µm², 80,000 µm² or 150,000 µm². The patterns of projecting the top surface 155 of the bump 150 and the top surface 393 of the thick metallization circuit layer 390 onto the plane 1000 have an overlapping area haven an extending distance of greater than 500 µm, 800 µm or 1200 µm.

Figure 64:
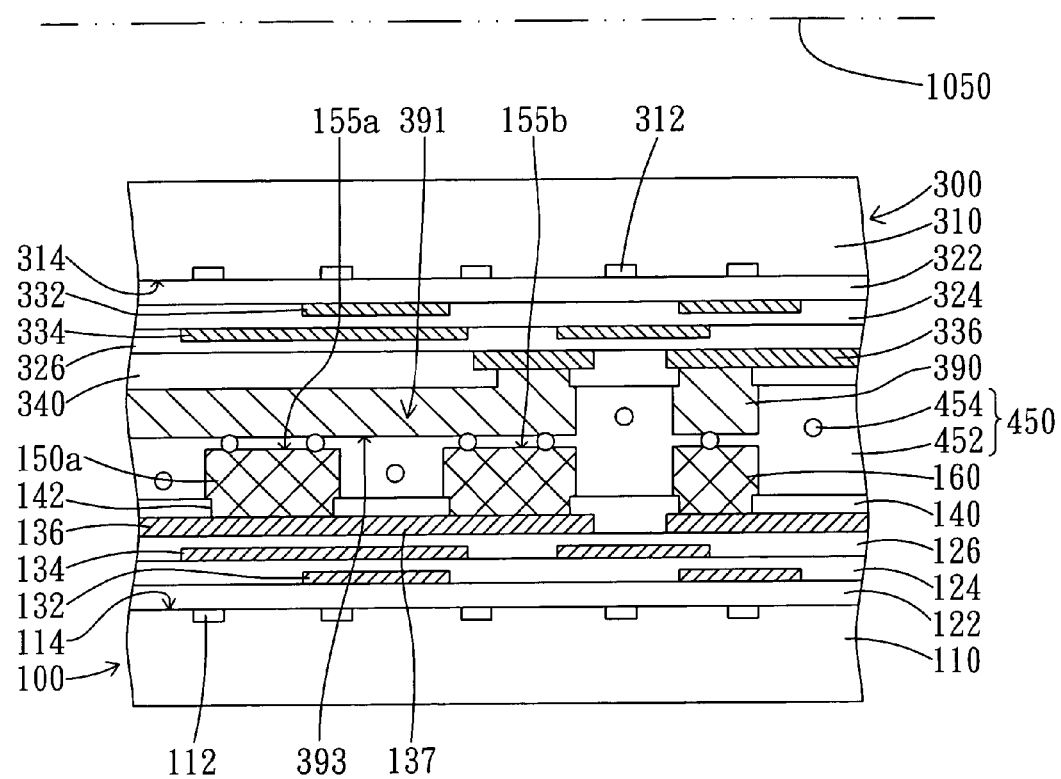

In FIG. 63, the single bump 150 is electrically connected to the thick metallization circuit 391. Alternatively, multiple bumps 150a and 150b deposited on the thin-film circuit 137 of the semiconductor chip 100 can be electrically connected to the thick metallization circuit 391, as shown in FIG. 64. FIG. 64 is a cross-sectional view showing another chip package according to the fourth embodiment.

The detail of the chip package shown in FIG. 64 can refer to FIG. 40 and the corresponding description. The only difference is that, as shown in FIG. 64, the bumps 150a and 150b deposited on the thin-film circuit 137 of the semiconductor chip 100 is electrically connected to the thick metallization circuit 391 through the metal particles 454 in the conductive layer 450.

Referring to FIG. 64, the patterns of projecting the top surface 155a of the bump 150a and the top surface 393 of the thick metallization circuit 391 onto the plane 1000 have an overlapping area of greater than 30,000 µm², 80,000 µm² or 150,000 μm². The patterns of projecting the top surface 155*b* of the bump 150*b* and the top surface 393 of the thick metallization circuit 391 onto the plane 1000 have an overlapping area of greater than 30,000 μm², 80,000 μm² or 150,000 μm². Alternatively, the patterns of projecting the top surface 393 of the thick metallization circuit 391 and one of the top surfaces 155*a* and 155*b* of the bumps 150*a* and 150*b* onto the plane 1000 have an overlapping area of greater than 30,000 μm², 80,000 μm² or 150,000 μm², but the patterns of projecting the top surface 393 of the thick metallization circuit 391 and the other one of the top surfaces 155*a* and 155*b* of the bumps 150*a* and 150*b* onto the plane 1000 have an overlapping area of less than 30,000 μm².

Referring to FIG. 64, the patterns of projecting the top surface 155*a* of the bump 150*a* and the top surface 393 of the thick metallization circuit 391 onto the plane 1000 have an overlapping area having an extending distance of greater than 500 μm, 800 μm or 1200 μm. The patterns of projecting the top surface 155*b* of the bump 150*b* and the top surface 393 of the thick metallization circuit 391 onto the plane 1000 have an overlapping area having an extending distance of greater than 500 μm, 800 μm or 1200 μm. Alternatively, the patterns of projecting the top surface 393 of the thick metallization circuit 391 and one of the top surfaces 155*a* and 155*b* of the bumps 150*a* and 150*b* onto the plane 1000 have an overlapping area having an extending distance of greater than 500 μm, 800 μm or 1200 μm, but the patterns of projecting the top surface 393 of the thick metallization circuit 391 and the other one of the top surfaces 155*a* and 155*b* of the bumps 150*a* and 150*b* onto the plane 1000 have an overlapping area having an extending distance of less than 500 μm.

Also, referring to FIG. 64, the patterns of projecting the top surfaces 155*a* and 155*b* of the bumps 150*a* and 150*b* and the top surface 393 of the thick metallization circuit 391 onto the plane 1000 have overlapping areas, total of which are greater than 30,000 μm², 80,000 μm² or 150,000 μm². The ratio of the total overlapping area of the patterns of "projecting the top surfaces 155*a* and 155*b* of the bumps 150*a* and 150*b* and the top surface 393 of the thick metallization circuit 391 onto the plane 1000" to the area of "projecting the top surface 393 of the thick metallization circuit 391 onto the plane 1000" is greater than 0.5 or 0.8.

Figure 65:
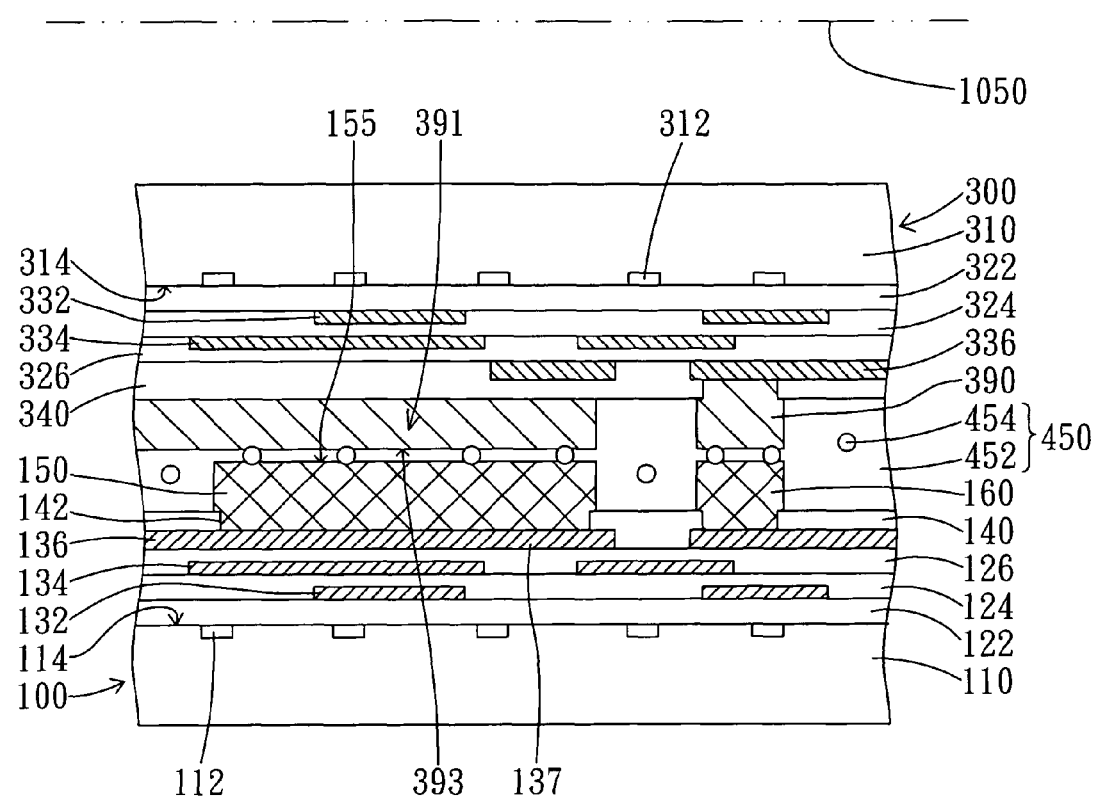

In FIGS. 62-64, the thick metallization circuit 391 is electrically connected to the thin-film circuit 336. Alternatively, the thick metallization circuit 391 can be disconnected from the thin-film circuit 336, as shown in FIG. 65. The detail of the chip package shown in FIG. 65 can refer to FIG. 47 and the corresponding description. The only difference is that, as shown in FIG. 65, the bump 150 deposited on the thin-film circuit 137 of the semiconductor chip 100 is electrically connected to the thick metallization circuit 391 through the metal particles 454 in the conductive layer 450. The relationship between the bump 150 and the thick metallization circuit 391 can refer to FIG. 63 and the corresponding description.

Figure 66:
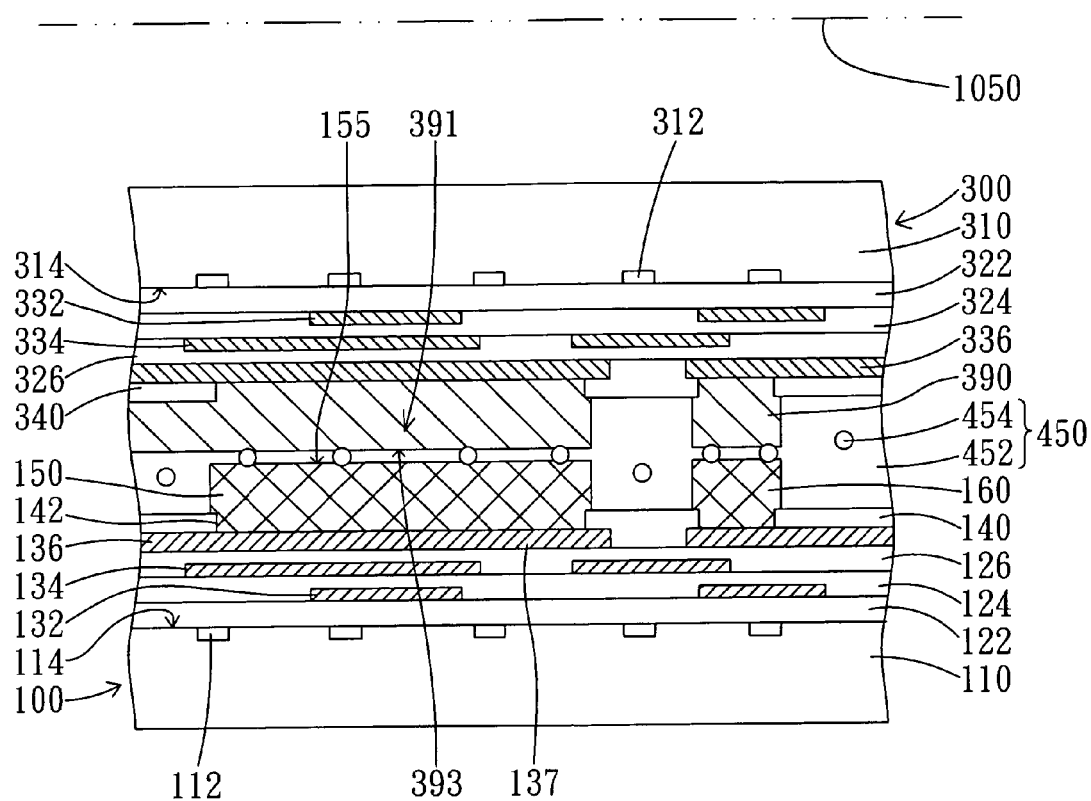

In FIGS. 62-64, the thick metallization circuit 391 is electrically connected to the thin-film circuit 336 with a small contact area. Alternatively, the thick metallization circuit 391 can be connected to the thin-film circuit 336 with a large contact area, as shown in FIG. 66. The detail of the chip package shown in FIG. 66 can refer to FIG. 49 and the corresponding description. The only difference is that, as shown in FIG. 66, the bump 150 deposited on the thin-film circuit 137 of the semiconductor chip 100 is electrically connected to the thick metallization circuit 391 through the metal particles 454 in the conductive layer 450. The relationship between the bump 150 and the thick metallization circuit 391 can refer to FIG. 63 and the corresponding description.

Figure 67:
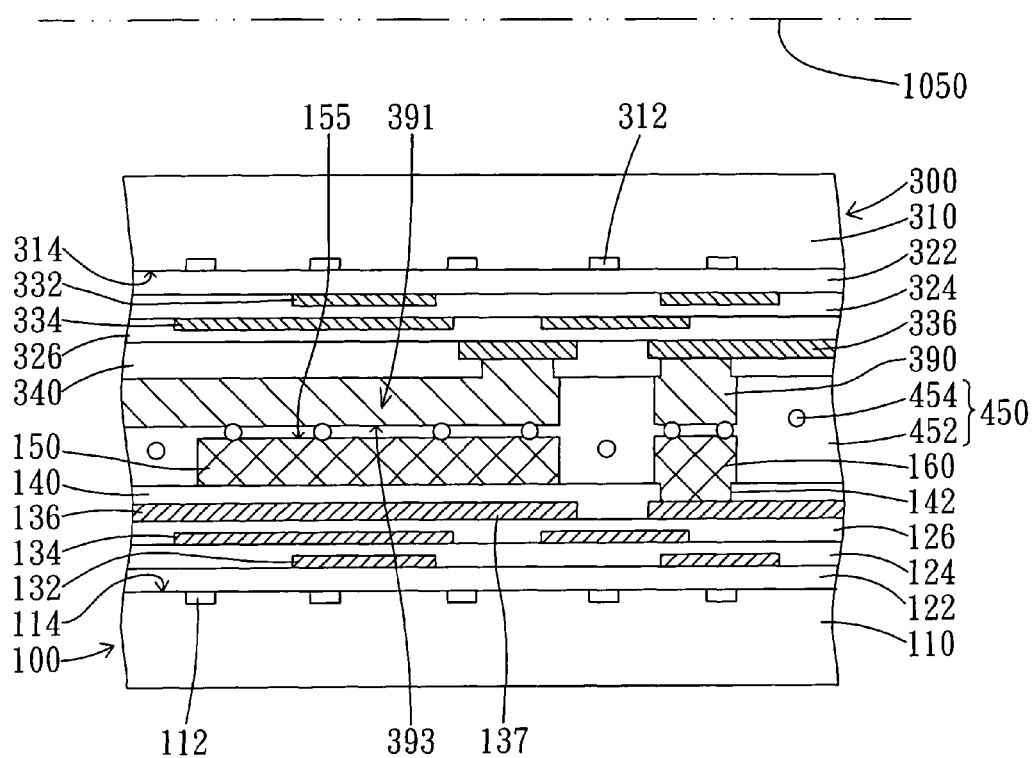

In FIGS. 62-66, the bump 150 is electrically connected to the thin-film circuit 136. Alternatively, the bump 150 can be disconnected from the thin-film circuit 136, as shown in FIG. 67. The detail of the chip package shown in FIG. 67 can refer to FIG. 51 and the corresponding description. The only difference is that, as shown in FIG. 67, the bump 150 deposited on the thin-film circuit 137 of the semiconductor chip 100 is electrically connected to the thick metallization circuit 391 through the metal particles 454 in the conductive layer 450. The relationship between the bump 150 and the thick metallization circuit 391 can refer to FIG. 63 and the corresponding description.

6. Bump Deposited on Thin-Film Circuit of Semiconductor Chip being Electrically Connected to Thin-Film Circuit of Another Semiconductor Chip Through Metal Particles in Conducting Layer.

FIG. 68 is a cross-sectional view showing a chip package before two semiconductor chips being assembled according to the fourth embodiment. FIG. 69 is a cross-sectional view showing a chip package created after bonding two semiconductor chips shown in FIG. 68.

Referring to FIG. 68, an opening 342 in the passivation layer 340 of the semiconductor chip 300 exposes the thin-film circuit 337. After providing the semiconductor chip 300, a conductive layer 450 can be deposited on the semiconductor chip 300, covering the thin-film circuit 137. The conductive layer 450 comprises a polymer 452 and multiple metal particles 454 scattering in the polymer 452. In this embodiment, the conducting layer 450 could be an anisotropic conductive paste (ACP) or an anisotropic conductive film (ACF).

The detail of the semiconductor chip 100 shown in FIG. 68 can refer to FIG. 1 and the corresponding description. Referring to FIG. 68, the semiconductor chip 300 comprises a semiconductor substrate 310, multiple dielectric layers 322, 324 and 326, multiple thin-film circuit layers 332, 334 and 336, and a passivation layer 340, the detail of which can refer to FIG. 29 and the corresponding description.

Referring to FIG. 69, the bump 150 deposited on the thin-film circuit 137 of the semiconductor chip 100 is electrically connected to the thin-film circuit 337 of the semiconductor chip 300 through metal particles 454 in the conductive layer 450. A plane 1000 parallel to the active surface 114 of chip 100 is defined. The patterns of projecting the top surface 155 of the bump 150 and the top surface 338 of the thin-film circuit 337 onto the plane 1000 have an overlapping area of greater than 30,000 μm², 80,000 μm² or 150,000 μm². The overlapping area may have an extending distance of greater than 500 μm, 800 μm or 1200 μm.

Referring to FIG. 69, the bump 150 can serve as the signal transmission media for the internal elements of the semiconductor chip 100 or 300, or for the interconnection between the semiconductor chips 100 and 300, described as follows.

Referring to FIG. 69, the bump 150 serves as the signal transmission medium for the interconnection between the semiconductor chips 100 and 300. An electronic signal can be transmitted from one of the electronic elements 112 of the semiconductor chip 100 to one of the electronic elements 312 of the semiconductor chip 300, sequentially passing the thin-film circuit layers 132, 134 and 136, penetrating through the passivation layer 140, passing the bump 150, penetrating through the passivation layer 340, and passing the thin-film circuit layers 336, 334 and 332. Alternatively, an electronic signal can be transmitted from one of the electronic elements 312 of the semiconductor chip 300 to one of the electronic elements 112 of the semiconductor chip 100, sequentially passing the thin-film circuit layers 332, 334 and 336, penetrating through the passivation layer 340, passing the bump 150, penetrating through the passivation layer 140, and passing the thin-film circuit layers 136, 134 and 132.

Referring to FIG. 69, the bump 150 serves as the signal transmission medium for the internal elements in the semiconductor chip 100. An electronic signal can be transmitted from one of the electronic elements 112 of the semiconductor chip 100 to the other one thereof, sequentially passing the thin-film circuit layers 132, 134 and 136 and bump 150, with horizontally transmitted via the bump 150, and then sequentially passing the thin-film circuit layers 136, 134 and 132. Furthermore, the electronic signal can be optionally transmitted to the electronic elements 312 of the semiconductor chip 300 from the bump 150 when being transmitted from one of the electronic elements 112 of the semiconductor chip 100 to the other one thereof. The bump 150 serves as the signal transmission media for the internal elements in the semiconductor chip 100, and for the interconnection between the semiconductor chips 100 and 300.

Referring to FIG. 69, the bump 150 serves as the signal transmission medium for the internal elements in the semiconductor chip 300. An electronic signal can be transmitted from one of the electronic elements 312 of the semiconductor chip 300 to the other one thereof, sequentially passing the thin-film circuit layers 332, 334 and 336 and bump 150, with horizontally transmitted via the bump 150, and then sequentially passing the thin-film circuit layers 336, 334 and 332. Furthermore, the electronic signal can be optionally transmitted to the electronic elements 112 of the semiconductor chip 100 from the bump 150 when being transmitted from one of the electronic elements 312 of the semiconductor chip 300 to the other one thereof. The bump 150 serves as the signal transmission media for the internal elements in the semiconductor chip 300, and for the interconnection between the semiconductor chips 100 and 300.

Referring to FIG. 69, through the bump 160, an electronic signal can be transmitted from the semiconductor chip 100 to the semiconductor chip 300 or transmitted from the semiconductor chip 300 to the semiconductor chip 100.

Referring to FIG. 69, the bump 150 not only horizontally transmits an electronic signal but also vertically transmits the electronic signal between the semiconductor chips 100 and 300. The top surface 155 of the bump 150 has a large area, and therefore can be joined with much more metal particles 454 in the conductive layer 450 for electrically connecting the bump 150 to the thin-film circuit 337 of the semiconductor chip 300. As a result, the cross-sectional area allowing electric current flowing between the bump 150 and the thin-film circuit 337 of the semiconductor chip 300 to flow through can be increased. The performance for electrical connection between the semiconductor chips 100 and 300 can be enhanced.

Alternatively, referring to FIG. 69, the bump 150 can serve as a power bus. The bump 150 can be connected to internal power buses in the semiconductor chips 100 and 300. The top surface 155 of the bump 150 has a large area, and therefore can be joined with much more metal particles 454 in the conductive layer 450 for electrically connecting the bump 150 to the thin-film circuit 337 of the semiconductor chip 300. The cross-sectional area allowing electric current flowing between the bump 150 and the thin-film circuit 337 of the semiconductor chip 300 to flow through can be increased. As a result, the appearance of the power bus of the semiconductor chip 100 or 300 providing an unstable power voltage due to being interfered by noise can be diminished, so the semiconductor chips 100 and 300 can provide a stable power voltage.

Alternatively, referring to FIG. 69, the bump 150 can serve as a ground bus. The bump 150 can be connected to internal ground buses in the semiconductor chips 100 and 300. The top surface 155 of the bump 150 has a large area, and therefore can be joined with much more metal particles 454 in the conductive layer 450 for electrically connecting the bump 150 to the thin-film circuit 337 of the semiconductor chip 300. The cross-sectional area allowing electric current flowing between the bump 150 and the thin-film circuit 337 of the semiconductor chip 300 to flow through can be increased. As a result, the appearance of the ground bus of the semiconductor chip 100 or 300 providing an unstable ground voltage due to being interfered by noise can be diminished, so the semiconductor chips 100 and 300 can provide a stable ground voltage.

In the FIG. 69, the single one bump 150 is connected to the thin-film circuit 337 of the semiconductor chip 300. Alternatively, multiple bumps 150a and 150b deposited on the thin-film circuit 137 can be electrically connected to the thin-film circuit 337 of the semiconductor chip 300 through the metal particles 454 in the conductive layer 450, as shown in FIG. 70. FIG. 70 is a cross-sectional view showing another chip package according to the fourth embodiment.

Referring to FIG. 70, the patterns of projecting the top surface 155a of the bump 150a and the top surface 338 of the thin-film circuit 337 onto the plane 1000 have an overlapping area of greater than 30,000 $\mu m^2$, 80,000 $\mu m^2$ or 150,000 $\mu m^2$. The patterns of projecting the top surface 155b of the bump 150b and the top surface 338 of the thin-film circuit 337 onto the plane 1000 have an overlapping area of greater than 30,000 $\mu m^2$, 80,000 $\mu m^2$ or 150,000 $\mu m^2$. Alternatively, the patterns of projecting the top surface 338 of the thin-film circuit 337 and one of the top surfaces 155a and 155b of the bumps 150a and 150b onto the plane 1000 have an overlapping area of greater than 30,000 $\mu m^2$, 80,000 $\mu m^2$ or 150,000 $\mu m^2$, but the patterns of projecting the top surface 338 of the thin-film circuit 337 and the other one of the top surfaces 155a and 155b of the bumps 150a and 150b onto the plane 1000 have an overlapping area of less than 30,000 $\mu m^2$.

Referring to FIG. 70, the patterns of projecting the top surface 155a of the bump 150a and the top surface 338 of the thin-film circuit 337 onto the plane 1000 have an overlapping area having an extending distance of greater than 500 µm, 800 µm or 1200 µm. The patterns of projecting the top surface 155b of the bump 150b and the top surface 338 of the thin-film circuit 337 onto the plane 1000 have an overlapping area having an extending distance of greater than 500 µm, 800 µm or 1200 µm. Alternatively, the patterns of projecting the top surface 338 of the thin-film circuit 337 and one of the top surfaces 155a and 155b of the bumps 150a and 150b onto the plane 1000 have an overlapping area having an extending distance of greater than 500 µm, 800 µm or 1200 µm, but the patterns of projecting the top surface 338 of the thin-film circuit 337 and the other one of the top surfaces 155a and 155b of the bumps 150a and 150b onto the plane 1000 have an overlapping area having an extending distance of less than 500 µm.

Alternatively, referring to FIG. 70, the patterns of projecting the top surface 338 of the thin-film circuit 337 and the top surfaces 155a and 155b of the bumps 150a and 150b onto the plane 1000 have overlapping areas, total of which are greater than 30,000 $\mu m^2$, 80,000 $\mu m^2$ or 150,000 $\mu m^2$. The ratio of the total overlapping area of the patterns of "projecting the top surface 338 of the thin-film circuit 337 and the top surfaces 155a and 155b of the bumps 150a and 150b onto the plane 1000" to the area of "projecting the top surface 338 of the thin-film circuit 337 onto the plane 1000" is greater than 0.5 or 0.8.

In FIGS. 68-70, the bump 150 is electrically connected to the thin-film circuit layer 136. Alternatively, the bump 150 can be disconnected from the thin-film circuit 136, as shown in FIG. 71.

Referring to FIG. 71, the bump 150 can serve as the signal transmission medium for the internal elements in the semiconductor chip 300. An electronic signal can be transmitted from one of the electronic elements 312 of the semiconductor chip 300 to the other one thereof, sequentially passing the thin-film circuit layers 332, 334 and 336, and bump 150, with horizontally transmitted via the bump 150, and then sequentially passing the thin-film circuit layers 336, 334 and 332.

Referring to FIG. 71, the bump 150 can serve as a power bus. The bump 150 can be connected to an internal power bus in the semiconductor chip 300. Alternatively, the bump 150 can serve as a ground bus. The bump 150 can be connected to an internal ground bus in the semiconductor chip 300.

5. Conclusion

The thick metallization circuit of the semiconductor chip can be connected to a circuit of a circuitry component with a large contact area, or can be connected to a circuit of a circuitry component through a conductive layer with a polymer and metal particles. Therefore, the resistance between the thick metallization circuit and the circuit of the circuitry component can be reduced. If the thick metallization circuit of the semiconductor chip and the circuit of the circuitry component bonded to each other with a large contact area serve as the signal transmission medium, they can provide a stable signal transmission. If the thick metallization circuit of the semiconductor chip and the circuit of the circuitry component bonded to each other with a large contact area serve as a power bus or ground bus, they can provide a stable power voltage or ground voltage.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip package comprising:
   a semiconductor chip comprising a semiconductor substrate, a first conductive structure coupled to said semiconductor substrate, wherein said first conductive structure comprises a first conductive layer and a second conductive layer coupled to said first conductive layer, a dielectric layer between said first and second conductive layers, a separating layer coupled to said semiconductor substrate, said first conductive structure and said dielectric layer, wherein an opening in said separating layer exposes a contact point of said first conductive structure, and said contact point is within said opening, and a second conductive structure on said contact point, wherein said second conductive structure is coupled to said contact point through said opening, wherein said second conductive structure comprises a first copper layer;
   a circuit substrate;
   a conductive interconnect between said second conductive structure and a conductive contact of said circuit substrate and coupled to said contact point, wherein said second conductive structure is coupled to said conductive contact through said conductive interconnect, wherein said conductive interconnect comprises tin, wherein from a first perspective view said conductive interconnect extends a distance greater than a width of said conductive interconnect, wherein a first contact area between said conductive contact and said conductive interconnect is greater than 30,000 square micrometers; and
   a first polymer layer and a second polymer layer between said semiconductor chip and said circuit substrate, wherein said first polymer layer contacts said semiconductor chip, said conductive structure, and a sidewall of said conductive interconnect, wherein said second polymer layer is directly coupled to said circuit substrate, directly on said first polymer layer, and directly coupled to said conductive interconnect at a sidewall of said conductive interconnect.

2. The chip package of claim 1, wherein said first contact area has an extending distance greater than 500 micrometers.

3. The chip package of claim 1, wherein said second conductive structure further comprises a titanium-containing layer coupled to said first copper layer.

4. The chip package of claim 1, wherein said conductive interconnect comprises a tin-silver alloy.

5. The chip package of claim 1, wherein said separating layer comprises a nitride.

6. The chip package of claim 1, wherein said first contact area is greater than 80,000 square micrometers.

7. The chip package of claim 1, wherein said first contact area is greater than 150,000 square micrometers.

8. The chip package of claim 1, wherein said first copper layer has a thickness greater than 3 micrometers.

9. The chip package of claim 1, wherein said second conductive layer comprises a second copper layer.

10. The chip package of claim 1, wherein a second contact area between said contact point and said second conductive structure is greater than 30,000 square micrometers.

11. The chip package of claim 10, wherein said second contact area is greater than 80,000 square micrometers.

12. The chip package of claim 1, wherein said second conductive structure further comprises a nickel layer on said first copper layer.

13. The chip package of claim 1, wherein from said first perspective view a second contact area between said contact point and said second conductive structure extends a distance greater than 500 micrometers.

14. The chip package of claim 1, wherein said distance extends in a direction perpendicular to said width.

15. A chip package comprising:
   a semiconductor chip comprising a semiconductor substrate, a first conductive structure coupled to said semiconductor substrate, wherein said first conductive structure comprises a first conductive layer and a second conductive layer coupled to said first conductive layer, a dielectric layer between said first and second conductive layers, a separating layer coupled to said semiconductor substrate, said first conductive structure and said dielectric layer, wherein an opening in said separating layer exposes a contact point of said first conductive structure, and said contact point is within said opening, and a second conductive structure on said contact point, wherein said second conductive structure is coupled to said contact point through said opening, wherein said second conductive structure comprises a first copper layer;
   a circuit substrate;

a conductive interconnect between said second conductive structure and a conductive contact of said circuit substrate and coupled to said contact point, wherein said second conductive structure is coupled to said conductive contact through said conductive interconnect wherein said conductive interconnect comprises tin, wherein from a first perspective view said conductive interconnect extends a distance greater than a width of said conductive interconnect, wherein a first contact area between said conductive contact and said conductive interconnect has an extending distance greater than 500 micrometers; and a first polymer layer and a second polymer layer between said semiconductor chip and said circuit substrate, wherein said first polymer layer contacts said semiconductor chip, said conductive structure, and a sidewall of said conductive interconnect, wherein said second polymer layer is directly coupled to said circuit substrate, directly on said first polymer layer, and directly coupled to said conductive interconnect at a sidewall of said conductive interconnect.

16. The chip package of claim 15, wherein said second conductive structure further comprises a titanium-containing layer coupled to said first copper layer.

17. The chip package of claim 15, wherein said conductive interconnect comprises a tin-silver alloy.

18. The chip package of claim 15, wherein said separating layer comprises a nitride.

19. The chip package of claim 15, wherein said extending distance is greater than 800 micrometers.

20. The chip package of claim 15, wherein said extending distance is greater than 1200 micrometers.

21. The chip package of claim 15, wherein said first copper layer has a thickness greater than 3 micrometers.

22. The chip package of claim 15, wherein said conductive layer comprises a second copper layer.

23. The chip package of claim 15, wherein a second contact area between said contact point and said second conductive structure is greater than 30,000 square micrometers.

24. The chip package of claim 23, wherein said second contact area is greater than 80,000 square micrometers.

25. The chip package of claim 15, wherein said second conductive structure further comprises a nickel layer on said first copper layer.

26. The chip package of claim 15, wherein from said first perspective view a second contact area between said contact point and said second conductive structure extends a distance greater than 500 micrometers.

27. The chip package of claim 15, wherein said distance extends in a direction perpendicular to said width.

28. A chip package comprising:
a semiconductor chip comprising a semiconductor substrate, a first conductive structure coupled to said semiconductor substrate, wherein said first conductive structure comprises a first conductive layer and a second conductive layer coupled to said first conductive layer, a dielectric layer between said first and second conductive layers, a passivation layer coupled to said semiconductor substrate, said first conductive and said dielectric layer, wherein said passivation layer comprises a nitride, wherein an opening in said passivation layer exposes a contact point of said first conductive structure, and said contact point is within said opening, and a second conductive structure on said contact point, wherein said second conductive structure is coupled to said contact point through said opening, wherein said second conductive structure comprises a first copper layer having a thickness greater than 3 micrometers;

a circuit substrate;

a conductive interconnect between said second conductive structure and a conductive contact of said circuit substrate and coupled to said contact point, wherein said second conductive structure is coupled to said conductive contact through said conductive interconnect wherein said conductive interconnect comprises tin, wherein from a first perspective view said conductive interconnect extends a distance greater than a width of said conductive interconnect; and a first polymer layer and a second polymer layer between said semiconductor chip and said circuit substrate, wherein said first polymer layer contacts said semiconductor chip, said conductive structure, and a sidewall of said conductive interconnect, wherein said second polymer layer is directly coupled to said circuit substrate, directly on said first polymer layer, and directly coupled to said conductive interconnect at a sidewall of said conductive interconnect.

29. The chip package of claim 28, wherein said second conductive structure further comprises a titanium-containing layer coupled to said first copper layer.

30. The chip package of claim 28, wherein said conductive interconnect comprises a tin-silver alloy.

31. The chip package of claim 28, wherein a contact area between said conductive contact and said conductive interconnect has an extending distance greater than 500 micrometers.

32. The chip package of claim 28, wherein a contact area between said conductive contact and said conductive interconnect is greater than 30,000 square micrometers.

33. The chip package of claim 28, wherein said second conductive layer comprises a second copper layer.

34. The chip package of claim 28, wherein a contact area between said contact point and said second conductive is greater than 30,000 square micrometers.

35. The chip package of claim 28, wherein said second conductive structure further comprises a nickel layer on said first copper layer.

36. The chip package of claim 28, wherein from said first perspective view a contact area between said contact point and said second conductive structure extends a distance greater than 500 micrometers.

37. The chip package of claim 28, wherein said distance extends in a direction perpendicular to said width.

* * * * *